(12) United States Patent
En et al.

(10) Patent No.: US 8,018,045 B2
(45) Date of Patent: Sep. 13, 2011

(54) PRINTED CIRCUIT BOARD

(75) Inventors: Honchin En, Ibi-gun (JP); Masayuki Hayashi, Ibi-gun (JP); Dongdong Wang, Ibi-gun (JP); Kenichi Shimada, Ibi-gun (JP); Motoo Asai, Ibi-gun (JP); Koji Sekine, Ibi-gun (JP); Tohru Nakai, Ibi-gun (JP); Shinichiro Ichikawa, Ibi-gun (JP); Yukihiko Toyoda, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/146,212

(22) Filed: Jun. 25, 2008

(65) Prior Publication Data

US 2008/0292852 A1 Nov. 27, 2008

Related U.S. Application Data

(60) Continuation of application No. 11/188,886, filed on Jul. 26, 2005, now Pat. No. 7,504,719, which is a division of application No. 09/806,203, filed as application No. PCT/JP99/05266 on Sep. 28, 1999, now Pat. No. 7,535,095.

(30) Foreign Application Priority Data

| Sep. 28, 1998 | (JP) | 10-272799 |
| Sep. 29, 1998 | (JP) | 10-276010 |
| Sep. 29, 1998 | (JP) | 10-276011 |
| Oct. 13, 1998 | (JP) | 10-290450 |
| Oct. 30, 1998 | (JP) | 10-310445 |
| Dec. 10, 1998 | (JP) | 10-351572 |
| Dec. 14, 1998 | (JP) | 10-354733 |
| Dec. 28, 1998 | (JP) | 10-372274 |
| Apr. 14, 1999 | (JP) | 11-106184 |
| Jul. 1, 1999 | (JP) | 11-187418 |

(51) Int. Cl.
*H01L 23/12* (2006.01)
*H01L 21/4763* (2006.01)

(52) U.S. Cl. ........ 257/700; 257/701; 257/758; 257/774; 257/E23.019; 257/E21.019; 438/622; 438/629

(58) Field of Classification Search .................. None
See application file for complete search history.

(56) References Cited

U.S. PATENT DOCUMENTS 3,310,432 A  3/1967  Griest et al.
(Continued)

FOREIGN PATENT DOCUMENTS

EP  0 257 737 A2  3/1988
(Continued)

OTHER PUBLICATIONS

Japanese Office Action mailed May 10, 2005.
(Continued)

*Primary Examiner* — Alonzo Chambliss
(74) *Attorney, Agent, or Firm* — Oblon, Spivak, McClelland, Maier & Neustadt, L.L.P.

(57) ABSTRACT

The present invention has for its object to provide a multilayer printed circuit board which is very satisfactory in facture toughness, dielectric constant, adhesion and processability, among other characteristics. The present invention is directed to a multilayer printed circuit board comprising a substrate board, a resin insulating layer formed on said board and a conductor circuit constructed on said resin insulating layer, wherein said resin insulating layer comprises a polyolefin resin.

23 Claims, 50 Drawing Sheets

U.S. PATENT DOCUMENTS

| | | | |
|---|---|---|---|
| 3,925,578 A | 12/1975 | Polichette et al. |
| 3,972,755 A | 8/1976 | Misfeldt |
| 4,211,603 A | 7/1980 | Reed |
| 4,520,041 A | 5/1985 | Aoyama et al. |
| 4,692,205 A | 9/1987 | Sachdev et al. |
| 4,751,126 A | 6/1988 | Oodaira et al. |
| 4,820,759 A | 4/1989 | Ichikawa et al. |
| 4,923,734 A | 5/1990 | Benedikt |
| 4,994,903 A | 2/1991 | Wroe et al. |
| 5,071,701 A | 12/1991 | Tenney et al. |
| 5,084,355 A | 1/1992 | Takahashi et al. |
| 5,118,385 A | 6/1992 | Kumar et al. |
| 5,137,597 A | 8/1992 | Curry, II et al. |
| 5,209,817 A | 5/1993 | Ahmad et al. |
| 5,227,012 A | 7/1993 | Brandli et al. |
| 5,248,853 A | 9/1993 | Ishikawa et al. |
| 5,346,728 A | 9/1994 | Yoshida |
| 5,388,328 A | 2/1995 | Yokono et al. |
| 5,451,721 A | 9/1995 | Tsukada et al. |
| 5,460,767 A | 10/1995 | Sanftleben et al. |
| 5,461,202 A | 10/1995 | Sera et al. |
| 5,478,972 A | 12/1995 | Mizutani et al. |
| 5,503,286 A | 4/1996 | Nye, III et al. |
| 5,583,376 A | 12/1996 | Sickler et al. |
| 5,589,250 A | 12/1996 | Asai et al. |
| 5,618,636 A | 4/1997 | Watanabe et al. |
| 5,699,613 A | 12/1997 | Chong et al. |
| 5,709,957 A | 1/1998 | Chiang et al. |
| 5,747,881 A | 5/1998 | Hosomi et al. |
| 5,837,155 A | 11/1998 | Inagaki et al. |
| 5,883,335 A | 3/1999 | Mizumoto et al. |
| 6,001,488 A | 12/1999 | Kataoka et al. |
| 6,045,866 A | 4/2000 | Chuang |
| 6,071,597 A | 6/2000 | Yang et al. |
| 6,103,977 A | 8/2000 | Namgung |
| 6,121,553 A | 9/2000 | Shinada et al. |
| 6,296,949 B1 | 10/2001 | Bergstresser et al. |
| 6,310,304 B1 | 10/2001 | Hayama et al. |
| 6,313,411 B1 | 11/2001 | Budnaitis |
| 6,331,679 B1 | 12/2001 | Higashi |
| 6,337,522 B1 * | 1/2002 | Kang et al. ............ 257/784 |
| 6,392,898 B1 | 5/2002 | Asai et al. |
| 6,411,519 B2 | 6/2002 | Asai et al. |
| 6,591,495 B2 | 7/2003 | Hirose et al. |
| 6,713,154 B1 | 3/2004 | Tsunogae et al. |
| 6,762,921 B1 | 7/2004 | Asai et al. |
| 2002/0103303 A1 | 8/2002 | Kodemura |
| 2008/0230263 A1 | 9/2008 | En |

FOREIGN PATENT DOCUMENTS

| | | |
|---|---|---|
| EP | 0 620 703 A1 | 10/1994 |
| EP | 0670563 A1 | 9/1995 |
| EP | 0678596 A1 | 10/1995 |
| EP | 0743812 A1 | 11/1996 |
| EP | 0804061 A1 | 10/1997 |
| EP | 0 811 480 A | 12/1997 |
| EP | 0817549 A2 | 1/1998 |
| EP | 0 936 231 A1 | 8/1999 |
| EP | 0 987 719 A1 | 3/2000 |
| GB | 2322735 A | 9/1998 |
| JP | 49-003851 | 1/1974 |
| JP | 55-150292 A | 11/1980 |
| JP | 57-050489 A | 3/1982 |
| JP | 57-098676 | 6/1982 |
| JP | 58-048432 | 3/1983 |
| JP | 59-084491 A | 5/1984 |
| JP | 61-224492 A | 10/1986 |
| JP | 62-133079 | 6/1987 |
| JP | 62-133080 | 6/1987 |
| JP | 62-181365 | 8/1987 |
| JP | 62-193102 | 8/1987 |
| JP | 62-242395 A | 10/1987 |
| JP | 04-055555 | 5/1988 |
| JP | 63-153893 | 6/1988 |
| JP | 63-153894 | 6/1988 |
| JP | 63-1852894 | 7/1988 |
| JP | 64-53495 | 3/1989 |
| JP | 01-173695 A | 10/1989 |
| JP | 02-188992 A | 7/1990 |
| JP | 2-198190 | 8/1990 |
| JP | 2-252294 | 10/1990 |
| JP | 03-003297 A | 1/1991 |
| JP | 03-227331 A | 10/1991 |
| JP | 03-229484 A | 10/1991 |
| JP | 04-055555 A | 2/1992 |
| JP | 04-264797 | 9/1992 |
| JP | 05-048269 | 2/1993 |
| JP | 05-136559 | 6/1993 |
| JP | 05-327207 | 12/1993 |
| JP | 06-228344 | 8/1994 |
| JP | 06-248164 | 9/1994 |
| JP | 06-260766 | 9/1994 |
| JP | 6-275950 | 9/1994 |
| JP | 06-283860 | 10/1994 |
| JP | 06-283860 A | 10/1994 |
| JP | 06-314865 | 11/1994 |
| JP | 07-001683 | 1/1995 |
| JP | 07-045948 | 2/1995 |
| JP | 07-094865 | 4/1995 |
| JP | 07-094865 A | 4/1995 |
| JP | 07-147483 | 6/1995 |
| JP | 7-173638 | 7/1995 |
| JP | 07-235743 | 9/1995 |
| JP | 07-235743 A | 9/1995 |
| JP | 7-235768 | 9/1995 |
| JP | 7-314603 | 12/1995 |
| JP | 07-321444 | 12/1995 |
| JP | 7-336017 | 12/1995 |
| JP | 08-020692 | 1/1996 |
| JP | 08-035086 | 2/1996 |
| JP | 8-107275 | 4/1996 |
| JP | 08-255981 A | 10/1996 |
| JP | 8-259784 | 10/1996 |
| JP | 08-288657 | 11/1996 |
| JP | 08-309918 | 11/1996 |
| JP | 9-1728 | 1/1997 |
| JP | 9-87366 | 3/1997 |
| JP | 09-130050 | 5/1997 |
| JP | 09-130050 A | 5/1997 |
| JP | 9-162514 | 6/1997 |
| JP | 9-265186 | 10/1997 |
| JP | 10-051113 | 2/1998 |
| JP | 10-070365 | 3/1998 |
| JP | 10-126040 | 5/1998 |
| JP | 10-163627 | 6/1998 |
| JP | 10-190224 | 7/1998 |
| JP | 10-224036 | 8/1998 |
| JP | 10-242638 A | 9/1998 |
| JP | 10-247782 | 9/1998 |
| JP | 10-247783 | 9/1998 |
| JP | 10-247784 | 9/1998 |
| JP | 10-256724 | 9/1998 |
| JP | 10-256736 | 9/1998 |
| JP | 10256724 A * | 9/1998 |
| JP | 10-284835 | 10/1998 |
| JP | 10-335826 | 12/1998 |
| JP | 11-43566 | 2/1999 |
| JP | 11-068315 | 3/1999 |
| JP | 11-087938 | 3/1999 |
| JP | 11-145621 | 5/1999 |
| JP | 11-172457 | 6/1999 |
| JP | 2004-014848 | 1/2004 |
| WO | 85-00379 | 1/1985 |
| WO | 98/18838 | 5/1998 |
| WO | WO 98/18838 | 5/1998 |
| WO | 98/56011 | 12/1998 |
| WO | WO 98/056011 | 12/1998 |
| WO | 00/19789 A1 | 4/2000 |

OTHER PUBLICATIONS

Office Action from the Japanese Patent Office dated Aug. 16, 2001.
Office Action from the Japanese Patent Office dated Jul. 30, 2002.
Computer-generated English Translation of JP 08-255981.
Computer-generated English Translation of JP 09-130050.

Computer-generated English Translation of JP 07-235743.
Computer-generated English Translation of JP 06-283860.
Computer-generated English Translation of JP 07-094865.
"The New Encyclopædia Britannica" vol. 15, 15$^{th}$ Edition, 3 pages, (including Figure 10 of the Table at p. 953).

U.S. Office Action dated Jun. 1, 2010 from U.S. Appl. No. 12/146,165.
Extended European Search Report issued Oct. 21, 2010 in EP 08 15 7080.

* cited by examiner (a)

(b)

PRINTED CIRCUIT BOARD

CROSS REFERENCE TO RELATED APPLICATIONS

This is a continuation of U.S. application Ser. No. 11/188,886 filed Jul. 26, 2005, which is a divisional of U.S. application Ser. No. 09/806,203 filed Jun. 19, 2001, which is a §371 of PCT Application No. PCT/JP99/05266 filed Sep. 28, 1999. The contents of those applications are incorporated herein by reference in their entirety.

TECHNICAL FIELD

The present invention relates to a printed circuit board and a technology for producing said printed circuit board.

BACKGROUND ART

With the recent trend toward ever higher frequencies of signals, package board materials are required to be of low dielectric constant and low dielectric loss tangent. Therefore, the current mainstream of package board material is shifting from ceramics to resins.

More recently, since higher wiring densities are also required and the printed circuit board known as the multilayer buildup printed circuit board comprising a plurality of circuit layers is getting a more dominant position.

The multilayer printed circuit board called the multilayer buildup printed circuit board is generally manufactured by the semi-additive process in which a conductor circuit of copper or the like and an interlayer resin insulating layer are built up successively and alternately on the so-called core board which is a resin sheet reinforced with glass cloth or the like and measuring about 0.6 to 1.5 mm in thickness. In such a multilayer printed circuit board, the electrical interconnection of the conductor circuits isolated by interlayer resin insulating layers is obtained with via holes.

Heretofore, buildup multilayer printed circuit boards have been manufactured by the technologies disclosed in Japanese Kokai Publication Hei-9-130050, Japanese Kokoku Publication H4-55555 and Japanese Kokai Publication He-7-235743.

More particularly, through holes are formed a copper-clad laminate carrying copper foil thereon and, then, subjected to electroless copper plating to provide plated-through holes therein. The surface of the substrate board is then etched imagewise, to provide a conductor circuit thereon. This conductor circuit is provided with a roughened surface by electroless plating or etching on this conductor circuit and an interlayer resin insulating layer comprising epoxy resin, acrylic resin, fluororesin or a mixed resin thereof is constructed on said roughened surface. Then, via holes are formed by light exposure and development or laser processing and the resin is UV-cured and postcured to provide the objective interlayer resin insulating layer.

This interlayer resin insulating layer is also subjected to surface roughening treatment and, then, a thin electroless plated metal layer is formed thereon. Thereafter, a plating resist is disposed on the electroless plated metal layer and a thick electroplated layer is then formed. The plating resist is then stripped off and etching is performed to provide a conductor circuit connected to the lower-layer conductor circuit by way of via holes.

The above sequence of steps is repeated and, then, as the outermost layer, a solder resist layer for protection of the conductor circuit is formed. This solder resist layer is formed with openings and the conductor layer in the areas corresponding to the openings is plated to provide pads. Solder vamps are then formed to complete the manufacture of a buildup multilayer printed circuit board.

When the surfaces of the interlayer resin insulating layer and conductor circuit are roughened so as to insure good adhesion as in the above conventional manufacturing process, the carrying of high frequency signals results in that the signals selectively travel in the surface of the roughed layer of the conductor circuit owing to a skin effect and the problem of signal conduction noise tends to occur on account of the surface irregularities.

Furthermore, the epoxy acrylate resin which is generally used for inter-level resin isolating layer is low in fracture toughness and circuit boards using this resin tends to undergo cracking across the interface between the conductor circuit and the resin insulating layer under the conditions of the heat cycle test.

In addition, the multilayer printed circuit boards thus fabricated using a mixture of epoxy resin, acrylic resin, etc. has a high dielectric constant of more than 3.5 in the GHz band, therefore, when an LSI chip or the like employing high-frequency signals of a GHz band is mounted, the signal delay and signal error due to the high dielectric constant of the interlayer resin insulating layer are sometimes encountered.

Moreover, when the multilayer printed circuit board is one employing fluororesin as the material for interlayer resin insulating layers, while the fluororesin has low dielectric constant, low hygroscopicity and high in fracture toughness, the substrate board must be heated to a temperature close to 350° C. in the pressure-laminating stage for construction of an interlayer resin insulating layer but any printed circuit board which has experienced such a high-temperature environment tends to undergo early aging.

In the process for manufacturing a multilayer printed circuit board as disclosed in Japanese Kokai Publication Hei-6-283860, a roughened layer comprising acicular crystals of Cu—Ni—P alloy is first formed by electroless plating over the surface of an internal conductor circuit on a core board and then an interlayer resin insulating layer is built on this roughened layer. This interlayer resin insulating layer is then formed with openings for via holes. The substrate board is then plated to fill said openings with a conductor and, at the same time, provide a caplayer conductor circuit on said interlayer resin insulating layer. This serial construction of a conductor circuit and an interlayer resin insulating layer is repeated to provide a multilayer printed circuit board.

According to the above production technology for a multilayer buildup printed circuit board as disclosed in Japanese Kokai Publication Hei-6-283860, a necessary adhesion between the conductor circuit and the interlayer resin insulating layer superposed thereon is insured by provision of a Cu—Ni—P acicular alloy layer on the conductor circuit.

However, the manufacture of a circuit board generally involves cleaning of the substrate board with an acid and a chromic acid treatment for the surface of the interlayer resin insulating layer provided with openings for via hole and, when such a roughened layer composed of Cu—Ni—P acicular alloy exists on the conductor circuit, a local cell reaction with the copper constituting the conductor circuit may take place to dissolve the conductor circuit.

To prevent such dissolution of the conductor circuit, Japanese Kokai Publication Hei-9-130050 discloses a technology for inhibiting the local cell reaction by covering the roughened layer composed of Cu—Ni—P acicular alloy with a metal such as Sn.

However, multilayer printed circuit boards at the product level are not uniform in the density of conductor circuits so that it is difficult to completely cover the rough Cu—Ni—P acicular alloy layer with a Sn layer and thereby prevent dissolution of the conductor circuit. Furthermore, when the plating of the conductor circuit with Cu—Ni—P acicular alloy is repeated and the plating bath is degraded, the problem occurred that the plating metal can hardly be deposited effectively on the conductor circuit.

Furthermore, as mentioned above, when the roughening treatment is applied to the conductor circuit, signals are carried selectively by the superficial portion of the conductor circuit so that the signal delay is sometimes induced by the surface irregularities. This trouble is particularly pronounced when the substrate is a resin board which is lower in dielectric constant and dielectric loss tangent than a ceramic board.

Furthermore, a resin board is poor in heat radiation factor as compared with a metal or ceramic board and, hence, liable to accumulate heat, with the result that the ion diffusion rate of the copper constituting the conductor circuit is high and this ion migration tends to destroy the layer to layer insulation.

Therefore, Japanese Kokai Publication Hei-7-45948 and Japanese Kokai Publication Hei-7-94865 disclose the technology which comprises spin-coating one side of a ceramic or metal substrate with a resin, forming a layer of a metal (e.g. chromium, nickel or titanium) having good adhesion to the conductor circuit on the resin coat by sputtering, and then constructing a conductor circuit thereon.

However, this is a technology for building up conductor circuits and interlayer resin insulating layers chiefly on one side of a substrate board and unlike the case of using a ceramic board or a metal road, the resin substrate board cannot inhibit shrinkage and expansion of the interlayer resin insulating layer to occur warps and cracks which are sometimes induced across the interface between the interlayer resin insulating layer and the conductor circuit.

Furthermore, when an attempt is actually made to construct a conductor circuit by using this technique, there is sometimes encountered the trouble that the conductor circuit peels from the metal layer composed of, for example, chromium, nickel or titanium.

The cause of this trouble is as follows. Thus, when a metal layer is formed on the surface of a resin insulating layer by a physical vapor deposition technique, the metal layer exposed to a high deposition temperature is oxidized on the surface so that when a conductor circuit is formed directly on the oxidized surface, the interposition of the oxide layer between the metal layer and the conductor circuit weakens the adhesion so that the conductor circuit tends to peel off. Moreover, even if the metal layer is formed by a chemical vapor deposition technique or by plating, said surface oxidation occurs when the substrate board is allowed to sit in the air, so that the conductor circuit tends to peel off.

The use of a metal forming a passivation layer, such as Ni or Al, in the construction of said metal layer is disadvantageous in that etching with a rather easily manageable acid such as hydrochloric acid or sulfuric acid cannot proceed smoothly because the oxide once formed in the course of etching is not readily decomposed by the above-mentioned acid.

Furthermore, when an oxide film has been formed on the surface of such a metal layer, it is no longer easy to remove it by etching.

In addition, those metals are soluble in strong acid such as concentrated nitric acid and aqua regia and, therefore, can be etched with an etching solution based on concentrated nitric acid or a cyanide or fluoride solution but because these acids are toxic and violent substances not easy to handle, the process control is difficult and the work environment tends to be adversely affected.

There also is a technique for preventing the stripping of the interlayer resin insulating layer from the underlying conductor circuit and via holes by a roughening procedure which comprises performing copper electroplating to form a thick Cu film, then performing electroless nickel plating to form a thin nickel film on said thick Cu film and further superimposing a roughened layer composed of Cu—Ni—P alloy.

However, if, in the conventional manufacturing process for a multilayer printed circuit board, an electroless plated nickel film is formed on an electroplated film and, then, a roughened layer of Cu—Ni—P alloy is superimposed, the adhesion between the plated nickel film and a roughened layer of Cu—Ni—P alloy, which is usually high in adhesion, will be unexpectedly low so that the roughened layer of Cu—Ni—P alloy tends to be exfoliated from the plated nickel layer.

There also is the problem that, in the step of plating the conductor circuit with Cu—Ni—P alloy, the plating bath is progressively degraded because of repeated use thereof so that the plating metal will not be deposited neatly on the surface of the conductor circuit.

Moreover, in order to form a cover metal layer, e.g. an Sn layer, in the above process for manufacturing a multilayer printed circuit board, the conductor circuit having a roughened surface must be electroless plated but this introduces complexity to the production process and leads to increased costs of production.

Moreover, when via holes are formed on such a conductor circuit having a cover metal layer, e.g. an Sn layer, a delamination trouble may take place in the areas of contact between the via holes and the underlying conductor circuit under the conditions of heating or the heat cycle test, thus reducing the connection reliability of the via holes.

SUMMARY OF THE INVENTION

Accomplished in view of the above state of the art, the present invention has for its object to provide a multilayer printed circuit board which is very satisfactory in fracture toughness, dielectric constant, adhesion and processability, among other characteristics.

Another object of the present invention is to provide a multilayer printed circuit board having an interlayer resin insulating layer which is low in dielectric constant and dielectric loss tangent, less liable to cause signal delay or signal error even with high-frequency signals in the GHz band, high in rigidity and other mechanical characteristics and therefore high in reliability of inter-circuit connection and a process for manufacturing said multilayer printed circuit board.

A still another object of the present invention is to provide a multilayer printed circuit board having such a construction that the dissolution of the conductor circuit due to the local cell reaction of the circuit during the acid treatment of the substrate board can be completely inhibited and that, in the Cu—Ni—P acicular alloy plating of the conductor circuit, the deposition of the plating metal can be allowed to proceed sufficiently so that an effective roughened layer can be provided with certainty.

A still further object of the present invention is to provide a process for manufacturing a multilayer printed circuit board, in accordance with which the signal conduction delay can be prevented and a good adhesion is insured between the metal layer disposed on the resin insulating layer and the conductor circuit.

Another yet object of the present invention is to provide a multilayer printed circuit board which is free from the trouble of poor adhesion between the interlayer resin insulating layer and the conductor circuit, signal noise and such other troubles as migration, warpage and cracks.

It is a further object of the present invention to provide a multilayer printed circuit board which is excellent in the adhesion between the interlayer resin insulating layer and the conductor circuit, amenable to fine pattern, excellent in the conduction of signals in the high-frequency band and in solder heat resistance, and highly resistant to board warpage and cracking and a process for manufacturing said multilayer printed circuit board.

A further object of the present invention is to provide a process for constructing a conductor circuit which permits selective etching with an easily manageable acid etching solution to construct a smooth and level conductor circuit with excellent adhesion to an insulating substrate such as a resin board and a process for manufacturing a multilayer printed circuit board which comprises using the construction process mentioned above.

It is still another object of the present invention to provide a process for forming a metal film such that a high adhesion between a nickel film on a substrate board and a film of a different metal to be formed thereon can be insured and a process for manufacturing a multilayer printed circuit board which comprises using said forming process.

It is a further object of the present invention to provide a multilayer printed circuit board which has a construction so that it is able to prevent dissolution of the conductor circuit caused by a local cell reaction when treating the substrate board with acid or the like and, when the roughening treatment such as the plating of the conductor circuit with Cu—Ni—P acicular alloy is curried out, the plating metal can be deposited effectively to ensure the provision of a roughened layer.

It is a further object of the present invention to provide a process for manufacturing a multilayer printed circuit board which includes a step of forming a masking film capable of protecting the roughened surface formed on the conductor circuit from the influence of a roughening solution and insuring a sufficiently reliable connection of the conductor circuit with the via holes to be constructed thereon, thus being contributory to simplification of the production process, and a multilayer printed circuit board which is manufactured by using said process.

The first group of the present invention is directed to a multilayer printed circuit board comprising a substrate board, a resin insulating layer formed on said board and a conductor circuit constructed on said resin insulating layer, wherein said resin insulating layer comprises a polyolefin resin.

The polyolefin resin mentioned above is preferably a thermosetting polyolefin resin or a thermoplastic polyolefin resin.

The thermoplastic polyolefin resin mentioned above is preferably one having a melting point of not less than 200° C.

The polyolefin resin mentioned above is preferably a resin which comprises one species of the repeating unit represented by the following chemical formula (1) or a resin comprising a copolymer of two or more different species of the repeating units mentioned above.

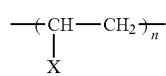
(1)

wherein n represents 1 to 10000; X represents a hydrogen atom, an alkyl group, a phenyl group, a hydroxyl group, an unsaturated hydrocarbon residue having 2 to 3 carbon atoms, an oxide group or a lactone group.

Furthermore, said polyolefin resin is preferably a resin which contains a double bond, an oxide structure, a lactone structure or a mono- or polycyclopentadiene structure in its backbone chain.

The polyolefin resin which is also useful for this first group of the present invention includes a mixed resin of two or more species of such polyolefin resin, a resin composed of two or more such resin species crosslinked to each other, or a mixed resin comprising such a polyolefin resin and a thermosetting resin.

The conductor circuit mentioned above is preferably a conductor circuit constructed on a resin insulating layer by way of a metal layer comprising at least one metal selected from among the metals of the $4^{th}$ to $7^{th}$ periods in Group 4A through Group 1B (exclusive of Cu) of the long-form periodic table of the elements, Al and Sn.

Furthermore, said metal layer is preferably disposed on a flat and level resin insulating layer.

Moreover, said resin insulating layer preferably has a surface subjected to plasma treatment or corona discharge treatment.

The substrate board mentioned above is preferably a board carrying a conductor circuit on its surface or inside.

The first invention in the second group of the present invention is directed to a multilayer printed circuit board comprising a substrate board and, as built up on said substrate board successively and alternately, a conductor circuit and a resin insulating layer at a plurality of levels with the conductor circuits being interconnected by way of via holes, wherein said resin insulating layer comprises a cycloolefin resin.

The dielectric constant of said resin insulating layer at 1 GHz is preferably not more than 3.0 and the dielectric loss tangent thereof is preferably not more than 0.01.

The cycloolefin resin mentioned above is preferably a homopolymer or copolymer of 2-norbornene, 5-ethylidene-2-norbornene and/or their derivatives.

The cycloolefin resin mentioned above is preferably a thermosetting cycloolefin resin.

The second invention belonging to the second group of the present invention is directed to a process for manufacturing a multilayer printed circuit board which comprises a substrate board and, as built up on said substrate board successively and alternately, a conductor circuit and a resin insulating layer at a plurality of levels with the conductor circuits being interconnected by way of via holes, wherein an interlayer resin insulating layer is formed by press lamination of a cycloolefin resin film on the substrate board under vacuum or reduced pressure.

The above process for manufacturing a multilayer printed circuit board is preferably a process which comprises forming the interlayer resin insulating layer composed of a cycloolefin resin on a conductor circuit formed on a substrate board and then forming openings for via holes in said interlayer resin insulating layer by irradiation with a laser beam.

The first invention belonging to the third group of the present invention is directed to a multilayer printed circuit board comprising a substrate board carrying a lower-layer conductor circuit and as built up thereon successively and alternately, an interlayer resin insulating layer and an upper-layer conductor layer, which further comprises a metal layer composed of at least one metal selected from among nickel, cobalt, tin and noble metals as formed at least on the surface of said lower-layer conductor circuit and a roughened layer composed of Cu—Ni—P alloy as formed on said metal layer.

The above-mentioned interlayer resin insulating layer is provided with via holes which are electrically connected to said lower-layer conductor circuit on the substrate board preferably by way of said metal layer composed of at least one metal selected from among nickel, cobalt, tin and noble metals and said roughened layer.

The roughened layer mentioned above is preferably a metal wherein at least one metal having the ionization tendency higher than copper but not higher than titanium or a noble metal cover layer is covered.

The via holes mentioned above are preferably filled with a plated metal film.

The fourth group of the present invention is directed to a process for manufacturing a multilayer printed circuit board which comprises forming a resin insulating layer and a conductor circuit on a resin substrate, which comprises forming a metal layer composed of at least one metal selected from among the metal elements of the $4^{th}$ through $7^{th}$ periods in Group 4A through Group 1B of the long-form periodic table of the elements, Al and Sn on the surface of said resin insulating layer, then cleaning the surface of said metal layer with an acid and thereafter constructing a conductor circuit on said metal layer.

The above-mentioned at least one metal selected from among the metal elements of the $4^{th}$ through $7^{th}$ periods in Group 4A through Group 1B of the long-form periodic table of the elements, Al and Sn is preferably at least one metal selected from among Ni, Cr, Mo, Ti, W, Cu, Al, Sn, Pt, Pd and Au.

The resin insulating layer mentioned above preferably has a flat and level surface.

The acid mentioned above is preferably an acid selected from among hydrochloric acid, sulfuric acid, acetic acid and phosphoric acid or a mixture of such acids.

The fifth group of the present invention is directed to a multilayer printed circuit board comprising a resin substrate board carrying a resin insulating layer on both sides thereof and a conductor circuit built on said resin insulating layer, wherein said conductor circuit has been formed by way of a metal layer composed of at least one metal selected from among metals (exclusive of Cu) of the $4^{th}$ through $7^{th}$ periods in Group 4A through Group 1B of the long-form periodic table of the elements, Al and Sn.

The metal layer mentioned above is preferably a layer containing at least one metal selected from among Al, Fe, W, Mo, Sn, Ni, Co, Cr, Ti and noble metals.

The resin insulating layer preferably has a flat and level surface.

Furthermore, said resin insulating layer is composed of a thermosetting polyolefin resin or a thermoplastic polyolefin resin.

This resin insulating layer preferably has a surface subjected to plasma treatment or corona discharge treatment.

Preferably, said conductor circuit has a metal layer composed of at least one metal selected from among metals (exclusive of Cu) of the $4^{th}$ through $7^{th}$ periods in Group 4A through Group 1B of the long-form periodic table of the elements, Al and Sn on the surface of said conductor circuit and that said metal layer has an interlayer resin insulating layer or a solder resist layer as built thereon.

Preferably the metal layer built on the surface of said resin insulating layer has a Cu layer formed on its surface and said Cu layer has a conductor circuit constructed thereon.

The preferred thickness of said metal layer is 0.01 to 0.2 µm.

The first invention belonging to the six group is directed to a multilayer printed circuit board comprising a resin substrate board and, as built up on both sides thereof, a lower-layer conductor circuit interconnected by plated-through holes, an interlayer resin insulating layer formed on said lower-layer conductor circuit, and an upper-layer conductor circuit formed on said interlayer resin insulating layer, wherein the surface of said lower-layer conductor circuit at least partially comprises being formed with a metal layer composed of at least one metal selected from among the metals (exclusive of Cu) of the $4^{th}$ through $7^{th}$ periods in Group 4A through Group 1B of the long-form periodic table of the elements, Al and Sn.

The above-mentioned metal layer is preferably formed from at least one metal selected from among Al, Fe, W, Mo, Sn, Ni, Co, Cr, Ti and noble metals.

The above-mentioned resin insulating layer is preferably composed of a thermosetting polyolefin resin or a thermoplastic polyolefin resin.

The above-mentioned interlayer resin insulating layer has a flat and level surface with an average roughness value of Ra being not more than 1 µm.

The second invention of the sixth group is directed to a process for manufacturing a multilayer printed circuit board comprising forming a conductor layer on both sides of a resin substrate board, disposing a plating resist according to a designed circuit pattern on each conductor layer, forming a plated metal film in the area not covered with the plating resist, removing said plating resist, etching the conductor layer under said plating resist to provide a lower-layer conductor circuit, forming an interlayer resin insulating layer over said lower-layer conductor circuit and forming an upper-layer conductor circuit by way of the interposed interlayer resin insulating layer, wherein, after formation of said plated metal layer in said area not covered with the plating resist, a metal layer composed of at least one metal selected from among the metals (exclusive of Cu) of the $4^{th}$ to $7^{th}$ periods in Group 4A through Group 1B of the long-form periodic table of the elements, Al and Sn is formed on at least part of the surface of said plated metal layer.

The first invention of the seventh group is directed to a process for constructing a conductor circuit, which comprises at least the following three steps (1) to (3):
(1) a step of constructing a first conductor layer composed of a metal forming a passivation film on surface on an insulating substrate board,
(2) a step of constructing a second conductor layer composed of a metal having the ionization tendency lower than said metal forming a passivation film on surface on said first conductor layer, and
(3) a step of performing selective etching with an acid etching solution to simultaneously etch off the first and second conductor layers in the non-conductor circuit-forming region.

The above-mentioned metal forming a surface passivation layer is preferably at least one metal selected from among Ni, Co, Cr, Ti, Nb, Ta and Al.

When the metal forming a surface passivation metal is Ni, said second conductor layer composed of a metal having the ionization tendency lower than Ni is preferably a conductor layer composed of at least one metal selected from among Cu, Sn and Pb.

When said metal forming a passivation film on surface is Al, said second conductor layer composed of a metal having the ionization tendency lower than Al is preferably composed of at least one metal selected from among Cu, Sn, Pb and Fe.

The acid etching solution mentioned above is preferably an aqueous solution of sulfuric acid, an aqueous solution of hydrogen chloride or an aqueous mixed solution of sulfuric acid and hydrogen peroxide.

The second invention of the seventh group is directed to a process for manufacturing a multilayer printed circuit board which comprises forming a resin insulating layer and a conductor circuit successively on an insulating substrate board, and at least the following steps (1) to (5):
(1) a step of constructing a first conductor layer composed of a metal forming a surface passivation layer on a resin insulating layer,
(2) a step of constructing a second conductor layer composed of a metal having the ionization tendency lower than said metal forming a passivation film on surface on said first conductor layer,
(3) a step of disposing a plating resist on said second conductor layer,
(4) a step of constructing a third conductive layer by electroplating on said second conductor layer provided with said plating resist, and
(5) after stripping of the plating resist, a step of simultaneously etching the first and second conductor layers under said plating resist with an acid etching solution.

The above-mentioned metal forming a passivation film on surface is preferably at least one species selected from among Ni, Co, Cr, Ti, Nb, Ta and Al.

When the metal forming a passivation film on surface is Ni, said second conductor layer composed of a metal having an ionization potential lower than Ni is preferably a conductor layer composed of at least one metal selected from among Cu, Sn and Pb.

When said metal forming a passivation film on surface is Al, said second conductor layer composed of a metal having the ionization tendency lower than Al is preferably a conductor layer composed of at least one metal selected from among Cu, Sn, Pb and Fe.

The acid etching solution mentioned above is preferably an aqueous solution of sulfuric acid, an aqueous solution of hydrogen chloride or an aqueous mixed solution of sulfuric acid and hydrogen peroxide.

The first invention of the eighth group is directed to a method of forming a metal film which comprises removing an oxide film from nickel film using an aqueous solution of a reducing acid having a concentration of 2.0 to 10.0 moles/L and then forming a metal film composed of a different metal on the surface of said nickel film.

The aqueous solution of a reducing acid is preferably hydrochloric acid or hydrofluoric acid.

The concentration of said reducing acid solution is preferably 4.0 to 8.0 moles/L.

The second invention of the eighth group is directed to a process for manufacturing a multilayer printed circuit board which comprises (1) a step of forming an interlayer resin insulating layer on a substrate board formed with a lower-layer conductor circuit and forming openings for via holes in said interlayer resin insulating layer, (2) a step of forming a metal film on said interlayer resin insulating layer, (3) a step of disposing a plating resist on said metal layer, (4) a step of performing electroplating and then forming a nickel film to construct an electroplated metal film and a nickel film among said plating resists, (5) a step of removing said plating resist and etching said metal layer under said plating resist to thereby construct an upper-layer conductor circuit and via holes and (6) a step of forming a roughened layer composed of Cu—Ni—P alloy on said upper-layer conductor circuit, wherein, immediately following said step (5), the oxide film on said nickel film is removed with an aqueous solution of a reducing acid having a concentration of 2.0 to 10.0 moles/L.

The above-mentioned aqueous solution of a reducing acid is preferably hydrochloric acid or hydrofluoric acid.

When said reducing acid has a concentration of 2.0 to 10.0 moles/L, the oxide film can be removed without adversely affecting the function of the substrate board.

The concentration of the aqueous reducing acid solution is preferably 4.0 to 8.0 moles/L.

The invention constituting the ninth group is directed to a multilayer printed circuit board comprising a substrate board carrying a lower-layer conductor circuit and, as built up over said conductor circuit successively and alternately, an interlayer resin insulating layer and an upper-layer conductor circuit in succession,
which further comprises a metal layer composed of at least one metal selected from among metals having ionization tendencies not lower than tin but not higher than aluminum and noble metals as formed on the surface of said lower-layer conductor circuit and a roughened layer superposed on said metal layer.

The above-mentioned at least one metal selected from among metals having ionization tendencies not lower than tin but not higher than aluminum and noble metals are preferably at least one metal selected from among aluminum, chromium, iron, zinc, nickel, cobalt, tin and noble metals.

The roughened layer mentioned above is preferably a layer composed of Cu—Ni—P alloy.

The above-mentioned interlayer resin insulating layer is provided with via holes which are electrically connected to said lower-layer conductor circuit formed on a substrate board preferably by way of said metal layer composed of at least one metal selected from among metals having the ionization tendency not lower than tin but not higher than aluminum and noble metals and said roughened layer.

The roughened layer mentioned above is preferably covered with a layer containing one or more metals having ionization tendencies greater than copper but not greater than titanium or a noble metal layer.

The via holes mentioned above are preferably filled with a plated metal.

The first invention of the tenth group is directed to a process for manufacturing a multilayer printed circuit board which comprises constructing a conductor circuit, roughening the conductor circuit to provide a roughened surface thereon, forming an interlayer resin insulating layer over the above-mentioned roughened surface having the conductor circuit and forming openings for via holes in a repeated sequence to construct a plurality of conductor circuits isolated by interlayer resin insulating layers on base materials, which comprises oxidizing the roughened surface of the conductor circuit to provide an oxide film on the whole roughened surface and, thereafter, constructing said interlayer resin insulating layer.

Preferably, for the above oxidation treatment, said roughened layer is formed on said conductor circuit and then the conductor circuit is heated in the atmospheric air at 80 to 200° C. for 10 minutes to 3 hours to thereby provide an oxide film on the entire roughened surface thereof.

The second invention of the tenth group is directed to a multilayer printed circuit board which comprises a substrate board and, as successively built thereon, a conductor circuit provided with a roughened surface and an interlayer resin insulating layer, said openings for via holes and a conductor on openings for via holes, and further comprises a covering layer comprising an oxide film layer on the whole roughened surface of the conductor circuit.

The preferred thickness of the covering layer comprising an oxide film is 0.01 to 0.2 μm.

DETAILED DESCRIPTION OF INVENTION

Figure 1:
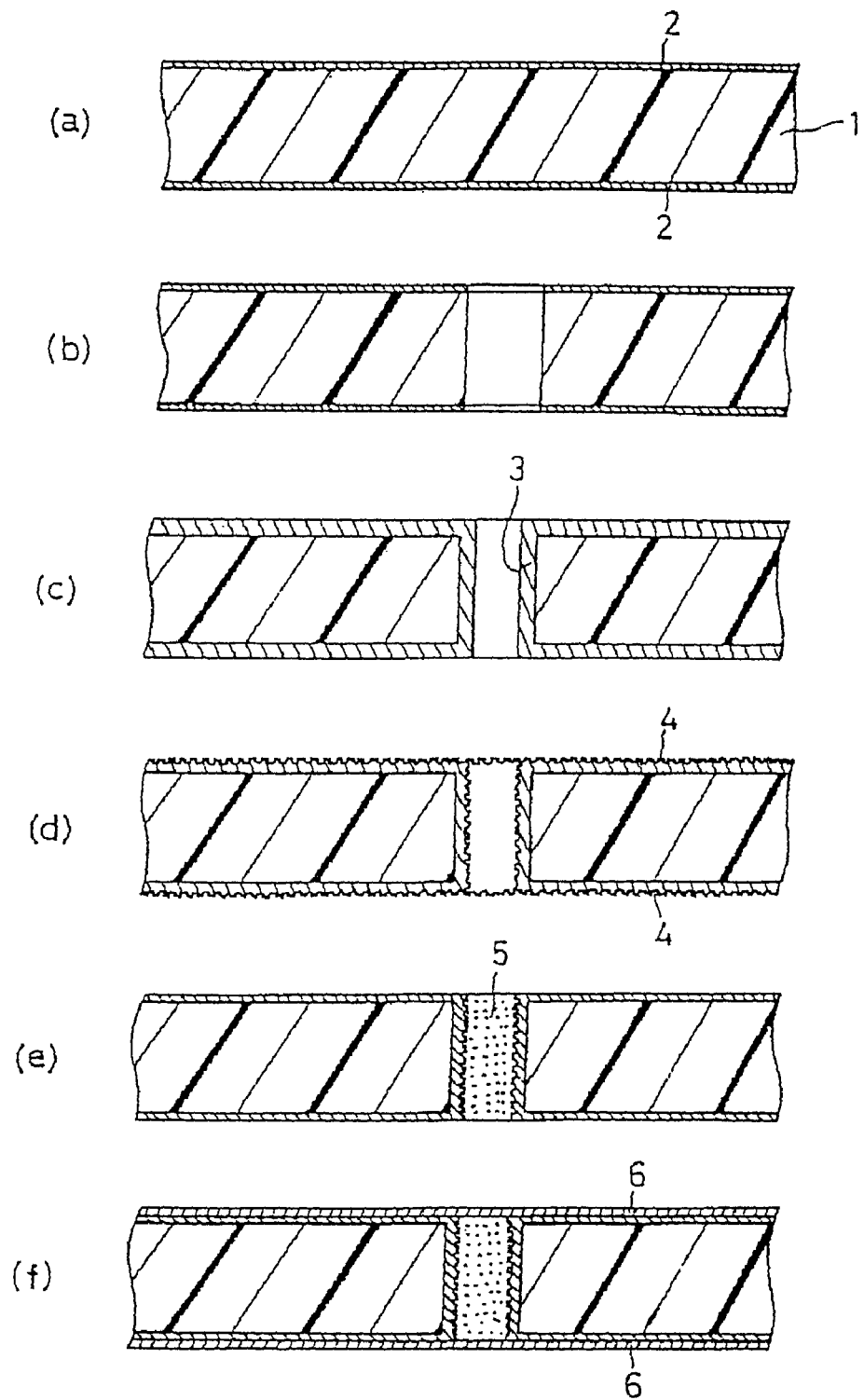
FIG. 1 (a) through (f) are cross-section views illustrating the flow of production of a multilayer printed circuit board in accordance with the first group of the present invention.

The multilayer printed circuit board according to the invention constituting the first group has a property that a polyolefin resin is used for the resin insulating layer.

The polyolefin resin mentioned above may be a thermosetting polyolefin resin or a thermoplastic polyolefin resin but is preferably a thermosetting polyolefin resin. This is because, in the process for fabricating a multilayer printed circuit board wherein a plurality of interlayer resin insulating layers are built up in succession, the lower-layer interlayer resin insulating layer, if made of a thermosetting polyolefin resin, will not be deformed upon hot-pressing with the consequent little topological displacement of via holes.

On the other hand, a thermoplastic polyolefin resin has a high fracture rigidity so that it is able to inhibition of cracks arising from a difference of the coefficient of thermal expansion between the conductor circuit and the resin under the conditions of the heat cycle test.

The thermoplastic polyolefin resin preferably has a melting point of not less than 200° C. This is because, when the melting point of the resin is not less than 200° C., the deformation upon hot-pressing can be minimized and the melting of the resin insulating layer can be prevented when the multilayer printed circuit board is provided with mounting solder layers or solder vamps by hot-melting at a temperature of not less than 200° C.

The polyolefin resin to be used in this invention is now described in detail. The polyolefin resin comprises resins having the following structures.

(1) The resin comprising one and the same repeating unit having the following chemical formula (1):

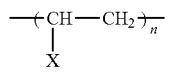

(1)

wherein n represents 1 to 10000 and X represents a hydrogen atom, an alkyl group, a phenyl group, a hydroxyl group, an unsaturated hydrocarbon residue having 2 to 3 carbon atoms, an oxide group or a lactone group.

(2) The resin comprising a copolymer of two or more different repeating units of the following chemical formula (1):

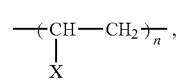

(1)

wherein n represents 1 to 10000 and X represents a hydrogen atom, an alkyl group, a phenyl group, a hydroxyl group, an unsaturated hydrocarbon residue having 2 to 3 carbon atoms, an oxide group or a lactone group.

(3) The resin containing a different repeating unit of the following chemical formula and having a double bond, an oxide structure, a lactone structure, or a mono- or polycyclopentadiene structure within the backbone chain of its molecule:

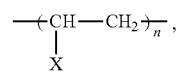

(1)

wherein n represents 1 to 10000 and X represents a hydrogen atom, an alkyl group, a phenyl group, a hydroxyl group, an unsaturated hydrocarbon residue having 2 to 3 carbon atoms, an oxide group or a lactone group.

(4) The resin comprising a mixed resin of two or more different resins selected from the above (1), (2) and (3), the resin comprising a mixed resin of a resin or resins selected from the above (1), (2) and (3) with one or more thermosetting resins, or the resin comprising resins selected from the above (1), (2) and (3) as crosslinked to each other.

The term "resin" as used in connection with the first group of the present invention is a collective term covering both a "polymer" and an "oligomer".

The resins (1) to (3) are first described in detail.

The reason why the resins (1) to (3) containing the repeating unit structure described above are selected is that the thermosetting polyolefins can be expressed without compromise in fracture rigidity.

The alkyl group mentioned for X in the above repeating unit structure is preferably at least one member selected from the group consisting of methyl, ethyl, propyl, isopropyl, butyl, isobutyl and t-butyl.

The unsaturated hydrocarbon residue having 2 to 3 atoms for X in the above repeating unit structure is preferably at least one member selected from the group consisting of $CH_2=CH-$, $CH_3CH=CH-$, $CH_2=C(CH_3)-$ and acetylene groups.

The oxide group for X in said repeating unit structure is preferably epoxy and/or propoxy, and the lactone group is preferably at least one member selected from among β-lactone, γ-lactone and δ-lactone groups.

The reason why said unsaturated hydrocarbon residue having 2 to 3 carbon atoms, oxide group, lactone group, and hydroxyl group are used for X in the repeating unit structure is that those groups are highly reactive so that resins (oligomers) having such functional groups can be easily crosslinked to each other.

The reason why n is defined as 1 to 10000 is that, if n exceeds 10000, the resin will be hardly soluble in solvents and, therefore, difficult to work with.

Referring to the double bond structure within the backbone chain of said resin (3), a copolymer comprising a repeating unit of the following chemical formula (1) and a repeating unit of the formula —(CH=CH)$_m$— or —(CH$_2$—CH=CH—CH$_2$)$_m$— is preferred.

In the above formulas, m represents 1 to 10000.

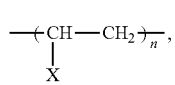

(1)

wherein n represents 1 to 10000 and X represents a hydrogen atom, an alkyl group, a phenyl group, a hydroxyl group, an unsaturated hydrocarbon residue having 2 to 3 carbon atoms, an oxide group or a lactone group.

Referring, further, to said resin (3), the oxide structure in the backbone chain of its molecular is preferably an epoxide. As the lactone structure within the backbone chain, β-lactone and γ-lactone are preferred. With regard to the mono- or polycyclopentadiene structure within the backbone chain of its molecule, a cyclopentadiene structure or a bicyclopentadiene structure can be selected.

The copolymer structure mentioned above includes a structure such that the repeating units are copolymerized alternately, e.g. ABAB..., a structure such that the repeating units are copolymerized in a random order, e.g. ABAA-BAAAAB..., and a structure such that the repeating units are block-copolymerized, e.g. AAAABBB....

The resin (4) is now described.

The resin (4) is a polymer alloy comprising a mixed resin of two or more resins selected from said (1), (2) and (3), a polymer alloy comprising a mixed resin of one or more resins selected from said (1), (2) and (3) with a thermosetting resin, or a polymer alloy comprising one or more resins selected from said (1), (2) and (3) as crosslinked to each other.

The mixed resining of two or more resins selected from said (1), (2) and (3) can be achieved by dissolving the resin particles in an organic solvent or melting them together under heating.

The blend of one or more resins selected from said categories (1), (2) and (3) with a thermosetting resin is also effected by dissolving the corresponding resin particles in an organic solvent. The preferred thermosetting resin for use in this case is at least one member selected from among thermosetting polyolefin resin, epoxy resin, phenolic resin, polyimide resin and bis(maleimide)triazine resin (BT).

Furthermore, when resins selected from said (1), (2) and (3) are to be crosslinked to each other, the unsaturated hydrocarbon residue having 2 to 3 carbon atoms, oxide group, lactone group or hydroxyl group and the double bond, oxide structure or lactone structure within the backbone chain of its molecule are utilized as a bonding hand.

As a representative commercial thermosetting polyolefin resin which can be used in this invention, Sumitomo-3M's product designation 1592 can be mentioned. As commercial thermoplastic polyolefin resins with melting points over 200° C., Mitsui Chemical's product designation TPX (m.p. 240° C.) and Idemitsu Petrochemical's product designation SPS (m.p. 270° C.) can be mentioned. TPX is a resin corresponding to the case in which X in said repeating unit structure is isobutyl and SPS is a resin containing phenyl for X and having a syndiotactic polymer structure.

The polyolefin resins described above show high adhesion to conductor circuits so that a conductor circuit can be constructed without roughening the surface of the resin insulating layer. Thus, a conductor circuit can be directly formed on the smooth surface of the resin insulating layer. In particular, by introducing a minor number of polar groups, the adhesion of those polyolefin resins to the conductor circuit can be remarkably improved.

Furthermore, said polyolefin resins have dielectric constant values not over 3 and dielectric loss tangent values not over 0.005, both being lower than the corresponding values of epoxy resin, with the result that there is no signal delay even when the circuits carry high-frequency signals. Moreover, those polyolefin resins are comparable to epoxy resin in heat resistance so that no stripping of the conductor circuit occurs even at the solder melting temperature. In addition, because of their high fracture rigidity, there is no risk for cracks originating from the interface between the conductor circuit and the resin insulating layer under the conditions of the heat cycle test.

Preferably, the conductor circuits constituting the multilayer printed circuit board of the invention belonging to the first group are respectively formed on a resin insulating layer by way of a metal layer composed of one or more metals selected from among the metals (exclusive of Cu) of the $4^{th}$ through $7^{th}$ periods in Group 4A through Group 1B of the long-form periodic table of the elements, Al and Sn. Such metal layers feature particularly high adhesion to polyolefin resins, insuring very high peel strength values between 1.5 and 2.5 kg/cm.

The above-mentioned one or more metals selected from among the metals (exclusive of Cu) of the $4^{th}$ through $7^{th}$ periods in Group 4A through Group 1B is preferably at least one metal selected from the group consisting of Ni, Co, Cr, Ti and noble metals. The preferred noble metals are Pd, Au and Pt.

The preferred thickness of this metal layer is 0.01 μm to 0.2 μm. This is because, by selecting a thickness of 0.01 μm or more, a sufficient adhesion can be established between the resin insulating layer and the conductor circuit and by limiting the thickness to 0.2 μm or less, cracks due to a stress of formation of the metal layer by sputtering can be prevented and, at the same time, the unwanted portions of the metal layer between conductor patterns can be easily dissolved and removed by etching after completion of the conductor circuit.

The above-mentioned metal layer can be formed by various alternative techniques such as electroless plating, electroplating, sputtering, physical vapor deposition and CVD.

The above-mentioned metal layer composed of one or more metals selected from among the metals (exclusive of Cu) of the $4^{th}$ through $7^{th}$ periods in Group 4A through Group 1B, Al and Sn may be formed on the surface of the conductor circuit where necessary. This is because, in the case of a multilayer printed circuit board, an interlayer resin insulating layer must be formed over the conductor circuit and this construction contributes to improved adhesion to the interlayer resin insulating layer.

Moreover, the multilayer printed circuit board according to the first group of the present invention is preferably a multilayer printed circuit board comprising conductor circuits each formed internally of the substrate board or on the surface thereof.

The process for manufacturing the printed circuit board according to the first group of the present invention is now described taking a multilayer printed circuit board as an example.

(1) First, a circuit board comprising a substrate board and an internal copper pattern formed on the surface thereon is prepared.

The substrate is preferably a member selected from among a glass-epoxy substrate, a polyimide resin substrate, a bis(maleimide)triazine resin substrate, a fluororesin substrate and a polyolefin resin substrate.

For the formation of said copper pattern on the resin substrate, a copper-clad laminate is etched.

Using a drill, through holes are pierced in this substrate and the wall of the through holes and the electroless plating of the surface of the copper foil are performed to provide plated-through holes. The electroless plating is preferably copper electroplating. When the substrate board is one giving a poor plating throwing power as it is the case with a fluororesin substrate, a surface modification pretreatment such as a treatment with a solution of an organometal compound (an organosodium compound) (Tetraetch™, Junkosha) or a plasma treatment is carried out.

Then, electroplating is performed to provide a thick layer. This electroplating is preferably copper electroplating.

The inner walls of the plated-through holes and the surface of the electroplated metal layer may be roughened. This roughening can be carried out by, for example, a blackening (oxidation)-reduction treatment, spraying with an aqueous mixed solution of an organic acid and a cupric complex, or Cu—Ni—P acicular alloy plating.

Where necessary, the plated-through holes may be filled with an electrically conductive paste and a conductor layer be formed over this conductive paste by electroless plating or electroplating.

(2) On the circuit board fabricated in the above step (1), a resin insulating layer composed of a polyolefin resin is constructed. In a multilayer printed circuit board, this resin insulating layer functions as an interlayer resin insulating layer.

This resin insulating layer is formed either by coating with an uncured resin solution or by hot press lamination of a resin film.

(3) Then, this polyolefin resin insulating layer is provided with openings for electrical connection to the lower-layer conductor circuit.

Formation of the openings is carried out with a laser beam. The laser which can be used for this purpose includes a carbon dioxide laser, a UV laser and an eximer laser, among others. When a $CO_2$ laser has been used for piercing the openings, a desmear treatment is performed. This desmear treatment can be carried out using an oxidizing agent such as an aqueous solution of chromic acid or a permanganate or optionally by oxygen plasma treatment, $CF_4$-oxygen mixed plasma treatment or corona discharge treatment. The $CF_4$-oxygen mixed plasma, in particular, is advantageous in that hydrophilic groups such as hydroxyl and carbonyl groups can be introduced into the surface layer of the resin to facilitate the subsequent CVD or PVD treatment.

(4) On the surface of the polyolefin resin insulating layer provided with said openings in the previous step (3), a metal layer composed of at least one metal selected from among said metals (exclusive of Cu) of the $4^{th}$ through $7^{th}$ periods in Group 4A through Group 1B, Al and Sn is formed by PVD or CVD method.

PVD method referred to above includes vapor deposition processes such as sputtering and ion beam sputtering. CVD method includes the PE-CVD (plasma enhanced CVD) using an organometal compound (MO), e.g. allylcyclopenta-diphenylpalladium, dimethylgold acetylacetate, tin tetramethylacrylonitrile, dicobalt octacarbonylacrylonitrile, etc., as a source.

(5) Then, on the metal layer formed in the above step (4), a metal layer of the same kind of metal as used in the next electroless plating procedure is constructed by sputtering and the like. This metal layer is disposed for the purpose of improving the affinity for the electroless plating metal. Specifically, a copper layer is preferably formed by sputtering.

(6) Then, electroless plating is applied to the metal layer formed in the above step (5).

The optimum electroless plating is copper plating. The recommended plating thickness is 0.1 to 5 μm. This is because the plated metal layer can be subsequently dissolved and removed by etching without adversely affecting the function of the electroplated conductor layer to be formed in the next step.

(7) Then, a plating resist is disposed on the electroless plated metal layer formed in the above step (6).

This plating resist is formed by laminating a photosensitive dry film and, then, performing a light exposure and development.

(8) Then, using the electroless plated metal film as the plating bar, electroplating is performed to construct a thick conductor circuit. The recommended thickness of this electroplated conductor layer is 5 to 30 μm.

(9) The plating resist is then stripped off and the electroless plated metal layer underlying the plating resist and said metal layer composed of at least one metal selected from among the metals of the $4^{th}$ through $7^{th}$ periods in Group 4A through Group 1B are dissolved and removed by etching to provide a discrete conductor circuit.

As the etching solution, there can be mentioned an aqueous mixed solution of sulfuric acid and hydrogen peroxide, an aqueous solution of a persulfate such as ammonium persulfate, sodium persulfate, potassium persulfate or the like, an aqueous solution of ferric chloride or cupric chloride, hydrochloric acid, nitric acid and hot dilute sulfuric acid.

(10) Where necessary, the above sequence of steps (2) to (9) is repeated to provide the objective multilayer printed circuit board.

While the semi-additive process is used for the formation of a conductor circuit in the above description, the full-additive process may also be adopted.

The full-additive process mentioned above comprises constructing a thin metal layer on the surface of a polyolefin resin insulating layer by CVD or PVD method, either laminating a photosensitive dry film or coating a liquid photosensitive resin thereon, carrying out a light exposure and development to form a plating resist, and performing an electroless plating to a sufficient thickness to provide a conductor circuit.

The multilayer printed circuit board according to the second group of the present invention is a multilayer printed circuit board which comprises a substrate board and, as successively built up on said substrate, a conductor circuit and a resin insulating layer alternately with the conductor circuits being interconnected by via holes, wherein said resin insulating layer comprises a cycloolefin resin.

In this multilayer printed circuit board according to the second group of the present invention, because the interlayer resin insulating layer is made of a cycloolefin resin, the dielectric constant and dielectric loss tangent are remarkably small as compared with the interlayer resin insulating layer composed of epoxy resin or the like so that the signal delay and the signal error due to the transmission loss of signals can be prevented.

Furthermore, because said cycloolefin resin is excellent in mechanical characteristics, particularly in rigidity, the conductor circuit can be constructed on a firm interlayer resin insulating layer so that the reliability of inter-circuit electrical connection is high.

In addition, because said cycloolefin resin shows good adhesion to the conductor circuit, the stripping of the interlayer resin insulating layer from the conductor circuit can be prevented and the formation of cracks due to stripping in the interlayer resin insulating layer can also be prevented.

Furthermore, because said cycloolefin resin has a low water absorption rate, the electrical insulation between conductor circuits can be improved, thus contributing to enhanced reliability.

The cycloolefin resin mentioned above is not particularly restricted in kind but is preferably a resin having a dielectric constant value at 1 GHz of not more than 3.0 and a dielectric loss tangent value of not more than 0.01. The still more preferred range of dielectric constant is 2.4 to 2.7.

By using a resin having such a low dielectric constant, the signal transmission delay and error due to the transmission loss of signals can be precluded.

The preferred cycloolefin resin is a homopolymer or copolymer of 2-norbornene, 5-ethylidene-2-norbornene and/or their derivatives. The derivatives mentioned above include said cycloolefins, e.g. 2-norbornene, to which an amino group, a maleic anhydride residue or a maleic acid-modified group for crosslinking has been attached.

As the monomer for use in synthesizing said copolymer, there can be mentioned ethylene and propylene.

The cycloolefin resin mentioned above may be a mixture of two or more species of said resin or even a polymer containing a resin other than said cycloolefin resin.

Furthermore, when said cycloolefin resin is a copolymer, it may be a block copolymer or a random copolymer.

The cycloolefin resin mentioned above is preferably a thermosetting cycloolefin resin. This is because, as the resin is crosslinked by heating, its rigidity is increased and mechanical characteristics is also improved.

The glass transition temperature (Tg) of said cycloolefin resin is preferably 130 to 200° C.

The cycloolefin resin mentioned above may be used in the form of a resin sheet (film) or may be used in the form of an uncured dispersion of a monomer or a polymer having a certain low molecular weight in a solvent such as xylene, cyclohexane or the like.

As the resin sheet, the so-called RCC (RESIN COATED COPPER, i.e. copper foil coated with the resin) can be used.

The cycloolefin resin need not necessarily contain a filler and other additives or may contain a flame retardant such as aluminum hydroxide, magnesium hydroxide and phosphoric acid esters.

The process for manufacturing a multilayer printed circuit board using such a cycloolefin resin is now described.

(1) First, a circuit board comprising a resin substrate carrying a lower-layer conductor circuit on its surface is prepared. The resin substrate is preferably a substrate containing an inorganic fiber, such as a glass cloth-epoxy substrate, a glass cloth-polyimide substrate, a glass cloth-bis(maleimide)triazine resin substrate and a glass cloth-fluororesin substrate.

A copper-clad laminate comprising said resin substrate clad with copper foil on both sides can also be used.

Usually, on the resin substrate, through holes are formed with a drill and the electroless plating is carried out on the wall surfaces of the through holes and the surface of the copper foil to provide plated-through holes. The electroless plating is preferably copper plating. In addition, electroplating may be carried out to virtually thicken the copper foil. This electroplating is preferably copper electroplating.

Thereafter, the inner walls of the plated-through holes are roughened and the plated-through holes are filled with a resin paste. Then, an electrically conductive layer is formed over the surface by electroless plating or electroplating.

The roughening treatment may for example be a blackening (oxidation)-reduction treatment, a spray treatment using a mixed aqueous solution of an organic acid and a cupric complex, or a treatment comprising Cu—Ni—P acicular alloy plating.

After the above process, an etching resist is disposed on the solid copper pattern formed all over the substrate using photolithographic technique and, then, etching is performed to construct a lower-layer conductor circuit. Where necessary, the concave area occurred by etching due to the formation of the conductor circuit may be filled with a resin or the like.

(2) The lower-layer conductor circuit thus formed is subjected to a roughening treatment where necessary. The roughening treatment can be carried out by any of the above-mentioned techniques, namely blackening (oxidation)-reduction, spray treatment using a mixed aqueous solution containing an organic acid and a cupric complex, and Cu—Ni—P acicular alloy plating.

As an alternative, instead of carrying out said roughening of the lower-layer conductor circuit, the substrate board carrying the lower-layer conductor circuit may be dipped in a solution dissolving the resin component to form a resin layer on the surface of said lower-layer conductor circuit for improving the adhesion to the interlayer resin insulating layer to be formed thereon.

(3) Then, an interlayer resin insulating layer composed of said cycloolefin resin is formed on both sides of the circuit board carrying lower-layer conductor circuits as fabricated in the above step (2).

This interlayer resin insulating layer can be formed by coating the substrate with an uncured cycloolefin resin solution and curing the coat by heating or formed by laminating a resin sheet by a press lamination technique under heating and vacuum or reduced pressure. However, the resin sheet laminating technique is preferred from the standpoint of the ease of handling. The heating conditions for use are preferably 100 to 180° C. and 0.5 to 20 minutes.

(4) Then, the interlayer resin insulating layer is irradiated with laser light to provide openings for via holes. The laser which can be used includes but is not limited to a carbon dioxide ($CO_2$) laser, a UV laser and an eximer layer, although an eximer laser or a $CO_2$ laser of short pulse duration is preferred.

The eximer laser is advantageous in that, with the aid of a mask having through holes corresponding to the openings for via holes, it is capable of piercing many openings for via holes in one operation. The $CO_2$ laser of short pulse duration leaves little residual resin in the openings and does not materially affect the resin around the openings.

The through holes within the mask must be true-round because an exactly circular laser beam spot can be obtained, therefore the diameter of the through holes is preferably about 0.1 to 2 mm.

When openings are pierced with a laser beam, particularly with a $CO_2$ laser beam, a desmear treatment is preferably carried out. This desmear treatment can be carried out using an oxidizing agent comprising an aqueous solution of chromic acid or an aqueous permanganate solution. As an alternative, oxygen plasma, $CF_4$-oxygen mixed plasma, or corona discharge may be utilized for desmear treatment. Surface modification by UV irradiation using a low-pressure mercury vapor lamp may also be performed.

(5) A metal layer may be directly formed on the interlayer resin insulating layer without prior roughening or may be formed after the surface of the interlayer resin insulating layer has been roughened by plasma treatment or acid treatment.

When a plasma treatment has been performed, an intermediate layer composed of Ni, Ti and/or Pd which has a good adhesion to the interlayer resin insulating layer may be provided to insure a better adhesion between the interlayer resin insulating layer and the upper-layer conductor circuit to be constructed thereon. This intermediate layer of metal mentioned above is preferably formed by a physical vapor deposition (PVD) technique such as sputtering and its thickness is preferably about 0.1 to 2.0 µm.

(6) Following the above step, a thin-film metal layer is formed. The preferred material for this thin film is copper or copper-nickel alloy. This thin-film layer can be formed by physical vapor deposition (PVD), chemical vapor deposition (CVD) or electroless plating.

Specific procedures for said PVD and CVD may be those described for the first group of the present invention.

The preferred thickness of this thin film is 0.1 to 5 µm. This thickness range is chosen because the etching can be carried out without adversely affect the conductor layer to be subsequently formed by electroplating. However, this step of forming a thin film is not essential but may be omitted.

(7) A plating resist is then disposed on the electroless plated metal film formed in the above step (6). This plating resist can be formed by laminating a photosensitive dry film and carrying out a light exposure and development.

(8) Then, using the thin metal film formed on the interlayer resin insulating layer as a plating bar, electroplating is performed to construct a conductor circuit of sufficient thickness. The preferred thickness of the electroplated metal layer is 5 to 30 µm.

Optionally, the openings for via holes may be filled up by this electroplating to provide the filled via structure.

(9) After this electroplating, the plating resist is stripped off and the electroless plated metal film and intermediate layer mentioned above are dissolved and removed by etching to provide a discrete conductor circuit. The electroplating mentioned above is preferably copper electroplating.

As the etching solution, there can be mentioned an aqueous sulfuric acid-hydrogen peroxide solution, an aqueous solution of a persulfate such as ammonium persulfate, sodium persulfate, potassium persulfate or the like, an aqueous solution of ferric chloride or cupric chloride, hydrochloric acid, nitric acid and hot dilute sulfuric acid. Moreover, by using said etching solution comprising an organic acid and a cupric complex, a roughened surface may be formed simultaneously with the etching of the non-conductor circuit regions.

(10) Thereafter, the above sequence of steps (2) to (9) is repeated to provide an upper-layer conductor circuit. Finally, a solder resist layer is formed on the uppermost layer and this solder resist layer is pierced to provide solder vamps, whereby a multilayer printed circuit board comprising, for example, 3 layers on either side, thus 6 layers in both sides is obtained.

The multilayer printed circuit board according to the third group of the present invention comprises a substrate board carrying a lower-layer conductor circuit and, as successively built up thereon, an interlayer resin insulating layer and an upper-layer conductor circuit alternately, and further comprises a metal layer composed of at least one metal selected from among nickel, cobalt, tin and noble metals as formed on the surface of the lower-layer conductor circuit (hereinafter referred to merely as the conductor circuit; since the metal layer mentioned hereinafter may be formed on an upper-layer conductor circuit as well, the term "conductor circuit" as used in the following description of the third group of the present invention means both the lower-layer conductor circuit and the upper-layer conductor circuit unless otherwise indicated) and a roughened layer composed of Cu—Ni—P alloy as formed on said metal layer.

According to the third group of the present invention wherein a metal layer (covering layer) composed of at least one metal selected from among nickel, cobalt, tin and noble metals is disposed on the surface of said conductor circuit, the local cell reaction between the copper constituting the conductor circuit and the Cu—Ni—P alloy which might occur on treatment of the substrate board whose roughened layer of the conductor circuit surface is exposed with an acid or the like is inhibited so that the dissolution of the conductor circuit is prevented.

Furthermore, Cu—Ni—P alloy easily deposits on the surface of the above metal layer so that no bare spots will be produced even if the plating solution has deteriorated. Thus, a roughened layer of Cu—Ni—P acicular alloy can be formed on the conductor circuit with high reliability.

Furthermore, the above-mentioned metal layer functions as an etching mask for the copper conductor circuit so that the excess etching of the conductor circuit can be prevented.

The above metal layer is formed on the upper surface of the conductor circuit or on the upper and lateral surfaces of the conductor circuit. The metal layer and roughened layer need not be formed on all conductor circuits. Therefore, for example, the metal layer and roughened layer are sometimes not formed on the conductor circuit of the uppermost layer.

The metal which can be used for said metal layer includes not only nickel, cobalt and tin but also noble metals such as gold, silver, platinum and palladium. Thus, said metal layer can be formed from at least one metal selected from among said metals and noble metals.

The preferred thickness of said metal layer is 0.1 to 3 µm. If the thickness is less than 0.1 µm, the local cell reaction may not be inhibited. If it is greater than 3 µm, the conductor circuit itself becomes too thick and the interlayer resin insulating layer is also increased in thickness so that it becomes difficult to form via holes having a small diameter. The via holes having a small diameter can be formed more easily when the thickness of the interlayer resin insulating layer is small.

The roughened layer composed of Cu—Ni—P acicular alloy preferably has an overall thickness of 1 to 7 µm.

Within the above thickness range, the interval of interlayer resin insulating layers and that of the conductor circuits can be smaller than those in the conventional multilayer printed circuit board, with the result that a higher wiring density as well as weight reduction can be accomplished.

The form of said roughened layer composed of Cu—Ni—P alloy is preferably acicular or porous. When the roughened layer is formed by plating, its texture varies with different surfactants used, among other factors, and it is necessary to select the plating conditions conducive to formation of an acicular or porous texture.

Preferably provided on the surface of said roughened layer composed of Cu—Ni—P alloy is a cover layer (hereinafter referred to as the roughened layer-covering layer) composed of a metal having the ionization tendency higher than copper but not higher than titanium or of a noble metal. The preferred thickness of the roughened layer-covering layer is 0.1 to 2 µm.

By constructing such a roughened layer-covering layer of said metal, direct contact of the electrolyte solution with the roughened layer can be prevented. Moreover, since the covering metal itself is oxidized to form a dense oxide film, the dissolution of the roughened layer and conductor circuit can be prevented.

The metal having the ionization tendency larger than copper but not larger than titanium includes but is not limited to titanium, aluminum, zinc, iron, indium, thallium, cobalt, nickel, tin, lead and bismuth. Moreover, said noble metal includes gold, silver, platinum and palladium. Thus, said roughened layer-covering layer can be formed from at least one metal selected from among the metals mentioned above and noble metals. Among those metals, tin is particularly preferred, for this metal can be made into a thin film by electroless substitution plating and can be deposited intimately tracing the irregularities of the roughened layer.

When tin is used as said metal, a tin borofluoride-thiourea solution or a tin chloride-thiourea solution is used as the plating solution. In this case, the Cu—Sn substitution reaction yields an Sn layer of about 0.01 to 2 μm in thickness. When a noble metal is used, a sputtering or other vapor deposition technique or a plating technique using a simple replacement type plating solution can be employed.

The conductor circuit-covering layer in this invention can be formed by, for example, electroplating, electroless plating, sputtering or vapor deposition.

For electroless nickel plating, an aqueous solution containing 10 to 50 g/L of nickel chloride, 5 to 20 g/L of sodium hypophosphite and 30 to 60 g/L of sodium hydroxyacetate or an aqueous solution containing 10 to 50 g/L of nickel chloride, 5 to 20 g/L of sodium hypophosphite and 5 to 20 g/L of sodium citrate can be employed.

For nickel electroplating, an aqueous solution containing 100 to 300 g/L of nickel sulfate, 10 to 60 g/L of nickel chloride and 10 to 50 g/L of boric acid can be used.

For electroless tin plating, an aqueous solution containing 0.1 to 0.5 mol/L of sodium citrate, 0.01 to 0.08 mol/L of EDTA, 0.01 to 0.08 mol/L of tin chloride and 0.01 to 0.05 mol/L of titanium chloride can be used.

Electroless cobalt plating can be performed using an aqueous solution containing 0.1 to 1.0 mol/L of cobalt chloride, 0.1 to 0.5 mol/L of sodium hypophosphite, 0.5 to 2.0 mol/L of sodium tartrate and 0.5 to 20 mol/L of ammonium chloride.

Electroless palladium plating can be performed using an aqueous solution containing 1 to 10 g/L of palladium tetramine dichloride, 10 to 50 g/L of sodium EDTA, 100 to 500 g/L of ammonia and 0.1 to 1.0 g/L of hydrazine.

The plating method for depositing and growing plated layer of a Cu—Ni—P alloy on the surface of the conductor circuit to provide a roughened layer in the third group of the present invention is now described.

In the invention of the third group, a substrate formed with a lower-layer conductor circuit is immersed in an aqueous plating solution containing a complexing agent, a copper compound, a nickel compound, a hypophosphite and an acetylene-containing polyoxyethylene series surfactant and subjected to a vibration or rocking action or otherwise supplied with the metal ions to let a porous Cu—Ni—P alloy be deposited and grow and thereby provide an alloy roughened layer composed of a covering layer and a roughened layer. The aqueous plating solution is preferably adjusted beforehand so that the concentrations of the copper ion, nickel ion, hypophosphite ion and complexing agent will be 0.007 to 0.160 mol/L, 0.001 to 0.023 mol/L, 0.1 to 1.0 mol/L and 0.01 to 0.2 mol/L, respectively.

The complexing agent mentioned above includes but is not limited to citric acid, tartaric acid, malic acid, EDTA, quadrol and glycine.

As the acetylene-containing polyoxyethylene series surfactant mentioned above, it is optimal to employ a surfactant of the under-mentioned structural formula (2) or (3). The surfactant of this type includes but is not limited to alkyne diols such as 2,4,7,9-tetramethyl-5-decyne-4,7-diol, 3,6-dimethyl-4-octyne-3,6-diol, etc. As commercial surfactants, Surfynol 104 (porous), 440, 465 and 485 (all acicular), available from Nisshin Chemical Industries Co., can be mentioned by way of example.

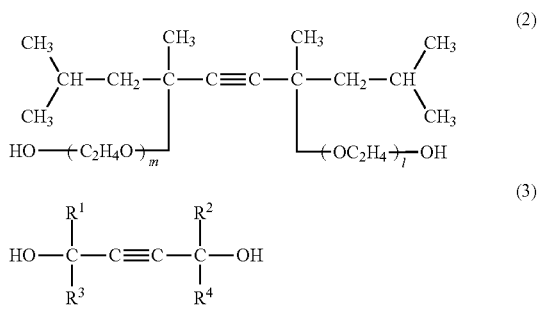

[In the above formula (2), m and l represents integers the sum of which is equal to 3 through 30. In the formula (3), $R^1$ and $R^2$ each represents an alkyl group and $R^3$ and $R^4$ each represents a hydrogen atom or a lower alkyl group].

The Cu—Ni—P alloy which deposits from said electroless plating solution has an acicular or porous surface structure. In the case of a porous alloy, the number of micropores per 1 $cm^2$ is 100,000 to 1,000,000 and generally within the range of 3,000,000 to 300,000,000. The pore diameter is the 0.01 to 100 μm and generally within the range of 0.1 to 10 μm.

In the third group of the present invention, an adhesive for electroless plating use is preferably used for the construction of the interlayer resin insulating layer on the conductor circuit. The optimum adhesive for electroless plating use is a dispersion of a cured heat-resistant resin particle soluble in an acid or an oxidizing agent or an uncured heat-resistant resin hardly soluble in the acid or oxidizing agent. Upon treatment with the solution of the acid or oxidizing agent, the heat-resistant resin particles are dissolved out to provide the surface of the adhesive layer with an roughened surface comprising anchors resembling narrow-necked pots.

Referring to the above adhesive for electroless plating use, said cured heat-resistant resin particle, in particular, is preferably a heat-resistant resin particles (1) having mean particle diameters not over 10 μm and (2) mixture of the particle having a relatively large mean particle diameter with one having a relatively small mean particle diameter. This is because the more intricate anchors can be formed.

The heat-resistant resin which can be used includes but is not limited to epoxy resin, polyimide resin, a mixed resin comprising epoxy resin and a thermoplastic resin. The thermoplastic resin to be used in the formation of such a mixed resin includes polyethersulfone (PES), for instance. As examples of said heat-resistant resin particle soluble in an acid or oxidizing agent, epoxy resins (particularly an epoxy resin cured with an amine series curing agent is preferred) and amino resins can be mentioned.

The solder resist which can be used in the third group of the present invention includes but is not limited to an epoxy resin acrylate and an imidazole series curing agent.

A process for manufacturing the multilayer printed circuit board according to the third group of the present invention is now described.

(1) First, a circuit board comprising a core board and, as formed on either side thereof, an inner copper pattern (lower-layer conductor circuit) is prepared.

This circuit board can be fabricated by the method described in connection with the first group of the invention or the second group of the invention.

(2) Then, an interlayer resin insulating layer is constructed on the circuit board prepared in the above step (1). Particularly in this third group of the present invention, the above-described adhesive for electroless plating use is preferably used as the material for the construction of the interlayer resin insulating layer.

(3) The layer formed from said adhesive for electroless plating use is dried and openings for via holes are provided where necessary. Thus, on the interlayer resin insulating layer, the openings for via holes are formed by light exposure and development, and subsequent thermal curing when a photosensitive resin is used or by thermal curing and subsequent laser processing when a thermosetting resin is used.

(4) Then, the acid- or oxidizing agent-soluble resin particles present on the surface of the layer of an adhesive for the cured electroless plating (interlayer resin insulating layer) are dissolved out with an acid or an oxidizing agent to roughen a surface of the layer of an adhesive for the electroless plating.

The acid mentioned just above may for example be an mineral acid, e.g. phosphoric acid, hydrochloric acid, sulfuric acid or the like; or an organic acid, e.g. formic acid, acetic acid or the like. Particularly preferred is an organic acid. This is because, in the course of roughening, the organic acid hardly corrode the conductive metal layer exposed from the via holes.

On the other hand, said oxidizing agent is preferably an aqueous chromic acid or permanganate (e.g. potassium permanganate) solution.

(5) Then, a catalyst nucleus is applied to the circuit board formed with the interlayer resin insulating layer having the roughened surface.

For application of catalyst nuclei, a noble metal ion species or a noble metal colloid is preferably used. Generally, palladium chloride or colloidal palladium is used. For immobilizing the catalyst nuclei, it is preferable to carry out a heat treatment. The preferred catalyst nucleus in this case is palladium.

(6) Electroless plating is carried out on the surface of the interlayer resin insulating layer to which the catalyst nuclei have been applied is electroless plated to form an film on the whole roughened surface. The preferred thickness of the electroless plated film is 0.5 to 5 μm.

Then, a plating resist is disposed on the electroless plated film.

(7) Then, the non-resist area is electroplated in a thickness of 5 to 20 μm to form an upper-layer conductor circuit and via holes.

For this electroplating, copper plating is preferably used.

Furthermore, as the resist layer for the etching of said metal layer and electroless plated film, a metal layer composed of at least one metal selected from among nickel, cobalt, tin and noble metals is formed.

After removal of the plating resist, the electroless plated film under said plating resist is dissolved and removed by etching with an etching solution comprising a sulfuric acid-hydrogen peroxide solution or an aqueous solution of sodium persulfate, ammonium persulfate or the like to provide a discrete conductor circuit.

Since the metal layer composed of at least one metal selected from among nickel, cobalt, tin and noble metals has been formed as a resist layer, the upper-layer conductor circuit made of copper is not etched.

The metal layer composed of at least one metal selected from among nickel, cobalt, tin and noble metals may be formed on the upper and lateral sides of the upper-layer conductor circuit and via holes. (See e.g., FIG. 26 (b), item 9.)

(8) Then, on the upper-layer conductor circuit formed with said metal layer composed of at least one metal selected from among nickel, cobalt, tin and noble metals, a porous Cu—Ni—P alloy roughened layer is formed.

Since the surface of said metal layer provides a favorable condition for oxidation and reduction reactions, the Cu—Ni—P alloy is liable to deposit.

(9) Then, a layer composed of an adhesive for electroless plating use is formed on the above substrate board as an interlayer resin insulating layer.

(10) The above sequence of steps (3) to (8) is repeated to provide an upper-layer conductor circuit. In this manner, a multilayer printed circuit board comprising 3 layers on either side, thus a total of 6 layers, is obtained.

During the above sequence of steps (3) to (8), the formation of openings for via holes is followed by roughening surface with chromic acid. By using chromic acid, the conductor circuit can be well protected against dissolution.

While the above description pertains to the manufacture of a multilayer printed circuit board by the so-called semi-additive process, it is likewise possible to adopt the so-called full-additive process which comprises roughening the layer of an adhesive for electroless plating, applying a catalyst nucleus, disposing a plating resist and performing electroless plating to form a conductor circuit.

The process for manufacturing a multilayer printed circuit board according to the fourth group of the present invention is a process for manufacturing a multilayer printed circuit board comprising building up resin insulating layers and conductor circuits alternately on a resin substrate, and comprises constructing a metal layer composed of at least one metal selected from among metals of the $4^{th}$ through $7^{th}$ periods in Group 4A through Group 1B of the long-form periodic table of the elements, Al and Sn on the surface of said resin insulating layer, cleaning the surface of said metal layer with an acid and then forming a conductor circuit on said metal layer.

In the above construction according to the fourth group of the present invention, a metal layer is formed on the surface of said resin insulating layer in the first place and the surface of said metal layer is then cleaned with an acid to remove the oxide film. This practice results in firmer adhesion between the metal layer and the conductor circuit to be built thereon, thus contributing to the prevention of stripping of the conductor circuit.

Furthermore, because the resin insulating layer need not be roughened ahead of time, its surface is flat and level. Thus, no roughened layer exists beneath the conductor circuit built thereon, so that the risk for signal conduction delay can be avoided.

For the formation of said metal layer on the surface of said resin insulating layer, it is preferable to use at least one metal selected from among Ni, Cr, Mo, Ti, W, Cu, Al, Sn, Pt, Pd and Au. The metal layer may be a layer composed of a single species of metal or an alloy layer composed of two or more metal species.

As the method for forming said metal layer in this fourth group of the present invention, there can be mentioned physical vapor deposition (PVD), chemical vapor deposition (CVD), electroplating and electroless plating.

The specific procedures of said physical vapor deposition and chemical vapor deposition may be those described for the first group of the present invention.

The acid for use in the step of cleaning with acid mentioned above is not particularly restricted but is preferably at least one acid selected from among hydrochloric acid, sulfuric acid, acetic acid and phosphoric acid or their mixed acids.

The temperature for cleaning with acid is preferably 25 to 60° C., for within this range a high cleaning power can be expected.

The preferred thickness of said alloy layer is 0.1 to 2.0 μm. An alloy layer less than 0.1 μm in thickness can hardly be formed by electroplating. Moreover, the effect on adhesion is not appreciable. If, conversely, the limit of 2.0 μm is exceeded, etching may be difficult.

The resin insulating layer in the fourth group of the present invention is preferably formed from a thermosetting resin, a thermoplastic resin or a mixed resin thereof.

The preferred thermosetting resin is at least one member selected from the group consisting of thermosetting polyolefin resins, epoxy resins, polyimide resins, phenolic resins and bis(maleimide)triazine resins.

The preferred thermoplastic resin is at least one member selected from among the so-called engineering plastics such as polymethylpentene (PMP), polystyrene (PS), polyethersulfone (PES), polyphenylene ether (PPE) and polyphenylene sulfide (PPS), among others.

In providing the multilayer printed circuit board according to the fourth group of the present invention, it is possible to use a resin substrate on which a conductor circuit has been directly formed and build up one or more resin insulating layers and conductor circuits alternately thereon or use a resin substrate not formed with a conductor circuit and build up one or more resin insulating layers and conductor circuits alternately thereon. Furthermore, said resin insulating layers and conductor circuits may be present on one side of the resin substrate or on both sides.

An exemplary process for manufacturing a multilayer printed circuit board according to the fourth group of the present invention is described in the following.

(1) First, a circuit board comprising a resin substrate board and, as disposed on the surface thereof, a lower-layer conductor circuit is prepared.

For this preparation, the same procedure as described for the first or second group of the invention can be used.

(2) Then, a resin insulating layer is formed on both sides of the circuit board carrying lower-layer conductor circuits as prepared in the above step (1). This resin insulating layer functions as an interlayer resin insulating layer of the multilayer printed circuit board.

This resin insulating layer can be provided either by coating with an uncured resin solution or by hot-press lamination of a resin film.

(3) Then, the resin insulating layer thus formed (hereinafter referred to as the interlayer resin insulating layer) is provided with openings for via holes necessary for electrical connection to the lower-layer conductor circuit.

Formation of the openings is performed by the light exposure and development according to a photolithographic technique or irradiation with laser light. The laser which can be used includes but is not limited to the $CO_2$ laser, UV laser and eximer laser.

When the piercing of openings is performed with a $CO_2$ laser, desmear treatment is subsequently carried out. This desmear treatment can be carried out using an oxidizing agent comprising an aqueous solution of chromic acid or an aqueous permanganate solution. A treatment with oxygen plasma, $CF_4$-oxygen mixed plasma or corona discharge can also be used. Surface modification by UV irradiation using a low-pressure mercury-vapor lamp is also useful.

Particularly by using a $CF_4$-oxygen mixed plasma treatment, hydrophilic groups such as hydroxyl and carbonyl groups can be introduced onto the resin surface. The above treatment of the interlayer resin insulating layer is advantageous in that an adhesion to the metal layer to be formed subsequently can be improved.

(4) On the surface of the interlayer resin insulating layer formed with openings for via holes in the above step (3), a metal layer composed of at least one metal selected from among metals of the $4^{th}$ through $7^{th}$ periods in Group 4A through Group 1B of the long-form periodic table of the elements, Al and Sn is formed by, for example, a PVD technique.

(5) Following the above step (4), the surface of the metal layer is treated with an acid to remove the oxide film on the surface of metal layer.

(6) The metal layer formed in the above step (5) is further electroless plated.

The optimum kind of electroless plating is copper plating. The preferred thickness of an electroless plating layer is 0.1 to 5 μm. This thickness range is selected because the layer can be dissolved and removed by etching without adversely affecting the function of the electroplated conductor layer to be subsequently constructed.

This electroless plating procedure is not essential but may be omitted.

(7) A plating resist is disposed on the electroless plated layer formed in the above step (6).

This plating resist is formed by laminating a photosensitive dry film and carrying out the light exposure and development.

(8) Then, using the electroless plated film as a plating bar, electroplating is performed to provide a conductor circuit in a sufficient thickness. The preferred thickness of this electroplated metal layer is 5 to 30 μm.

(9) After formation of said electroplated metal layer, the plating resist is stripped off and the electroless plated metal film and said metal layer under the plating resist are dissolved and removed by etching to provide a discrete conductor circuit.

The etching solution which can be used includes but is not limited to an aqueous sulfuric acid-hydrogen peroxide solution, an aqueous solution of a persulfate, e.g. ammonium persulfate, sodium persulfate, potassium persulfate or the like, an aqueous solution of ferric chloride or cupric chloride, hydrochloric acid, nitric acid and hot dilute sulfuric acid.

(10) Where necessary, on the surface of the above upper-layer conductor circuit, a thin metal layer composed of at least one metal selected from among metals of the $4^{th}$ through $7^{th}$ periods in Group 4A to Group 1B of the long-form periodic table, Al and Sn is formed by plating, PVD or CVD and the above sequence of steps (2) to (9) is repeated. Finally, solder resist layers and solder vamps are formed to provide a multilayered printed circuit board.

While the above description pertains to the construction of conductor circuits by the semi-additive process, the full-additive process may be likewise employed.

The multilayer printed circuit board according to the fifth group of the present invention comprises a resin insulating layer and the corresponding conductor circuit as built up on both sides of the substrate board, and further comprises a metal layer composed of at least one metal selected from among metals (exclusive of Cu) of the $4^{th}$ through $7^{th}$ periods in Group 4A to Group 1B of the periodic table of the elements, Al and Sn as formed on the surface of said resin insulating layer and an upper-layer conductor circuit as constructed further on said metal layer.

Since the metal constituting said metal layer has a high adhesion to the insulating resin, the resin insulating layer can obtain a firm adhesion to the upper-layer conductor circuit without providing a roughened layer on the surface thereof. As a result, the resin insulating layer presents with a flat and level surface and the surface of the conductor circuit also becomes flat so that no signal conduction delay occurs even when high-frequency signals are used.

Unlike a ceramic substrate and a metal substrate, a resin substrate is liable to undergo warpage and so poor in heat radiation that a migration of copper ions due to heat accumulation tends to take place. However, the above-mentioned transition metal constituting said metal layer according to this invention is harder than copper and the metal layer composed of such a metal inhibits expansion and shrinkage of the interlayer resin insulating layer. Moreover, because such a metal layer is constructed on both sides of the resin substrate, the warping and cracking of the substrate board under the condition of the heat cycle test can be prevented and, in addition, this metal layer serves as a barrier to the migration of copper ions from the copper conductor circuit, thus promising an effective layer to layer insulation even in a highly humid environment.

Moreover, a Cu layer may be disposed on said transition metal film. When the conductor circuit to be formed thereon is of copper, such a Cu layer improves the adhesion between the transition metal and the conductor circuit.

In the multilayer printed circuit board according to the fifth group of the present invention, the metal constituting said metal layer is at least one transition metal selected from among Al, Fe, W, Mo, Sn, Ni, Co, Cr, Ti and noble metals. The preferred noble metals are Pd, Au and Pt.

The thickness of the metal layer composed of said transition metal is preferably 0.02 µm to 0.2 µm. The reason is as follows. When the thickness is not less than 0.02 µm, a good adhesion can be established between the resin insulating layer and the conductor circuit. On the other hand, when the thickness is not over 0.2 µm, cracking due to the stress applied in the formation of the metal layer by a sputtering technique can be prevented and, moreover, the metal layer among the conductor circuits which has become unnecessary after construction of the conductor circuit can be easily dissolved and removed by etching.

The thickness of the Cu layer to be formed on said transition metal layer is preferably 0.02 to 0.2 µm. Thus, when the thickness is not less than 0.02 µm, a good adhesion can be obtained between the transition metal layer and the conductor circuit. On the other hand, when the thickness is not more than 0.2 µm, cracking due to the stress applied in the formation of the metal layer by a sputtering technique can be prevented and, moreover, the Cu layer among the conductor circuits which has become unnecessary after construction of the conductor circuit can be easily dissolved and removed by etching.

On the above metal layer, a metal layer of a different sort is preferably provided as necessary. More particularly, when a nickel layer is first formed on the resin insulating layer and a copper layer is then formed in superimposition, the incidence of bare spots in the construction of a conductor circuit can be prevented.

The metal layer mentioned above is formed by electroless plating, electroplating, sputtering, physical vapor deposition or CVD.

Unlike the ceramic substrate and metal substrate, the resin substrate for use in the fifth group of the present invention is generally liable to undergo warping and, moreover, poor in heat radiation efficiency so that the migration of copper ions due to heat accumulation tends to take place. In this respect, according to this fifth group of the invention, metal layer serves as a barrier to the migration of copper ions from the copper conductor circuit, thus insuring a good layer to layer insulation even in a highly humid environment.

The interlayer resin insulating layer in the fifth group of the present invention is preferably formed from a thermosetting resin, a thermoplastic resin or a mixed resin thereof.

The preferred thermosetting resin is at least one member selected from the group consisting of thermosetting polyolefin resin, epoxy resin, polyimide resin, phenolic resin and bis(maleimide)triazine resin.

The preferred thermoplastic resin is at least one member selected from among engineering plastics such as polymethylpentene (PMP), polystyrene (PS), polyethersulfone (PES), polyphenylene ether (PPE), polyphenylene sulfide (PPS), etc.

In the fifth group of the present invention, said interlayer resin insulating layer is most preferably formed from the same polyolefin resin as mentioned for the first group of the present invention.

The polyolefin resins described above show high adhesion to conductor circuits so that a conductor circuit can be constructed without roughening the surface of the resin insulating layer. Thus, a conductor circuit can be directly formed on the surface of the smooth resin insulating layer.

Furthermore, said polyolefin resins have dielectric constant values not more than 3 and dielectric loss tangent values not more than 0.05, both being lower than the corresponding values of epoxy resin, with the result that there is no signal conduction delay even when high-frequency signals are carried. Moreover, those polyolefin resins are comparable to epoxy resin in heat resistance so that no stripping of the conductor circuit occurs even at the solder melting temperature. In addition, because of their high fracture rigidity, there is no risk for cracks originating from the interface between the conductor circuit and the resin insulating layer under the conditions of the heat cycle test.

An exemplary process for manufacturing a multilayer printed circuit board according to the fifth group of the present invention is now described.

(1) First, a circuit board comprising a resin substrate board and, as disposed on the surface thereof, an inner copper pattern is prepared.

For this preparation, the same procedure as described for the first and second groups of the invention can be used.

(2) Then, a resin insulating layer is formed on both sides of the circuit board as prepared in the above step (1). This resin insulating layer functions as an interlayer resin insulating layer of the multilayer printed circuit board.

This resin insulating layer can be provided either by coating with an uncured resin solution or by hot-press lamination of a resin film.

(3) Then, the resin insulating layer thus formed is provided with openings in order to ensure electrical connection to the lower-layer conductor circuit.

Formation of the openings is performed by irradiation with laser light. The laser which can be used includes but is not limited to the $CO_2$ laser, UV laser and eximer laser. When a $CO_2$ laser is used for the formation of said openings, desmear treatment is performed as an after-treatment. This desmear treatment can be carried out using an oxidizing agent comprising an aqueous solution of chromic acid or an aqueous permanganate solution. A treatment with oxygen plasma, $CF_4$-oxygen mixed plasma or corona discharge can also be used. Surface modification by UV irradiation using a low-pressure mercury-vapor lamp is also useful.

Particularly the $CF_4$-oxygen mixed plasma treatment is advantageous in that hydrophilic groups such as hydroxyl and carbonyl groups can be introduced onto the resin surface and, hence, the subsequent CVD or PVD treatment will be facilitated.

(4) On the surface of the resin insulating layer formed with openings in the above step (3), a thin metal layer composed of at least one metal selected from among metals of the $4^{th}$ through $7^{th}$ periods in Group 4A through Group 1B is formed by, for example, a plating, PVD or CVD technique.

Specific procedures for PVD and CVD may be those described hereinbefore for the first group of the present invention.

(5) Then, on the metal layer formed in the above step (4), another metal layer similar to the electroless plated metal layer to be formed in the next step is formed by, for example, sputtering. This procedure is intended to improve the affinity for the electroless plated metal layer. More particularly, a copper layer is preferably formed by sputtering.

(6) The metal layer formed in the above step (5) is further electroless plated.

The optimum kind of electroless plating is copper plating. The preferred thickness of electroless plating is 0.1 to 5 μm. This thickness range is selected because the layer can be dissolved and removed by etching without adversely affecting the function of the electroplated conductor layer to be subsequently constructed.

(7) A plating resist is then disposed on the electroless plated layer formed in the above step (6). This plating resist can be formed by laminating a photosensitive dry film and carrying out the light exposure and development.

(8) Then, using the electroless plated film as a plating bar, electroplating is performed to provide a conductor circuit in a sufficient thickness. The preferred thickness of this electrolated metal layer is 5 to 30 μm.

(9) Then, the plating resist is stripped off and the electroless plated film and said metal layer composed of at least one metal selected from among metals of the $4^{th}$ through $7^{th}$ periods in Group 4A through Group 1B under the plating resist are dissolved and removed by etching to provide a discrete conductor circuit.

The etching solution which can be used includes but is not limited to an aqueous sulfuric acid-hydrogen peroxide solution, an aqueous solution of a persulfate, e.g. ammonium persulfate, sodium persulfate, potassium persulfate or the like, an aqueous solution of ferric chloride or cupric chloride, hydrochloric acid, nitric acid and hot dilute sulfuric acid.

(10) Where necessary, on the surface of the conductor circuit, a thin metal layer composed of at least one metal selected from among metals of the $4^{th}$ through $7^{th}$ periods in Group 4A to Group 1B of the long-form periodic table (exclusive of Cu), Al and Sn is formed by plating, PVD or CVD and the above sequence of steps (2) to (9) is repeated to provide a multilayered printed circuit board.

While the above description pertains to the construction of a conductor circuit by the semi-additive process, the full-additive process may be likewise employed.

This full-additive process comprises forming a thin metal layer on the surface of a resin insulating layer by CVD or PVD, laminating a photosensitive dry film or coating a liquid photosensitive resin, carrying out light exposure and development to dispose a plating resist and carrying out electroless plating to a sufficient thickness to provide a conductor circuit.

As an alternative, a conductor circuit can be constructed by disposing a plating resist on the surface of a resin insulating layer, forming a thin metal layer by a CVD or PVD technique, sanding off this metal layer adherent to the surface of the plating resist or removing the plating resist itself and, using this metal layer as catalyst, performing electroless plating.

The multilayer printed circuit board according to the six group of the present invention comprises a metal layer composed of at least one metal selected from among metals (exclusive of Cu) of the $4^{th}$ through $7^{th}$ periods in Group 4A to Group 1B of the long-form periodic table of the elements, Al and Sn is disposed on at least part of the surface of the lower-layer conductor circuit formed on both sides of a resin substrate board.

The metal mentioned above is preferably selected from among Al, Fe, W, Mo, Sn, Ni, Co, Cr, Ti and noble metals, and the preferred noble metals are Pd, Au and Pt.

All the above metals provide good adhesion to the interlayer insulating resin. Therefore, even when warpage occurs in the resin substrate, no delamination is induced between the conductor circuit and the interlayer resin insulating layer. Moreover, since such structures as above are formed symmetrically on both sides of the resin substrate, the amount of warpage of the substrate itself is decreased to prevent cracking which might occur around the interface between the conductor circuit and the interlayer resin insulating layer even when it undergoes the heat cycle tests.

Furthermore, when a metal layer composed of the above-mentioned metal is formed, the required degree of adhesion to the upper-layer conductor circuit can be insured even without roughening the surface of the conductor circuit, with the result that no conduction delay occurs even when high-frequency signals are carried.

When the conductor circuit is formed by etching, said metal layer acts as an etching resist, thus contributing to the formation of a fine pattern.

The thickness of the metal layer mentioned above is preferably 0.01 μm to 0.2 μm. The reason is as follows. When the thickness is not less than 0.01 μm, a good adhesion can be obtained between the resin insulating layer and the conductor circuit. On the other hand, when the thickness is not over 0.2 μm, cracking due to the stress of formation of the metal layer by sputtering can be prevented and, moreover, the metal layer among the conductor circuits which has become unnecessary after construction of the conductor circuit can be easily dissolved and removed by etching.

On the above metal layer, a metal layer composed of a different kind of metal may be provided as necessary. More particularly, when a nickel layer is first formed on the interlayer resin insulating layer and a copper layer is then formed in superimposition, the incidence of bare spots in the construction of a conductor circuit can be prevented. The metal layer mentioned above is formed by electroless plating, electroplating, sputtering, vapor deposition or CVD.

Unlike the ceramic substrate or the metal substrate, the resin substrate for use in the sixth group of the present invention is generally liable to undergo warping and, moreover, poor in heat radiation factor so that the migration of copper ions due to heat accumulation tends to take place. In this respect, the metal layer in this invention serves as a barrier to the migration of copper ions from the copper conductor circuit, thus insuring a good layer to layer insulation even in a highly humid environment.

The interlayer resin insulating layer in the sixth group of the present invention is preferably formed from a thermosetting resin, a thermoplastic resin or a mixed resin thereof.

The preferred thermosetting resin is at least one member selected from the group consisting of thermosetting polyolefin resin, epoxy resin, polyimide resin, phenolic resin and bis(maleimide)triazine resin.

The preferred thermoplastic resin is at least one member selected from among the so-called engineering plastics such as polymethylpentene (PMP), polystyrene (PS), polyethersulfone (PES), polyphenylene ether (PPE), polyphenylene sulfide (PPS), etc.

In this invention, said interlayer resin insulating layer is most preferably formed from the same polyolefin resin as mentioned for the first group of the present invention.

The polyolefin resin mentioned above provides for good adhesion to the conductor circuit even without roughening the surface of the inner-layer conductor circuit so that a flat and level conductor circuit can be provided.

Furthermore, said polyolefin resins have dielectric constant values not less than 3 and dielectric loss tangent values not more than 0.05, both being lower than the corresponding values of epoxy resin, with the result that there is no signal conduction delay even when high-frequency signals are used. Moreover, those polyolefin resins are comparable to epoxy resin in heat resistance so that no stripping of the conductor circuit occurs even at the solder melting temperature. In addition, because of their high fracture rigidity, there is no risk for cracks originating from the interface between the conductor circuit and the resin insulating layer under the conditions of the heat cycle test.

An exemplary process for manufacturing a multilayer printed circuit board according to the sixth group of the present invention is now described.

(1) First, a circuit board comprising a resin substrate board and, as disposed on the surface thereof, an inner-layer copper pattern is prepared.

For this preparation, the same procedure as described for the first and second groups of the present invention can be used.

(2) Then, a resin insulating layer is formed on both sides of the circuit board as prepared in the above step (1). This resin insulating layer functions as an interlayer resin insulating layer of the multilayer printed circuit board.

This resin insulating layer can be provided either by coating with an uncured resin solution or by hot-press lamination of a resin film.

(3) Then, the resin insulating layer thus formed is provided with openings to insure an electrical connection to the lower-layer conductor circuit.

Formation of said openings is performed by irradiation with laser light. The laser which can be used includes but is not limited to the $CO_2$ laser, UV laser and eximer laser. When a $CO_2$ laser is used for the formation of said openings, desmear treatment is performed as an after-treatment. This desmear treatment can be carried out using an oxidizing agent comprising an aqueous solution of chromic acid or an aqueous permanganate solution. A treatment with oxygen plasma, $CF_4$-oxygen mixed plasma or corona discharge can also be used. Surface modification by UV irradiation using a low-pressure mercury-vapor lamp is also usable.

Particularly the $CF_4$-oxygen mixed plasma treatment is advantageous in that hydrophilic groups such as hydroxyl and carbonyl groups can be introduced onto the resin surface and, hence, the subsequent CVD or PVD treatment will be easy to handle.

(4) On the surface of the resin insulating layer formed with openings in the above step (3), a thin metal layer composed of at least one metal selected from among metals (exclusive of Cu) of the $4^{th}$ through $7^{th}$ periods in Group 4A through Group 1B, Al and Sn is formed by, for example, a plating, PVD or CVD technique.

Specific procedures of PVD and CVD may be those described hereinbefore for the first group of the present invention.

(5) Then, on the metal layer formed in the above step (4), a metal layer similar to the electroless plated layer to be formed in the next step is formed by, for example, sputtering. This procedure is intended to improve the affinity for the electroless plated metal layer. More particularly, a copper layer is preferably formed by sputtering.

(6) Electroless plating is performed on the metal layer formed in the above step (5).

The optimum kind of electroless plating is copper plating. The preferred electroless plating thickness is 0.1 to 5 µm. This thickness range is selected because the layer can be dissolved and removed by etching without adversely affecting the function of the electroplated conductor layer to be subsequently constructed.

This electroless plated metal layer and/or the said thin metal layer composed of at least one metal selected from among metals (exclusive of Cu) of the $4^{th}$ through $7^{th}$ periods in Group 4A to Group 1B, Al and Sn serves as plating bar.

(7) A plating resist is disposed on the electroless plated metal layer formed in the above step (6). This plating resist is formed by laminating a photosensitive dry film and carrying out the light exposure and development.

(8) On the electroless plated metal layer subjected to the procedure described in the above step (7), a metal layer composed of at least one metal selected from among metals (exclusive of Cu) of the $4^{th}$ through $7^{th}$ periods in Group 4A to Group 1B, Al and Sn is formed by said plating, PVD or CVD technique.

It is particularly preferable that the formation of said metal layer in this step be carried out by electroless plating.

Then, using said electroless plated metal layer and said metal layer as the plating bar, electroplating is performed to provide a conductor circuit in a sufficient thickness. The thickness of the electroplated metal layer formed by this treatment is preferably 5 to 30 µm.

(9) Then, said plating resist is stripped off and the electroless plated metal film and said metal layer under the plating resist are dissolved and removed by etching to provide a discrete conductor circuit. The etching solution which can be used in this step includes but is not limited to an aqueous sulfuric acid-hydrogen peroxide solution, an aqueous solution of a persulfate, e.g. ammonium persulfate, sodium persulfate, potassium persulfate or the like, an aqueous solution of ferric chloride or cupric chloride, hydrochloric acid, nitric acid and hot dilute sulfuric acid.

In this etching treatment, said metal layer serves as an etching resist so that even a discrete conductor circuit with an L/S value of 15/15 µm (L/S means line/space) can be provided.

(10) Where necessary, on the surface of said conductor circuit, a thin metal layer composed of said metal is formed by plating, PVD or CVD and the above sequence of steps (2) to (9) is repeated to provide a double-sided multilayered printed circuit board.

While the above description pertains to the construction of conductor circuits by the semi-additive process, the full-additive process may be likewise employed.

This full-additive process comprises forming a thin metal layer on the surface of a resin insulating layer by CVD or PVD, laminating a photosensitive dry film or coating a liquid photosensitive resin, carrying out light exposure and development to dispose a plating resist and carrying out electroless plating to a sufficient thickness to provide a conductor circuit.

As an alternative, a conductor circuit can be constructed by disposing a plating resist on the surface of a resin insulating layer, forming a thin metal layer by a CVD or PVD technique, removing by abrasion or the like this metal layer adherent to the surface of the plating resist or stripping off the plating resist itself and, using this metal layer as catalyst, performing electroless plating.

The process for fabricating a conductor circuit according to the first invention of the seventh group of the present invention comprises at least the following steps (1) through (3), namely (1) a step of forming a first conductor layer composed of a metal forming a passivation film on the surface thereof, such as Ni or Al, on an insulating substrate board, (2) a step of forming a second conductor layer composed of a metal having the ionization tendency lower than said metal forming a passivation film on surface, such as Ni or Al, on said first conductor layer and (3) performing selective etching with an acid etching solution to simultaneously etching said first conductor layer and second conductor layer in specified regions.

In the above process for fabricating a conductor circuit, etching results in dissolution of the metal having the ionization tendency lower than the metal forming a passivation film on surface in the first place so that the metal forming a passivation film on surface, such as Ni or Al, is exposed on the surface. As the metal forming a passivation film on surface, such as Ni or Al, is thus exposed on the surface, this metal and the metal having a lower ionization tendency undergo a cell reaction with the acid etching solution acting as electrolyte, with the result that the metal forming a passivation film, e.g. Ni or al, is dissolved.

Therefore, said acid etching solution may be an aqueous solution of sulfuric acid, an aqueous solution of hydrogen chloride or a mixed aqueous sulfuric acid-hydrogen peroxide solution and it is not necessary to use an acid not suited for a high-production run, such as aqua regia or nitric acid.

Furthermore, the use of said acid etching solution contributes to a higher etching rate than ever before.

In the invention of the seventh group, the metal forming a passivation film on surface is preferably at least one metal selected from among Ni, Co, Cr, Ti, Nb, Ta and Al.

This is because those are ready to form a passivation film and not soluble in the ordinary acid etching solution.

The particularly preferred metal forming a passivation film on surface includes Ni and Al, for those metals show good adhesion to resins and are most suited for use for constructing the conductor circuit of the printed circuit board.

This invention is now described in further detail, reference being had to the accompanying drawings. The following description is pertinent to the case in which Ni or Al is used as said metal forming a passivation film on surface.

Figure 28:
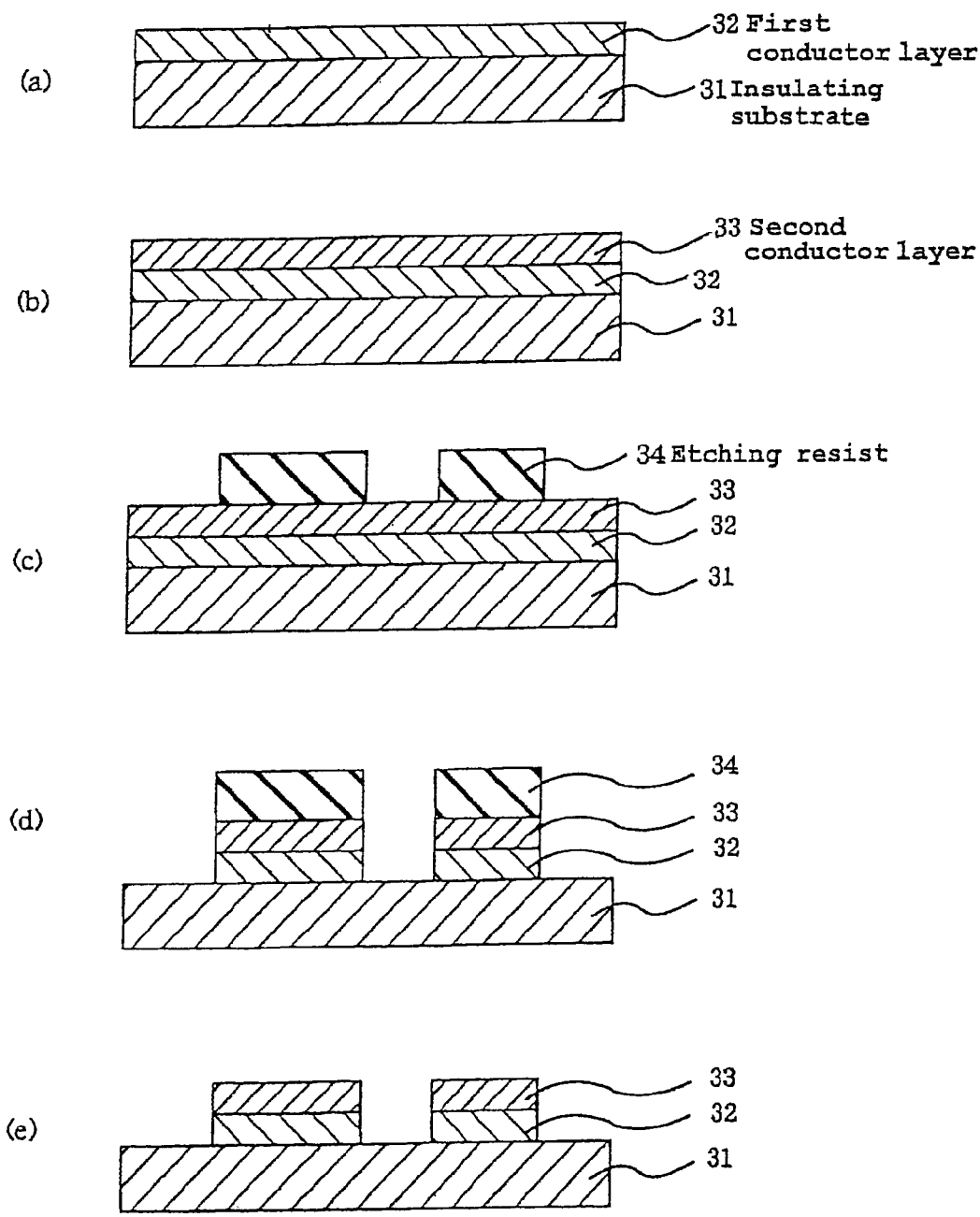
FIG. 28 (a) through (e) are cross-section views showing parts of a process for construction of the conductor circuit according to the seventh group of the present invention.

FIG. 28 (a) to (e) are schematic cross-section views showing the steps constituting the process for constructing a conductor circuit in accordance with this invention.

In the seventh group of the present invention, a first conductor layer 32 composed of Ni or Al is formed on an insulating substrate board 31 in the first place [FIG. 28(a)].

The material for said insulating substrate board 31 is not particularly restricted but includes substrate boards made of inorganic materials, such as ceramic boards, and substrate boards made of organic materials, such as resin boards. However, this invention is chiefly directed to the use of a resin substrate because the invention provides for a conductor layer with good adhesion to a resin board when it is poor in the adhesion to a conductor layer formed.

The technique of forming said first conductor layer 32 is not particularly restricted but includes vapor deposition techniques and plating, among others. However, vapor deposition, particularly sputtering, is preferred because it is conducive to formation of a conductor layer showing good adhesion to a resin substrate. When the first conductor layer 32 is to be constructed by sputtering, the procedure is preferably carried out in an inert gas atmosphere under reduced pressure so that the first conductor layer 32 once formed will not be oxidized.

Then, on the first conductor layer 32 formed on said insulating substrate board 31, a second conductor layer 33 composed of a metal having the ionization tendency lower than Ni or Al is constructed [FIG. 28(b)].

The metal having the ionization tendency lower than Ni includes but is not limited to Cu, Sn and Pb. Those metals may be used each alone or in combination. Thus, a layer composed exclusively of such a metal may be formed or alternatively a plurality of layers of such metals may be disposed.

The metal having the ionization tendency lower than Al includes but is not limited to Cu, Sn, Pb and Fe. Those metals may also be used each alone or in combination.

The technique of forming the second conductor layer 33 is not particularly restricted, either, but includes vapor deposition and plating, among others. However, the use of the same technique as used above facilitates the construction of a conductor layer. Thus, it is preferable to use the same technique as used in the construction of the first conductor layer 32. In other words, both the first conductor layer 32 and the second conductor layer 33 are constructed by the same vapor deposition technique, such as sputtering.

In order that the first conductor layer 32 will not be oxidized in the formation of the second conductor layer 33, the latter layer is preferably constructed as quickly as possible after construction of the former layer 32 avoiding exposure of the layer 32 to atmospheric air.

After the construction of the second conductor layer 33, selective etching is performed with an acid etching solution to simultaneously etching the first conductor layer 32 and second conductor layer 33 in specified regions to construct a conductor circuit.

The method for selective etching is not particularly restricted but may, for example, comprise disposing an etching resist on the above two-component conductor layer and etching the regions not covered with the etching resist to provide a conductor circuit. An alternative method may comprise disposing a plating resist, thickening the conductor layer not covered with the plating resist by, for example, electroplating, stripping off the plating resist and etching the conductor layer under the plating resist to provide a conductor circuit.

In the following description, the former method is employed. The latter method will be described in detail in connection with the process for manufacturing a printed circuit board.

Thus, using a photolithographic technique, an etching resist 34 is constructed on the second conductor layer 33 in the first place [FIG. 28(c)]. Then, the region not covered with the etching resist 34 is dissolved and removed by etching to provide a conductor circuit.

This etching treatment can be carried out using an acid etching solution.

The acid etching solution mentioned just above includes easily-manageable etching solutions which are generally used, for example an aqueous solution of sulfuric acid, an aqueous solution of hydrogen chloride or a mixed aqueous sulfuric acid-hydrogen peroxide system.

Assuming that the first conductor layer 32 is an Ni layer, the second conductor layer 33 is a Cu layer, and the etching solution is an aqueous sulfuric acid-hydrogen peroxide system, etching proceeds in the following manner.

First, according to the following chemical formulas (1) and (2), the Cu layer is dissolved and removed by etching.

$$Cu + H_2O_2 \rightarrow CuO + H_2O \quad (1)$$

$$CuO + H_2SO_4 \rightarrow Cu^{2+} + SO_4^{2-} + H_2O \quad (2)$$

As the Cu layer is dissolved and removed by etching to expose the Ni layer, the etching of Ni layer begins.

When the layer composed exclusively of Ni is etched, the reaction may proceed according to the following chemical formulas (3) and (4).

$$Ni + H_2O_2 \rightarrow NiO + H_2O \quad (3)$$

$$NiO + H_2SO_4 \rightarrow Ni^{2+} + SO_4^{2-} + H_2O \quad (4)$$

Actually, however, the reaction between the NiO originating from the above formula (3) and $H_2SO_4$, that is to say the reaction according to the formula (4), does not proceed appreciably so that the Ni layer is covered with an oxide film and, therefore, substantially not etched.

On the other hand, in the present invention wherein the conductor layer has a binary structure composed of a Cu layer and a Ni layer, an electric cell is formed by the Cu layer as cathode and the Ni layer as anode, with the result that the reactions according to the following formulas (5) and (6) take place and proceed.

$$Cu^{2+} \rightarrow Cu \quad (5)$$

$$Ni \rightarrow Ni^{2+} \quad (6)$$

As to Cu, the oxidation reaction (ionization reaction) due to said etching and the reduction reaction due to the cell formed as above proceed reversibly but because the ionization tendency of Ni is higher than that of Cu, only the irreversible reaction from Ni metal to Ni ion proceeds so that Ni dissolves in the solution and etching is proceeded. Moreover, since this reaction does not involve formation of an oxide, it does not happen that Ni is passivated to stop the reaction but the reaction proceeds to an end for complete etching [FIG. 28(d)].

Then, the etching resist is stripped off, whereupon a conductor circuit comprising the first conductor layer 32 and second conductor layer 33 is obtained on the insulating substrate board 31 [FIG. 28(e)].

Since, in the process for constructing a conductor circuit according to the seventh group of the present invention, the second conductor layer 33 composed of a metal having the ionization tendency lower than Ni or Al is formed on the first conductor layer 32 composed of Ni or Al so that said selective etching can be easily carried out using an easily manageable acid solution such as an aqueous solution of hydrogen chloride. Moreover, as the first conductor layer 32 of Ni or Al is first formed on the insulating substrate board 31, a flat and level conductor circuit with good adhesion to the substrate can be formed particularly when the insulating board 31 is a resin board.

The process for manufacturing a multilayer printed circuit board according to the second invention belonging to the seventh group of the present invention is now described.

In this process for manufacturing a multilayer printed circuit board according to the second invention of the seventh group, a resin insulating layer and a conductor circuit are built up in succession on an insulating substrate board, which comprises at least the following steps [1] to [5], namely [1] a step of forming a first conductor layer composed of a metal forming a passivation film on surface, such as Ni or Al, on a resin insulating layer, [2] a step of forming a second conductor layer composed of a metal having the ionization tendency lower than said metal forming a passivation film on surface, such as Ni or Al, on said first conductor layer, [3] a step of disposing a plating resist on said second conductor layer, [4] a step of forming a third conductor layer by electroplating on said second conductor layer carrying said plating resist and [5] a step of striping off the plating resist and, using an acid etching solution, etching the first conductor layer and second conductor layer under said plating resist simultaneously.

The metal having the ionization tendency lower than said metal forming a passivation film on surface and the acid etching solution, which are for use in the process for manufacturing a multilayer printed circuit board according to the second invention belonging to the seventh group of the present invention, may be quite the same metal and etching solution as mentioned for the above-described process for constructing a conductor circuit.

Furthermore, etching in the above step (5) proceeds according to the same reactions as mentioned above for the process for constructing a conductor circuit, and the first conductor layer and second conductor layer under the plating resist are simultaneously dissolved and removed by etching.

The process for manufacturing a multilayer printed circuit board according to the second invention of the seventh group may be carried out by using a resin substrate on which a conductor circuit has been directly formed and building up a resin insulating layer and a conductor circuit in that order each in a single layer or in a plurality of layers over the first-mentioned conductor circuit. As an alternative, it is possible to use a resin substrate not formed with a conductor circuit and construct a resin insulating layer and a conductor circuit in that order each in a single layer or in a plurality of layers. Moreover, said resin insulating layer and said conductor circuit may be built up only on one side of the resin substrate board or on both sides.

A typical procedure for carrying out the process for manufacturing a multilayer printed circuit board according to the second invention of the seventh group is now described in detail.

(1) First, a circuit board comprising a resin substrate board and, as formed on the surface thereof, a lower-layer conductor circuit (inner copper pattern) is provided.

This fabrication of the circuit board can be carried out by the same procedure as described for the inventions of the first and second groups.

(2) Then, a resin insulating layer is formed on both sides of the circuit board prepared in the above step (1). This resin insulating layer functions as an interlayer resin insulating layer of the multilayer printed circuit board.

Preferably this resin insulating layer is composed of a thermosetting resin, a thermoplastic resin or a mixed resin thereof.

The preferred thermosetting resin is preferably one member selected from the group consisting of thermosetting polyolefin resins, epoxy resins, polyimide resins, phenolic resins and bis(maleimide)triazine resins.

The preferred thermoplastic resin is preferably selected from among engineering plastics such as polymethylpentene (PMP), polystyrene (PS), polyethersulfone (PES), polyphenylene ether (PPE), polyphenylene sulfide (PPS), etc.

(3) Then, this resin insulating layer (hereinafter referred to as the interlayer resin insulating layer) is provided with openings for via holes for securing an electrical connection to the lower-layer conductor circuit.

When a photosensitive resin is used, said openings for via holes are pierced in the above-mentioned interlayer resin insulating layer by light exposure and development and thermal curing. When a thermosetting resin or a polyolefin resin is used, said openings are pierced by means of laser light.

The laser for use in this laser processing includes but is not limited to the carbon dioxide gas laser, ultraviolet laser and eximer laser.

(4) Then, as the above-mentioned step [1], a first conductor layer composed of a metal forming a passivation film on surface, e.g. Ni or Al, is formed on the resin insulating layer.

The technique of forming this first conductor layer is not particularly restricted but sputtering in an inert gas atmosphere under reduced pressure is preferred. The preferred thickness of said first conductor layer is 0.01 to 0.5 µm.

In this manner, a flat and level first conductor layer showing good adhesion to the resin insulating layer can be constructed on said resin insulating layer.

(5) Then, as said step [2], a second conductor layer composed of a metal having the ionization tendency lower than said metal forming a passivation film on surface, such as Ni or Al, is formed on said first conductor layer.

The technique of forming this second conductor layer is not particularly restricted, either, but sputtering in an inert gas atmosphere under reduced pressure is preferred. The preferred thickness of said second conductor layer is 0.05 to 1.0 µm.

(6) As said step (3), a plating resist is disposed on the second conductor layer formed in the above step (5).

The technique of disposing said plating resist is not particularly restricted but generally the resist is formed by laminating a photosensitive dry film and carrying out light exposure and development.

(7) Then, as said step (4), a third conductor layer is formed by electroplating using the electroless plated layer as a plating bar to thicken the conductor circuit. The preferred thickness of this third conductor layer (electroplated copper layer) is 5 to 30 µm.

(8) After completion of the third conductor layer, said step (5) is carried out. Thus, the plating resist is stripped off and the second conductor layer and first conductor layer beneath the plating resist are dissolved and removed by etching with an acid etching solution to provide a discrete conductor circuit.

The acid etching solution that can be used for this purpose includes easily manageable acid solutions such as an aqueous solution of sulfuric acid, an aqueous solution of hydrogen chloride and a mixed aqueous solution of sulfuric acid and hydrogen peroxide.

(9) Where necessary, an Ni layer is formed on the surface of the conductor circuit by plating, physical vapor deposition (PVD) or chemical vapor deposition (CVD) and, then, the above sequence of steps (2) to (8) is repeated to provide a multilayer printed circuit board.

The process for forming a metal film according to the first invention of the eighth group comprises removing the oxide film on the surface of the nickel film with an aqueous reducing acid solution of 2.0 to 10.0 M/L concentration and, then, forming a different metal film on the surface of said nickel film.

According to this constitution of the first invention of the eighth group, the oxide film formed on the surface of the nickel film can be thoroughly removed using a reducing acid in the above concentration range, therefore, when another metal film is formed thereon, the two metal layers directly contact each other without interposition of an oxide film, as a result that a conductor circuit comprising conductor layers with good mutual adhesion can be constructed.

The above-mentioned nickel film may have been formed on an insulating substrate or a metal layer. The material for said insulating substrate is not particularly restricted but may be a substrate made of an inorganic material, such as a ceramic board, or a substrate made of an organic material, such as a resin board. The metal layer mentioned just above may for example be a conductor circuit made of copper.

The technique of forming said nickel film is not particularly restricted but includes vapor deposition and plating, among others. The oxide film tends to form on the surface of the nickel film when the nickel film once formed is exposed to the atmospheric air or an oxidizing atmosphere. Therefore, this invention can be applied with advantage in such cases to thoroughly remove the surface oxide film with an aqueous reducing acid solution of the above-mentioned concentration.

The area on which the nickel film is formed is not particularly restricted but the nickel film may have been formed directly on an insulating substrate or on another metal film. Moreover, the nickel film may have been formed after construction of one or more metal films and a resin insulating layer on an insulating board.

As said another metal layer to be formed on the nickel film, a Cu—Ni—P alloy roughened layer or a gold layer can be mentioned.

The aqueous reducing acid solution mentioned above is not particularly restricted but may for example be hydrochloric acid or hydrofluoric acid. From the standpoint of the ease of handling, hydrochloric acid is preferred.

Incidentally, the oxide film formed on said nickel film can hardly be removed by the oxidizing acid usually employed for removal of oxide films, such as sulfuric acid, phosphoric acid, etc.

The concentration of the reducing acid in said aqueous reducing acid solution is 2.0 to 10.0 mol/L.

If the concentration of the reducing acid is less than 2.0 mol/L, thoroughly removing the oxide film on the nickel film may be difficult. When, conversely, the limit of 10.0 mol/L is exceeded, the nickel film dissolves so that removing the oxide film cannot be performed.

The preferred concentration of the reducing acid in said aqueous reducing acid solution is 4.0 to 6.0 mol/L.

The preferred temperature of said aqueous reducing acid solution is 20 to 40° C. and the duration of contact of the aqueous reducing acid solution with the nickel film is preferably 1 to 5 minutes.

If the temperature of said aqueous reducing acid solution is below 20° C., the oxide film may not be easily removed thoroughly. If the limit of 40° C. is exceeded, the nickel film will dissolve so that removing the oxide film cannot be performed.

If the duration of immersion in said aqueous reducing acid solution is less than 1 minute, the oxide film may not be thoroughly removed, while the film may be thoroughly removed by immersion of 5 min. Therefore, any longer immersion time in excess of 5 minutes will not be efficient.

The kind of said another metal to be deposited on the nickel film from which the surface oxide film has been removed is not particularly restricted but includes alloys of nickel with other metals, such as Cu—Ni—P alloy, Au and Cu.

The technology of this invention can be applied to any process including a step of forming another metal layer which is liable to form an oxide film on said nickel layer, e.g. for the construction of a Cu—Ni—P alloy roughened layer after formation of a nickel layer over a conductor circuit in the roughening step in the under-described process for manufacturing a printed circuit board or the construction of an Au film on a nickel film as the metal layer for construction of solder vamps in the stage preceding the provision of solder vamps.

The process for manufacturing a multilayer printed circuit board according to the second invention of the eighth group is now described in detail.

The process for manufacturing a multilayer printed circuit board according to the second invention of the eighth group is a process comprising (1) a step of forming an interlayer resin insulating layer on a substrate board carrying a lower-layer conductor circuit and piercing openings for via holes in said interlayer resin insulating layer, (2) a step of forming a metal film on said interlayer resin insulating layer, (3) a step of disposing a plating resist on said metal film, (4) a step of performing electroplating and further depositing nickel to form an electroplated metal film and, a nickel film in the regions not covered by said plating resist, (5) removing said plating resist and etching said metal film under said plating resist to provide an upper-layer conductor circuit and via holes, and (6) a step of forming a Cu—Ni—P alloy having a roughened layer on said upper-layer conductor circuit, and comprises, after completion of said step (5), the oxide film formed on said nickel film is removed with an aqueous reducing acid solution having a concentration of 2.0 to 10.0 mol/L.

In the above process according to the eighth group of the present invention, the oxide film on said nickel film can be thoroughly removed with a reducing acid of said concentration so that, when the Cu—Ni—P alloy roughened layer is formed thereon, the two metal layers come into direct contact with each other without interposition of the oxide film so that a roughened layer with good adhesion to the lower-layer nickel film can be provided.

The multilayer printed circuit board according to the second invention of the eighth group can be manufactured by using a resin substrate on which a conductor circuit has been directly formed and building up a resin insulating layer and a conductor circuit in that order each in a single layer or in a plurality of layers over the first-mentioned conductor circuit. As an alternative, it is possible to use a resin substrate not formed with a conductor circuit and build up two or more than one insulating layers and the corresponding number of conductor circuits. Moreover, said resin insulating layer and said conductor circuit may be built up on one side of the resin substrate board or on both sides.

A typical procedure for carrying out the process for manufacturing a multilayer printed circuit board according to the second invention of the eighth group is now described 1.

(1) First, a circuit board comprising a resin substrate board and, as formed on the surface thereof, a lower-layer conductor circuit is provided.

This fabrication of the circuit board can be carried out by the same procedure as described for the inventions of the first and second groups.

(2) Then, a resin insulating layer is formed on both sides of the circuit board comprising lower-layer circuit board in the above step (1). This resin insulating layer functions as an interlayer resin insulating layer in the multilayer printed circuit board.

As the material for use in the construction of said resin insulating layer (hereinafter referred to as the interlayer resin insulating layer), there can be mentioned a thermosetting resin, a thermoplastic resin and a mixed resin composed of them.

In the practice of this invention of the eighth group, an adhesive for electroless plating use is preferably used as said interlayer resin insulating layer. This adhesive for electroless plating use is most preferably a dispersion of a cured acid- or oxidizing agent-soluble heat-resistant resin particle in an uncured hardly acid- or oxidizing agent-soluble heat-resistant resin particle. As the heat-resistant resin particle is dissolved out with an aqueous solution of an acid or oxidizing agent, the adhesive layer is provided with a roughened surface comprising an anchor resembling narrow-necked pots.

Referring to the above-mentioned adhesive for electroless plating use, said cured heat-resistant resin particle, in particular, is preferable in the following: (1) a particle having a mean particle diameter of not greater than 10 μm and/or (2) a particle which comprises a mixture of a particle having a relatively large mean particle diameter and a particle having a relatively small mean particle diameter. This is because anchors of the more intricate profiles can be provided.

The heat-resistant resin that can be used includes but is not limited to epoxy resin, polyimide resin, and a mixed resin or polymer alloy composed of epoxy resin and thermoplastic resin. The thermoplastic resin which can be alloyed includes but is not limited to polyethersulfone (PES). The heat-resistant resin particle soluble in an acid or oxidizing agent includes but is not limited to epoxy resins (particularly the epoxy resin cured with an amine series curing agent is preferred) and amino resins.

(3) Then, the interlayer resin insulating layer is formed with openings for via holes for insuring electrical connection to the lower-layer conductor circuit.

When said adhesive for electroless plating use is employed, said openings for via holes can be pierced by light exposure and development and subsequent thermal curing. When a thermosetting resin is used, said openings for via holes in said interlayer resin insulating layer can be provided by thermal curing and subsequent laser processing.

(4) Then, the surface of said interlayer resin insulating layer is roughened. When said adhesive for electroless plating use is employed, the surface of the layer of an adhesive for electroless plating use is roughened by dissolving out the acid- or oxidizing agent-soluble resin particles on the surface of said interlayer resin insulating layer with an acid or oxidizing agent.

The acid mentioned just above includes inorganic acids such as phosphoric acid, hydrochloric acid, sulfuric acid, etc. and organic acids such as formic acid, acetic acid, etc., although the use of an organic acid is particularly preferred. This is, because when an organic acid is used, the metal conductor layer exposed from the via holes will not be corroded appreciably in the roughening step.

On the other hand, said oxidizing agent is preferably an aqueous solution of chromic acid or an aqueous permanganate (e.g. potassium permanganate) solution.

(5) Then, a catalyst nucleus is applied to the circuit board having a roughened interlayer resin insulating layer.

For this application of catalyst nuclei, it is preferable to use a noble metal ion species or a coloidal noble metal and generally palladium chloride or coloidal palladium is used. For application of the catalyst nuclei, a heat treatment is preferably performed. The most preferred catalyst species is palladium.

(6) Then, the surface of the interlayer resin insulating layer to which the catalyst nuclei have been applied is electroless plated to form an electroless plated metal film over the entire roughened surface. The thickness of this electroless plated metal film is preferably 0.5 to 5 μm.

Then, a plating resist is disposed on this electroless plated metal film.

(7) Then, the area not covered with the plating resist is electroplated in a thickness of 5 to 20 μm to construct an upper-layer conductor circuit and via holes.

Following this electroplating, a nickel film is formed by at least one technique selected from among nickel electroplating, electroless nickel plating and sputtering. This is because a Cu—Ni—P alloy can be easily deposited on such a nickel film. Moreover, the nickel film functions as a metal resist and, hence, precludes overetching in the subsequent etching step.

The electroplating mentioned above is preferably copper electroplating.

The plating resist is then stripped off and the electroless plated metal film under the plating resist is dissolved and removed by etching with an etching solution comprising a sulfuric acid-hydrogen peroxide solution or an aqueous solution of sodium persulfate, ammonium persulfate or the like, whereby a discrete upper-layer conductor circuit is obtained.

(8) Then, the oxide film formed on said electroless plated nickel film is removed with an aqueous reducing acid solution having a concentration of 2.0 to 10.0 mol/L. With said etching solution comprising a sulfuric acid-hydrogen peroxide solution or the like, the oxide film formed on the nickel film cannot be removed.

(9) The substrate board thus stripped of the oxide film was then immersed in a plating solution to form a porous Cu—Ni—P alloy roughened layer over said upper-layer conductor circuit.

(10) Then, on this board, a layer composed of an adhesive for electroless plating use, for instance, is formed as the interlayer resin insulating layer.

(11) The above sequence of steps (3) to (9) is repeated to construct a further upper-layer conductor circuit, whereby a double-sided multilayer printed circuit board comprising 3 layers on either side, thus 6 layers on both sides is obtained.

The multilayer printed circuit board according to the ninth group of the present invention is a multilayered printed circuit board comprising a substrate board formed with a lower-layer conductor circuit and, as successively built up thereon, an interlayer resin insulating layer and an upper-layer conductor circuit alternately, and comprising a metal layer composed of at least one metal selected from among metals having the ionization tendency not lower than tin but not higher than aluminum and noble metals as disposed on the surface of at least said lower-layer conductor circuit (hereinafter referred to merely as "conductor circuit"; since said metal layer may be formed on an upper-layer conductor circuit, the term "conductor circuit" is used hereinafter to denote both said lower-layer conductor circuit and such upper-layer conductor circuit unless otherwise specified) and a roughened layer composed of Cu—Ni—P alloy, for instance, as disposed further on said metal layer.

In the above constitution of the ninth group of the present invention, a metal layer composed of at least one metal selected from among metals having the ionization tendency not lower than tin but not higher than aluminum and noble metals is disposed on the surface of said conductor circuit, with the result that when the substrate board with the surface of the exposed roughened layer on the conductor circuit is treated with an acid, for instance, the local cell reaction between the copper constituting the conductor circuit and the roughened layer such as the Cu—Ni—P alloy or the like is inhibited so that the dissolution of the conductor circuit is prevented.

Moreover, particularly on the surface of said metal layer, Cu—Ni—P alloy or other plating metal tends to deposit in the formation of a roughened layer by plating and bare spots do not remain even if the plating solution deteriorate so that a satisfactory roughened layer composed of acicular or porous Cu—Ni—P alloy can be certainly formed on the conductor circuit.

Furthermore, said metal layer functions as an etching mask for the conductor circuit composed of copper so that overetch of the conductor circuit can be prevented.

The metal layer mentioned above is formed on upper surface of the conductor circuit or on the upper and lateral surfaces of the conductor circuit. Said metal layer and roughened layer need not be formed on all the conductor circuits. For example, there are cases in which said metal layer and roughened layer are not formed on the uppermost conductor circuit.

The metal that can be used for the construction of said metal layer includes not only the above-mentioned aluminum, chromium, iron, zinc, nickel, cobalt and tin but also noble metals such as gold, silver, platinum and palladium. Thus, said metal layer can be constructed using at least one metal selected from among the above-mentioned metals and noble metals.

The preferred thickness of said metal layer is 0.1 to 3 µm. If the thickness is less than 0.1 µm, the local cell reaction may not be inhibited. If, conversely, the metal layer is more than 3 µm thick, the thickness of the conductor circuit will be too great and the thickness of the interlayer resin insulating layer will also be large so that via holes with a small diameter can hardly be formed. Thus, the smaller the thickness of the interlayer resin insulating layer, the easier via holes with a small diameter can be provided.

The roughened layer composed of acicular or porous Cu—Ni—P alloy or the like is preferably 1 to 7 µm in overall thickness.

When the thickness of the roughened layer is in the above range, the interval of interlayer resin insulating layers and the interval of conductor circuits can be set smaller than it is the case with the conventional multilayer printed circuit board so that the higher wiring density and weight reduction of a multilayer printed circuit board can be accomplished.

The form of the roughened layer composed of Cu—Ni—P alloy or the like is preferably acicular or porous. When the roughened layer is provided by a plating technique, the form of the roughened layer depends on the type of surfactant used, among other factors. Therefore, conditions conducive to formation of an acicular or porous roughened layer should be selected.

In the practice of the ninth group of the present invention, the roughened layer may be formed by Cu—Ce—P corrugation plating or copper nodule as well as said acicular or porous Cu—Ni—P alloy plating.

For the formation of copper nodule, an aqueous solution containing 22 to 38 g/L of a copper compound, 10 to 20 g/L of a complexing agent, 150 to 250 g/L of a pyrophosphate, 5 to 10 g/L of a nitrate, 1 to 3 g/L of ammonia and 10 to 25 g/L of an orthophosphate can be used as the plating solution. The complexing agent that can be used includes but is not limited to EDTA and Rochelle salt.

In the ninth group of the present invention, a cover layer (hereinafter referred to as a roughened layer-covering layer) composed of a metal having the ionization tendency not lower than copper but not higher than titanium or a noble metal is preferably formed on the surface of the Cu—Ni—P alloy roughened layer. The preferred thickness of this roughened layer-covering layer is 0.1 to 2 µm.

As the roughened layer-covering layer of such a metal is provided, direct contact of the electrolyte with the roughened layer can be prevented. Moreover, since the metal layer itself is oxidized to form a dense oxide film, the dissolution of the roughened layer and conductor circuit is prevented.

The above-mentioned metal having the ionization tendency not lower than copper but not higher than titanium includes but is not limited to titanium, aluminum, zinc, iron, indium, thallium, cobalt, nickel, tin, lead and bismuth. The noble metal mentioned above includes but is not limited to gold, silver, platinum and palladium. Thus, at least one member selected from among said metals and said noble metals can be used for the construction of said roughened layer-covering layer. Particularly preferred, among said metals, is tin. This is partly because, with tin, a thin layer can be formed by electroless substitution plating and partly because tin can be evenly deposited in conformity with the surface irregularities of the roughened layer.

When tin is chosen as said metal, a tin borofluoride-thiourea solution or a tin chloride-thiourea solution is used. In this case, an Sn layer of about 0.1 to 2 μm thick is formed by Cu—Sn substitution reaction. When a noble metal is chosen, sputtering, vapor deposition or plating with a simple substitution type plating solution can be utilized.

The metal layer to be provided on the surface of the conductor circuit in the ninth group of the present invention can be formed by electroplating, electroless plating, sputtering or vapor deposition.

The electroless nickel plating, nickel electroplating, electroless tin plating, electroless cobalt plating and electroless palladium plating can be carried out by the same corresponding procedures as described for the third group of the present invention.

The chromium electroplating process comprises preparing an aqueous solution of 250 to 350 g/L of chromic anhydride, 12 to 20 g/L of sodium silicofluoride and 0.1 to 0.5 g/L of sulfuric acid as a plating bath, immersing the substrate board in this plating bath and passing a current at a current density of 10 to 30 A/dm$^2$.

For the formation of said metal layer comprising aluminum, a sputtering technique is used, for an aluminum layer cannot be easily formed by plating.

Electroless zinc plating is performed at room temperature using an aqueous solution containing 100 to 800 g/L of sodium hydroxide and 50 to 200 g/L of zinc oxide.

Iron electroplating can be performed by preparing an aqueous solution of 100 to 400 g/L of ferrous sulfate and 50 to 200 g/L of ammonium sulfate as a plating bath, immersing the substrate board in the plating bath and passing a current at a current density of 6 to 10 A/dm$^2$.

Referring, further, to the ninth group of the present invention, the plating technique which comprises causing a Cu—Ni—P alloy to deposit and grow on the surface of a conductor circuit and forming a roughened layer thereon is now described.

In the ninth group of the present invention, the substrate board formed with a lower-layer conductor circuit is immersed in an aqueous plating solution containing a complexing agent, a copper compound, a nickel compound, a hypophosphite and an acetylene-containing polyoxyethylene series surfactant and given a shaking or rocking motion or the metal ions are otherwise supplied to cause deposition and growth of an acicular or porous Cu—Ni—P alloy to provide an alloy roughened layer comprising a cover layer and a roughened layer. This aqueous plating solution is preferably so adjusted that the copper ion concentration, nickel ion concentration, hypophosphite ion concentration and complexing agent concentration will be 0.007 to 0.160 mol/L, 0.001 to 0.023 mol/L, 0.1 to 1.0 mol/L and 0.01 to 0.2 mol/L, respectively.

The complexing agent mentioned above includes but is not limited to citric acid, tartaric acid, malic acid, EDTA, quadrol and glycine.

As the acetylene-containing polyoxyethylene series surfactant mentioned above, it is most suitable to employ a surfactant of the under-mentioned structural formula (2) or (3). The surfactant of this type includes but is not limited to alkyne diols such as 2,4,7,9-tetramethyl-5-decyne-4,7-diol, 3,6-dimethyl-4-octyne-3,6-diol, etc. As commercial surfactants, Surfynol 104 (porous), 440, 465 and 485 (all acicular), all available from Nisshin Chemical Industries Co., can be mentioned by way of example.

The Cu—Ni—P alloy layer formed from said electroless plating solution presents with an acicular or porous surface structure. In the case of a porous alloy, the number of micropores is 100,000 to 1,000,000 per 1 cm$^2$ and generally within the range of 3,000,000 to 300,000,000 per 1 cm$^2$. The pore diameter is 0.01 to 100 μm and generally within the range of 0.1 to 10 μm.

In the multilayer printed circuit board according to the ninth group of the present invention, an adhesive for electroless plating use is preferably employed for the construction of an interlayer resin insulating layer on the above-mentioned conductor circuit. The optimum adhesive for electroless plating use is a dispersion of a cured heat-resistant resin particle soluble in acid or oxidizing agent into an uncured heat-resistant resin hardly soluble in acid or oxidizing agent. Upon treatment with an acid or an oxidizing agent, the heat-resistant resin particles are dissolved out to produce the roughened surface comprising anchors resembling narrow-necked pots on the surface of the adhesive layer.

Referring to the above adhesive for electroless plating use, said cured heat-resistant resin particle, in particular, is preferred such as: (1) a particle having a mean particle diameter not over 10 μm and (2) a mixture of a particle having a relatively large mean particle diameter and a particle having a relatively small mean particle diameter. This is because the more intricate anchors can be formed by using such a mixed particle.

The heat-resistant resin which can be used includes but is not limited to epoxy resin, polyimide resin and a mixed resin composed of epoxy resin and a thermoplastic resin. The thermoplastic resin to be used in the formation of such a mixed resin or polymer alloy includes polyethersulfone (PES), for instance. As examples of said heat-resistant resin particle soluble in an acid or oxidizing agent, epoxy resins (particularly an epoxy resin cured with an amine series curing agent is preferred) and amino resins can be mentioned.

The solder resist that can be used in the practice of the ninth group of the present invention includes but is not limited to an epoxy resin acrylate and an imidazole series curing agent.

A process for manufacturing a multilayer printed circuit board according to the ninth group of the present invention is now described.

(1) First, a circuit board comprising a core board and, as formed on the surface thereof, an inner copper pattern (lower-layer conductor circuit) is prepared.

The construction of the lower-layer conductor circuit on the core board is performed by etching a copper-clad laminate or alternatively in the following manner. Thus, an the layer of an adhesive for electroless plating use is formed on a substrate board such as a glass-epoxy substrate, a polyimide substrate, a ceramic substrate, or a metal substrate and the surface of this adhesive layer is roughened. Then, a conductor layer is formed by electroplating and this conductor layer is pattern-etched to provide a lower-layer conductor circuit.

Said core board has been formed with plated-through holes in such a manner that the face and reverse sides of wiring layers may be electrically interconnected by said plated-through holes.

Furthermore, the plated-through holes and the lower-layer conductor circuit pattern gaps may have been filled with a resin to insure a smooth and level surface.

Particularly in this ninth group of the present invention, a metal layer composed of at least one metal selected from among aluminum, chlomium, iron, zinc, nickel, cobalt, tin and noble metals is formed on the surface of the lower-layer conductor circuit of the core board and lands of the plated-through holes of this core board and further on said metal layer, a roughened layer composed of acicular or porous Cu—Ni—P alloy or the like is further built up as mentioned above. Where necessary, said roughened layer-covering layer is formed on said roughened layer.

(2) Then, an interlayer resin insulating layer is formed on the circuit board fabricated in the above step (1). Particularly in this invention, the above-described adhesive for electroless plating use is preferably used as the material for the construction of the interlayer resin insulating layer.

(3) The layer of said adhesive for electroless plating use is dried and openings for via holes are provided where necessary. Thus, the interlayer resin insulating layer is formed with said openings for via holes by light exposure and development and subsequent thermal curing in the case of a photosensitive resin or by thermal curing and subsequent laser processing in the case of a thermosetting resin.

(4) Then, the resin particles soluble in an acid and an oxidizing agent present on the surface of the cured the layer of an adhesive for electroless plating use (interlayer resin insulating layer) are dissolved off with an acid or an oxidizing agent to provide a roughened surface of the layer of an adhesive for electroless plating use.

The acid mentioned just above may for example be an mineral acid, e.g. phosphoric acid, hydrochloric acid, sulfuric acid or the like, or an organic acid, e.g. formic acid, acetic acid or the like. Particularly preferred is an organic acid. This is because, in the course of roughening, the organic acid will not materially corrode the electrically conductive metal layer exposed from the via holes.

On the other hand, said oxidizing agent is preferably an aqueous solution of chromic acid or of a permanganate (e.g. potassium permanganate).

(5) Then, a catalyst nuclei is applied to the circuit board formed with the roughened interlayer resin insulating layer.

For application of said catalyst nuclei, a noble metal ion species or a colloidal noble metal is preferably used. Generally, palladium chloride or colloidal palladium is used. For immobilizing the catalyst nuclei, it is preferable to carry out a heat treatment. The preferred catalyst nucleus in this case is palladium.

(6) Then, the surface of the interlayer resin insulating layer to which the catalyst nuclei have been applied is electroless plated to form an electroless plated film on the entire roughened surface. The preferred thickness of the electroless plated metal film is 0.5 to 5 μm.

Then, a plating resist is disposed on the electroless plated metal film.

(7) Then, the non-resist area is electroplated in a thickness of 5 to 20 μm to form an upper-layer conductor circuit and via holes.

For this electroplating, copper electroplating is preferably used.

Furthermore, as the resist layer for use in the etching of said metal layer and electroless plated film, a metal layer composed of at least one metal selected from among aluminum, chromium, iron, zinc, nickel, cobalt, tin and noble metals is formed.

After removal of the plating resist, the electroless plated film under said plating resist is dissolved and removed with an etching solution comprising a sulfuric acid-hydrogen peroxide solution or an aqueous solution of sodium persulfate, ammonium persulfate or the like to provide a discrete conductor circuit.

Since the metal layer composed of at least one metal selected from among aluminum, chromium, iron, zinc, nickel, cobalt, tin and noble metals has been formed as a resist layer, the upper-layer conductor circuit of copper is not etched.

The metal layer composed of at least one metal selected from among aluminum, chromium, iron, zinc, nickel, cobalt, tin and noble metals may be formed on the upper and lateral sides of the discrete upper-layer conductor circuit inclusive of via holes.

(8) Then, on the upper-layer conductor circuit formed with said metal layer composed of at least one metal selected from among aluminum, chromium, iron, zinc, nickel, cobalt, tin and noble metals, a roughened layer composed of Cu—Ni—P alloy or the like is formed.

Since the surface of said metal layer provides a favorable condition for oxidation and reduction reactions, the deposition of Cu—Ni—P alloy is easy to be deposited.

(9) Then, on the surface of said roughened layer composed of Cu—Ni—P alloy, a roughened layer-covering layer is formed using a metal having the ionization tendency not lower than copper but not higher than titanium or a noble metal.

(10) Thereafter, as the interlayer resin insulating layer, a layer of an adhesive for electroless plating use is formed on the substrate board formed with said roughened layer-covering layer.

(11) The above sequence of steps (3) to (10) is repeated to provide an upper-layer conductor circuit, whereupon a multilayer printed circuit board comprising 3 layers on either side, thus 6 layers on both sides, is obtained.

During the above sequence of steps (3) to (10), the formation of openings for via holes is followed by surface-roughening with chromic acid but, even when chromic acid is used, the conductor circuit is well protected against dissolution.

While the above description pertains to the manufacture of a multilayer printed circuit board by the so-called semi-additive process, it is likewise possible to adopt the so-called full-additive process which comprises roughening the the layer of an adhesive for electroless plating use, applying a catalyst nuclei, disposing a plating resist and performing electroless plating to form a conductor circuit.

The process for manufacturing a multilayer printed circuit board according to the tenth group of the present invention comprises carrying out a sequence of the steps of constructing a conductor circuit, roughening to provide the roughened surface on said conductor circuit, covering the conductor circuit having a roughened surface with an interlayer resin insulating layer and piercing openings for via holes in said interlayer resin insulating layer in repetition to build up a conductor circuit at a plurality of layers isolated with an interlayer resin insulating layer on an insulating substrate board, wherein, after the formation of roughened surface on the conductor circuit, an oxidation treatment is curried out to form an oxide film on the entire roughened surface, then providing said interlayer resin insulating layer.

In accordance with the tenth group of the present invention, an oxide film can be formed on the entire roughened surface of the conductor circuit by a simple technique, such as heating the substrate board, so that the process for manufacture of a multilayer printed circuit board can be simplified. Moreover, via holes with good adhesion to the lower-layer conductor circuit can be provided. As a consequence, a multilayer printed circuit board with a high reliability of connection of via holes with conductor circuits can be manufactured.

Figure 49:
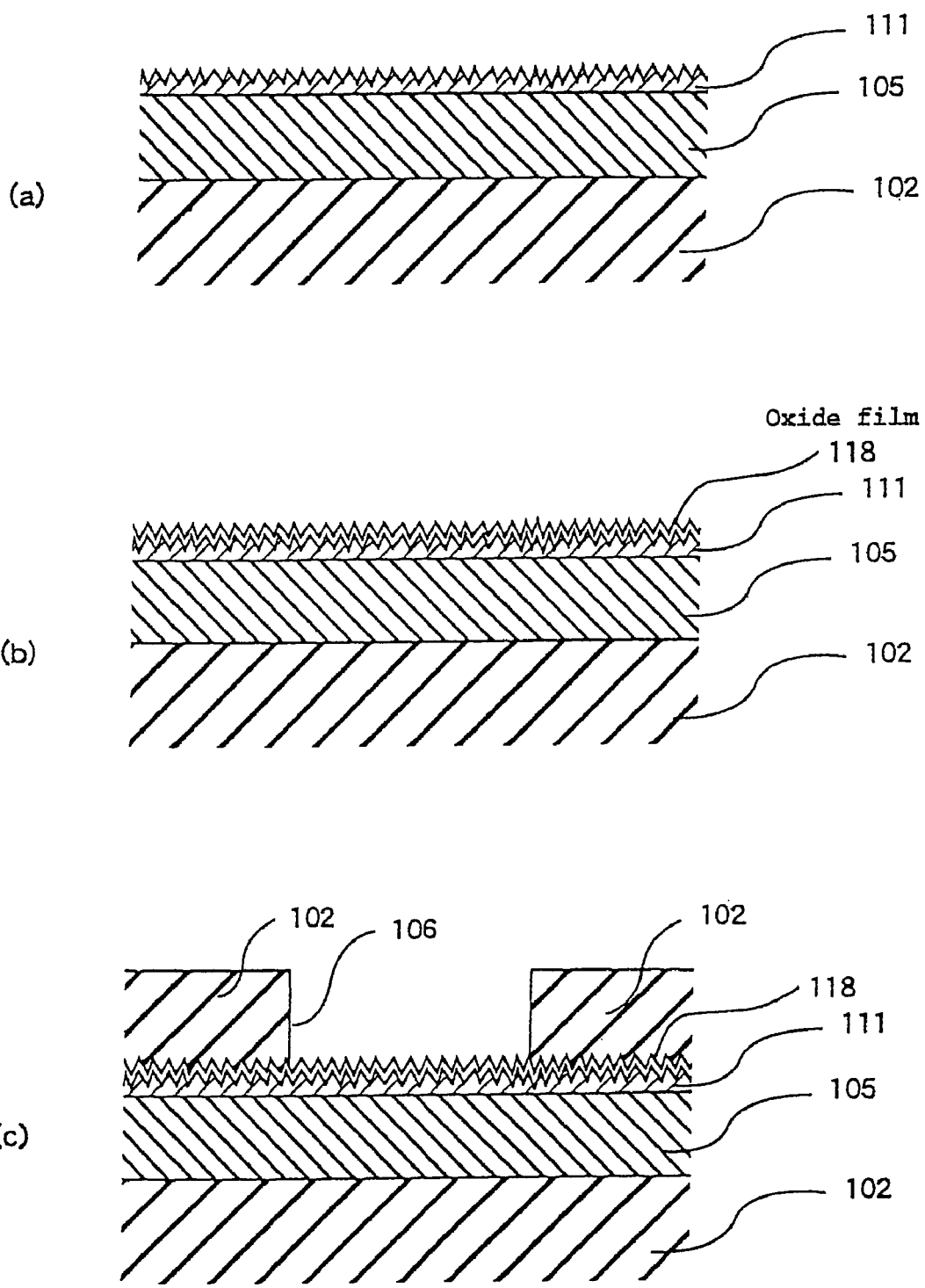
FIG. 49 (*a*) through (*c*) are cross-section views illustrating the step of forming an oxide film in the process for manufacturing a multilayer printed circuit board according to the tenth group of the present invention.
Figure 50:
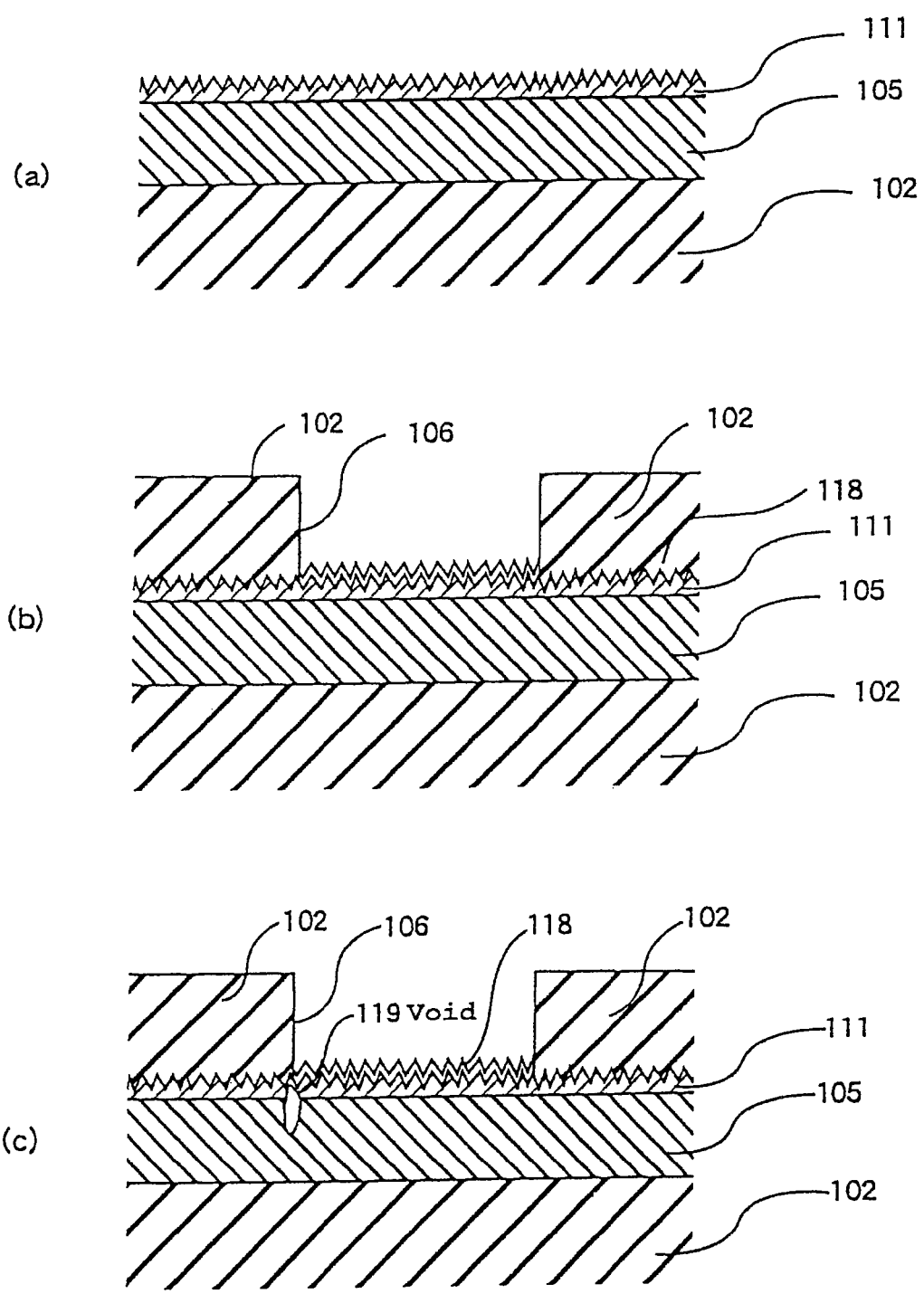
FIG. 50 (*a*) through (*c*) are cross-section views illustrating the step of forming an oxide film in the conventional process for manufacturing a multilayer printed circuit board.

FIG. 49 (a) to (c) are cross-section views illustrating the step of forming an oxide film in accordance with this invention and FIG. 50 (a) to (c) are cross-section views showing the step of forming an oxide film in the conventional production process.

As shown in FIG. 49, the process according to the tenth group of the invention comprises forming a roughened layer 111 on the surface of a conductor circuit 105 [FIG. 49(a)], then forming an oxide film 118 on the entire surface of roughened layer 111 (roughened surface) [FIG. 49(b)] and then forming an interlayer resin insulating layer 102 and via holes 106 [FIG. 49(c)].

The oxide film 118 formed in the above step covers up all the area to be covered with the interlayer resin insulating layer 102 and the area to be exposed from the interlayer resin insulating layer 102 so that contact with the roughening solution does not cause a local cell reaction. Therefore, corrosion resistance to an oxidizing agent or the like is insured and even when the surface of the conductor circuit is brought into contact with an acidic solution in a subsequent acid cleaning step, for instance, the trouble of the surface (roughened layer) of conductor circuit 105 being dissolved to give rise to voids can be prevented.

In this connection, the prior art includes the sequence of forming a roughened layer 111 on the conductor circuit 105 [FIG. 50(a)], then building an interlayer resin insulating layer 102 on the conductor circuit 105, forming openings 106 for via holes [FIG. 50(b)] and heating the substrate board at 150° C. to completely cure the interlayer resin insulating layer 102.

However, the heating for curing the interlayer resin insulating layer 102 results in selective oxidation of the openings 106 for via holes to produce the oxide film 118 so that when the roughening solution enters from the interlayer resin insulating layer 102, a local electric cell is formed between the oxide film 118 and conductor circuit 105 with the result that the formation of voids 119 is inevitable [FIG. 50(c)].

The technique for formation of the roughened surface on the conductor circuit is not particularly restricted but includes etching, blackening-oxidation, plating, etc.

The etching mentioned above includes a method in which an etching solution containing a cupric complex and an organic acid is permitted to act upon the surface of the conductor circuit in the presence of oxygen. As a plating technique, formation of a roughened layer composed of acicular or porous Cu—Ni—P alloy by electroless plating can be mentioned by way of example.

After the formation of a roughened surface on the conductor circuit by the above plating or etching technique, an oxide film is formed on the roughened surface. The technique of forming this oxide film is not particularly restricted, either. The method of contacting an oxidizing agent-containing solution with the surface of the conductor circuit may for example be employed. However, the method of oxidation by heating the substrate board after the above-mentioned process in the atmospheric air at 100 to 200° C. for 10 minutes to 3 hours to form an oxide film on the entire rough surface is simpler procedure-wise and provides a denser oxide film.

The temperature for this oxidation treatment is more preferably 130 to 160° C. and the duration of the oxidation treatment is more preferably 10 to 180 seconds.

By the above oxidation treatment, an approximately 0.01 to 0.2 μm thick oxide film is formed on the surface and the profile of the roughened layer remains almost unchanged.

Moreover, this oxide film is resistant to corrosion by oxidizing agents and the like so that even without the provision of a cover layer such as an Sn layer on the conductor circuit, the trouble of dissolution of the conductor circuit and formation of voids can be prevented in the subsequent step of cleaning the substrate board with an acid or in the subsequent step of roughening the surface of the interlayer resin insulating layer having openings for via holes with chromic acid, for instance.

Therefore, on the conductor circuit having a surface oxide film, an interlayer resin insulating layer with good adhesion to said conductor circuit can be constructed.

When this interlayer resin insulating layer is provided with openings for via holes and the via holes are then constructed, the via holes with good adhesion to the lower-layer conductor circuit is obtained.

The multilayer printed circuit board according to the tenth group of the present invention comprises a substrate board, a conductor circuit having a roughened surface as constructed thereon and an interlayer resin insulating layer formed further thereon with said interlayer resin insulating layer being formed with openings for via holes which are filled with a conductor to constitute the via holes, and further comprises a cover layer composed of an oxide film on the surface of the conductor circuit formed with a roughened surface.

In the above constitution of the tenth group of the present invention, the surface of the conductor circuit formed with the roughened surface is covered with said oxide film and this oxide film has been formed by oxidation of the whole surface of the conductor circuit with the result that it is dense enough to give a good peel strength even when via holes are formed on the conductor circuit having said oxide film.

Thus, the via holes formed on the conductor circuit shows good adhesion to the conductor circuit and are resistant to the change in temperature in heat cycles without the trouble of stripping.

The process for manufacturing a multilayer printed circuit board according to the tenth group of the present invention is now described, taking the semi-additive process as an example.

(1) First, a core board formed with an inner copper pattern (lower-layer conductor circuit) is prepared.

The conductor circuit can be constructed on the core board by various techniques, for example by a method which comprises etching a copper-clad laminate to a determined pattern, a method which comprises forming an the layer of an adhesive for electroless plating use on a substrate such as a glass-epoxy substrate, a polyimide substrate, a ceramic substrate or a metal substrate, roughening the surface of said layer of an adhesive for electroless plating use and carrying out electroless plating, or electroless plating the entire rough surface, disposing a plating resist, electroplating the non-resist area, removing the plating resist and performing etching to provide a conductor circuit comprising an electroplated metal film and an electroless plated metal film [semi-additive process].

While the flatness of the resin layer and conductor circuit is usually insured by forming a conductor circuit on a substrate board, filling a low-viscosity resin filler into the plated-through holes and conductor circuit pattern gaps on the core board and filling the resin layer and conductor circuit, a roughened layer is formed on the surface of the conductor circuit prior to fill said resin filler.

In this connection, the core board may have been formed with plated-through holes so that the circuit layers on the face and reverse sides may be electrically interconnected through these plated-through holes.

The roughened surface mentioned above is preferably formed by abrasion, etching, blackening/reduction, or plating.

The blackening-reduction process, among the above processes, is preferably carried out using a blackening bath (oxidation bath) comprising an aqueous solution of NaOH (20 g/L), NaClO$_2$ (50 g/L) and Na$_3$PO$_4$ (15.0 g/L) and a reduction bath comprising an aqueous solution of NaOH (2.7 g/L) and NaBH$_4$ (1.0 g/L).

When forming roughened layer by the plating method, the method is preferred which comprises an electroless plating process using a plating bath (pH=9) containing copper sulfate (1 to 40 g/L), nickel sulfate (0.1 to 6.0 g/L), citric acid (10 to 20 g/L), sodium hypophosphite (10 to 100 g/L), boric acid (10 to 40 g/L) and surfactant (Nisshin Chemical Industries; Surfynol 465) (0.01 to 10 g/L) to provide a roughened layer composed of a Cu—Ni—P alloy.

The crystal structure of the film deposited within the above range is acicular and, hence, provides for an excellent anchor effect. The above electroless plating bath may contain a complexing agent and various additives in addition to the compounds mentioned above.

The etching process may comprise permitting an etching solution containing a cupric complex and an organic acid to act upon the surface of the conductor circuit in the presence of oxygen to thereby roughen said surface.

In this case, etching proceeds according to the reactions represented by the following chemical formulas (7) and (8).

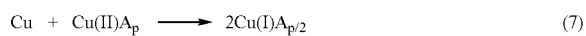

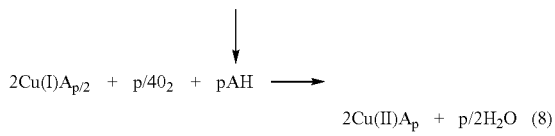

(wherein A represents a complexing agent (which functions as a chelating agent) and p represents a coordination number).

The cupric complex mentioned above is preferably a cupric azole complex. This cupric azole acts as an oxidizing agent which oxidizes metallic copper or the like. The azole may for example be a diazole, a triazole or a tetrazole. Particularly preferred species are imidazole, 2-methylimidazole, 2-ethylimidazole, 2-ethyl-4-methylimidazole, 2-phenylimidazole and 2-undecylimidazole. The cupric azole complex content of said etching solution is preferably 1 to 15 weight %. Within this range, the complex is not only satisfactory in solubility and stability but also capable of dissolving even a noble metal, such as Pd, which constitutes the catalyst nucleus.

To insure dissolution of copper oxide, an organic acid is used in association with the cupric azole complex. The organic acid includes but is not limited to formic acid, acetic acid, propionic acid, butyric acid, valeric acid, caproic acid, acrylic acid, crotonic acid, oxalic acid, malonic acid, succinic acid, glutaric acid, maleic acid, benzoic acid, glycolic acid, lactic acid, malic acid and sulfamic acid. Those acids may be used each independently or in a combination of two or more species.

The preferred organic acid content of the etching solution is 0.1 to 30 weight %. Within this range, the solubility of oxidized copper and the solution stability can be sufficiently insured. As expressed by the above chemical formula (8), the cuprous complex generated is dissolved under the influence of the acid and binds oxygen to form the cupric complex, thus contributing to the oxidation of copper again.

To assist in the dissolution of copper and the oxidizing action of the azole compound, the etching solution mentioned above may be supplemented with a halide ion, e.g. fluoride ion, chloride ion or bromide ion. The halide ion may also be supplied by adding hydrochloric acid, sodium chloride or the like. The halide ion content of the etching solution is preferably 0.01 to 20 weight %. Within this range, a good adhesion can be obtained between the roughened surface and the interlayer resin insulating layer.

In preparing the above etching solution, said cupric azole complex and organic acid (where necessary, one having a halide ion is used) are dissolved in water. As said etching solution, a commercial etching solution, for example Meck Etch Bond™ manufactured by Meck Co., Ltd., can be used. The etching amount, when the above etching solution is used, is preferably 1 to 10 μm. If the etching amount exceeds 10 μm, a connection defect may occur between the roughened surface and the via hole conductor. On the other hand, if the etching amount is less than 1 μm, the adhesion to the interlayer resin insulating layer to be built thereon will not be sufficiently high.

The roughened surface formed by the above technique is generally buffed leaving the lateral sides unabraded to insure flatness of the surface of the resin layer and conductor circuit.

Then, the conductor circuit is subjected to a roughening treatment again. This roughening treatment is preferably carried out by any of said alternative techniques such as abrasion, etching, blackening-reduction and plating.

Optionally the interlayer resin insulating layer may be formed directly after said roughened surface is formed on the conductor circuit, omitting said abrasive treatment.

(2) The substrate board which has undergone the treatments described in step (1) is placed in an oven and oxidized by heating in the atmospheric air at 100 to 200° C. for 10 minutes to 3 hours to form an oxide film on the roughened surface formed by etching or the roughened surface formed by plating on the conductor circuit.

(3) Then, the substrate board prepared as above in step (2) is coated with an organic solvent-based resin composition for preparation of a roughened surface and the coat is dried to provide a layer of said rough surface-forming resin composition on the substrate surface.

The resin composition for forming roughened surface mentioned above is preferably a composition comprising an uncured heat-resistant matrix resin, which is hardly soluble in a roughing solution comprising at least one member selected from the group consisting of an acid, an alkali and an oxidizing agent, and, as dispersed therein, a substance soluble in said roughening solution comprising at least one member selected from the group consisting of an acid, an alkali and an oxidizing agent.

The terms "hardly soluble" and "soluble" as used in connection with this invention mean that, when immersed in the same roughening solution for the same duration of time, the substance which dissolves at a relatively high dissolution rate is described as being "soluble" and the one which shows a relatively low dissolution rate is described as being "hardly soluble", for convenience' sake.

As the heat-resistant matrix resin mentioned above, a thermosetting resin or a mixed resin comprising a thermosetting resin (inclusive of one in which some of the available thermosetting groups have been photosensitized) and a thermoplastic resin, for instance, can be used.

The thermosetting resin mentioned above includes but is not limited to epoxy resin, phenolic resin, polyimide resin and thermosetting polyolefin resin. Photosensitization of the thermosetting resin, referred to above, can be achieved by (meth) acrylating the thermosetting groups of the resin with methacrylic acid or acrylic acid. The most preferred example is a (meth)acrylated epoxy resin.

The epoxy resin mentioned above includes but is not limited to novolac epoxy resin and alicyclic epoxy resin.

The thermoplastic resin mentioned above includes but is not limited to polyethersulfone, polysulfone, polyphenylenesulfone, polyphenylene sulfide, polyphenyl ether and polyetherimide.

The above-mentioned substance soluble in said roughening solution comprising at least one member selected from the group consisting of an acid, an alkali and an oxidizing agent is preferably at least one member selected from the group consisting of an inorganic particle, a resin particle, a metal particle, a rubber particle, a liquid-phase resin and a liquid-phase rubber.

The inorganic particle mentioned above includes but is not limited to particles of silica, alumina, calcium carbonate, talc and dolomite. Those substances can be used either independently or in a combination of two or more species.

The alumina particle mentioned above can be dissolved and removed with hydrofluoric acid and the calcium carbonate particle can be dissolved and removed using hydrochloric acid. The sodium-containing silica and dolomite can be dissolved and removed with an aqueous alkaline solution.

The resin particle mentioned above includes but is not limited to amino resin (e.g. melamine resin, urea resin, guanamine resin, etc.), epoxy resin and bis(maleimide)triazine resin. Those resins can be used either independently or in a combination of two or more species.

As species of said epoxy resin, either the resin soluble in acids and oxidizing agents or the resin hardly soluble therein can be freely prepared by judicious selection of oligomers and curing agents. For example, whereas the resin obtainable by curing bisphenol A epoxy resin with an amine series curing agent is readily soluble in chromic acid and the resin obtainable by curing cresol novolac epoxy resin with an imidazole series curing agent is hardly soluble in chromic acid.

It is essential that said resin particle be cured in advance. Unless cured ahead of time, the resin particle dissolves in the solvent for the resin matrix to give a homogeneous mixture so that the resin particle added cannot be selectively dissolved out with an acid or an oxidizing agent.

The metal particle mentioned above includes but is not limited to particles of gold, silver, copper, tin, zinc, stainless steel and aluminum. Those metal particles can be used either independently or as a mixture of two or more species.

The rubber particle mentioned above includes but is not limited to particles of acrylonitrile-butadiene rubber, polychloroprene rubber, polyisoprene rubber, acryl rubber, polysulfide-vulcanized hard rubber, fluoro rubber, urethane rubber, silicone rubber and ABS resin. Those rubber particles can be used either independently or in a combination of two or more species.

As the liquid resin mentioned above, a solution of the thermosetting resin in uncured state can be used. For example, a mixture of an uncured epoxy oligomer and an amine series curing agent can be mentioned.

As the liquid rubber, a solution of any of the above-mentioned rubbers in uncured state can be used.

In preparing said photosensitive resin composition using said liquid resin or liquid rubber, those compounds should be selected to insure that said heat-resistant resin matrix and the selected soluble substance will not form a homogeneous mixture (i.e. but will form discrete phases).

By using the heat-resistant matrix resin and soluble substance selected according to the above criterion, there can be obtained a photosensitive resin composition in which a multiplicity of islands formed by said liquid resin or rubber are scattered in an ocean of said heat-resistant resin matrix or conversely a multiplicity of islands of said matrix heat-resistant resin are scattered in an ocean of said liquid resin or rubber.

After curing such a photosensitive resin composition, the liquid resin or rubber forming either said ocean or said islands, as the case may be, is removed, whereupon the objective rough surface is obtained.

The acid which can be used as said roughening solution includes phosphoric acid, hydrochloric acid, sulfuric acid and an organic acids such as formic acid and acetic acid, among others, although an organic acid is preferably used. This is because when an organic acid is used, it does hardly corrode the metal conductor layer exposed from via holes.

As the oxidizing agent mentioned above, chromic acid or an aqueous solution of an alkali permanganate (e.g. potassium permanganate), for instance, is preferably selected.

The alkali mentioned above is preferably an aqueous solution of sodium hydroxide or potassium hydroxide, for instance.

In the present invention, wherein said inorganic particles, metal particles or resin particle is used, the mean particle diameter of the particles is preferably not greater than 10 μm.

Particularly the use of a mixed particles not greater than 2 μm in mean particle diameter and actually composed of a coarse particles having a relatively large mean particle diameter and a fine particle having a relatively small mean particle diameter will eliminate undissolved residues of electroless plated metal, reduce the amount of the palladium catalyst under the plating resist and, moreover, provide a shallow but complex rough surface texture. By providing such a roughened surface having a complex profile, a practically useful peel strength can be imparted even with a shallow roughened layer.

The reason why a shallow but complex rough surface can be provided by using said coarse particle and fine particle in combination is that because the mean particle diameter of even the coarse particle is less than 2 μm, the anchors available upon dissolution and removal of the particles are small in depth and, at the same time, because the particles so removed is actually a mixture of a coarse particles having a relatively large particle size and a fine particle having a relatively small particle size, the resulting rough surface assumes a complex texture.

Furthermore, since the mean particle diameter of even the coarse particle used is less than 2 μm, there is no risk for clearances arising from excessive roughening, so that the resulting interlayer resin insulating layer is excellent in interlayer insulation.

It is preferable that the mean particle diameter of said coarse particle be over 0.8 μm and less than 2.0 μm and that of said fine particle be 0.1 to 0.8 μm.

Within the above range, the depth of said rough surface is approximately Rmax=3 μm, and in the semi-additive process, it is not only easy to etch off the electroless plated metal layer but also easy to remove the Pd catalyst beneath the electroless plated metal layer. Moreover, a practically useful peel strength of 1.0 to 1.3 kg/cm can be insured.

The organic solvent content of the above resin composition for preparation of the roughened surface is preferably not more than 10 weight %.

The resin composition for forming roughened surface can be applied by means of a roll coater or a curtain coater, for instance.

(4) The resin composition for forming roughened surface layer formed in the above step (3) is dried to a semi-cured state and, then, openings for via holes are provided.

In the dry state of the layer of resin composition for forming a roughened layer, the thickness of this resin composition layer on the conductor circuit pattern is small while the thickness of the interlayer resin insulating layer on the large-area plain layer is large and, moreover, due to the unevenness of the conductor circuit and non-conductor circuit regions, the interlayer resin insulating layer is often not uniform in level. Therefore, the surface of the interlayer resin insulating layer is preferably flattened by pressing with a metal plate or metal roll under heating.

The openings for via holes are created in the layer of the resin composition for forming a roughened layer by exposure to UV or other light and development. For this purpose, a photomask (preferably a glass substrate) printed with black dots corresponding to said openings for via holes is set in position with its printed side in close contact with the layer of the resin composition for forming roughened surface and the exposure and development is carried out.

(5) Then, this layer of the resin composition for forming roughened surface is cured to provide an interlayer resin insulating layer, which is then roughened.

This roughening treatment comprises removing said at least one soluble substance selected from among an inorganic particle, a resin particle, a metal particle, a rubber particle, a liquid-phase resin and a liquid-phase rubber, which exists on the surface of said interlayer resin insulating layer, with said roughening solution such as an acid, an oxidizing agent or an alkali. This roughening treatment is preferably carried out under conditions such that the oxide film formed on the conductor circuit will not be etched. Therefore, the roughening solution to be used is preferably an aqueous solution containing 10 to 1000 g/L of chromic acid or an alkaline aqueous solution containing 0.1 to 10 mol/L of a permanganate. The depth of the roughened layer formed on the interlayer resin insulating layer is preferably about 1 to 5 μm.

(6) Then, catalyst nuclei are applied to the roughened surface of the interlayer resin insulating layer. The catalyst nucleus to be used is preferably a noble metal ion species or a colloidal noble metal and generally palladium chloride or colloidal palladium is employed. To immobilize the catalyst nuclei, a heat treatment is preferably carried out. The preferred catalyst nucleus for this purpose is palladium.

(7) Then, an electroless plated film is formed on the entire rough surface. This electroless plating is performed using the following plating solution, for instance.

The preferred plating bath composition is an aqueous solution containing EDTA (50 g/L), copper sulfate (10 g/L), HCHO (8 ml/L), NaOH (10 g/L). The thickness of the electroless plated metal film is preferably 0.1 to 5 μm, more preferably 0.5 to 3 μm.

(8) Then, a photosensitive resin film (dry film) is laminated onto the electroless plated layer and a photomask (preferably a glass substrate) printed with a plating resist pattern is set in close contact with the photosensitive resin film. Thereafter, exposure and development are carried out to form a plating resist pattern.

(9) Then, the resist-free surface is electroplated to form the necessary conductor circuit and via holes.

As the technique of electroplating, copper electroplating is preferred and the plating thickness is preferably 1 to 20 μm.

(10) After removal of the plating resist, the electroless plated metal layer is removed using an etching solution containing sulfuric acid-hydrogen peroxide, sodium persulfate, ammonium persulfate, ferric chloride or cupric chloride to provide an isolated or discrete conductor circuit. Thereafter, where necessary, the palladium catalyst nuclei are dissolved out with, for example, chromic acid.

(11) Then, the surface of the conductor circuit is roughened. The roughened surface is preferably prepared by any of said techniques, namely abrasion, etching, blackening-reduction, and plating.

Thereafter, an oxide film is formed on the surface of the conductor circuit in the same manner as in step (2).

(12) Then, using the resin composition for forming a roughened surface, an interlayer resin insulating layer is formed on the substrate board in the same manner as described above.

(13) Then, the steps (4) to (12) are repeated to form an upper-layer conductor circuit and, then, planar conductor pads to serve as solder pads, via holes, etc. are formed. Finally, a solder resist layer and solder vamps are formed to complete the manufacture of a multilayer printed circuit board. While the above description pertains to the semi-additive process, the full-additive process may likewise be used.

BEST MODE FOR CARRYING OUT THE INVENTION

Example 1

(1) A copper-clad BT resin laminate (Mitsubishi Gas Chemical; product designation: HL 830-C, 8T12D) comprising a 0.8 mm-thick BT [bis(maleimide)triazine] resin substrate 1 and an 18 μm-thick copper foil 2 laminated to both sides thereof was used as the starting material [FIG. 1(*a*)]. First, this copper-clad laminate was drilled [FIG. 1(*b*)] and a palladium-tin coloid was applied. Using an aqueous electroless plating solution of the under-mentioned formulation, electroless plating was performed to form a 0.7 μm-thick electroless plated copper film on the entire substrate surface.

| [Aqueous electroless plating solution] | |
|---|---|
| EDTA | 150 g/L |
| Copper sulfate | 20 g/L |
| HCHO | 30 ml/L |
| NaOH | 40 g/L |
| α,α'-Bipyridyl | 80 mg/L |
| PEG | 0.1 g/L |
| [Electroless plating conditions] | |
| Bath temperature: | 70° C., for 30 min. |

Then, using an aqueous electroplating solution of the under-mentioned formulation, copper electroplating was performed to provide a 15 μm-thick copper electrodeposition film [FIG. 1(*c*)].

| [Aqueous electroplating solution] | |
| --- | --- |
| Sulfuric acid | 180 g/L |
| Copper sulfate | 80 g/L |
| Additive (Atotech Japan, product designation: Kaparacid GL) | 1 ml/L |
| [Electroplating conditions] | |
| Current density | 1 A/dm$^2$ |
| Time | 30 min. |
| Temperature | Room temperature |

(2) The substrate board carrying an inner copper pattern thus formed (inclusive of plated-through holes 3) was rinsed with water and dried. Then, using an aqueous solution containing NaOH (20 g/L), NaClO$_2$ (50 g/L) and Na$_3$PO$_4$ (15.0 g/L) as oxidation bath (blackening bath) and an aqueous solution containing NaOH (2.7 g/L) and NaBH$_4$ (1.0 g/L) as reduction bath, an oxidation-reduction treatment was carried out to provide a roughened layer 4 on the entire surface of the conductor circuit and plated-through holes [FIG. 1(d)].

(3) The plated-through holes 3 were then filled with an electrically conductive paste 5 containing copper particles by a screen-printing technique and the paste was then dried and cured. The roughened layer 4 on the conductor and the excess conductive paste 5 exposed from the plated-through holes 3 were removed by sanding with a belt sander using a #400 belt sanding paper (Sankyo Rikagaku), followed by abrasion to remove the injuries caused by sanding to flatten the substrate board surface [FIG. 1(e)].

(4) To the flattened surface of the substrate board as prepared in the above step (3) was applied a colloidal palladium catalyst, and electroless plating was carried out in the routine manner to form a 0.6 μm-thick electroless plated copper film 6 [FIG. 1(f)].

(5) Then, copper electroplating was performed under the following conditions to form a electroplating copper layer 7 in a thickness of 15 for thickening the part which was to become a conductor circuit 9 and a conductor layer (cover plating layer) 10 to cover the conductive paste 5 filled into the plated-through holes 3.

| [Aqueous electroplating solution] | |
| --- | --- |
| Sulfuric acid | 180 g/L |
| Copper sulfate | 80 g/L |
| Additive (Atotech Japan, product designation: Kaparacid GL) | 1 ml/L |
| [Electroplating conditions] | |
| Current density | 1 A/dm$^2$ |
| Time | 30 min. |
| Temperature | Room temperature |

Figure 2:
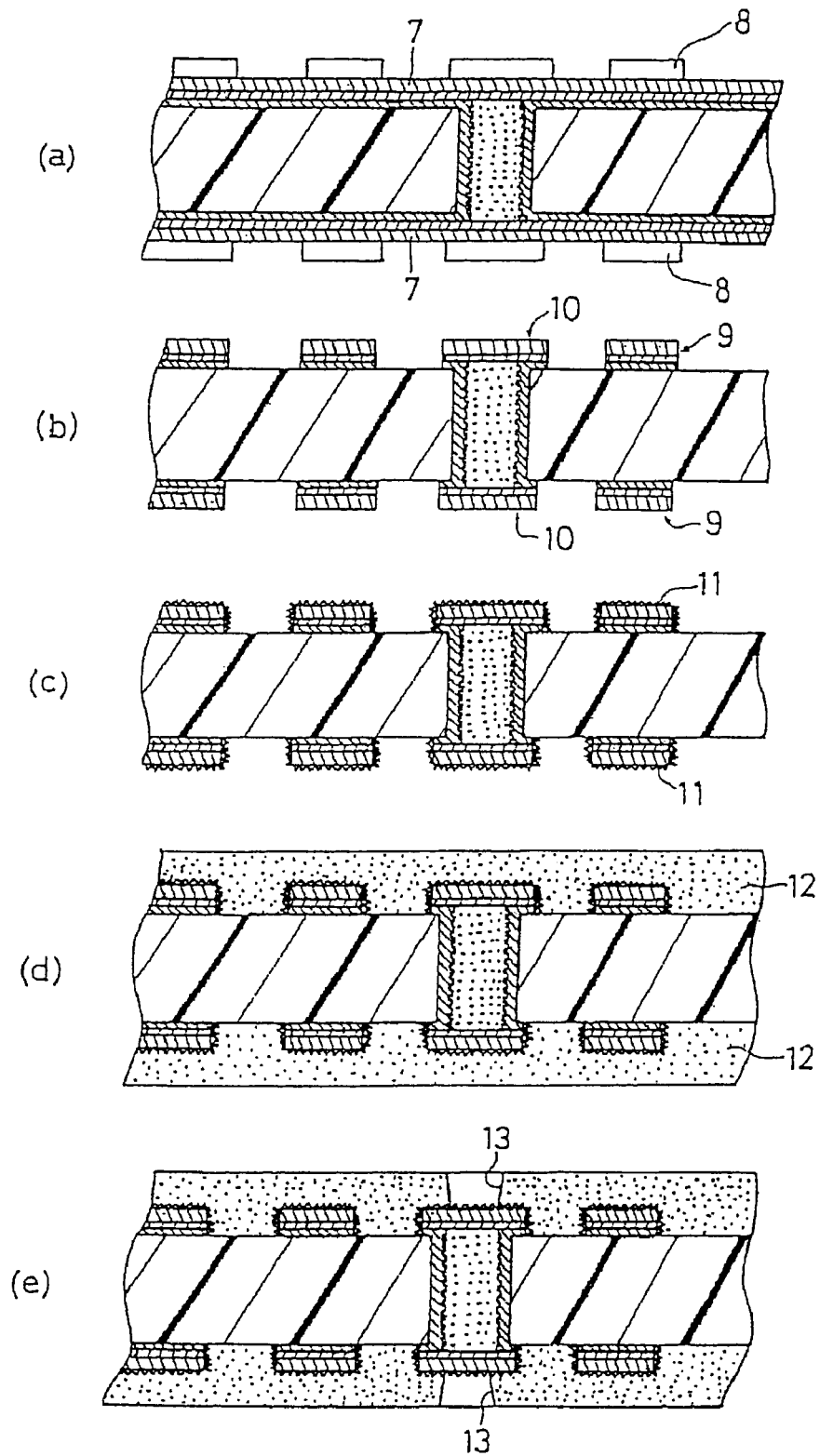
FIG. 2 (a) through (e) are cross-section views illustrating the flow of production of a multilayer printed circuit board in accordance with the first group of the present invention.

(6) To both sides of the substrate board thus formed with said layer to become the conductor circuit 9 and conductor layer 10, a commercial photosensitive dry film was laminated, and with a mask set in position, light exposure at 100 mJ/cm$^2$ and development with 0.8% sodium hydrogen carbonate/water were carried out to provide a 15 μm-thick etching resist 8 [FIG. 2(a)].

(7) The plated metal film not masked by the etching resist 8 was dissolved and removed by etching with a sulfuric acid-hydrogen peroxide solution. Then, the plating resist 8 was stripped off with 5% KOH to provide a discrete conductor circuit 9 and a conductor layer 10 covering the conductive paste 5 (the latter conductor layer is briefly called "cover-plating layer") [FIG. 2(b)].

(8) Then, a 2.5 μm-thick roughened layer (uneven layer) 11 composed of Cu—Ni—P alloy was then formed on the entire surface inclusive of the lateral sides of the conductor circuit 9 and cover-plating layer 10 and a 0.3 μm-thick Sn layer was further built up on the surface of said roughened layer 11 [FIG. 2(c); the Sn layer is not shown].

The specific procedure was as follows. Thus, a substrate board was acid-degreased, soft-etched and, then, treated with a catalyst solution of palladium chloride in an organic acid to apply the Pd catalyst to the substrate board. After this catalyst was activated, electroless plating was carried out using an electroless plating bath (pH=9) comprising an aqueous solution of copper sulfate (8 g/L), nickel sulfate (0.6 g/L), citric acid (15 g/L), sodium hypophosphite (29 g/L), boric acid (31 g/L) and surfactant (Nisshin Chemical Industries, Surfynol 465) (0.1 g/L) to provide a roughened layer 11 composed of Cu—Ni—P alloy on the entire surface of the conductor circuit 9 and cover-plating layer 10. Then, using an aqueous solution of tin borofluoride (0.1 mol/L) and thiourea (1.0 mol/L), a Cu—Sn substitution reaction was carried out at 50° C. and pH=1.2 to provide a 0.3 μm-thick Sn layer on the surface of said roughened layer 11 (the Sn layer is not shown).

(9) To both sides of the above substrate board, a 50 μm-thick thermosetting polyolefin resin sheet (Sumitomo-3M, product designation 1592) was laminated on an ascending temperature gradient of 50 to 180° C. under a pressure of 10 kg/cm$^2$ to provide an interlayer resin insulating layer 12 composed of said polyolefin resin [FIG. 2(d)].

(10) Using a CO$_2$ gas layer at a wavelength of 10.4 μm, openings 13 for via holes, having 80 μm of diameter, were pierced through the interlayer resin insulating layer 12 of polyolefin resin. Then, desmearing was performed by means of oxygen plasma. This plasma treatment was carried out at 500 W under 500 mTorr for 10 minutes.

(11) Then, using Ni as the target, sputtering was performed at gas pressure: 0.6 Pa, temperature: 80° C., power: 200 W and time: 5 min. to form a Ni thin film on the surface of said polyolefin resin insulating layer 12. The thickness of the Ni metal layer thus formed was 0.1 μm.

As the sputtering equipment, SV-4540 manufactured by Japan Vacuum Technology Co., Ltd. was used.

Figure 3:
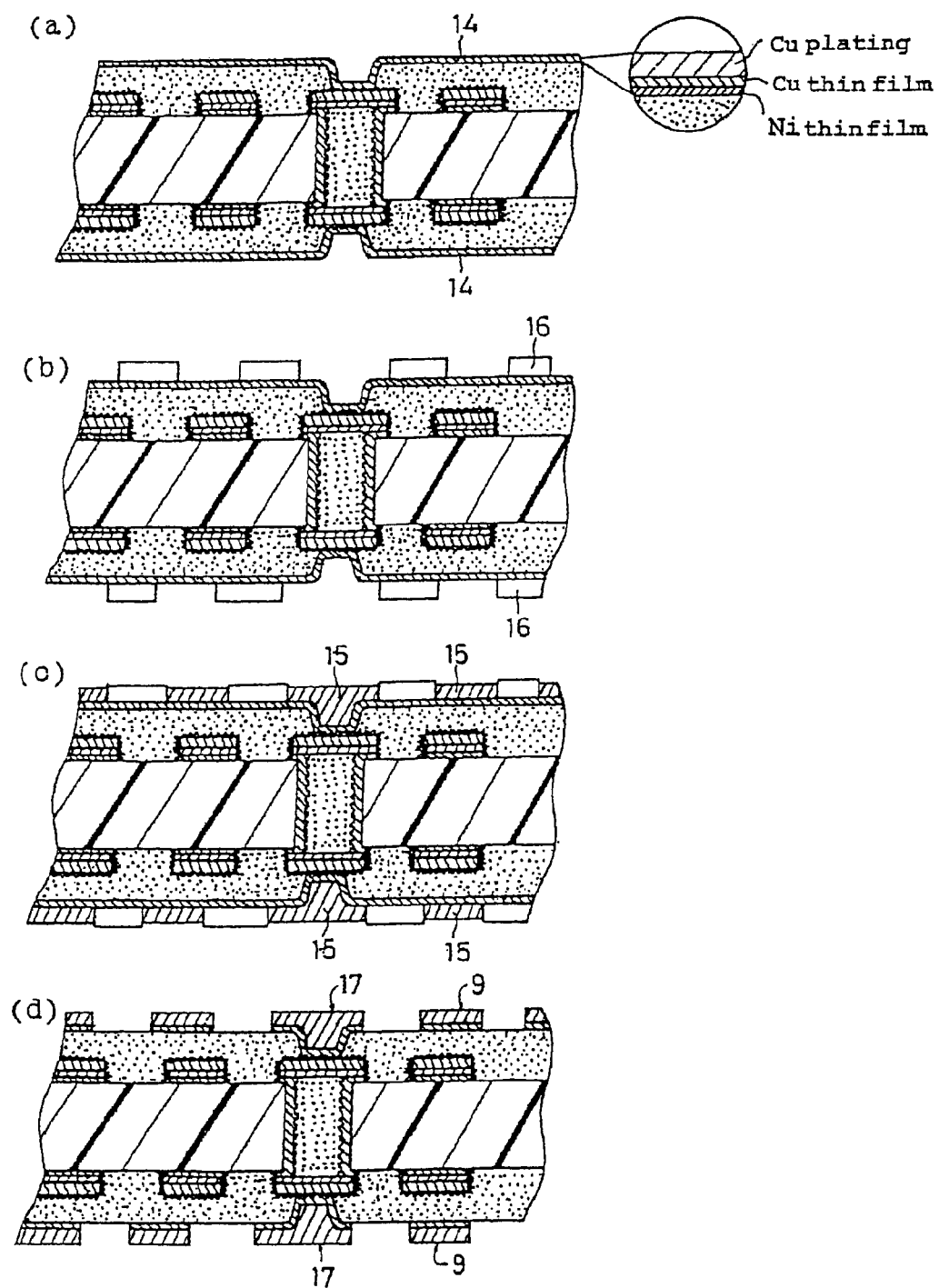
FIG. 3 (a) through (d) are cross-section views illustrating the flow of production of a multilayer printed circuit board in accordance with the first group of the present invention.

(12) The substrate which had undergone the above treatment (11) was further subjected to Cu sputtering to provide a 0.05 μm Cu film. Thus, using Cu as the target, sputtering was carried out under the conditions of gas pressure: 0.6 Pa, temperature: 80° C., power: 200 W and time: 2 min. Then, electroless plating was performed as in step (1) to provide a 0.7 μm-thick electroless plated film 14 [FIG. 3(a)].

(13) To both sides of the substrate formed with said electroless plated film 14 in the above step (12), a commercial photosensitive dry film was laminated, and with a photomask set in position, exposure at 100 mJ/cm$^2$ and development with 0.8% sodium carbonate/water were carried out to provide a 15 μm-thick plating resist 16 [FIG. 3(b)].

(14) In addition, electroplating was performed as in step (1) to provide a 15 μm-thick electroplated copper film 15 for the thickening of conductor circuit 9 and the filling of via holes 17 with the plating metal [FIG. 3(c)].

(15) Then, the plating resist 16 was stripped off with 5% KOH and the Ni film and electroless plated film 14 under the plating resist 16 were dissolved and removed by etching with a sulfuric acid-hydrogen peroxide solution and a nitric acid-hydrochloric acid solution to provide a discrete 16

μm-thick conductor circuit 9 (inclusive of via holes 17) comprising electroless plated copper film 14 and electroplated copper film 15. The fabrication of a multilayer printed circuit board was thus completed [FIG. 3(*b*)].

Example 2

In this example, Mitsui Chemical's TPX (product designation) was used as polyolefin resin and desmear treatment and surface modification were carried out by oxygen plasma treatment. After this surface modification, the presence of polar groups such as hydroxyl and carbonyl on the surface of the insulating layer was confirmed.

Except for the above modification and further except that Ni was deposited on the polyolefin resin insulating layer under the conditions of gas pressure: 0.6 Pa, temperature: 100° C., power: 200 W and time: 1 min, the procedure of Example 1 was otherwise repeated to manufacture a multilayer printed circuit board.

Example 3

In this example, Idemitsu Petrochemical's SPS (product designation) was used as polyolefin resin and desmear tratment and surface modification by oxygen plasma treatment was carried out. After this surface modification, the presence of polar groups such as hydroxyl and carbonyl on the surface of the insulating layer was confirmed.

Except for the above modification and further except that Pt was deposited on the polyolefin resin insulating layer under the conditions of gas pressure: 0.6 Pa, temperature: 100° C., power: 200 W and time 2 min, the procedure of Example 1 was otherwise repeated to manufacture a multilayer printed circuit board.

Example 4

The polyolefin resin used in this example was the resin synthesized by copolymerizing monomers having $CH_2=CH-$, H and phenyl, respectively, for X in said repeating unit structure and crosslinking the resulting polyolefin oligomer with the benzoyl peroxide initiator via $CH_2=CH-$. More particularly, using a film of the polyolefin oligomer film synthesized in the following example of synthesis, the procedure of Example 1 was otherwise repeated to manufacture a multilayer printed circuit board. In this example, as a further modification, Au in lieu of Ni was deposited on the polyolefin resin insulating layer under the conditions of gas pressure: 0.6 Pa, temperature: 100° C., power: 200 W and time: 2 min.

The polyolefin oligomer film synthesized in the following example of synthesis is of the thermosetting type. Thus, this polyolefin oligomer undergoes crosslinking to harden in the course of hot-press operation.

[Example of Synthesis]
(1) In 500 ml of n-heptane were dissolved 104 weight parts of styrene and 10.8 weight parts of butyllithium, and the solution was heated at 70° C. for 3 hours.
(2) A mixed gas of ethylene and butadiene (3:1, v/v) was sit at 70° C. for 5 hours with being bubbled in the solution prepared in the above step (1).
(3) Then, $I_2$ was added and the solution was allowed to stand at 100° C. for 1 hour to remove n-heptane.
(4) The residue was washed with acetone to remove the unreacted starting material and LiI.
(5) A 50 weight-part portion of the resulting product was redissolved in 500 ml of n-heptane and, in addition, 1 weight part of benzoyl peroxide was dissolved therein. The mixture was cast thin on a polyethylene terephthalate film.
(6) The temperature was increased gradually from 50° C. to 100° C. at a rate of 1° C./min., followed by standing at this temperature for 30 minutes to remove the solvent, whereupon a 50-μm thick polyolefin oligomer film in semi-cured state was obtained. This polyolefin oligomer film had a melting point of 110° C.

Example 5

The polyolefin resin used in this example was an epoxy-crosslinked resin synthesized by copolymerizing monomers having epoxy, H and phenyl, respectively, for X in said repeating unit structure and crosslinking the resulting polyolefin oligomer with the initiator benzoyl peroxide. More particularly, using a film of the polyolefin oligomer film synthesized in the following example of synthesis, the procedure of Example 1 was otherwise repeated to manufacture a multilayer printed circuit board. However, in this example, Ti in lieu of Ni was deposited on the polyolefin resin insulating layer under the conditions of gas pressure: 0.6 Pa, temperature: 100° C., power: 200 W and time: 5 min.

The polyolefin oligomer film synthesized in the following example of synthesis is of the thermosetting type. Thus, this polyolefin oligomer undergoes crosslinking to harden in the course of hot-press operation.

[Example of Synthesis]
(1) In 500 ml of n-heptane were dissolved 104 weight parts of styrene and 10.8 weight parts of butyllithium, and the solution was heated at 70° C. for 3 hours.
(2) With a mixed gas of ethylene and butadiene (3:1, v/v) bubbled in the solution prepared in the above step (1), the solution was allowed to stand at 70° C. for 5 hours.
(3) Then, $I_2$ was added and the mixture was allowed to stand at 100° C. for 1 hour to remove n-heptane.
(4) The residue was washed with acetone to remove the unreacted material and LiI.
(5) The product obtained in the above step (4) was redissolved in n-heptane, followed by dissolution of about 1.3 equivalents of perbenzoic acid based on the residual double bond content of the product, and the solution was allowed to stand at 50° C. for 5 hours.
(6) The solution was further left standing at 100° C. for 1 hour to remove n-heptane.
(7) The residue was washed with acetone, and after removal of acetone, the residue was redissolved in n-heptane, followed by addition of a small amount of TPP (triphenylphosphine).
(8) The product obtained in the above step (7) was cast on a polyethylene terephthalate film and the temperature was increased from 50° C. to 100° C. at a rate of 1° C./min. and held at this temperature for 30 minutes, whereby an uncured polyolefin oligomer film was obtained. The melting point of this polyolefin oligomer film was 120° C.

Example 6

The polyolefin resin used in this example was an epoxy-crosslinked resin synthesized by copolymerizing monomers having epoxy, H and phenyl, respectively, for X in said repeating unit structure and crosslinking the resulting polyolefin oligomer with the initiator benzoyl peroxide. More particularly, using a film of the polyolefin oligomer film synthesized in the following example of synthesis, the procedure of Example 1 was otherwise repeated to manufacture a multilayer printed circuit board. However, in this example, Co in lieu of Ni was deposited on the polyolefin resin insulating layer under the conditions of gas pressure: 0.6 Pa, temperature: 100° C., power: 200 W and time: 5 min.

The polyolefin oligomer film synthesized in the following example of synthesis is of the thermosetting type. Thus, this polyolefin oligomer undergoes crosslinking to harden in the course of hot-press operation.

[Example of Synthesis]

(1) In 500 ml of n-heptane were dissolved 104 weight parts of styrene and 10.8 weight parts of butyllithium, and the solution was heated at 70° C. for 3 hours.

(2) A mixed gas of ethylene and butadiene (3:1, v/v) was sit at 70° C. for 5 hours with being bubbled in the solution prepared in the above step (1).

(3) Then, $I_2$ was added and the solution was allowed to stand at 100° C. for 1 hour to remove n-heptane.

(4) The residue was washed with acetone to remove the unreacted starting material and LiI.

(5) Twenty (20) weight parts of the product obtained in the above step (4) was suspended in a cyclohexanol-supplemented aqueous solution containing 60 weight % of sulfuric acid and 0.5 weight % of hydrogen peroxide and the suspension was allowed to stand at room temperature for 2 hours.

(6) The product was then extracted with tetrahydrofuran (THF) and while the extract was maintained at 5° C., ketene gas was continuously bubbled through it for 10 minutes.

(7) The reaction mixture obtained in the above step (6) was cast on a polyethylene terephthalate film and allowed to dry spontaneously at room temperature, whereby THF and ketene were removed to give an uncured polyolefin oligomer film. The melting point of this polyolefin oligomer film was 105° C.

Example 7

The polyolefin resin used in this example was the resin synthesized by copolymerizing monomers having H and phenyl, respectively, for X in said repeating unit structure and a monomer having a —$(CH_2—CH=CH—CH_2)_m$— structure within its backbone chain and crosslinking the resulting polyolefin oligomer by a condensation reaction involving the decarboxylation of the lactone group in the presence of the initiator benzoyl peroxide. More particularly, using a film of the polyolefin oligomer prepared in the following example of synthesis, the procedure of Example 1 was otherwise repeated to manufacture a multilayer printed circuit board. In this example, however, Cr in lieu of Ni was deposited on the polyolefin resin insulating layer under the conditions of gas pressure: 0.6 Pa, temperature: 100° C., power: 200 W and time: 3 min.

[Example of Synthesis]

(1) In 500 ml of n-heptane was dissolved 104 weight parts of styrene and a mixed gas of ethylene and butadiene (3:1, v/v) was bubbled in the solution.

(2) With the introduction of said mixed gas continued, 4 weight parts of benzoyl peroxide was dissolved in the solution, and the solution was allowed to stand at 70° C. for 3 hours.

(3) This reaction mixture was heated at 100° C. for 1 hour to remove n-heptane.

(4) The residue was washed with acetone, and after removal of acetone, 50 weight parts of the residue was redissolved in 500 ml of n-heptane followed by addition of 3 weight parts of benzoyl peroxide.

(5) The solution thus obtained was cast thin on a polyethylene terephthalate film and heated from 50° C. to 100° C. at a rate of 1° C./min, followed by further standing for 30 minutes to give a polyolefin oligomer film in semi-cured state. The melting point of this polyolefin oligomer film was 78° C.

Example 8

The polyolefin resin used in this example was the resin prepared by synthesizing a polyolefin oligomer having OH for X in said repeating unit structure and a polyolefin oligomer having a lactone structure within its backbone chain and crosslinking these oligomers via OH and lactone groups. More particularly, using a film of the polyolefin oligomer film prepared in the following example of synthesis, the procedure of Example 1 was otherwise repeated to manufacture a multilayer printed circuit board.

[Example of Synthesis]

(1) In 500 ml of 3-heptane was dissolved 100 weight parts of acrylic acid, and with a small amount of butadiene gas bubbled in the solution, 2 weight parts of benzoyl peroxide was added and dissolved. The solution was then allowed to stand at 50° C. for 1 hour. Thereafter, with a mixed gas of ethylene and butadiene (3:1, v/v) bubbled in the solution, the solution was allowed to stand at 70° C. for 3 hours.

(2) This reaction mixture was heated at 150° C. for 2 hours to remove 3-heptanone, and the unreacted starting material was removed with acetone.

(3) To cyclohexanol was added 20 weight parts of the above product, and the mixture was suspended in 60% sulfuric acid/water and allowed to stand at room temperature for 2 hours. Then, the reaction mixture was extracted with ethyl acetate.

(4) To the extract obtained was added thionyl chloride, and the mixture was allowed to stand at room temperature for 2 hours. Thereafter, ethyl acetate and other low molecular substances were distilled off under reduced pressure and the residue was washed with acetone again.

(5) Separately, a Ziegler catalyst ($Al(Et)_3$+Co support) and a small amount of acetaldehyde were dissolved in xylene, and with ethylene gas bubbled in the solution, the reaction was carried out at 50° C.

(6) The reaction system was heated at 150° C. for 30 minutes to remove xylene and the residue was washed with dilute hydrochloric acid and acetone. The resulting product was dissolved in n-heptane. In this solution was dissolved the product obtained in the above step (4), and the mixed solution was cast on a polyethylene terephthalate film. The temperature was increased from 50° C. to 100° C. at a rate of 1° C./min. and the casting was allowed to sit for 30 minutes to provide an uncured polyolefin film. The melting point of this polyolefin film was 210° C.

Example 9

(Example of Block Copolymerization)

The polyolefin resin used in this example was the resin prepared by polymerizing a monomer having phenyl for X in said repeating unit structure and a monomer having a —$(CH_2—CH=CH—CH_2)_m$— structure within its backbone chain and crosslinking the resulting polyolefin oligomers. More particularly, using a film of the polyolefin oligomer film prepared in the following example of synthesis, the procedure of Example 1 was otherwise repeated to provide a multilayer printed circuit board.

[Example of Synthesis]
(1) In 500 ml of n-heptane was dissolved 104 weight parts of styrene. Then, butadiene gas was bubbled in the solution and, further, $BF_3$ was bubbled in the solution for 10 minutes.
(2) Then, with butadiene gas alone bubbled in the solution, the reaction was carried out at 70° C. for 2 hours.
(3) This reaction mixture was cast thin on a polyethylene terephthalate film and heated at 100° C. for 30 minutes to remove n-heptane, whereupon an uncured polyolefin film was obtained. The melting point of this polyolefin film was 100° C. In addition, the cured film was disrupted in liquefied nitrogen and the cross-section of the fragment was examined by electron microscopy and ESCA. The examinations revealed that it was a block copolymer of polystyrene and polybutadiene. Each block was about 0.5 to 2 μm long.

Example 10

(Polymer Alloy: Thermoplastic Polyolefin+Thermosetting Polyolefin)

Using the polyolefin film prepared as in the following example of synthesis, the procedure of Example 1 was repeated to provide a multilayer printed circuit board.
[Example of Synthesis]
(1) In 500 ml of n-heptane were dissolved 104 weight parts of styrene and 10.4 weight parts of butyllithium, and the solution was heated at 70° C. for 3 hours.
(2) A mixed gas of ethylene and butadiene (3:1, v/v) was sit at 70° C. for 5 hours with being bubbled in the solution prepared in the above step (1).
(3) Then, $I_2$ was added and the solution was allowed to stand at 100° C. for 1 hour to remove n-heptane.
(4) The residue was washed with acetone to remove the unreacted starting material and LiI.
(5) Separately, the thermoplastic polyolefin SPS (product designation, Idemitsu Petrochemical) was dissolved in xylene.
(6) The solutions prepared in the above steps (4) and (5) were mixed and cast and the temperature was increased from 50° C. to 150° C. at a rate of 1° C./min to remove the solvent and provide an uncured polyolefin film.

Example 11

(Polymer Alloy: Thermoplastic Polyolefin+Thermosetting Resin)

Using the polyolefin film prepared in the following example of synthesis, the procedure of Example 1 was otherwise repeated to provide a multilayer printed circuit board.
[Example of Synthesis]
(1) In n-heptane was dissolved polymethylpentene (Mitsui Chemical, product designation TPX), and the solution was mixed with bisphenol F epoxy resin, an imidazole series curing agent (Shikoku Kasei, 2E4MZ-CN) and TPP (triphenylphosphine) according to the following formulation.

|  | Weight parts |
| --- | --- |
| TPX | 80 |
| Bisphenol F epoxy resin | 15 |
| Imidazole curing agent | 5 |
| TPP | 0.1 |

(2) Using a roll coater, the solution prepared in the above step (1) was cast on a polyethylene terephthalate film and heated at 70° C. for 30 minutes to remove the solvent.
(3) The resin was completely cured by heating at 180° C. for 5 hours to provide a polyolefin film.

Comparative Example 1

In this comparative example, a fluororesin was used as the inter-level insulating resin but otherwise the procedure of Example 1 was repeated to provide a multilayer printed circuit board.

Formation of the inter-level insulating resin layer was carried out by laminating a 25 μm-thick Teflon sheet (DuPont, product designation: Teflon FEP) at a temperature of 200° C. and a pressure of 20 kg/cm², followed by annealing at 300° C.

Comparative Example 2

In this comparative example, except that an epoxy acrylate resin was used as the inter-level insulating resin, the procedure of Example 1 was otherwise repeated to provide a multilayer printed circuit board.

Formation of the interlayer resin insulating layer was carried out by coating with a cresol novolac epoxy acrylate resin (Kyoeisha, CNA-25) and subsequent curing at 120° C. for 3 hours.

For each of the multilayer printed circuit boards obtained in the foregoing examples and comparative examples, measurement of peel strength, a heat cycle test setting from −55° C. to 125° C. (3 minutes each) in 1000 cycles, dielectric constant determination and a solider heat resistance test were performed.

As a result, the peel strength was: the circuit board of Example 1: 2.4 kg/cm, the circuit board of Example 2: 2.0 kg/cm, the circuit board of Example 3: 1.5 kg/cm, the circuit board of Example 4: 1.7 kg/cm, the circuit board of Example 5: 1.5 kg/cm, the circuit board of Example 6: 1.8 kg/cm, the circuit board of Example 7: 2.1 kg/cm, the circuit board of Example 8: 1.6 kg/cm, the circuit board of Example 9: 1.3 kg/cm, the circuit board of Example 10:1.2 kg/cm, the circuit board of Example 11: 1.4 kg/cm.

Thus, in the circuit board according to the present invention wherein the polyolefin resin is used for the interlayer resin insulating layer, a practically useful peel strength can be insured despite the omission of surface roughening of the interlayer resin insulating layer.

This is in contrast to the circuit board of Comparative Example 1, the peel strength of which was 0.7 kg/cm, one-half of the value of the corresponding example of this invention.

In the heat cycle test, the circuit boards according to Examples 1 through 11 showed no cracking of the inter-level rein insulating layer.

In contrast, the circuit board of Comparative Example 2 showed cracks originating from the interface between the conductor circuit and the interlayer resin insulating layer.

The dielectric constant of the circuit board according to Example 1 wherein the polyolefin resin was used for the interlayer resin insulating layer at 10 MHz, 100 MHz, 500 MHz and 1 GHz were 2.8, 2.7, 2.6 and 2.5, respectively. The dielectric loss tangent was 0.001.

Moreover, in the solder heat resistance test (260° C., 30-sec. dip), no stripping was observed.

Example 12

Figure 4:
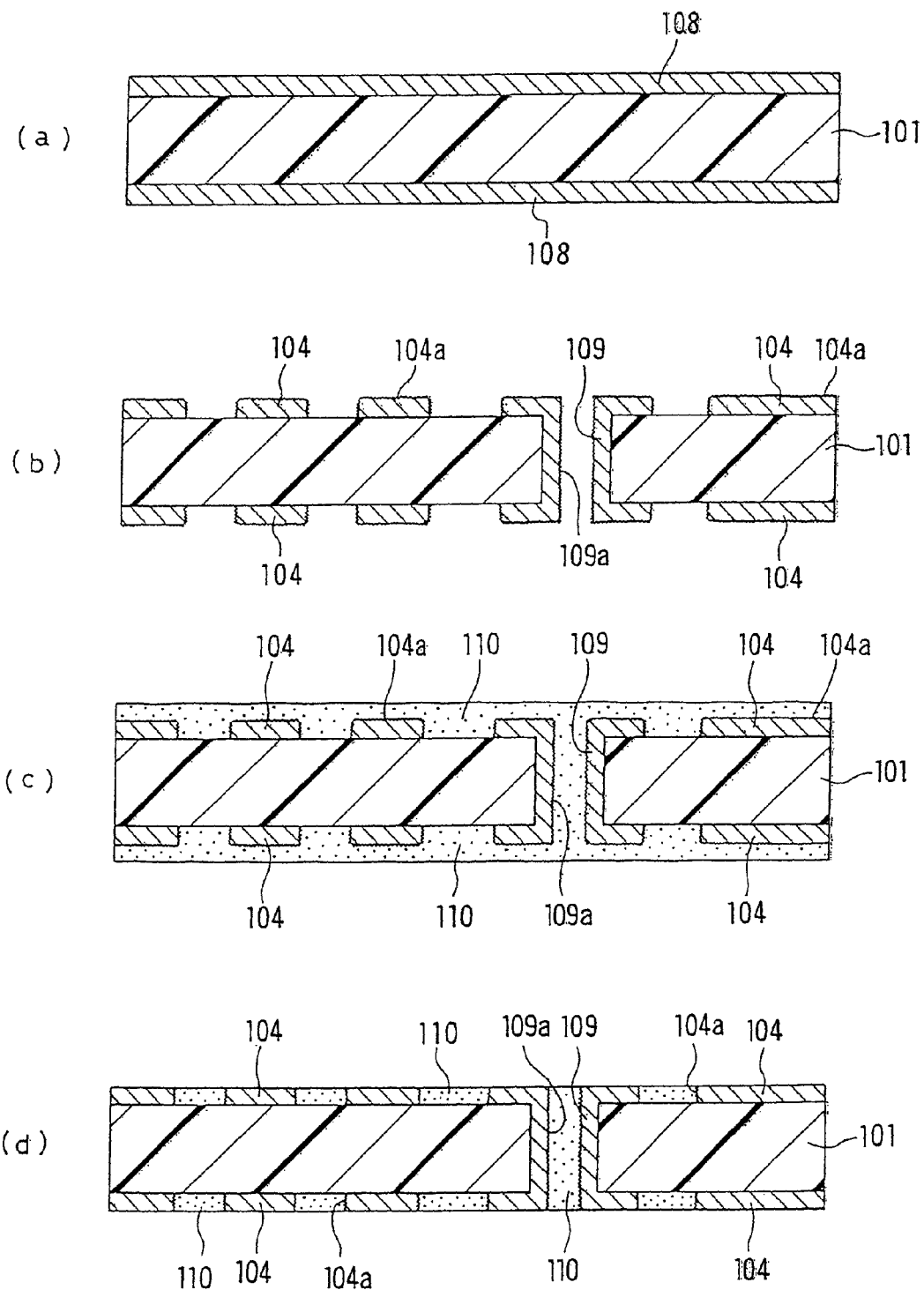
FIG. 4 (a) through (d) are cross-section views illustrating the flow of production of a multilayer printed circuit board in accordance with the second group of the present invention.

(1) A copper-clad laminate comprising a 1 mm-thick glass-epoxy resin or BT [bis(maleimide) triazine] resin sheet 101 and an 18 μm-thick copper foil 108 laminated to both sides of said sheet was used as the starting material [FIG. 4(*a*)]. First, the above copper-clad laminate was drilled and a plating resist was formed thereon. The laminate was then subjected to electroless copper plating to provide plated-through holes 109. Thereafter, the copper foil was dissolved and removed by etching in the routine manner to provide an inner copper pattern (lower-layer conductor circuit) on both sides of the substrate board.

(2) The substrate board formed with lower-layer conductor circuits 104 was rinsed with water and dried and both sides of the substrate board were sprayed with an etching solution to etch the surface of the lower-layer conductor circuit 104 and the land surfaces and internal walls of the plated-through holes 109, whereby rough surfaces 104*a* and 109*a* were imparted to the entire surface of the lower-layer conductor circuit 104 [FIG. 4(*b*)]. The etching solution was a mixture of 10 weight parts of imidazole copper (II) complex, 7 weight parts of glycolic acid, 5 weight parts of potassium chloride and 78 weight parts of deionized water.

(3) Using a printer, a resin filler 110 composed predominantly of cycloolefin resin was applied to both sides of the substrate board to fill up the pattern gaps of the lower-layer conductor circuit 104 and the plated-through holes 109, followed by oven-drying. By this operation, the pattern gaps of the lower-layer conductor circuit 104 and the plated-through holes 109 were filled with the resin filler 110 [FIG. 4(*c*)].

(4) One side of the substrate board subjected to the above step (3) was abraded with a belt sander using a belt sanding paper (Sankyo Rikagaku) to eliminate the resin filler 110 from the surface of lower-layer conductor circuit 104 and the land surface of the plated-through holes 109, followed by abrasion to get rid of injuries caused by sanding. The other side of the substrate board was also subjected to the same treatment series. Then, the resin filler 110 was cured by heating [FIG. 4(*d*)].

In this manner, the superficial layer of the resin filler 110 filled in the plated-through holes 109 and the roughened surface layer 104*a* on the lower-layer conductor circuit 104 were removed to smoothen the surface on both sides of the substrate board to thereby give a multilayer printed circuit board featuring a firm adhesion between the resin filler 110 and the lateral walls of the lower-layer conductor circuit 104 through the roughened layer 104*a* as well as a firm adhesion between the internal walls of the plated-through holes 109 and the resin filler 110 via the roughened layer 109*a*.

Figure 5:
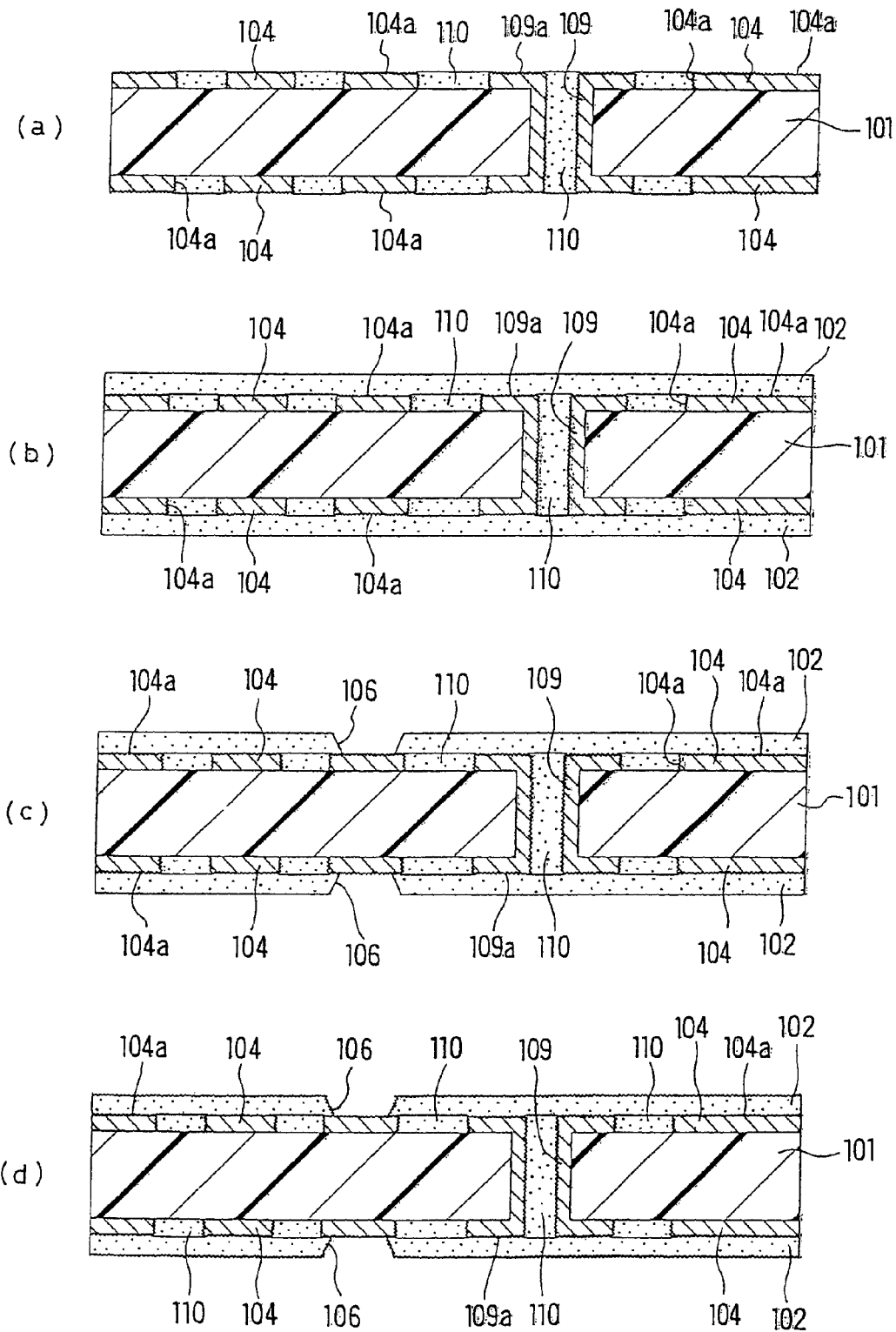
FIG. 5 (a) through (d) are cross-section views illustrating the flow of production of a multilayer printed circuit board in accordance with the second group of the present invention.

(5) Then, both sides of the circuit board obtained in the above step (4) was sprayed with the same etching solution as used in step (2) to etch off the flattened surface of the lower-layer conductor circuit 104 and the land surfaces of the plated-through holes 109, whereby roughened surfaces 104*a* and 109*a* were imparted to the entire surface of the lower-layer conductor circuit 104 [FIG. 5(*a*)].

(6) Then, to both sides of the substrate board treated in the above step, a 50 μm-thick thermosetting cycloolefin resin sheet was laminated by vacuum press lamination with a temperature increasing 50° C. to 150° C. and a pressure of 5 kg/cm² to provide an interlayer resin insulating layer 102 composed of cycloolefin resin [FIG. 5(*b*)]. The degree of vacuum used in this vacuum press lamination was 10 mmHg.

(7) Then, using a CO₂ gas laser at a wavelength of 10.4 μm, openings 106 for via holes, having 80 μm of diameter, were pierced through the interlayer resin insulating layer 102 of cycloolefin resin under the conditions of beam dia. 5 mm, top hat mode, pulse width 50 μsec., mask aperture dia. 0.5 mm, 3 shots [FIG. 5(*c*)]. Then, desmear treatment with oxygen plasma was carried out.

(8) Then, using Japan Vacuum Technology's SV-4540, a plasma treatment was carried out to roughen the surface of the interlayer resin insulating layer 102 [FIG. 5(*d*)]. This plasma treatment was carried out using argon gas as the inert gas for 2 minutes under the conditions of power: 200 W, gas pressure: 0.6 Pa and temperature: 70° C.

(9) Then, using the same equipment, after argon gas purging, a sputtering was carried out using Ni—Cu alloy as the target under the conditions of gas pressure: 0.6 Pa, temperature: 80° C., power 200 W and time: 5 min. to form a Ni—Cu alloy layer 112 on the surface of the interlayer resin insulating layer 102 of polyolefin resin. The thickness of the Ni—Cu alloy layer 112 thus formed was 0.2 μm [FIG. 6(*a*)].

Figure 6:
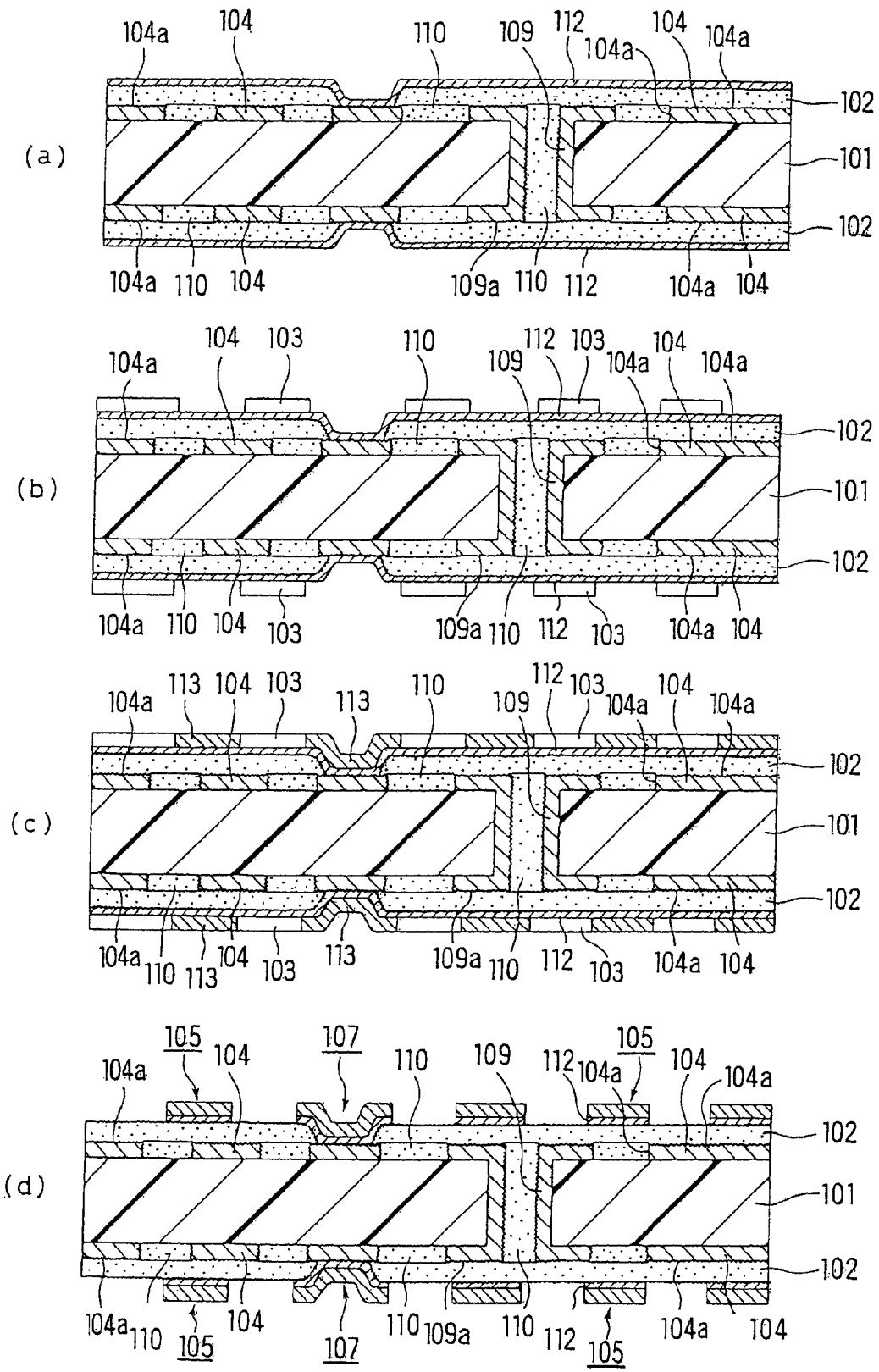
FIG. 6 (a) through (d) are cross-section views illustrating the flow of production of a multilayer printed circuit board in accordance with the second group of the present invention.

(10) To both sides of the substrate board treated as above, a commercial photosensitive dry film was laminated, and with a photomask film set in position, light exposure at 100 mJ/cm² and development with 0.8% sodium carbonate/water were carried out to form a 15 μm-thick plating resist 103 pattern [FIG. 6(*b*)].

(11) Then, electroplating was performed under the following conditions to form a 15 μm-thick electroplated layer 113 [FIG. 6(*c*)]. This electroplated film 113 served the purpose of thickening the part to form the conductor circuit 105 and filling the region to form via holes 107 in the subsequent step. The additive used in the electroplating solution was Kaparacid HL from Atotech Japan.

| [Aqueous electroplating solution] | |
|---|---|
| Sulfuric acid | 2.24 mol/L |
| Copper sulfate | 0.26 mol/L |
| Additive | 19.5 mol/L |
| [Electroplating conditions] | |
| Current density | 1 A/dm² |
| Time | 65 min. |
| Temperature | 22 ± 2° C. |

(12) Then, the plating resist 103 was stripped off with 5% NaOH and the Ni—Cu alloy layer 112 under the resist 103 was dissolved and removed by etching with nitric acid and sulfuric acid-hydrogen peroxide to provide a 16 μm-thick conductor circuit 105 (inclusive of via holes 107) comprising electroplated copper film 113 [FIG. 6(*d*)].

Figure 7:
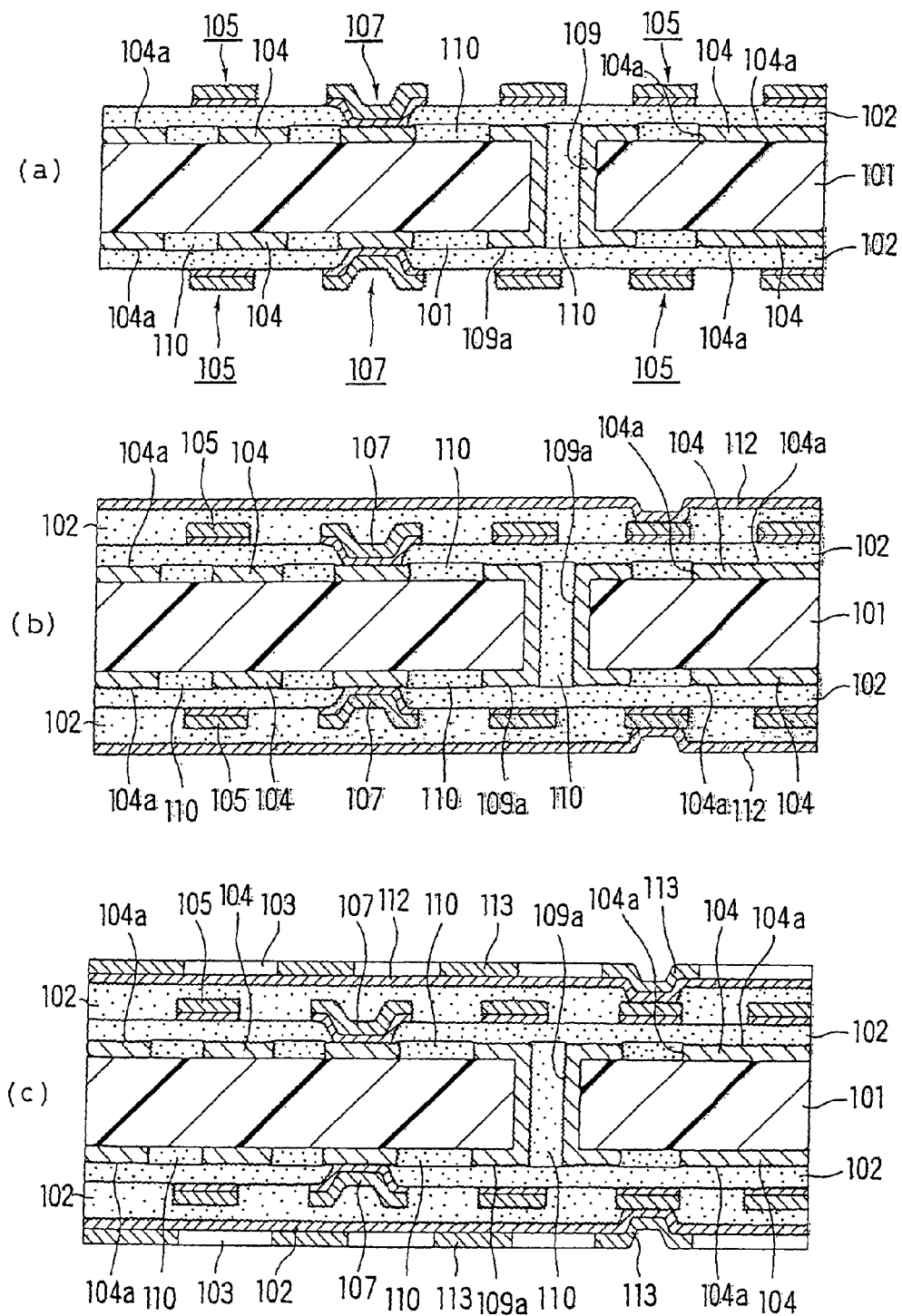
FIG. 7 (a) through (c) are cross-section views illustrating the flow of production of a multilayer printed circuit board in accordance with the second group of the present invention.
Figure 8:
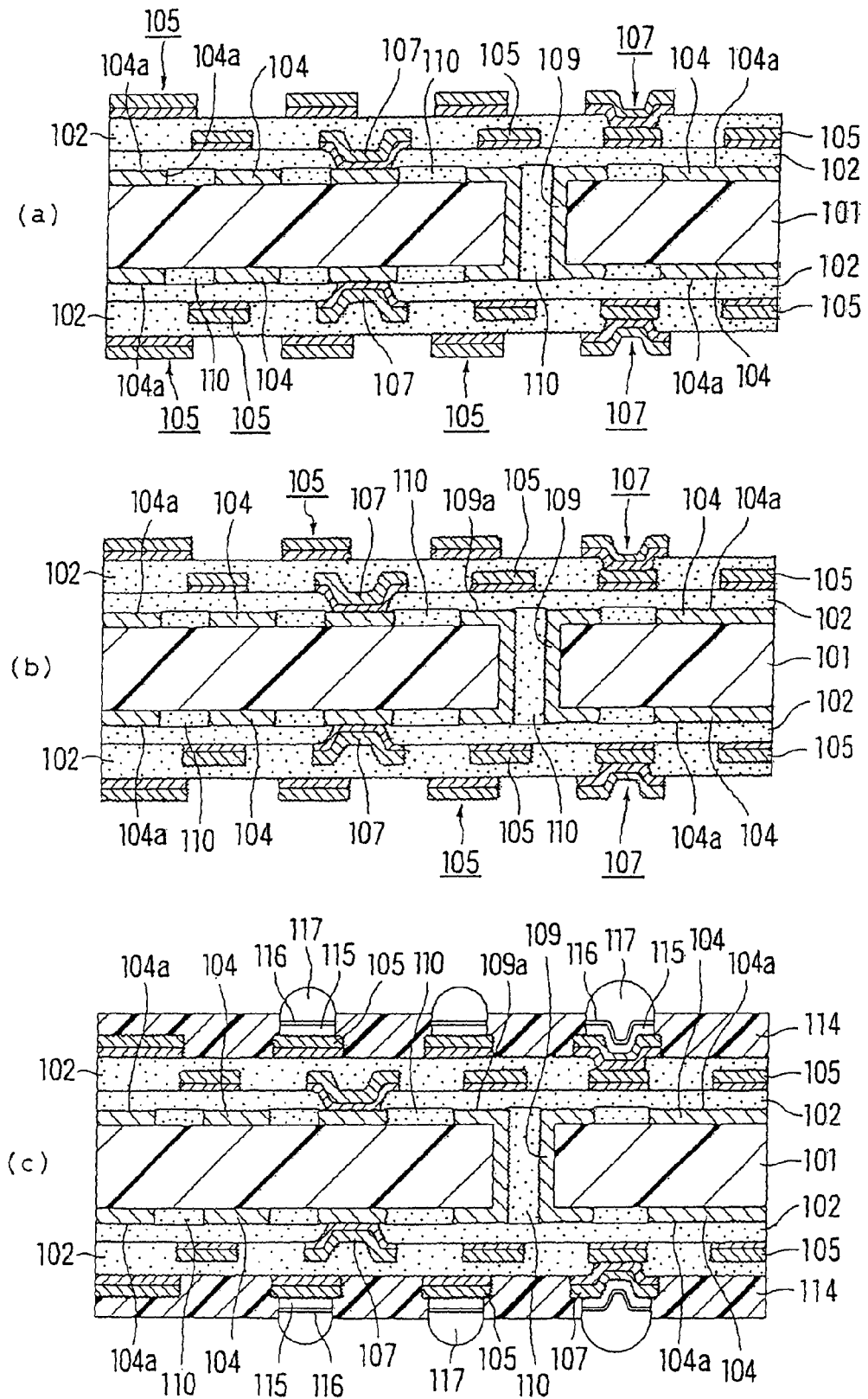
FIG. 8 (a) through (c) are cross-section views illustrating the flow of production of a multilayer printed circuit board in accordance with the second group of the present invention.

(13) Then, the above sequence of steps (5) to (13) was repeated to build a further upper-layer conductor circuit [FIG. 7(*a*) to FIG. 8(*b*)].

(14) Then, 46.67 weight parts of a photosensitized oligomer (mol. wt.: 4000) prepared by acrylating 50% of the epoxy groups of cresol novolac epoxy resin (Nippon Kayaku) as dissolved in diethylene glycol dimethyl ether (DMDG) to a concentration of 60 weight %, 15 weight parts of bisphenol A epoxy resin (Yuka-Shell, product designation: Epikote 1001) as dissolved in methyl ethyl ketone to a concentration of 80 weight %, 1.6 weight parts of imidazole series curing agent (Shikoku Kasei, product designation: 2E4MZ-CN), 3 weight parts of a polyfunctional acrylic monomer [photosensitive monomer] (Nippon Kayaku, product designation: R604), 1.5 weight parts of a polyfunctional acrylic monomer [photosensitive monomer] (Kyoei Kagaku, product designation: DPE6A), and 0.71 weight part of dispersion antifoam (Sun Nopco, product designation: S-65) were taken in a vessel, stirred and mixed to prepare a mixed composition. To this mixed composition, 2.0 weight parts of the photopolymerization initiator benzophenone (Kanto Chemical) and 0.2 weight part of the photosensitizer Michler's ketone (Kanto Chemical) were added, and the viscosity of the whole mixture was adjusted to 2.0 Pa·s at 25° C. to provide a solder resist composition (an organic resin insulating material).

The measurement of viscosity was performed with a Type B viscometer (Tokyo Instruments, DVL-B) using Rotor No. 4 for 60 rpm and Rotor No. 3 for 6 rpm.

(15) Then, on both sides of the multilayer circuit board, the solder resist composition prepared above was coated in a thickness of 20 μm and oven-dried at 70° C. for 20 minutes and, then, at 70° C. for 30 minutes. Thereafter, with a 5 mm-thick photomask printed with a pattern of solder resist openings set in close contact with the solder resist layer, exposure to ultraviolet light at 1000 mJ/cm² and development with DMTG were carried out to form openings measuring 200 μm in diameter.

The substrate board was then heated at 80° C. for 1 hour, at 100° C. for 1 hour, at 120° C. for 1 hour and at 150° C. for 3 hours to cure the solder resist layer. In this manner, a 20 μm-thick solder resist layer (organic resin insulating layer) 114 comprising openings through solder pad.

(16) The substrate board carrying the solder resist layer (organic resin insulating layer) 114 as constructed as above was then immersed in an electroless nickel plating solution (pH=4.5) containing nickel chloride ($2.3 \times 10^{-1}$ mol/L), sodium hypophosphite ($2.8 \times 10^{-1}$ mol/L) and sodium citrate ($1.6 \times 10^{-1}$ mol/L) for 20 minutes to form a 5 μm-thick plated nickel layer 115 in the openings. This substrate board was further immersed in an electroless plating solution containing potassium gold cyanide ($7.6 \times 10^{-3}$ mol/L), ammonium chloride ($1.9 \times 10^{-1}$ mol/L), sodium citrate ($1.2 \times 10^{-1}$ mol/L) and sodium hypophosphite ($1.7 \times 10^{-1}$ mol/l) at 80° C. for 7.5 minutes to form a 0.03 μm-thick plated gold layer 116 on said plated nickel layer 115.

(17) Then, the openings of the solder resist layer 114 were supplied with a solder paste by printing, followed by reflow at 200° C., to provide solder vamps (solder masses) 117 and thus, provide a multilayer printed circuit board comprising solder vamps 117 [FIG. 8(c)].

The multilayer printed circuit board thus obtained was subjected to the measurement of dielectric constant, dielectric loss tangent and peel strength, heat treatment test at 128° C. for 48 hr, and heat cycle test setting 1000 cycles at −55° C. to 125° C. After the above heat treatment test and after the heat cycle test, the degree of delamination between the interlayer resin insulating layer and the lower-layer conductor circuit was evaluated and the percent change in via hole resistance was determined. The results are presented below in Table 1.

Example 13

Except that both the etching of the conductor circuit in step (5) and the roughening of the interlayer resin insulating layer in step (8) were omitted, the procedure of Example 12 was otherwise repeated to provide a multilayer printed circuit board. The multilayer printed circuit board thus obtained was subjected to the same determinations and evaluations as described in Example 12. The results are presented below in Table 1.

Comparative Example 3

Except that a thermosetting linear polyolefin resin (Sumitomo-3M, product designation: 1592) was used as the resin for construction of the interlayer resin insulating layer, the procedure of Example 12 was otherwise repeated to provide a multilayer printed circuit board. This multilayer printed circuit board was tested and evaluated as in Example 12. The results are presented below in Table 1.

TABLE 1

| | Dielectric constant ($\epsilon$) | Dielectric loss tangent ($\tan\delta$) | Peel strength (kg/cm) | Heat treatment test | Heat cycle test |
|---|---|---|---|---|---|
| Example 12 | 2.5 | 0.008 | 1.0 | No peel; Resistance change 0% | No peel; Resistance change 0% |
| Example 13 | 2.8 | 0.008 | 1.0 | No peel; Resistance change 0% | No peel; Resistance change 0% |
| Compar. Example 3 | 3.1 | 0.1 | 0.3 | Resistance change 30% | Resistance change 30% |

It will be apparent from Table 1 that, even after the heat treatment test and after the heat cycle test, the multilayer printed circuit boards according to the examples were little changed in resistance between the conductor circuit and interlayer resin insulating layer and showed no delamination between the conductor circuit and the interlayer resin insulating layer. In contrast, the multilayer printed circuit board according to the comparative example showed either a marked change in resistance or delamination after either test.

Example 14

A. Preparation of an Adhesive for Electroless Plating Use (1) Thirty-five (35) weight parts of cresol novolac epoxy resin (Nippon Kayaku, mol. wt.: 2500) 25% acrylate, 3.15 weight parts of photosensitive monomer (To a Gosei, Aronix M325), 0.5 weight part of antifoam and 3.6 weight parts of N-methylpyrrolidone (NMP) were taken in a vessel, then stirred and mixed to provide a mixed composition.

(2) Separately, 12 weight parts of polyethersulfone (PES), 7.2 weight parts of epoxy resin particle (Sanyo Kasei, Polymerpole) having a mean particle diameter of 1.0 μm and 3.09 weight parts of the same resin particle having a mean particle diameter of 0.5 μm were taken in another vessel and stirred. Then, 30 weight parts of NMP was further added and the whole mixture was stirred in a beads mill to provide another mixed composition.

(3) In addition, 2 weight parts of an immidazole series curing agent (Shikoku Kasei, 2E4MZ-CN), 2 weight parts of the photopolymerization initiator benzophenone, 0.2 weight parts of the photosensitizer Michler's ketone and 1.5 weight parts of NMP were taken in still another vessel and mixed to provide a mixed composition.

Figure 9:
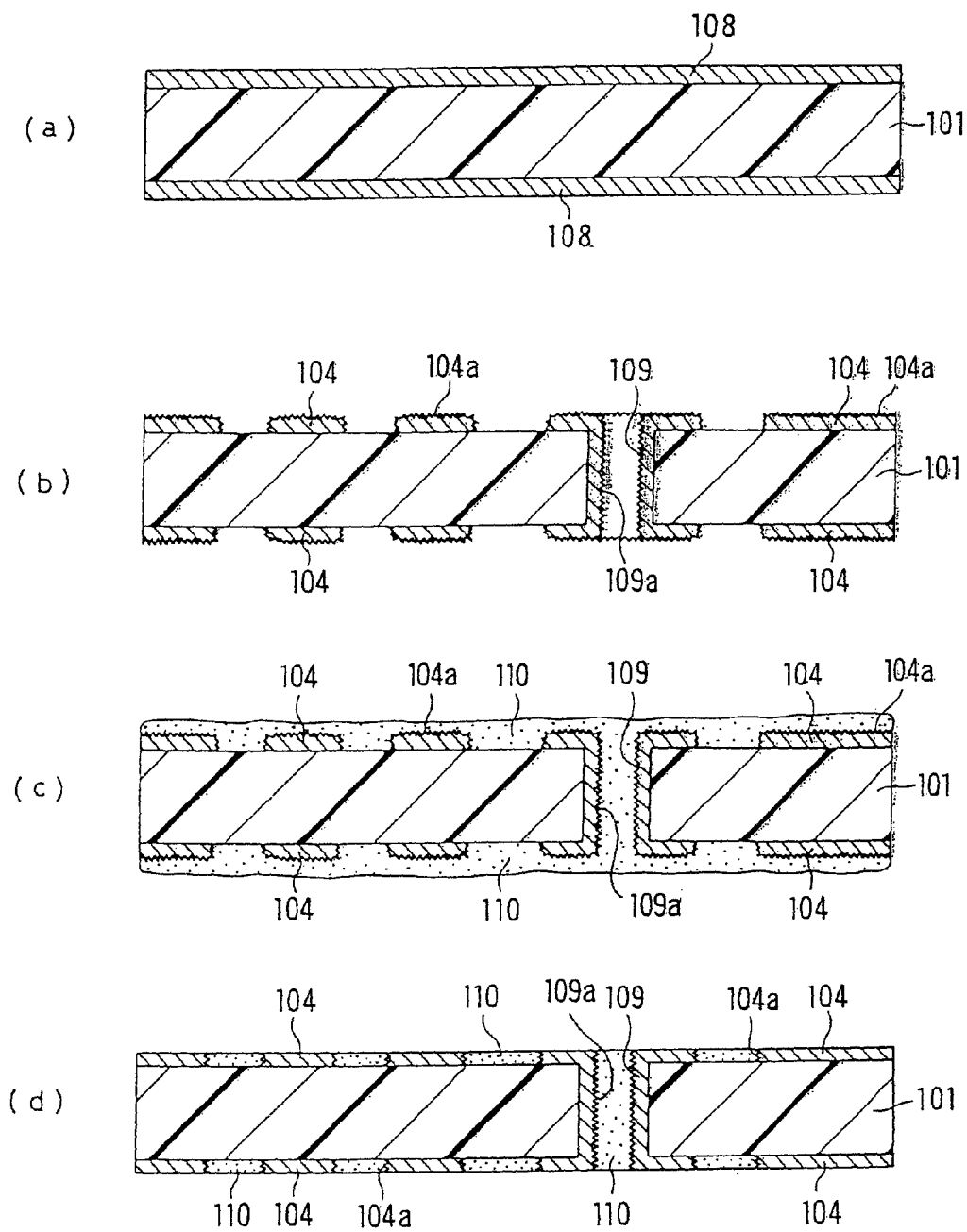
FIG. 9 (a) through (d) are cross-section views illustrating the flow of production of a multilayer printed circuit board in accordance with the third group of the present invention.

The mixed compositions prepared above in (1), (2) and (3), respectively, were admixed to provide an adhesive for electroless plating B. Process for Manufacture of a Multilayer Printed Circuit Board (1) A copper-clad laminate composed of a substrate 101 comprising a 1 mm-thick glass-epoxy or BT (bis(maleimide) triazine) resin and an 18 μm-thick copper foil 108 laminated to both sides of said substrate was used as the starting material [FIG. 9(a)]. First, this copper-clad laminate was drilled and, then, a plating resist was disposed. This substrate board was electroless copper plated to prepare plated-through holes 109 and the copper foil was pattern-etched in the routine manner to provide an inner copper pattern (lower-layer conductor circuit) 104 on both sides of the substrate board.

The substrate board formed with lower-layer conductor circuits 104 was rinsed with water and dried. Then, an oxidation treatment using an aqueous solution of NaOH (10 g/L), NaClO$_2$ (40 g/L) and Na$_3$PO$_4$ (6 g/L) as the oxidizing (blackening) bath was carried out to form roughened surface layers 104a, 109b on the entire surfaces of the lower-layer conductor layers inclusive of the plated-through holes 109 [FIG. 9(b)].

(2) To both sides of the substrate board, a resin filler 110 composed predominantly of epoxy resin was applied with a printing press to fill up the gaps of the lower-layer conductor circuit patterns 104 and the free spaces in the plated-through holes 109 followed by oven-drying. By this procedure, the resin filler 110 was filled in the gaps of the lower-layer conductor circuit patterns 104 and the free spaces within the plated-through holes 109 [FIG. 9(c)].

(3) One side of the substrate board which had undergone the above treatment (2) was abraded with a belt sander using a belt sanding paper (Sankyo Rikagaku) to thoroughly remove the resin filler 110 from the surface of the lower-layer conductor circuit 104 and the land surfaces of the plated-through holes 109 and further buffed to remove any surface injuries originating from the sanding operation. The above series of operations was repeated for the other side of the substrate board. Then, the resin filler 110 was thermally cured [FIG. 9(d)].

In this manner, the superficial layer of the resin filler 110 in the plated-through holes 109 and the roughened surface layers 104a of the lower-layer conductor circuits 104 were removed to smoothen both sides of the substrate board to thereby give a circuit board featuring a firm adhesion between the resin filler 110 and the lateral walls of the lower-layer conductor circuits 104 via said roughened layers 104a as well as a firm adhesion between the resin filler 110 and the internal walls of the plated-through holes 109 via said roughened layers 109a.

(4) The substrate board processed in the above step (3) was immersed in an electroless nickel plating bath comprising an aqueous solution (90° C.) of nickel chloride (30 g/L), sodium hypophosphite (10 g/L) and sodium citrate (10 g/L) to form a 1.2 μm-thick nickel cover layer 111a on the upper surface of the lower-layer conductor circuit 104 and lands of the plated-through holes 109.

Figure 10:
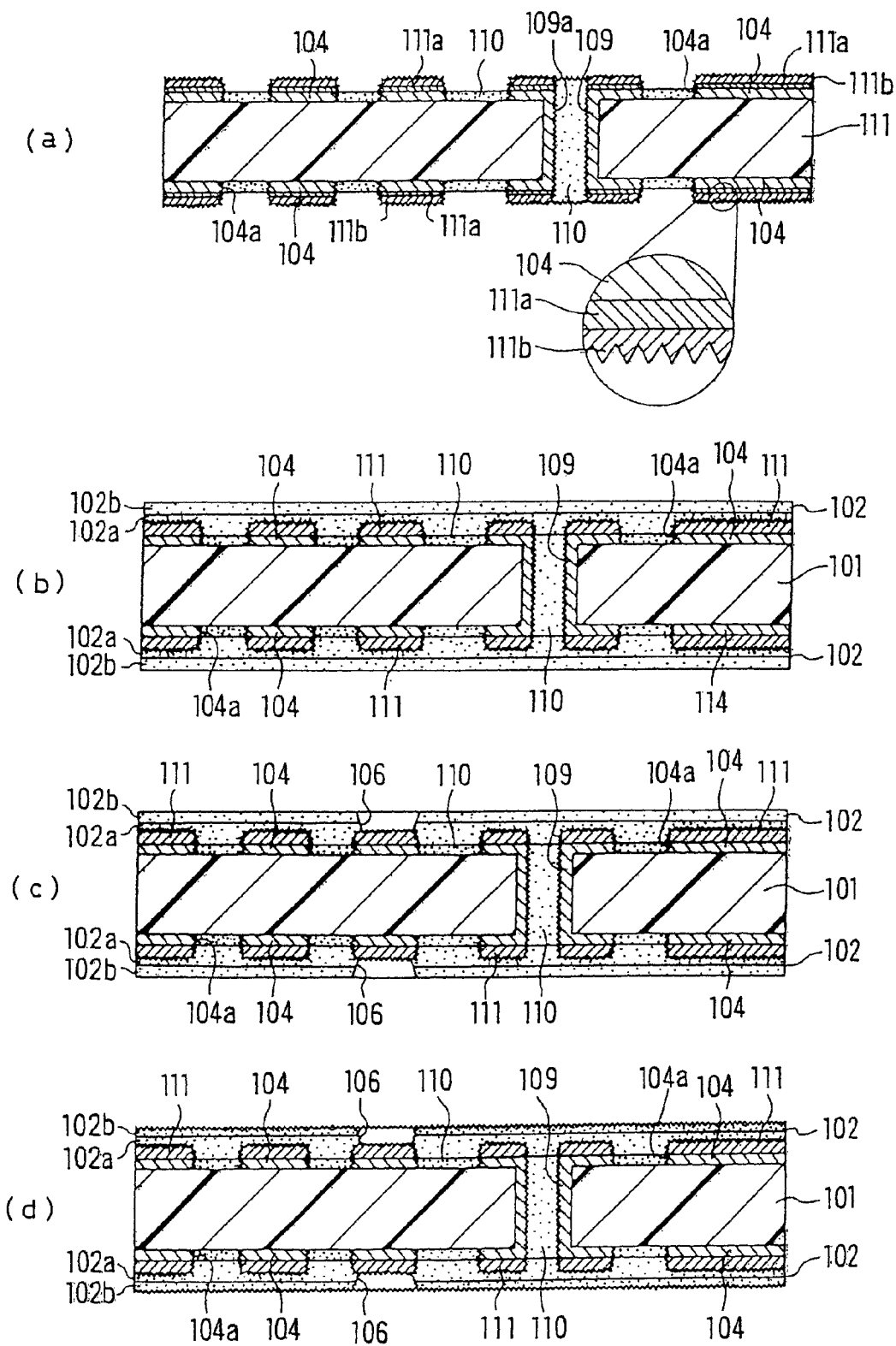
FIG. 10 (a) through (d) are cross-section views illustrating the flow of production of a multilayer printed circuit board in accordance with the third group of the present invention.

(5) Then, on the nickel layer formed as above on the exposed conductor circuit 104 and lands of plated-through holes 109, a 2 μm-thick porous Cu—Ni—P alloy roughened layer 111b was formed and, in addition, a 0.3 μm-thick Sn layer was formed on the surface of said roughened layer 111b [FIG. 10(a)]. The Sn layer is not shown, however.

The procedure for forming said roughened layer 111b was as follows. Thus, the substrate board was subjected to alkali degreasing and soft etching. Then, it was treated with a catalyst solution of palladium chloride in an organic acid to apply the Pd catalyst. After this catalyst was activated, the substrate board was immersed in an electroless copper plating bath (pH=9) comprising an aqueous solution of copper sulfate (3.2×10$^{-2}$ mol/L), nickel sulfate (2.4×10$^{-3}$ mol/L), citric acid (5.2×10$^{-2}$ mol/L), sodium hypophosphite (2.7×10$^{-1}$ mol/L), boric acid (5.0×10$^{-1}$ mol/L) and surfactant (Nisshin Chemical Industries, Surfynol 465 (1.0 g/L). Beginning 2 minutes after dipping, the substrate board was vibrated lengthwise every second to form a 5 μm-thick acicular Cu—Ni—P alloy roughened layer 111b over the nickel layer formed on the surface of copper conductor circuit 104 and land surface of plated-through holes 109. Furthermore, a Cu—Sn substitution reaction was carried out under the conditions of tin borofluoride: 0.1 mol/L, thiourea: 1.0 mol/L, temperature: 35° C. and pH=1.2 to deposit a 0.3 μm-thick Sn layer (not shown) on the surface of said roughened layer.

(6) Using a roll coater, both sides of the substrate board were coated twice with an adhesive for electroless plating of said formulation mentioned in A and the substrate board was allowed to sit in horizontal position for 20 minutes and then oven-dried at 60° C. for 30 minutes [FIG. 10(b)]. In the views of FIG. 10(b) et seq., the nickel cover layer 111a and the roughened layer 111b can not be neatly shown as independent members and, therefore, are generally indicated by the numeral 111.

(7) On both sides of the substrate board formed with the layer of an adhesive for electroless plating use in the above step (6), a photomask printed with black dots having a diameter of 85 μm each was placed in close contact with said layer and using an ultrahigh-pressure mercury vapor lamp, light exposure was carried out at 500 mJ/cm$^2$. The resultant compound was developed by spraying diethylene glycol dimethyl ether (DMDG) to form openings measuring 85 μm in diameter for via holes in the adhesive layer. Furthermore, using the ultrahigh-pressure mercury vapor lamp, light exposure at 3000 mJ/cm$^2$ was carried out and the substrate board was then heat-treated at 100° C. for 1 hour and further at 150° C. for 5 hours to construct an 18 μm-thick interlayer resin insulating layer 102 (102a, 102b) having openings (openings 106 for via holes) with an excellent accuracy of dimention for the photomask used [FIG. 10(c)].

(8) The substrate board formed with said openings 106 for via holes was then immersed in an aqueous solution of chromic acid (7500 g/L) at 73° C. for 20 minutes to dissolve out the epoxy resin particles from the surface of the interlayer resin insulating layer 102 and thereby roughen said surface thereof to provide a roughen layer. The substrate board was then immersed in a neutralizing solution (Shipley) and, then, rinsed with water [FIG. 10(d)].

The substrate board formed with said roughened surface was treated with a palladium catalyst (Atotech) solution to deposit catalyst nuclei on the surface of the interlayer resin insulating layer 102 and the internal walls of openings 106 for via holes.

Figure 11:
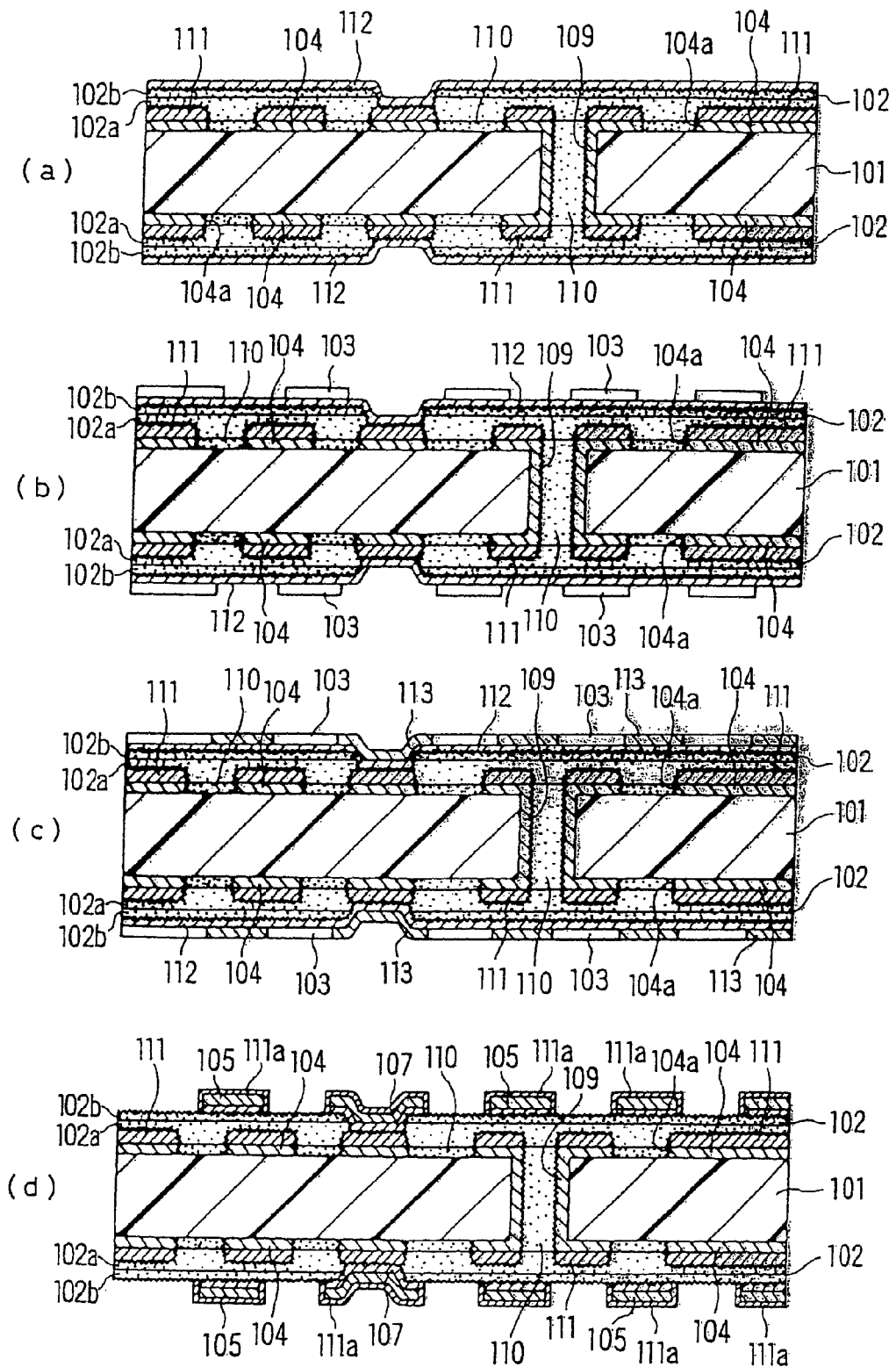
FIG. 11 (a) through (d) are cross-section views illustrating the flow of production of a multilayer printed circuit board in accordance with the third group of the present invention.

(9) Then, the substrate board was immersed in an aqueous electroless copper plating solution of the following formulation to form a 0.8 μm-thick electroless plated copper film 112 on the entire roughened surface [FIG. 11(a)].

| [Aqueous electroless plating solution] | |
| --- | --- |
| EDTA | 50 g/L |
| Copper sulfate | 10 g/L |
| HCHO | 10 ml/L |
| NaOH | 6 g/L |
| α,α'-Bipyridyl | 80 mg/L |
| Polyethylene grycol (PEG) | 0.1 g/L |
| [Electroless plating conditions] | |
| Bath temperature: | 70° C., for 15 min. |

(10) A commercial photosensitive dry film was laminated to said electroless plated copper film 112, and with a photomask set in position, exposure at 100 mJ/cm$^2$ and development with 0.8% sodium carbonate/water were carried out to provide a plating resist 103 [FIG. 11(b)].

(11) Then, copper electroplating was carried out under the following conditions to construct a 13 μm-thick electroplated copper film 113 [FIG. 11(c)].

| [Aqueous electroplating solution] | |
|---|---|
| Sulfuric acid | 180 g/L |
| Copper sulfate | 80 g/L |
| Additive (Atotech Japan, product designation: Kaparacid GL) | 1 ml/L |
| [Electroplating conditions] | |
| Current density | 1 A/dm$^2$ |
| Time | 30 min. |
| Temperature | Room temperature |

(12) The plating resist 103 was stripped off with 5% aqueous KOH solution and the electroless plated film 112 under the plating resist 103 was dissolved and removed by etching with a sulfuric acid-hydrogen peroxide solution to provide an 11 μm-thick L/S=28/28 upper-layer conductor circuit 105 (inclusive of via holes 107) comprising electroless plated copper film 112 and electroplated copper film 113.

The substrate board was further immersed in an electroless nickel plating bath (90° C.) comprising an aqueous solution of nickel chloride (30 g/L), sodium hypophosphite (10 g/L) and sodium citrate (10 g/L) to form a 1.2 μm-thick nickel cover layer 111a over the entire surface of the conductor circuit and plated-through hole lands [FIG. 11(d)].

Figure 12:
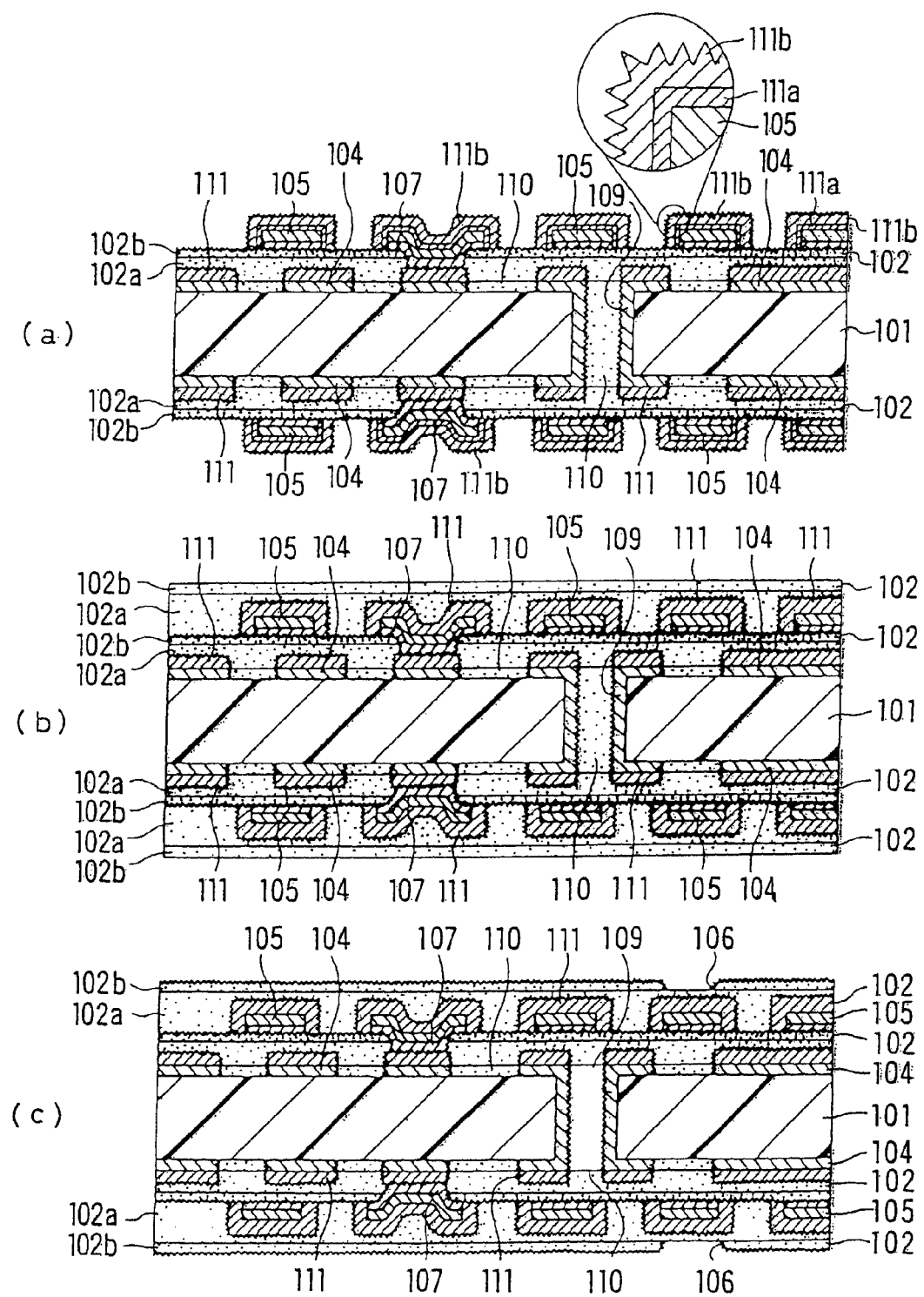
FIG. 12 (a) through (c) are cross-section views illustrating the flow of production of a multilayer printed circuit board in accordance with the third group of the present invention.
Figure 13:
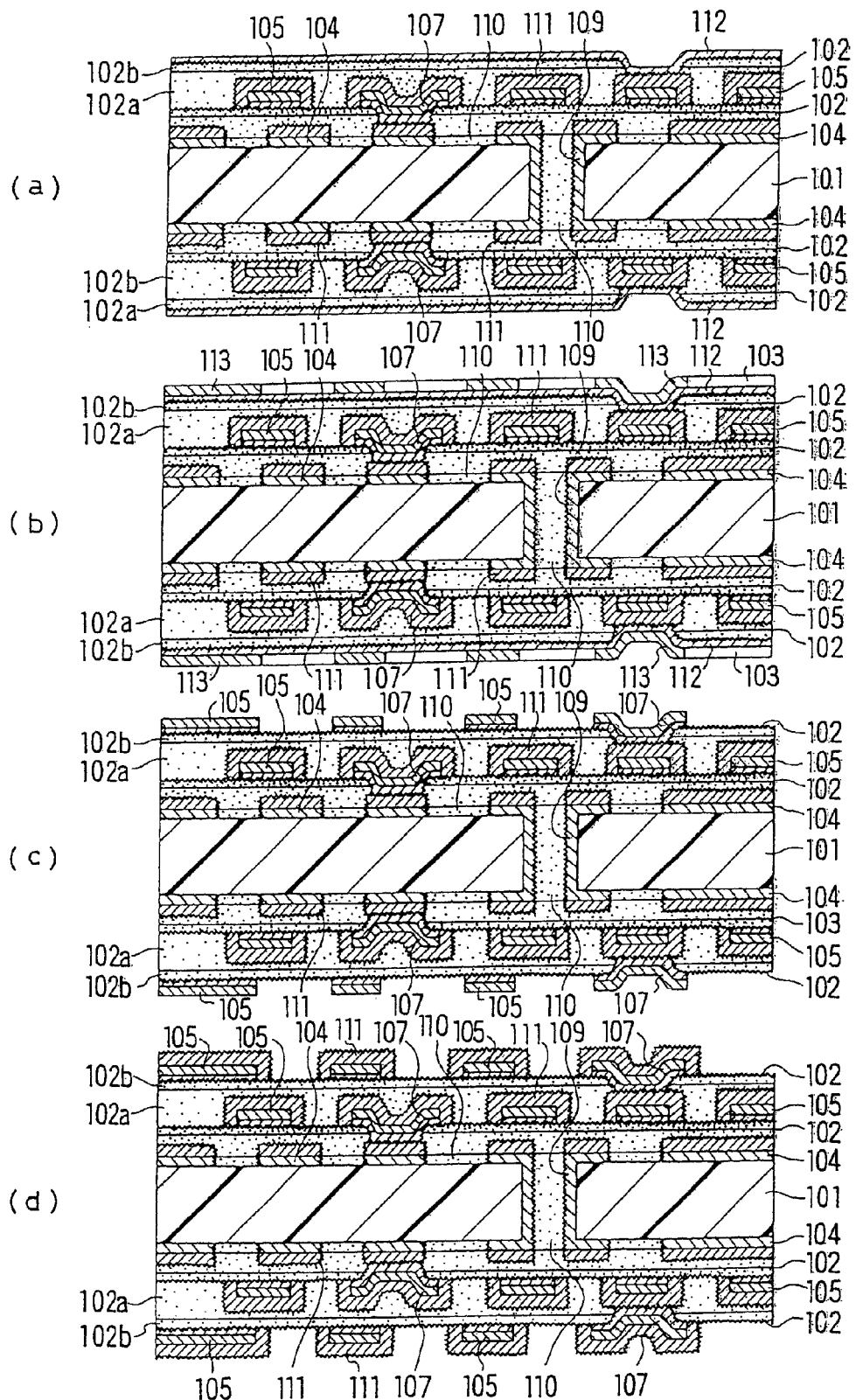
FIG. 13 (a) through (d) are cross-section views illustrating the flow of production of a multilayer printed circuit board in accordance with the third group of the present invention.

(13) The substrate board formed with the upper-layer conductor circuit 105 and nickel cover layer 111a as above was subjected to the same treatment as in step (5) to form a 2-μm thick Cu—Ni—P alloy roughened layer 111b on the surface of said upper-layer conductor circuit 105 [FIG. 12(a)]. Furthermore, a Cu—Sn substitution reaction was carried out under the conditions: tin borofluoride: 0.1 mol/L, thiourea: 1.0 mol/L, temperature: 35° C. and pH: 1.2 to dispose a 0.3 μm-thick Sn layer (not shown) on the surface of said roughened layer.

(14) The above sequence of steps (6) to (13) was repeated to construct a still upper-layer conductor circuit [FIG. 12(b) to FIG. 13(d)] and finally, though not shown, formation of a solder resist layer with openings, gold plating, and formation of solder vamps were carried out to provide a multilayer printed circuit board comprising solder vamps. In FIG. 12(b) through FIG. 13(d), too, the nickel cover layer 111a and roughened layer 111b are generally indicated by the reference numeral 111.

Example 15

The procedure of Example 14 was repeated except that the step (12) was modified as follows.

(12) After copper electroplating, the substrate board was further immersed in a plating bath (pH=4.5) comprising an aqueous solution of nickel sulfate (240 g/L), nickel chloride (45 g/L) and boric acid (30 g/L) and using an Ni plate as anode, nickel electroplating was performed under the conditions of temperature: 55±5° C. and current density: 4 A/dm$^2$ to provide a 0.8 μm-thick nickel cover layer.

Figure 14:
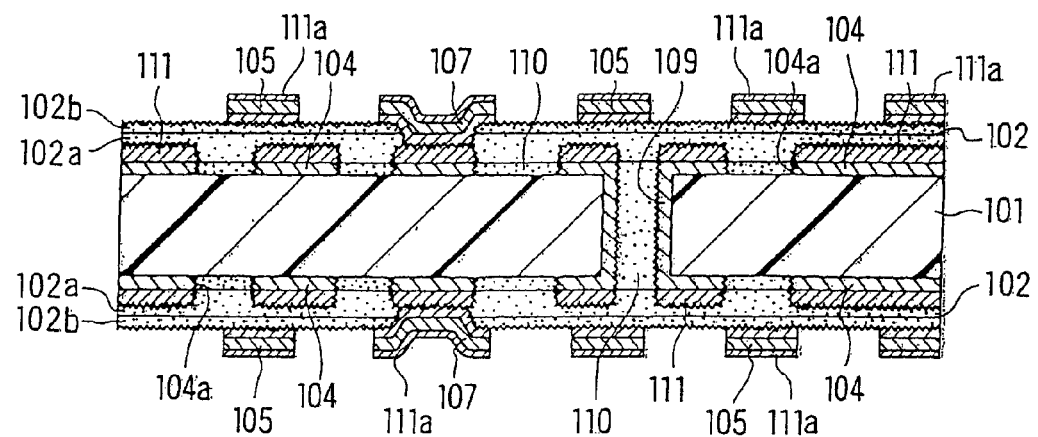
FIG. 14 is a cross-section view showing the manufacture of another multilayer printed circuit board according to the third group of the present invention.

Then, the plating resist 103 was stripped off with 5% aqueous KOH solution and the electroless plated film 112 under said plating resist 103 was dissolved and removed by etching with a mixed solution of sulfuric acid and hydrogen peroxide to construct an 11 μm-thick (L/S=28/28) upper-layer conductor circuit 105 (inclusive of via holes 107) comprising electroless plated copper film 112 and electroplated copper film 113 [FIG. 14].

Comparative Example 4

Except that the formation of said nickel cover layer was omitted, the procedure of Example 14 was otherwise repeated to provide a multilayer printed circuit board.

Example 16

Except that a 1.1 μm-thick tin layer in lieu of the nickel layer was formed by electroless plating, the procedure of Example 14 was otherwise repeated to provide a multilayer printed circuit board. The formulation of the plating bath used is as follows.

| Sodium citrate | 0.34 mol/L |
|---|---|
| EDTA | 0.04 mol/L |
| Tin chloride | 0.04 mol/L |
| Sodium acetate | 0.12 mol/L |
| Titanium chloride | 0.029 mol/L |
| Bath temperature | 70 to 90° C. |

Example 17

Except that a cobalt layer in lieu of the nickel layer was formed by electroless plating, the procedure of Example 14 was otherwise repeated to provide a multilayer printed circuit board. The electroless plating conditions were as follows.

| [Electroless plating solution] | |
|---|---|
| Cobalt chloride | 0.60 mol/L |
| Sodium hypophosphite | 0.26 mol/L |
| Sodium tartrate | 0.90 mol/L |
| Ammonium chloride | 1.30 mol/L |
| pH | 8 to 10 |
| Bath temperature | 90 to 100° C. |

Example 18

Except that a palladium layer in lieu of the nickel layer was formed by electroless plating, the procedure of Example 14 was otherwise repeated to provide a multilayer printed circuit board. The electroless plating conditions were as follows.

| [Electroless plating solution] | |
|---|---|
| Tetramine palladium chloride | 5.4 g/L |
| EDTA sodium salt | 33.6 g/L |
| Ammonia | 350 g/L |
| Hydrazine | 0.3 g/L |
| Bath temperature | 90° C. |

For each of the printed circuit boards obtained in the above examples and comparative examples, the cross-section was examined under the light microscope to assess the dissolution of the conductor circuit and the bare spots in the Cu—Ni—P roughened layer.

In Examples 14 to 18, dissolution of the conductor circuit was not observed. In Comparative Example 4, partial dissolution of the power layer (plain layer) was observed.

Moreover, whereas in Examples 14 to 18 no bare spots occurred in acicular Cu—Ni—P alloy plating even in the 10$^{th}$ turn, bare spots were observed in as early as the 3$^{rd}$ turn in Comparative Example 4.

Furthermore, in respect of the pattern width (L/S) which can be implemented, whereas a fine pattern width of 15/15 μm could be obtained in Examples 14 to 18, only a large pattern width of 30/30 could be realized in Comparative Example 4.

Example 19

(1) A copper-clad BT resin laminate (Mitsubishi Gas Chemical, product designation: HL830-1. 0T12D) composed of a1. 0 mm-thick BT (bis(maleimide)triazine) resin substrate 1 and an 18 μm-thick copper foil 2 laminated to both sides of said substrate was used as the starting material [FIG. 15(a)]. First, this copper-clad laminate was drilled to form through holes [FIG. 15(b)]. Then, palladium-tin coloid was applied to the surface and using an aqueous electroless plating solution of the under-mentioned formulation, electroless plating was carried out under the following conditions to form a 0.7 μm-thick electroless plated film on the entire surface of the substrate board.

| [Aqueous electroless plating solution] | |
|---|---|
| EDTA | 60 g/L |
| Copper sulfate | 10 g/L |
| HCHO | 8 ml/L |
| NaOH | 10 g/L |
| α,α'-Bipyridyl | 80 mg/L |
| Polyethylene grycol (PEG) | 0.1 g/L |
| [Electroless plating conditions] | |
| Bath temperature: | 70° C., for 10 min. |

Furthermore, using a copper electroplating solution of the under-mentioned formulation, copper electroplating was carried out to form a 15 μm-thick electroplated copper film.

| [Aqueous electroplating solution] | |
|---|---|
| Sulfuric acid | 170 to 200 g/L |
| Copper sulfate | 50 to 70 g/L |
| Additive (Atotech Japan, product designation: Kaparacid GL) | 20 to 40 ml/L |
| [Electroplating conditions] | |
| Current density | 1.5 to 2.3 A/dm$^2$ |
| Temperature | 23 to 26° C. |

Figure 15:
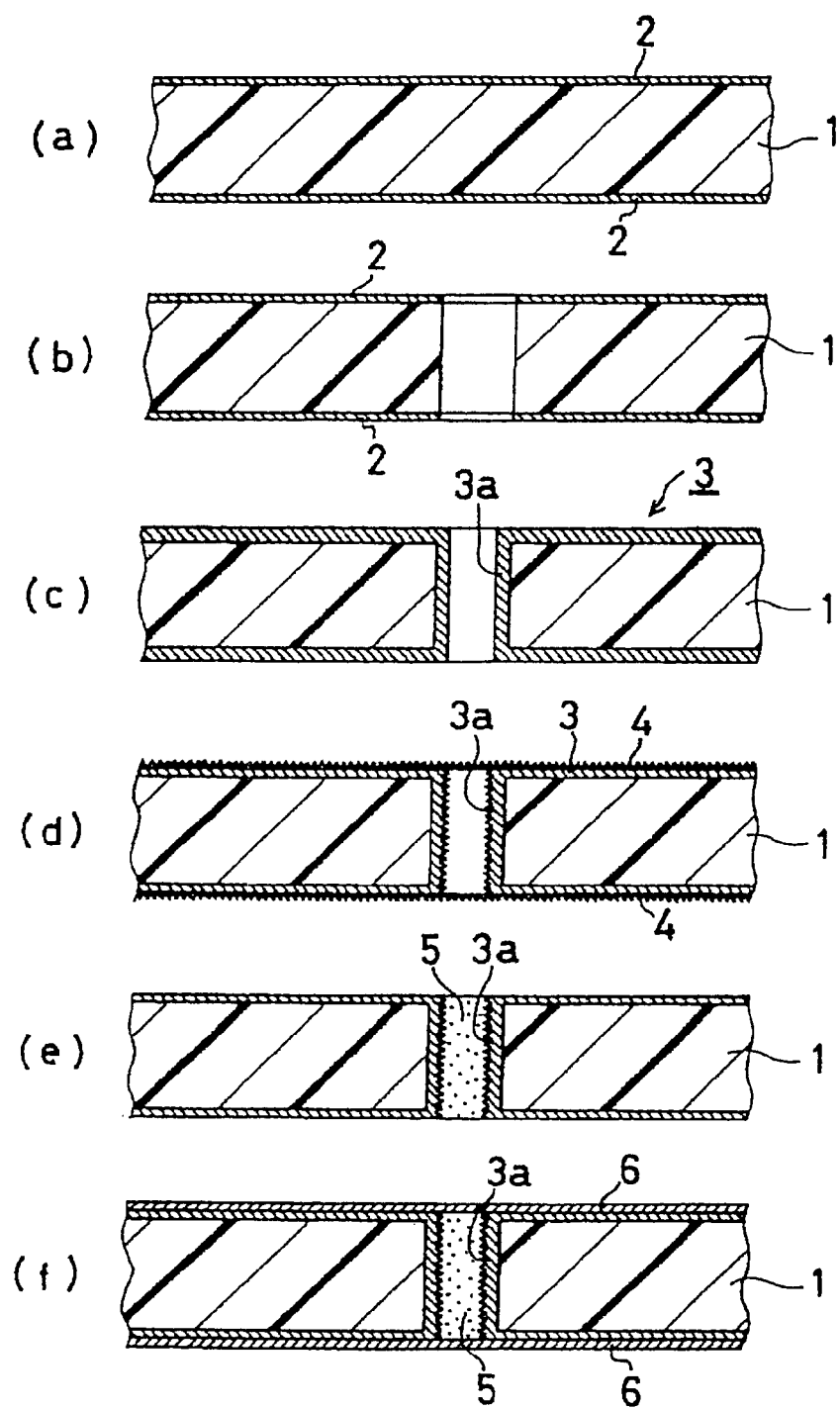
FIG. 15 (a) through (f) are cross-section views illustrating the flow of production of a multilayer printed circuit board in accordance with the fourth group of the present invention.

(2) The substrate board formed with the conductor layer 3 all over its surface (inclusive of plated-through holes 3a) as obtained in the above step [FIG. 15(c)] was rinsed with water and dried. This board was subjected to an oxidation-reduction treatment using an oxidation bath (blackening bath) comprising an aqueous solution of NaOH (20 g/L), NaClO$_2$ (50 g/L) and Na$_3$PO$_4$ (15.0 g/L) and a reduction bath comprising an aqueous solution of NaOH (2.7 g/L) and NaBH$_4$ (1.0 g/L) to provide the entire surface of the conductor layer 3 inclusive of plated-through holes 3a with a roughened surface 4 [FIG. 15(d)].

(3) Then, the plated-through holes 3a were filled with a metal particle paste containing a copper particle having a mean particle diameter of 15 μm (Tatsuta Electric Wire, DD Paste: a nonconductive fill copper paste) by screen printing and the paste was dried and cured at 100° C. for 30 minutes and further at 180° C. for 2 hours. The metal particle paste 5 which was deposited on the roughened surface 4 on the surface of the conductor layer 3 or overflowed the plated-through holes 3a was removed with a belt sander using a #400 belt sanding paper (Sankyo Kagaku) and, to remove the injuries produced by belt sanding, alumina abrasion or abrasion with SiC grits was performed to flatten the substrate board surface [FIG. 15(e)]

(4) To the flattened surface of the substrate board as prepared in the above step (3) was applied a coloidal palladium catalyst, and electroless plating was performed in the routine manner to form a 0.6 μm-thick electroless plated copper film 6 [FIG. 15(f)].

Figure 16:
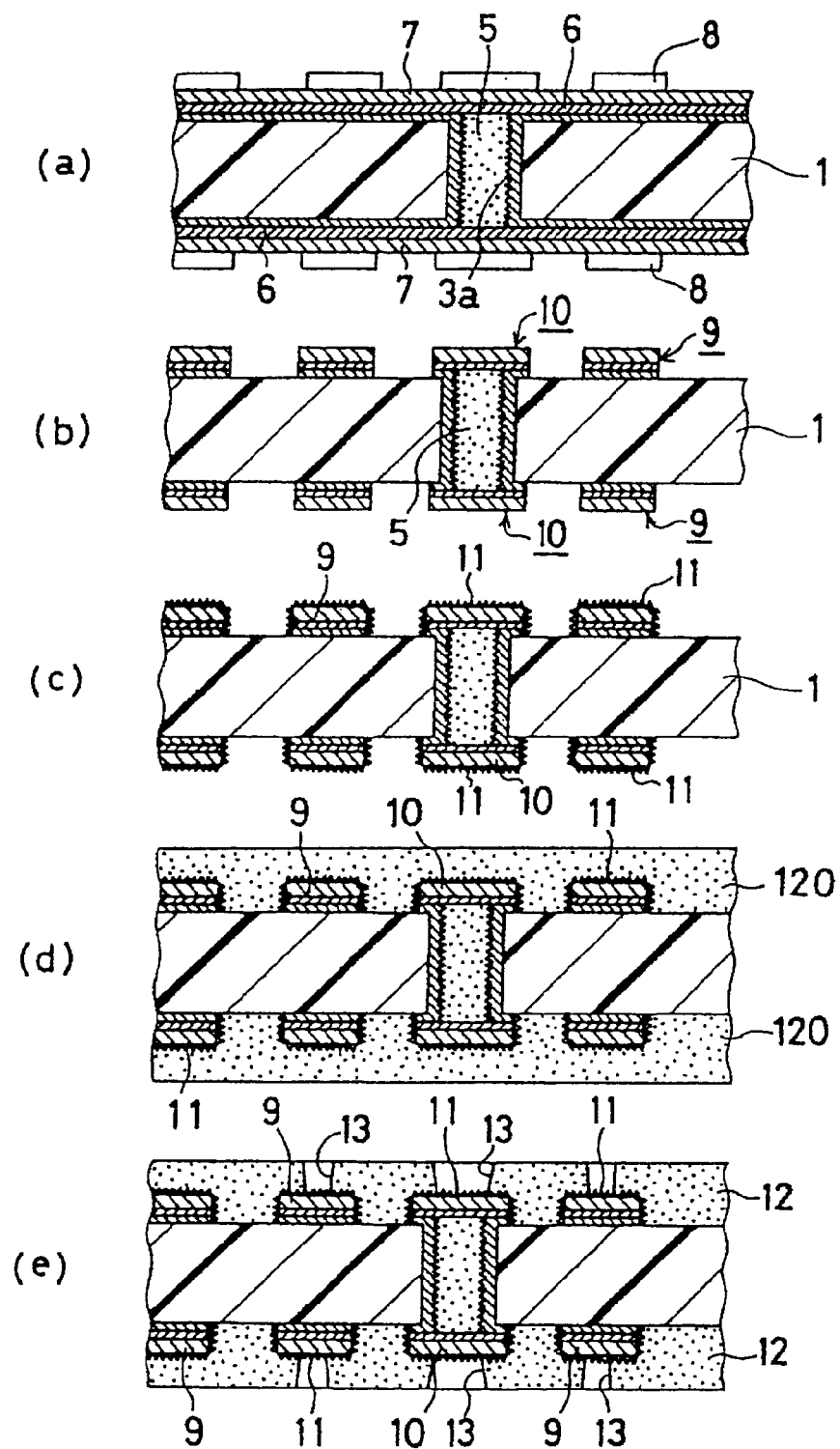
FIG. 16 (a) through (e) are cross-section views illustrating the flow of production of a multilayer printed circuit board in accordance with the fourth group of the present invention.

(5) Then, copper electroplating was performed under the following conditions to form a 15 μm-thick electroplated copper film 7 for thickening the part to become a lower-layer conductor circuit 9 and forming the part to become a conductor layer 10 covering the metal particle paste 5 filled into the plated-through holes 3 in a subsequent step, viz. FIG. 16(b).

| [Aqueous electroplating solution] | |
|---|---|
| Sulfuric acid | 170 to 200 g/L |
| Copper sulfate | 50 to 70 g/L |
| Additive (Atotech Japan, product designation: Kaparacid GL) | 20 to 40 ml/L |
| [Electroplating conditions] | |
| Current density | 1.5 to 2.3 A/dm$^2$ |
| Temperature | 23 to 26° C. |

(6) To both sides of the substrate board formed with said part which were to become the lower-layer conductor circuit 9 and conductor layer 10, a commercial photosensitive dry film was laminated, and with a photomask set in position, light exposure at 100 mJ/cm$^2$ and development with 0.8% sodium carbonate/water were carried out to provide a 15 μm-thick etching resist 8 [FIG. 16(a)].

(7) The plated film in the area not masked by the etching resist 8 was dissolved and removed by etching with a sulfuric acid-hydrogen peroxide solution and the etching resist 8 was stripped off with 5% KOH to construct a discrete lower-layer conductor circuit 9 and a conductor layer 10 covering the conductive paste 5 [FIG. 16(b)].

(8) Then, on the surface of said lower-layer conductor circuit 9 and said conductive layer 10 covering the metal particle paste 5, a 2.5 μm-thick roughened layer (uneven layer) 11 of Cu—Ni—P alloy was constructed and, further on the surface of said roughened layer 11, a 0.3 μm-thick Sn layer was formed [FIG. 16(c)]. The specific procedure used for the construction of the above layers are as follows. Incidentally, the Sn layer is not shown in FIG. 16(c).

Thus, the substrate board was acid-degreased and soft-etched. The substrate board was then treated with a catalyst solution of palladium chloride in an organic acid to let the Pd catalyst be deposited on the substrate board. After the Pt catalyst was activated, electroless plating was performed using an electroless plating bath (pH=9) containing copper sulfate (8 g/L), nickel sulfate (0.6 g/L), citric acid (15 g/L), sodium hypophosphite (29 g/L), boric acid (31 g/L) and surfactant (Nisshin Chemical Industries, Surfynol 465) (0.1 g/L) to form a roughened layer (uneven layer) 11 of Cu—Ni—P alloy on the entire surface of the conductor circuit. Furthermore, the substrate board was immersed in an electroless Sn substitution plating bath (pH=1.2, temperature=50° C.) containing tin borofluoride (0.1 mol/L) and thiourea (1.0 mol/L) to form a 0.3 μm-thick Sn layer on the surface of said roughened layer.

(9) Thirty-five (35) weight parts of cresol novolac epoxy resin (Nippon Kayaku, mol. wt. 2500) 25% acrylate, 3.15 weight parts of photosensitive monomer (To a Gosei, product designation: Aronix M325), 0.5 weight part of antifoam (Sun Nopco, product designation: S-65), 2 weight parts of imidazole series curing agent (Shikoku Kasei, product designation: 2E4MZ-CN), 2 weight parts of the photopolymerization initiator benzophenone, 0.2 weight part of the photosensitizer Michler's ketone and 1.5 weight parts of N-methylpyrrolidone (NMP) were taken in a vessel and stirred to provide an epoxy resin acrylate composition.

Then, using a roll coater, said epoxy resin acrylate composition was applied To both sides of the substrate board to form a resin layer 120 which was to become the interlayer resin insulating layer 12 [FIG. 16(d)].

(10) After the formation of said resin layer 120, the substrate board was prebaked at 80° C. for 10 minutes and, then, the UV exposure and development was performed to pierce openings 13 for via holes. Then, thermal curing was performed at 150° C. for 4 hours to provide the objective interlayer resin insulating layer 12 [FIG. 16(e)]. The cured thickness of the interlayer resin insulating layer 12 was 18 μm.

Figure 17:
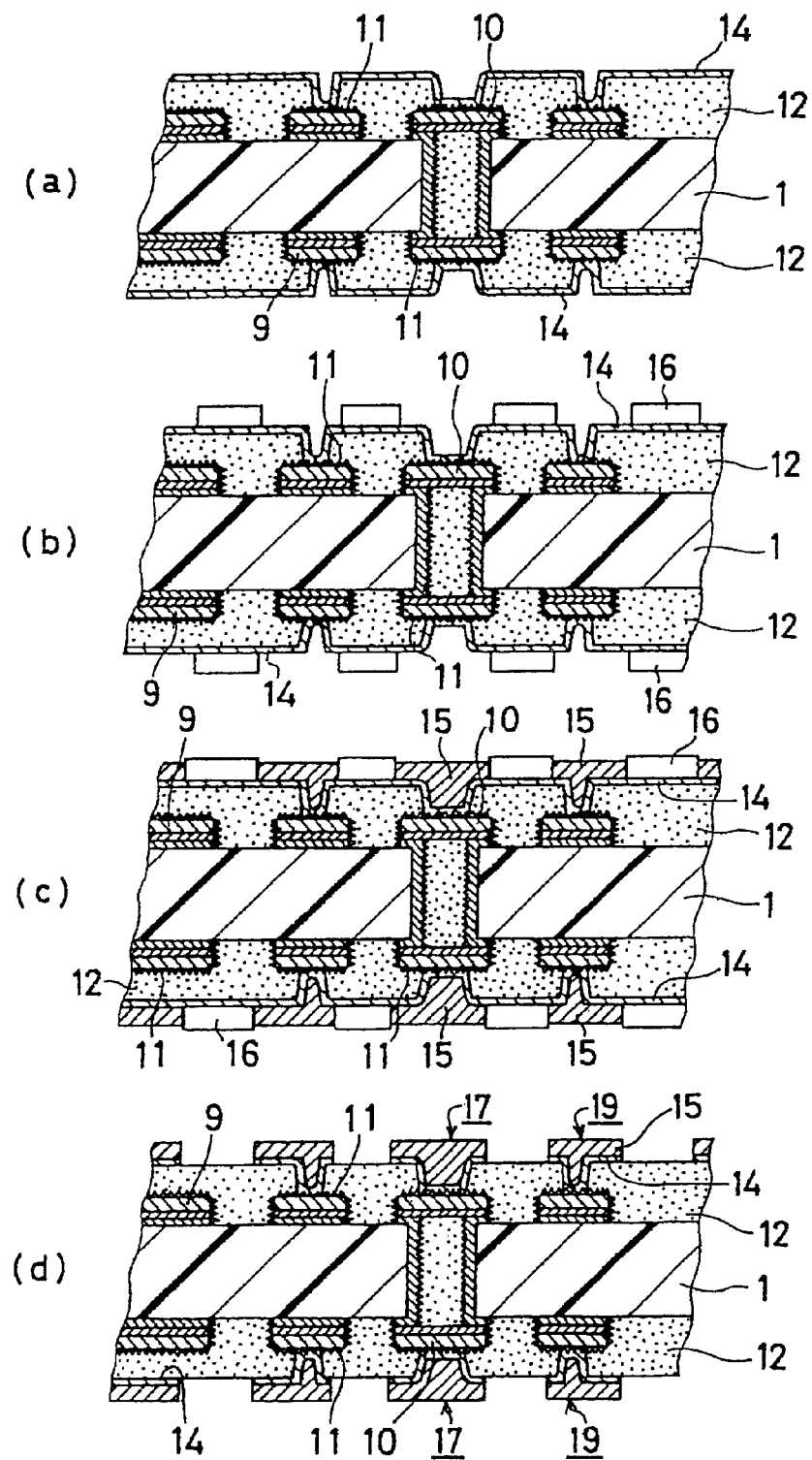
FIG. 17 (a) through (d) are cross-section views illustrating the flow of production of a multilayer printed circuit board in accordance with the fourth group of the present invention.

(11) Sputtering with Ni as the target was carried out under the conditions of gas pressure: 0.8 Pa, temperature: 80° C., power: 200 W and time: 20 min. to form a 0.6 μm-thick Ni metal layer 14 on the surface of said interlayer resin insulating layer 12 [FIG. 17(a)]. As the sputtering equipment, Japan Vacuum Technology's SV-4540 was used.

(12) To both sides of the substrate board formed with said metal layer 14 in the above step (11), a commercial photosensitive dry film was laminated, and with a photomask set in position, light exposure at 100 mJ/cm² and development with 0.8% sodium carbonate/water were carried out to form a 30 μm-thick plating resist 16 pattern [FIG. 17(b)].

(13) Then, the Ni metal layer 14 was treated with an acid solution containing sulfuric acid (150 g/L) at 40° C. for 5 minutes to remove the surface oxide film.

(14) Then, electroplating was performed under the same conditions as in step (1) to provide a 21 μm-thick electroplated film 15. This electroplated film 15 thickened the part to become the conductor circuit 9 and filled the via holes 17 [FIG. 17(c)].

(15) The plating resist 16 was then stripped off with 5% NaOH and the Ni metal layer 14 under said plating resist 16 was dissolved and removed by etching with an aqueous solution of sodium persulfate (100 g/L) at 40° C. to provide a 16 μm-thick upper-layer conductor circuit 19 (inclusive of via holes 17) comprised of said Ni metal layer 14 and electroplated copper film 15 [FIG. 17(d)].

Figure 18:
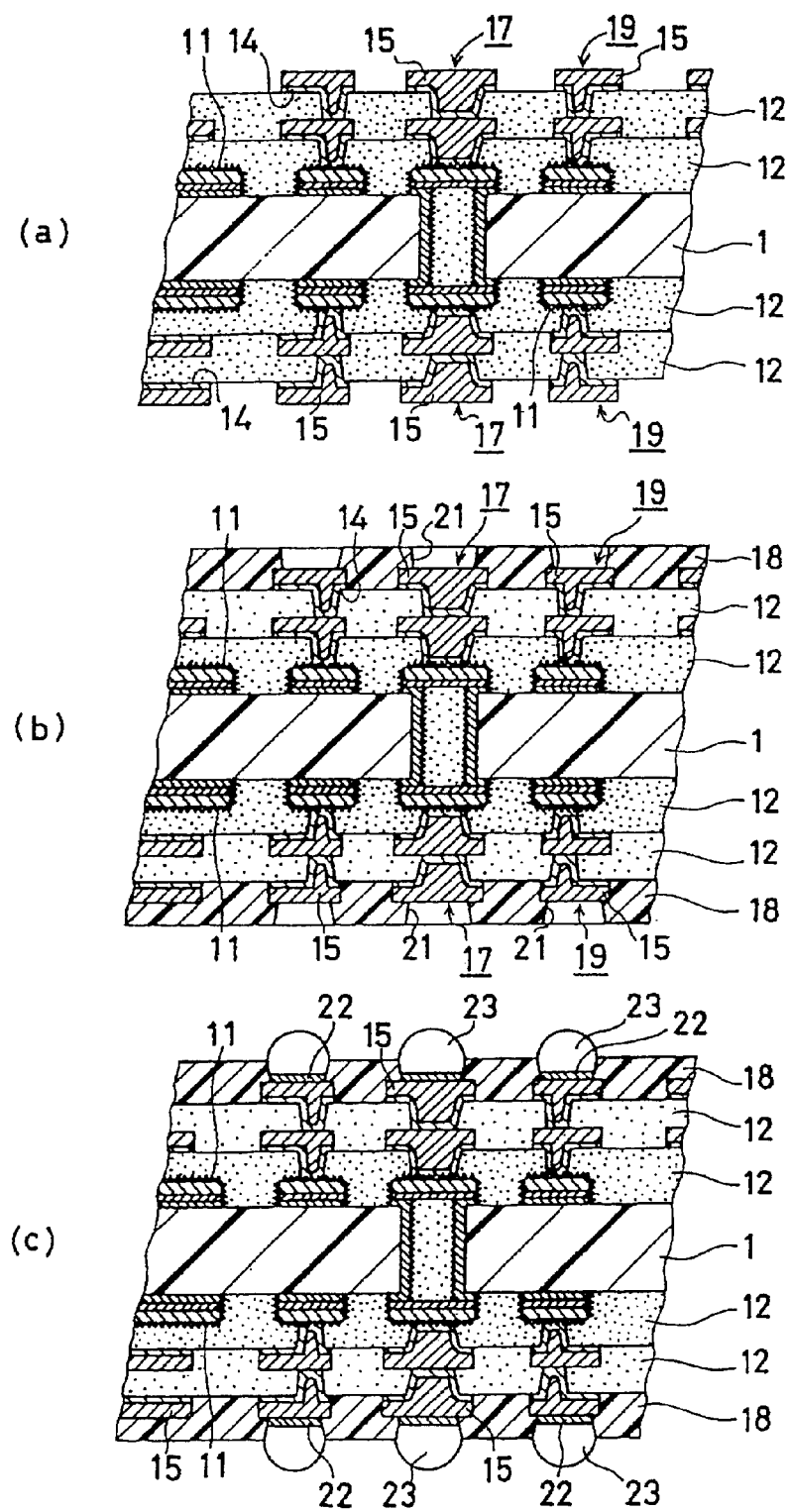
FIG. 18 (a) through (c) are cross-section views illustrating the flow of production of a multilayer printed circuit board in accordance with the fourth group of the present invention.

(16) Thereafter, the sequence of steps (9) to (15) was repeated to provide a multilayer circuit board. In the process shown in FIG. 18, the sequence of steps (9) to (15) was applied to the substrate board carrying an upper-layer conductor circuit 19 etc. as shown in FIG. 17(d) to further build an interlayer resin insulating layer 12, an upper-layer conductor circuit 19, etc. [FIG. 18(a)] and, using a solder resist composition prepared as in Example 12 (14), a solder resist layer was formed thereon [FIG. 18(b) to (c)] as described below.

(17) Thus, on both sides of the multilayer circuit board, said solder resist composition was coated in a thickness of 20 μm and dried. Then, a photomask printed with a pattern corresponding to solder resist openings was set in close contact with the solder resist layer, and UV exposure at 1000 mJ/cm² and development with DMTG were carried out to provide openings. The substrate board was then heat-treated under the conditions of 80° C. for 1 hr, 100° C. for 1 hr, 120° C. for 1 hr and 150° C. for 3 hrs sequentially to cure the solder resist layer and thereby provide a 20 μm-thick solder resist pattern layer 18 having openings 21 [FIG. 18(b)].

(18) Then, the substrate board formed with said solder resist pattern layer 18 as above was immersed in an electroless nickel plating bath (pH=5) containing nickel chloride (30 g/L), sodium hypophosphite (10 g/L) and sodium citrate (10 g/L) for 20 minutes to form a 5 μm-thick plated nickel layer in the valleys of openings 21.

This board was then immersed in an electroless plating solution containing potassium gold cyanide (2 g/L), ammonium chloride (75 g/L), sodium citrate (50 g/L) and sodium hypophosphite (10 g/L) at 93° C. for 23 seconds to form a 0.03 μm-thick plated gold layer 22 on the plated nickel layer. In FIG. 18(c), the plated nickel layer and the plated gold layer formed as above are combinedly indicated by the reference numeral 22.

(19) Then, a solder paste was printed into the openings 21 of the solder resist pattern layer 18 and caused to reflow at 200° C. to form solder vamps (solder masses) 23 and thus provide a multilayer printed circuit board comprising solder vamps 23 [FIG. 18(c)].

Example 20

Except that the sputtering was carried out using a Cr target under the conditions of gas pressure: 0.9 Pa·s and time: 20 min to form a 0.5 μm-thick Cr metal layer, the procedure of Example 19 was otherwise repeated to provide a multilayer printed circuit board.

Example 21

Except that a Pd target was used to form a Pd metal layer, the procedure of Example 19 was otherwise repeated to provide a multilayer printed circuit board.

Comparative Example 5

Except that the acid cleaning was not performed after formation of the Ni metal layer, the procedure of Example 19 was otherwise repeated to provide a multilayer printed circuit board.

For each of the multilayer printed circuit boards obtained in Examples 19 to 22 and Comparative Example 5, peel strength was measured. In addition, light microscopy was performed to evaluate the degree of delamination between the metal layer and the electroplated copper film. The results are presented below in Table 2.

TABLE 2

| | Peel strength (kg/cm) | Delamination |
|---|---|---|
| Example 19 | 1.3 | None |
| Example 20 | 1.1 | None |
| Example 21 | 1.2 | None |
| Example 22 | 1.1 | None |
| Compar. Example 5 | 1.2 | Delaminated |

It will be apparent from Table 2 that by performing an acid cleaning after formation of a metal layer on the interlayer resin insulating layer to remove the oxide film from the surface of the metal layer, the adhesion between the metal layer and the electroplated copper layer can be improved so that delamination of the electroplated copper film is prevented.

Example 23

(1) A copper-clad BT resin laminate (Mitsubishi Gas Chemical, product designation: HL830-1. 0T12D) composed of a 1.0 mm-thick BT (bis(maleimide)triazine) resin substrate 1 and an 18 μm-thick copper foil 2 laminated to both sides of said substrate was used as the starting material [FIG. 19(*a*)]. First, this copper-clad laminate was drilled to form through holes [FIG. 19(*b*)]. Then, palladium-tin coloid was applied to the surface and using an aqueous electroless plating solution of the under-mentioned formulation, electroless plating was carried out under the following conditions to form a 0.7 μm-thick electroless plated film on the entire surface of the substrate board.

| [Aqueous electroless plating solution] | |
| --- | --- |
| EDTA | 150 g/L |
| Copper sulfate | 20 g/L |
| HCHO | 30 ml/L |
| NaOH | 40 g/L |
| α,α'-Bipyridyl | 80 mg/L |
| PEG | 0.1 g/L |
| [Electroless plating conditions] | |
| Bath temperature: | 70° C., for 30 min. |

Figure 19:
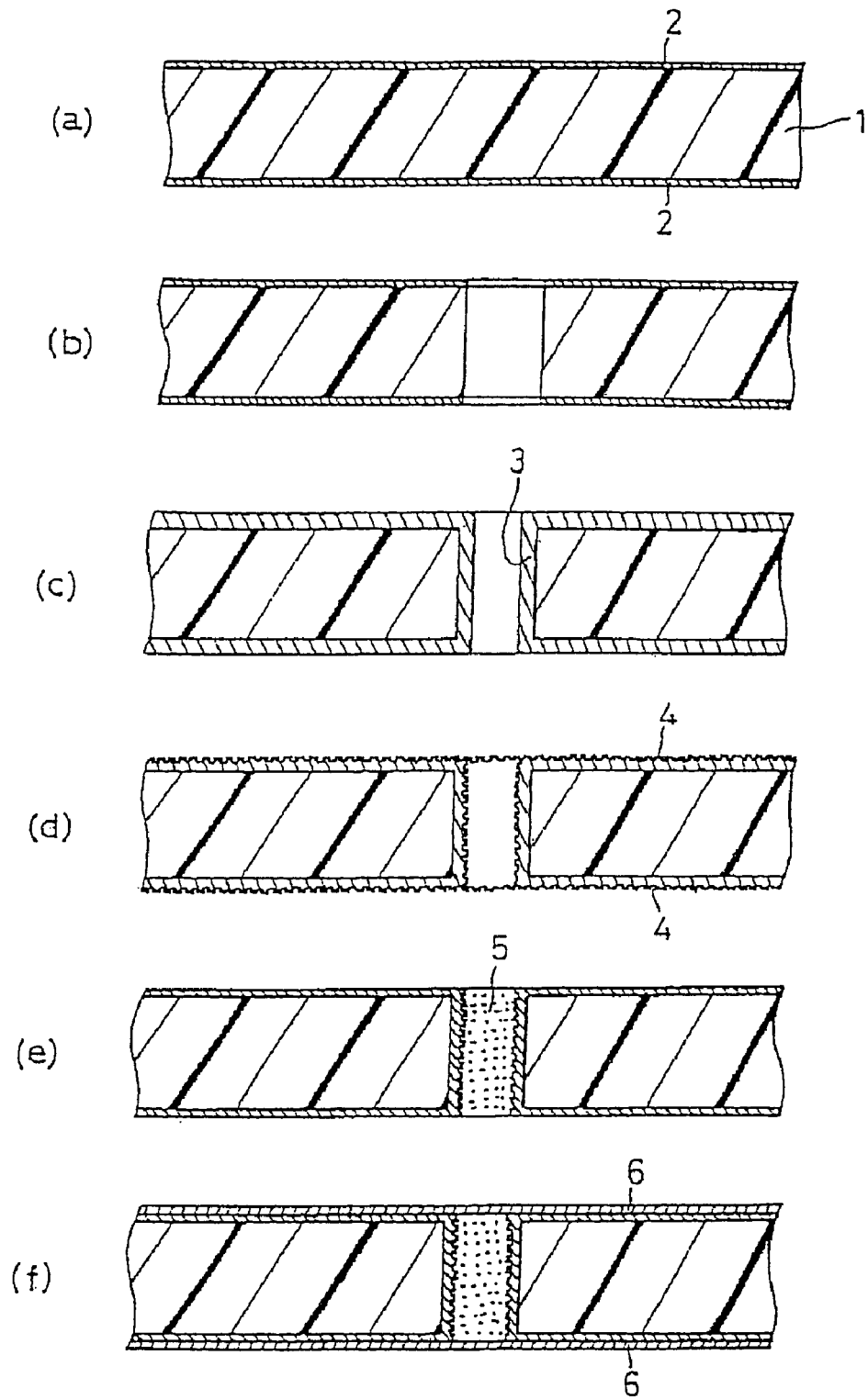
FIG. 19 (a) through (f) are cross-section views illustrating the flow of production of a multilayer printed circuit board in accordance with the fifth group of the present invention.
Figure 20:
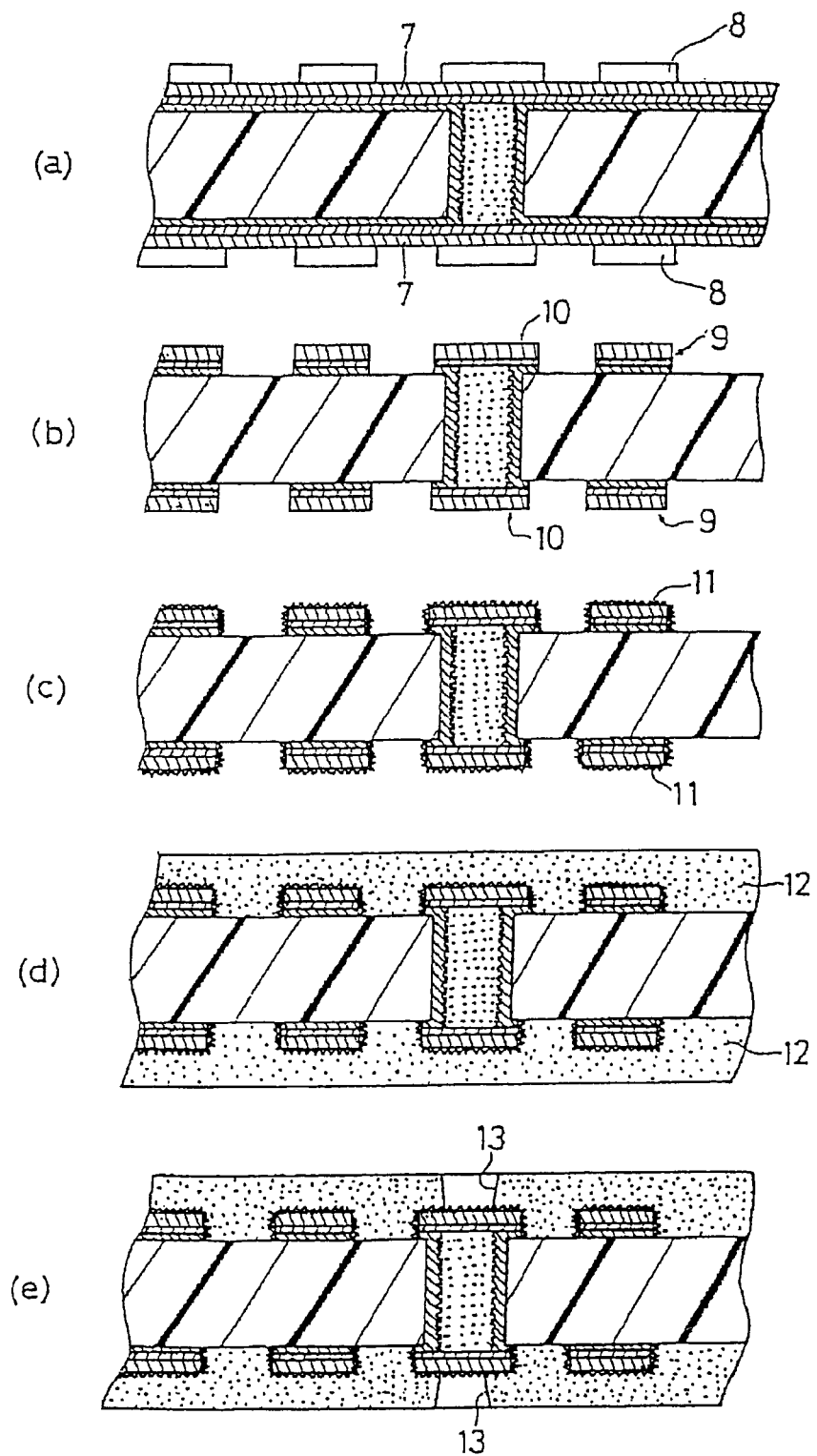
FIG. 20 (a) through (e) are cross-section views illustrating the flow of production of a multilayer printed circuit board in accordance with the fifth group of the present invention.
Figure 21:
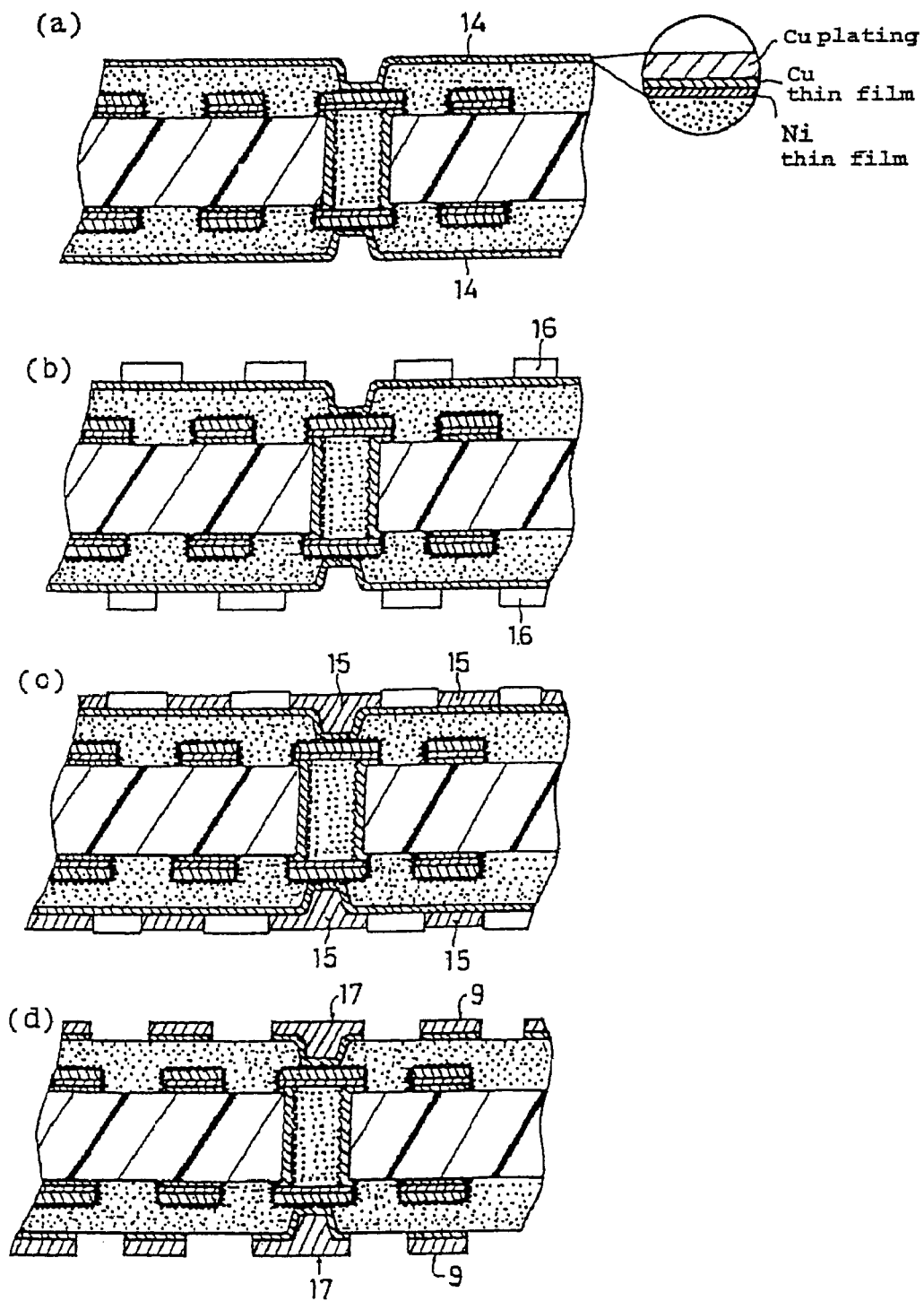
FIG. 21 (a) through (d) are cross-section views illustrating the flow of production of a multilayer printed circuit board in accordance with the fifth group of the present invention.
Figure 22:
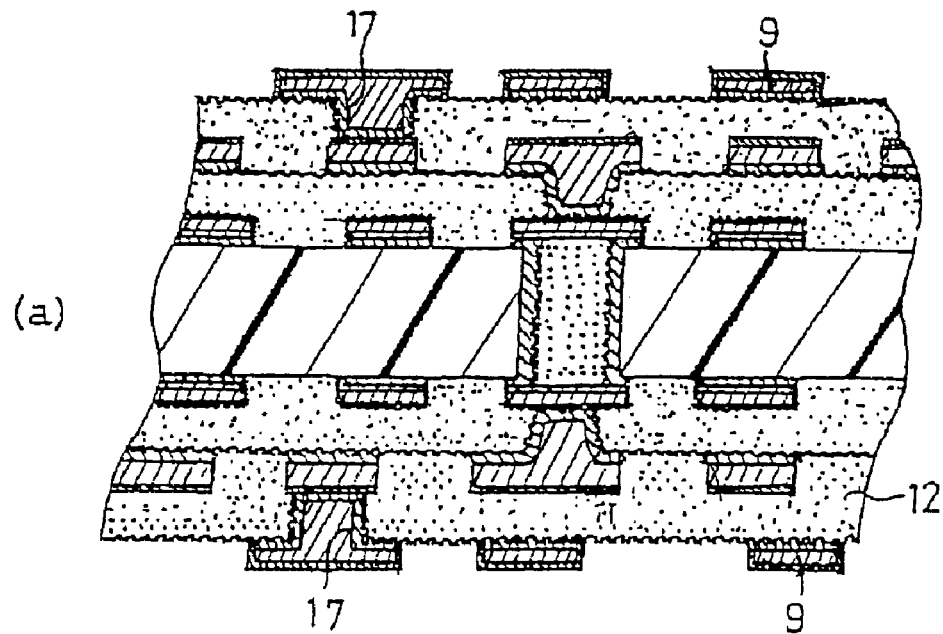
FIGS. 22 (a) and (b) are cross-section views illustrating the flow of production of a multilayer printed circuit board in accordance with the fifth group of the present invention.
Figure 22:
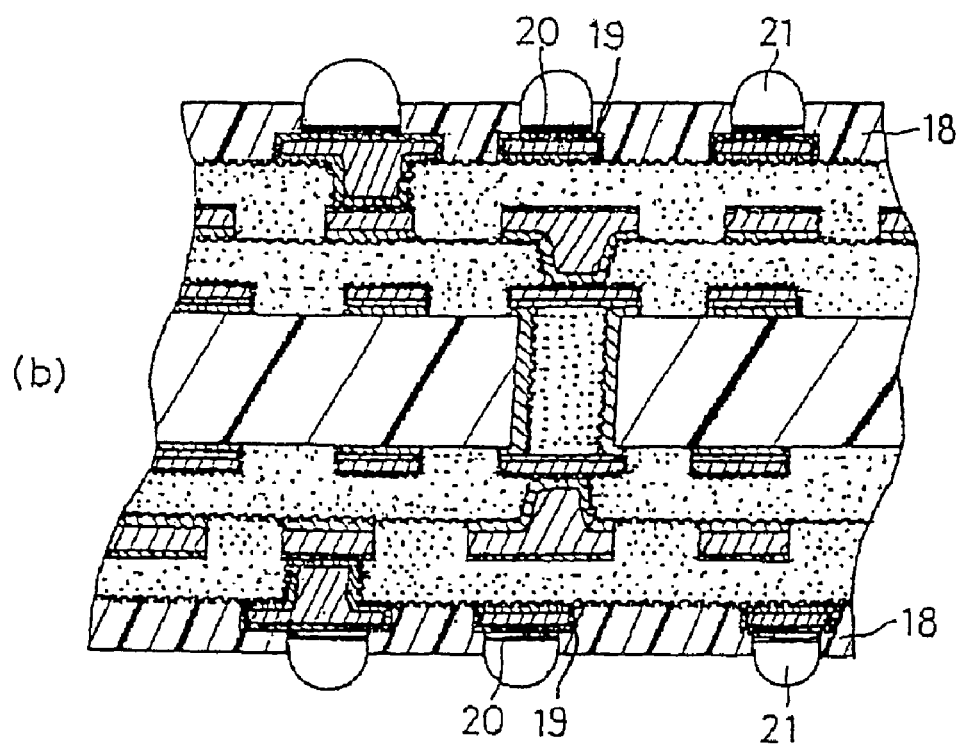

Furthermore, using a copper electroplating solution of the under-mentioned formulation, copper electroplating was carried out to form a 15 μm-thick electroplated copper film [FIG. 19(*c*)].

| [Aqueous electroplating solution] | |
| --- | --- |
| Sulfuric acid | 180 g/L |
| Copper sulfate | 80 g/L |
| Additive (Atotech Japan, product designation: Kaparacid GL) | 1 ml/L |
| [Electroplating conditions] | |
| Current density | 1 A/dm² |
| Time | 30 min. |
| Temperature | Room temperature |

(2) The substrate board formed with the inner copper pattern (inclusive of plated-through holes 3) as above was rinsed with water and dried. The substrate board was then subjected to an oxidation-reduction treatment using an aqueous solution of NaOH (20 g/L), NaClO$_2$ (50 g/L) and Na$_3$PO$_4$ (15.0 g/L) as oxidation bath (blackening bath) and an aqueous solution of NaOH (2.7 g/L) and NaBH$_4$ (1.0 g/L) as reduction bath to provide a roughened layer 4 on the entire surface of the conductor circuit and plated-through holes [FIG. 19(*d*)].

(3) The plated-through holes 3 were filled with a conductive paste 5 containing copper particle by a screen printing technique, followed by drying and curing. Then, the conductive paste 5 deposited on the roughened layer 4 of the conductor or overflowing the plated-through holes 3 was abraded off with a belt sander using a #400 belt sanding paper (Sankyo Rikagaku). To remove the injuries caused by belt sanding, abrasion was further performed to flatten the substrate board surface [FIG. 19(*e*)].

(4) To the flattened surface of the substrate board as prepared in the above step (3) was applied a coloidal palladium catalyst, and electroless plating was performed in the routine manner to form a 0.6 μm-thick electroless plated copper film 6 [FIG. 19(*f*)].

(5) Then, copper electroplating was performed under the following conditions to form a 15 μm-thick electroplated copper film 7 to thicken the part to become the conductor circuit 9 and provide a conductor layer (cover plated layer) 10 covering the conductive paste 5 filled into the plated-through holes 3.

| [Aqueous electroplating solution] | |
| --- | --- |
| Sulfuric acid | 180 g/L |
| Copper sulfate | 80 g/L |
| Additive (Atotech Japan, product designation: Kaparacid GL) | 1 ml/L |
| [Electroplating conditions] | |
| Current density | 1 A/dm² |
| Time | 30 min. |
| Temperature | Room temperature |

Figure 24:
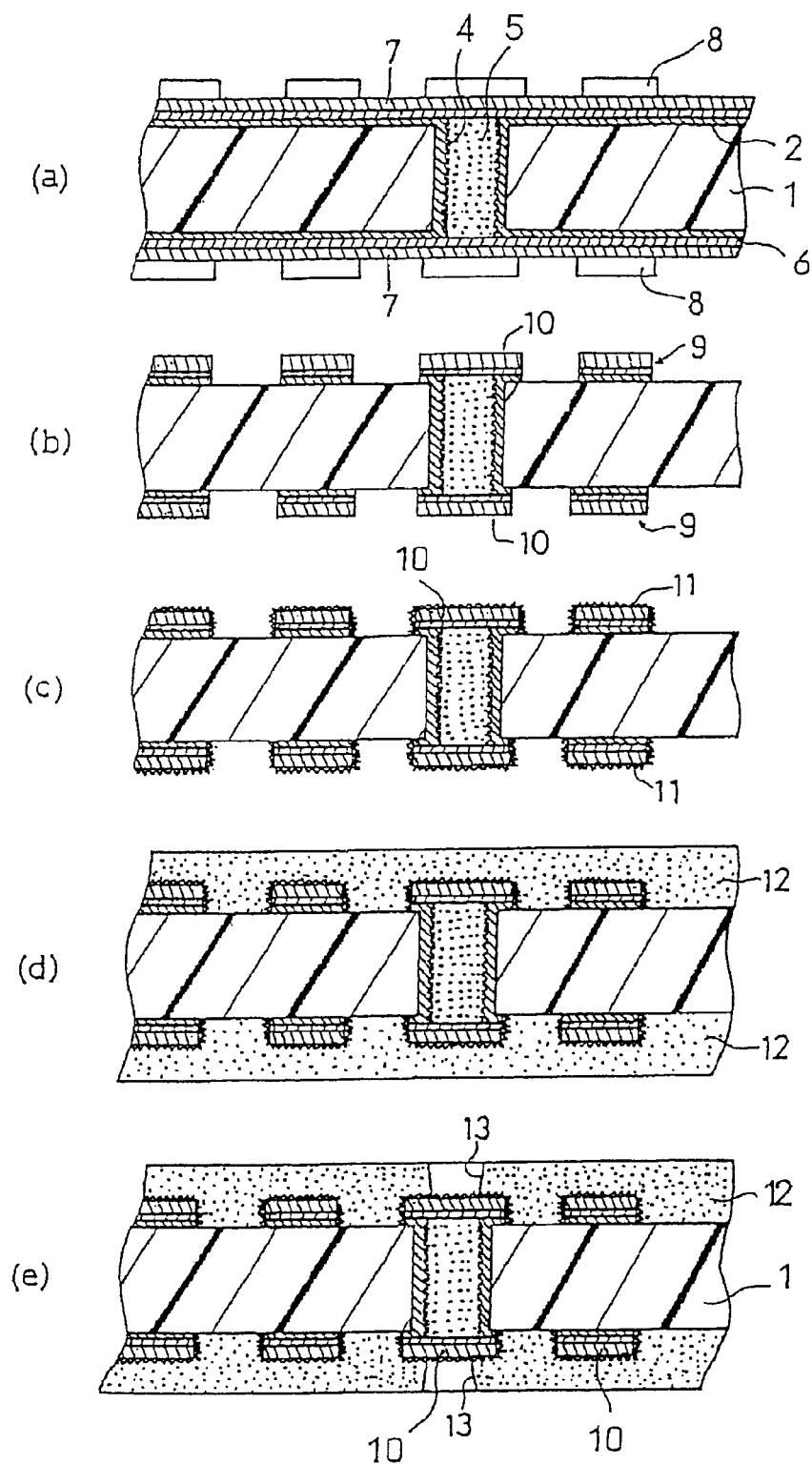
FIG. 24 (a) through (e) are cross-section views illustrating the flow of production of a multilayer printed circuit board in accordance with the sixth group of the present invention.

(6) To both sides of the substrate board formed with said part which were to become the lower-layer conductor circuit 9 and conductor layer 10, a commercial photosensitive dry film was laminated, and with a photomask set in position, light exposure at 100 mJ/cm² and development with 0.8% sodium carbonate/water were carried out to provide a 15 μm-thick etching resist 8 [FIG. 24(*a*)].

(7) The plated film in the area not masked by the etching resist 8 was dissolved and removed by etching with a sulfuric acid-hydrogen peroxide solution and the etching resist 8 was stripped off with 5% KOH to construct a discrete lower-layer conductor circuit 9 and a conductor layer 10 covering the conductive paste 5 [FIG. 24(*b*)].

(8) Then, on the surface of said lower-layer conductor circuit 9 and said conductive layer 10 covering the metal particle paste 5, a 2.5 μm-thick roughened layer (uneven layer) 11 of Cu—Ni—P alloy was constructed and, further on the surface of said roughened layer 11, a 0.3 μm-thick Sn layer was formed [FIG. 24(*c*)]. The specific procedure used for the construction of the above layers are as follows. (Incidentally, the Sn layer is not shown in FIG. 24(*c*).)

Thus, the substrate board was acid-degreased and soft-etched. The substrate board was then treated with a catalyst solution of palladium chloride in an organic acid to let the Pd catalyst be deposited on the substrate board. After the Pt catalyst was activated, electroless plating was performed using an electroless plating bath (pH=9) containing copper sulfate (8 g/L), nickel sulfate (0.6 g/L), citric acid (15 g/L), sodium hypophosphite (29 g/L), boric acid (31 g/L) and surfactant (Nisshin Chemical Industries, Surfynol 465) (0.1 g/L) to form a roughened layer (uneven layer) 11 of Cu—Ni—P alloy on the entire surface of the conductor circuit. Furthermore, the substrate board was immersed in an electroless Sn substitution plating bath (pH=1.2, temperature=50° C.) containing tin borofluoride (0.1 mol/L) and thiourea (1.0 mol/L) to form a 0.3 μm-thick Sn layer on the surface of said roughened layer. (Incidentally, the Sn layer is not shown.)

(9) To both sides of the substrate board, a 50 μm-thick thermosetting polyolefin resin sheet (Sumitomo-3M, product designation: 1592) was laminated by hot pressing with increasing temperature from 50° C. to 180° C. under a pressure of 10 kg/cm² to form an inter-level resin insulating resin layer 12 of polyolefin resin [FIG. 24(d)].

(10) Using a $CO_2$ gas laser at a wavelength of 10.4 μm, 80 μm (dia.) openings 13 for via holes were pierced in said resin insulating layer 12 comprising polyolefin. Then, a $CF_4$-oxygen mixed plasma treatment was carried out for desmear treatment and surface modification of the polyolefin resin insulating layer. As a result, hydrophilic groups such as OH, carbonyl and COOH were confirmed on the modified surface.

The conditions of the above plasma treatment were particle: 800 W, pressure: 500 m Torr, time: 20 min.

(11) Using Ni as the target, sputtering was performed under the conditions of gas pressure: 0.6 Pa, temperature: 80° C., power: 200 W, time: 5 min. to provide an Ni thin film on the surface of the polyolefin resin insulating layer 12. The thickness of the Ni metal layer formed was 0.1 μm.

Furthermore, on the Ni metal layer, a 0.1 μm-thick copper layer was formed by sputtering under the same conditions. As the equipment for this sputtering treatment, Japan Vacuum Technology's SV-4540 was used.

(12) The substrate board which had undergone the above treatment in step (11) was electroless plated as in step (1) to form a 0.7 μm-thick electroless plated film 14 [FIG. 25(a)].

(13) To both sides of the substrate board formed with the electroless plated film 14 in the above step (12), a commercial photosensitive dry film was laminated, and with a photomask set in position, exposure at 100 mJ/cm² and development with 0.8% sodium carbonate/water were carried out to provide a 15 μm-thick plating resist 16 [FIG. 25(b)].

(14) Then, electroplating was carried out as in step (1) to form a 15 μm-thick electroplated film 15 and thereby thicken the part to become the conductor circuit 9 and fill the spaces to constitute the via holes 17 [FIG. 25(c)].

(15) The plating resist 16 was stripped off with 5% KOH/$H_2O$ and the Ni film and electroless plated film 14 under the plating resist 16 were dissolved and removed by etching using nitric acid and sulfuric acid-hydrogen peroxide to provide a 16 μm-thick conductor circuit (inclusive of via holes 17) composed of said Ni film, electroless plated copper film 14 and electroplated copper film 15 [FIG. 25(d)].

(16) The above sequence of steps (8) to (15) was repeated to complete a multilayer printed circuit board [FIG. 26(a)]. Separately, a solder resist composition was prepared as in Example 12 (14).

(17) The multilayer circuit board obtained in the above step (16) was held in vertical position between the coating rollers of a roll coater and coated with said solder resist composition in a thickness of 20 μm.

(18) The substrate board was then dried at 70° C. for 20 minutes and further at 70° C. for 30 minutes and, then, subjected to UV exposure at 1000 mJ/cm² and development with DMTG.

The substrate board was further heat-treated under the conditions of 80° C. for 1 hr, 100° C. for 1 hr, 120° C. for 1 hr and 150° C. for 3 hrs sequentially to form a solder resist layer 18 (20 μm thick) with openings on the via hole, lands and in part of the upper surface of the grid-shaped power layer (openings diameter 200 μm).

(19) The substrate board thus formed with the solder resist layer was immersed in an electroless nickel plating bath (pH=5) comprising an aqueous solution of nickel chloride (30 g/L), sodium hypophosphite (10 g/L) and sodium citrate (10 g/L) for 20 minutes to form a 5 μm-thick plated nickel layer 19 in the opening areas. This board was further immersed in an electroless gold plating solution comprising an aqueous solution of potassium gold cyanide (2 g/L), ammonium chloride (75 g/L), sodium citrate (50 g/L) and sodium hypophosphite (10 g/L) at 93° C. for 23 seconds to form a 0.03 μm-thick plated gold layer 20 on the nickel plating layer 19.

(20) Then, a solder paste was printed into the openings of the solder resist layer 18 and let reflow at 200° C. to form solder vamps 21. In this manner, a multilayer printed circuit board comprising solder vamps 21 was obtained [FIG. 26(b)].

Example 24

In this example using Mitsui Chemical's TPX (product designation) as polyolefin resin, desmear treatment with oxygen plasma was carried out as in Example 23 and surface modification was performed by UV irradiation for 30 to 60 sec. with a low-pressure mercury vapor lamp to introduce OH and carbonyl groups.

In this example, Pd was applied in a thickness of 0.1 μm to the polyolefin resin insulating layer under the conditions of gas pressure: 0.6 Pa, temperature: 100° C., power: 200 W and time: 2 min. Otherwise, the procedure of Example 23 was repeated to manufacture a multilayer printed circuit board.

Example 25

In this example, Idemitsu Petrochemical's SPS (product designation) was used as polyolefin resin and Ti was deposited in a thickness of 0.1 μm on the polyolefin resin insulating resin under the conditions of gas pressure: 0.6 Pa, temperature: 100° C., power: 200 W and time: 5 min. Otherwise, the procedure of Example 23 was repeated to provide a multilayer printed circuit board.

Example 26

In this example, except that the conductor circuit was constructed in the following manner, the procedure of Example 23 was otherwise repeated to provide a multilayer printed circuit board.

Thus, following the steps (8) to (9) in the procedure of Example 23, a commercial photosensitive dry film was laminated to the inter-level polyolefin resin insulating layer and, with a photomask film set in position, exposure at 100 mJ/cm² and development with 0.8% sodium carbonate/water were carried out to dispose a 10 μm-thick plating resist. Then, Co sputtering was carried out under the conditions of gas pressure: 0.6 Pa, temperature: 100° C., power: 200 W, and time: 2 min. to form a 0.1 μm-thick Co layer. The plating resist was then removed with 5% KOH and using the Co layer as catalyst, electroless copper plating was performed as in Example 23 to construct a 10 μm-thick conductor circuit.

Example 27

Except that sputtering was carried out using Al, Cr, Sn, Mo, W or Fe instead of Ni, the procedure of Example 23 was otherwise repeated to manufacture a multilayer printed circuit board.

The above sputtering was performed under the conditions of gas pressure: 0.6 Pa, temperature: 100° C., power: 200 W and time: 2 min. to deposit the corresponding metal in a thickness of 0.1 μm on the surface of the polyolefin resin insulating layer.

For each of the multilayer printed circuit boards obtained in the above manner, peel strength was measured.

Furthermore, each circuit board was allowed to sit at 128° C. for 48 hours and the percent gain in the amount of warpage was determined. Moreover, the substrate board was subjected to 500 heat cycles at −55 to 125° C.

In addition, after an IC chip was mounted, the circuit board was driven at room temperature in an atmosphere controlled at 100% R.H. for 100 hours and checked for copper migration. The test of migration was whether inter-level conduction occurred or not. The results are shown in Table 3.

TABLE 3

|  | Peal strength (kg/cm) | % Gain in warpage (%) | Migration | Crack |
|---|---|---|---|---|
| Example 23 (Ni) | 2.4 | 1 | None | None |
| Example 24 (Pd) | 2.0 | 1 | None | None |
| Example 25 (Ti) | 1.5 | 1 | None | None |
| Example 26 (Co) | 2.0 | 1 | None | None |
| Example 27-1 (Cr) | 2.0 | 1 | None | None |
| Example 27-2 (Sn) | 2.0 | 1 | None | None |
| Example 27-3 (Mo) | 1.8 | 1 | None | None |
| Example 27-4 (W) | 1.5 | 1 | None | None |
| Example 27-5 (Al) | 1.6 | 1 | None | None |

It will be apparent from Table 3 that the circuit boards according to the examples had sufficient peel strength notwithstanding the omission of the roughened surface of the interlayer resin insulating layers.

Furthermore, despite the low heat radiation characteristic, the circuit boards according to the examples kept a good retention of layer to layer insulation without the migration because the diffusion of copper ions was inhibited by metals such as Ni, Pd or the like. Furthermore, the gain in warpage was also inhibited.

Thus, the beneficial effect of the fifth group of the present invention is materialized as a buildup structure is formed on both sides of a resin substrate board and each of its conductor circuits is constructed on a metal layer formed directly on a resin insulating layer, said metal layer being composed of at least one metal selected from among the metals (exclusive of Cu) of the 4$^{th}$ through 7$^{th}$ periods in Group 4A to Group 1B of the periodic table of the elements.

Example 28

(1) As the starting core board, a copper-clad BT resin laminate comprising a 0.8 mm-thick BT (bis(maleimide) triazine) resin substrate sheet 1 and a 18 μm-thick copper foil 2 laminated to both sides of said resin sheet (Mitsubishi Gas Chemical, product designation: HL830-0.8T12D) was used [FIG. 23(a)]. First, this copper-clad laminate was drilled to form through holes [FIG. 23(b)]. Then, palladium-tin coloid was applied to the surface and using an aqueous electroless plating solution of the under-mentioned formulation, electroless plating was carried out under the following conditions to form a 0.7 μm-thick electroless plated film on the entire surface of the substrate board.

[Aqueous electroless plating solution]

| EDTA | 150 g/L |
|---|---|
| Copper sulfate | 20 g/L |
| HCHO | 30 ml/L |
| NaOH | 40 g/L |
| α,α'-Bipyridyl | 80 mg/L |
| PEG | 0.1 g/L |

[Electroless plating conditions]

| Bath temperature: | 70° C., for 30 min. |
|---|---|

Figure 23:
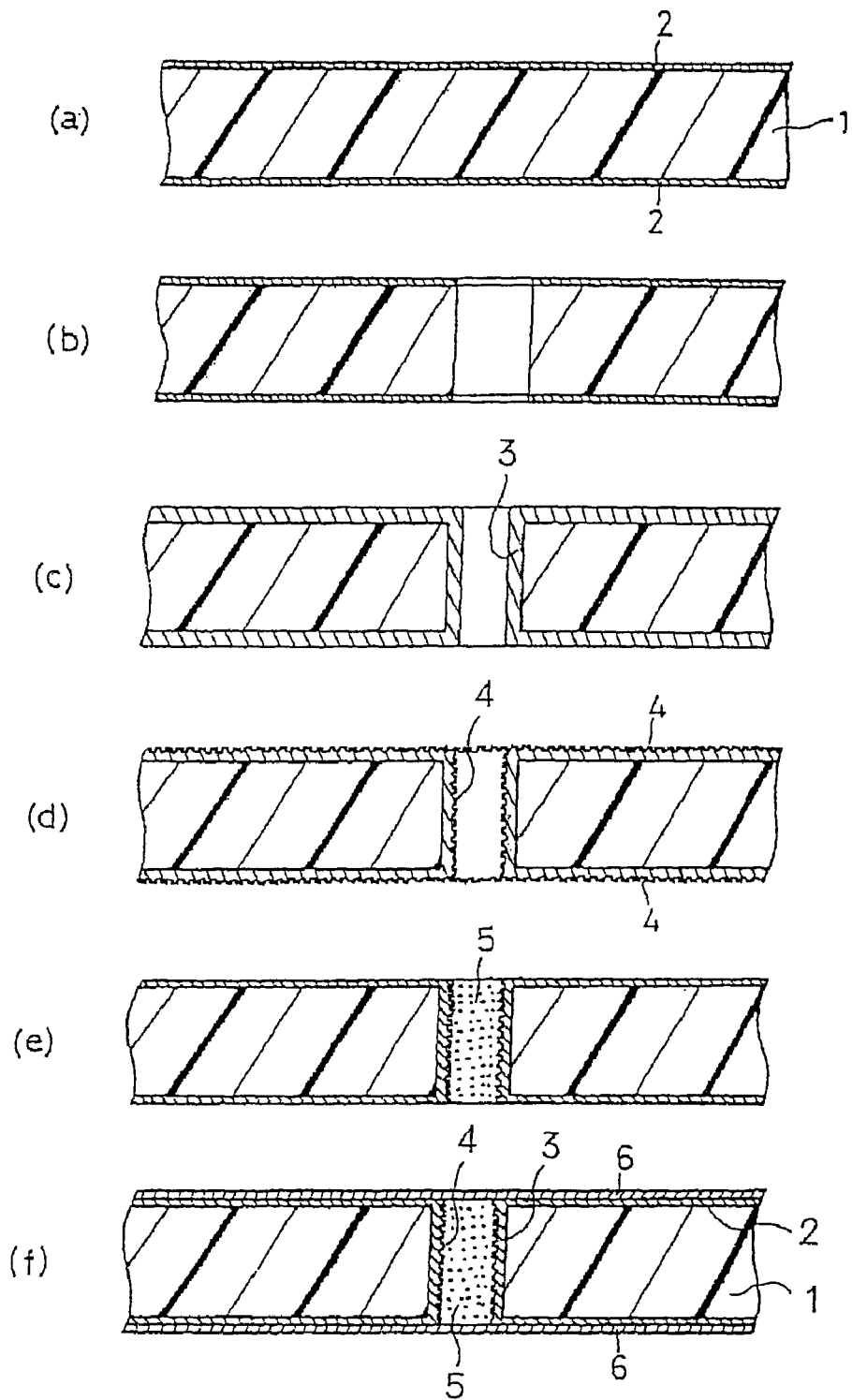
FIG. 23 (a) through (f) are cross-section views illustrating the flow of production of a multilayer printed circuit board in accordance with the sixth group of the present invention.

Furthermore, using a copper electroplating solution of the under-mentioned formulation, copper electroplating was carried out to form a 15 μm-thick electroplated copper film [FIG. 23(c)].

[Aqueous electroplating solution]

| Sulfuric acid | 180 g/L |
|---|---|
| Copper sulfate | 80 g/L |
| Additive (Atotech Japan, product designation: Kaparacid GL) | |

[Electroplating conditions]

| Current density | 1 A/dm$^2$ |
|---|---|
| Time | 30 min. |
| Temperature | Room temperature |

(2) The substrate board formed with the inner copper pattern (inclusive of plated-through holes 3) as above was rinsed with water and dried. The substrate board was then subjected to an oxidation-reduction treatment using an aqueous solution of NaOH (20 g/L), NaClO$_2$ (50 g/L) and Na$_3$PO$_4$ (15.0 g/L) as oxidation bath (blackening bath) and an aqueous solution of NaOH (2.7 g/L) and HaBH$_4$ (1.0 g/L) as reduction bath to provide a roughened layer 4 on the entire surface of the conductor circuit and plated through holes [FIG. 23(d)].

(3) The plated-through holes 3 were filled with a conductive paste 5 containing copper particle by a screen printing technique, followed by drying and curing. Then, the conductive paste 5 deposited on the roughened layer 4 of the conductor or overflowing the plated-through holes 3 was abraded off with a belt sander using a #400 belt sanding paper (Sankyo Rikagaku). To remove the injuries caused by belt sanding, abrasion was further performed to flatten the substrate board surface [FIG. 23(e)].

(4) To the flattened surface of the substrate board as prepared in the above step (3) was applied a coloidal palladium catalyst, and electroless plating was performed in the routine manner to form a 0.6 μm-thick electroless plated copper film 6 [FIG. 24(f)].

(5) Then, copper electroplating was performed under the following conditions to form a 15 μm-thick electroplated copper film 7 to thicken the part to become the conductor circuit 9 and provide a conductor layer (cover plated layer) 10 covering the conductive paste 5 filled into the plated-through holes 3.

[Aqueous electroplating solution]

| Sulfuric acid | 180 g/L |
|---|---|
| Copper sulfate | 80 g/L |
| Additive (Atotech Japan, product designation: Kaparacid GL) | 1 ml/L |

| [Electroplating conditions] | |
|---|---|
| Current density | 1 A/dm² |
| Time | 30 min. |
| Temperature | Room temperature |

(6) To both sides of the substrate board formed with said part which were to become the lower-layer conductor circuit 9 and conductor layer 10, a commercial photosensitive dry film was laminated, and with a photomask set in position, light exposure at 100 mJ/cm² and development with 0.8% sodium carbonate/water were carried out to provide a 15 µm-thick etching resist 8 [FIG. 24(*a*)].

(7) The plated film in the area not masked by the etching resist 8 was dissolved and removed by etching with a sulfuric acid-hydrogen peroxide solution and the etching resist 8 was stripped off with 5% KOH to construct a discrete lower-layer conductor circuit 9 and a conductor layer 10 covering the conductive paste 5 [FIG. 24(*b*)].

(8) Then, on the surface of said lower-layer conductor circuit 9 and said conductive layer 10 covering the metal particle paste 5, a 2.5 µm-thick roughened layer (uneven layer) 11 of Cu—Ni—P alloy was constructed and, further on the surface of said roughened layer 11, a 0.3 µm-thick Sn layer was formed. (FIG. 24(*c*), however the Sn layer is not shown.)

The specific procedure was as follows.

Thus, the substrate board was acid-degreased and soft-etched. The substrate board was then treated with a catalyst solution of palladium chloride in an organic acid to let the Pd catalyst be deposited on the substrate board. After the Pt catalyst was activated, electroless plating was performed using an electroless plating bath (pH=9) containing copper sulfate (8 g/L), nickel sulfate (0.6 g/L), citric acid (15 g/L), sodium hypophosphite (29 g/L), boric acid (31 g/L) and surfactant (Nisshin Chemical Industries, Surfynol 465) (0.1 g/L) to form a roughened layer (uneven layer) 11 of Cu—Ni—P alloy on the entire surface of the conductor circuit. Furthermore, the substrate board was immersed in an electroless Sn substitution plating bath (pH=1.2, temperature=50° C.) containing tin borofluoride (0.1 mol/L) and thiourea (1.0 mol/L) to form a 0.3 µm-thick Sn layer on the surface of said roughened layer. (Incidentally, the Sn layer is not shown.)

(9) To both sides of the substrate board, a 50 µm-thick thermosetting polyolefin resin sheet (Sumitomo-3M, product designation: 1592) was laminated by hot pressing with increasing temperature from 50° C. to 180° C. under a pressure of 10 kg/cm² to form an inter-level resin insulating resin layer 12 of polyolefin resin [FIG. 24(*d*)].

(10) Using a CO₂ gas laser at a wavelength of 10.4 µm, 80 µm (dia.) of openings 13 for via holes were pierced in said resin insulating layer 12 comprising polyolefin. Then, a CF₄-oxygen mixed plasma treatment was carried out for desmear treatment and surface modification of the polyolefin resin insulating layer. As a result, hydrophilic groups such as OH, carbonyl and COOH were confirmed on the modified surface.

The conditions of the above plasma treatment were particle: 800 W, pressure: 500 m Torr, time: 20 min.

(11) Then, using Ni as the target metal, an Ni thin film was formed on the surface of said polyolefin resin insulating layer 12 by sputtering under the conditions of gas pressure 0.6 Pa, temperature: 80° C., power: 200 W and time: 5 min. The thickness of the Ni metal layer thus formed was 0.1 µm.

Figure 25:
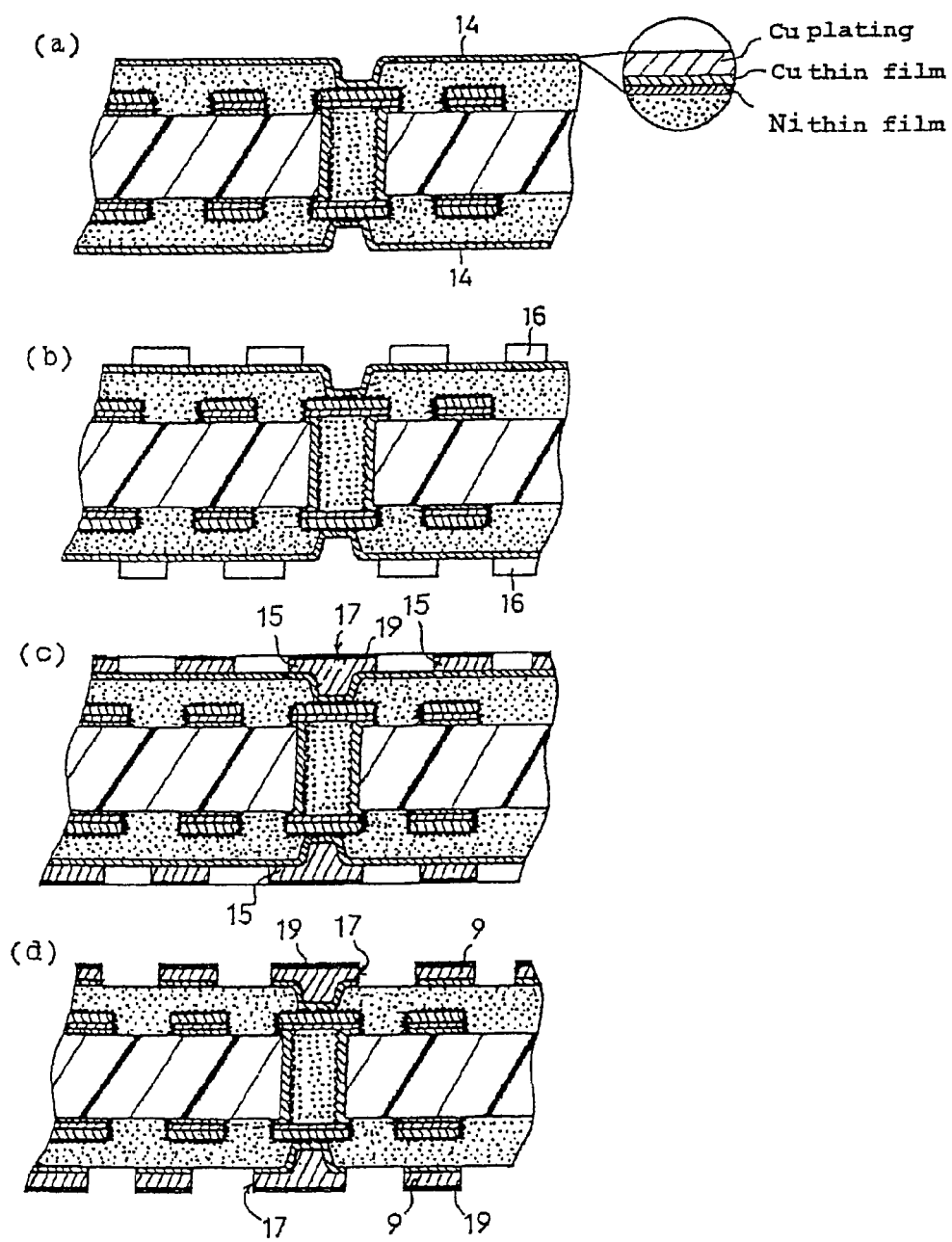
FIG. 25 (a) through (d) are cross-section views illustrating the flow of production of a multilayer printed circuit board in accordance with the sixth group of the present invention.

Then, as shown in FIG. 25(*a*), a 0.1 µm-thick copper layer was formed on the lowermost Ni layer by sputtering under the same conditions as above. As the sputtering equipment, Japan Vacuum Technology's SV-4540 was used.

(12) To the substrate board after treatment of said step (11), the electroless plating as same procedure as said step (1) was carried out to form a 7 µm-thick electroless plating layer 14 [FIG. 25(*a*)].

(13) To both sides of the substrate board formed with electroless plating layer 14 by said step (12), a commercial photosensitive dry film was laminated, and with a photomask set in position, light exposure at 100 mJ/cm² and development with 0.8% sodium carbonate/water were carried out to provide a 15 µm-thick etching resist 16 [FIG. 25(*b*)].

(14) Then, electroplating was performed under the same conditions as in step (1) to provide a 21 µm-thick electroplated film 15. This electroplated film 15 thickened the part to become the conductor circuit 9 and filled the via holes 17 [FIG. 25(*c*)].

Then, the substrate board was immersed in an electroless nickel plating bath (pH=5) comprising an aqueous solution of nickel chloride (30 g/L), sodium hypophosphite (10 g/L) and sodium citrate (10 g/L) for 1 min. to form a 0.1 µm-thick plated nickel layer 19.

(15) The plating resist 16 was stripped off with 5% KOH and the Ni film and electroless plated film 14 under the plating resist 16 were dissolved and removed by etching with nitric acid and sulfuric acid-hydrogen peroxide to provide a 16 µm-thick conductor circuit (inclusive of via holes 17) composed of said Ni film, electroless plated copper film 14 and electroplated copper film 15 [FIG. 25(*d*)].

Figure 26:
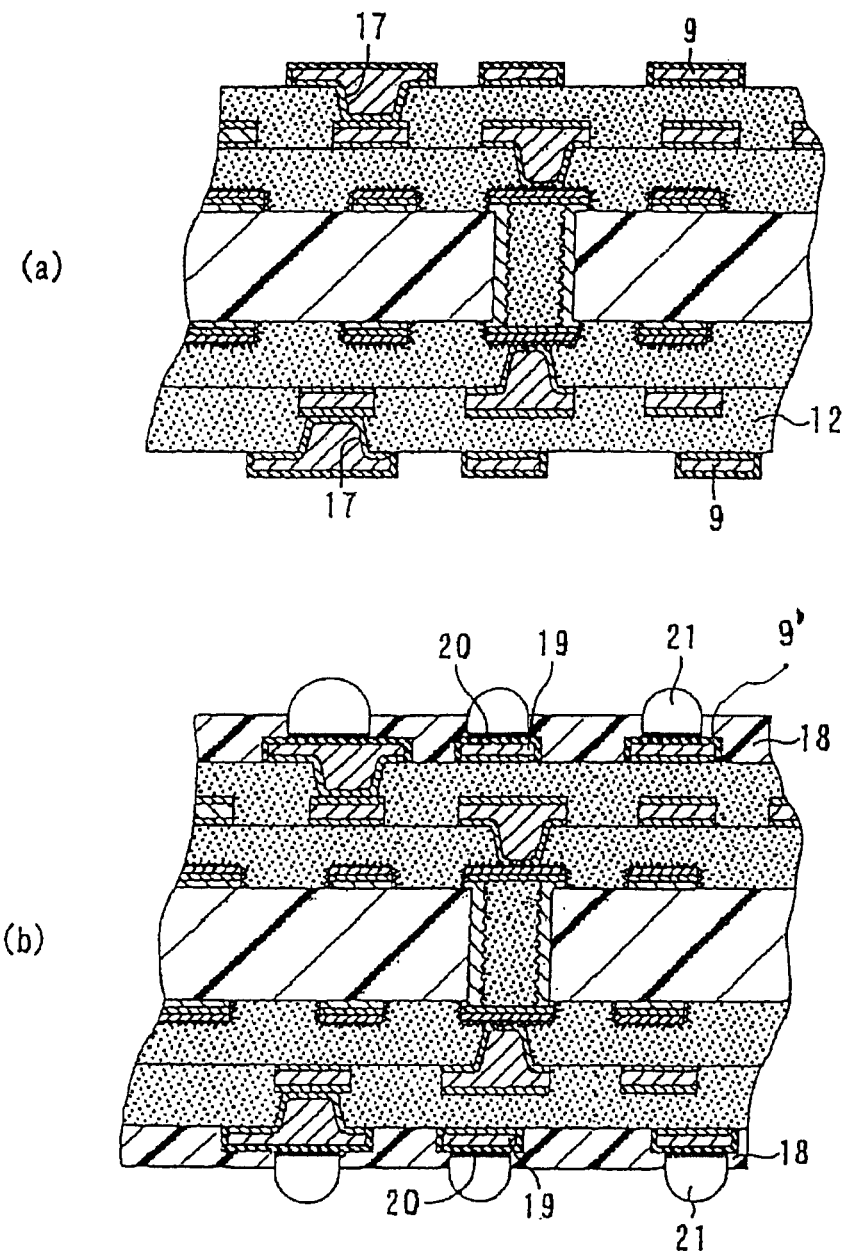
FIGS. 26 (a) and (b) are cross-section views illustrating the flow of production of a multilayer printed circuit board in accordance with the fifth group of the present invention.
Figure 27:
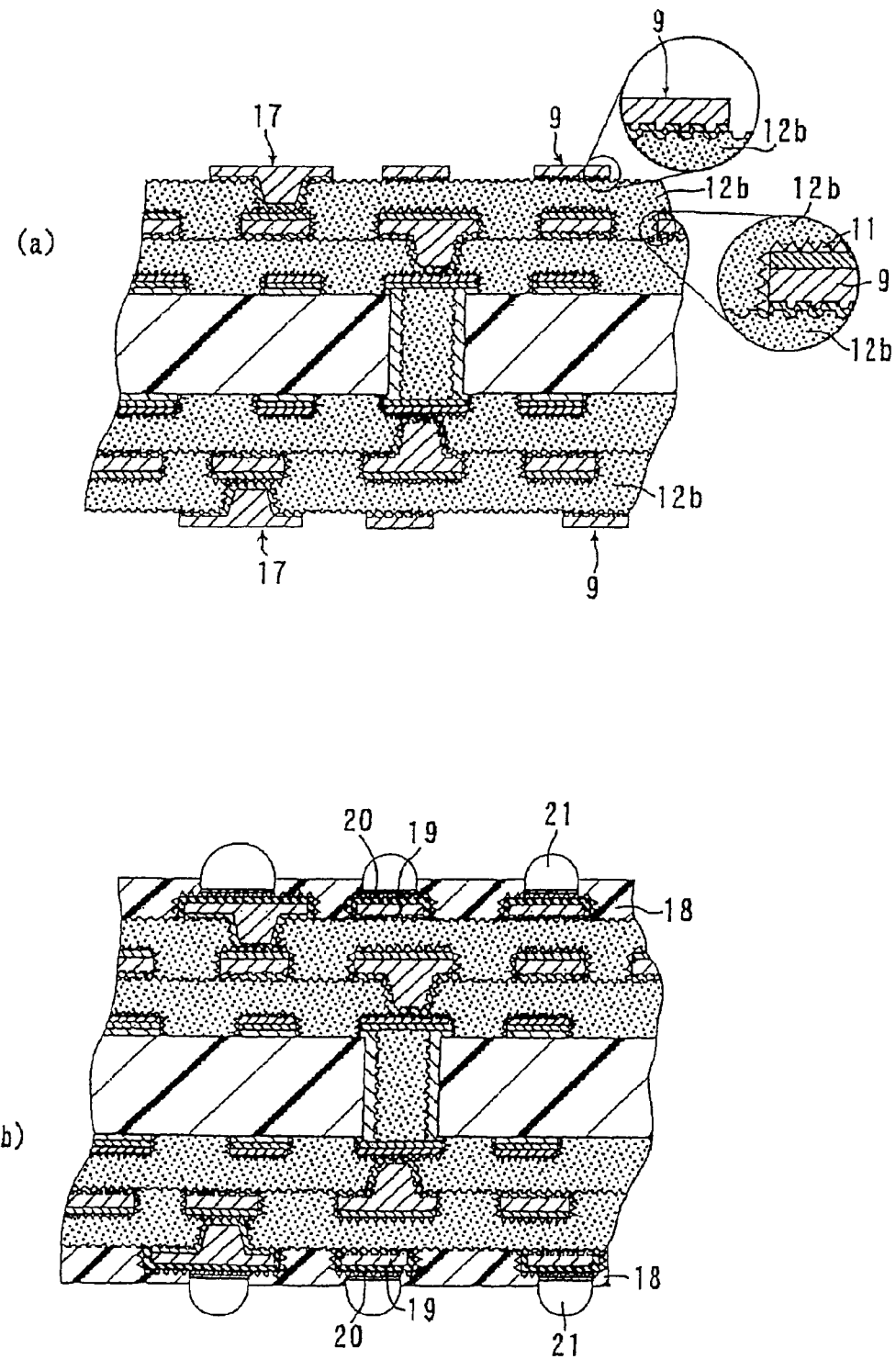
FIGS. 27 (a) and (b) are cross-section views showing parts of a process for manufacture of a multilayer printed circuit board according to a comparative example pertinent to the sixth group of the present invention.

(16) The above sequence of steps (8) to (15) was repeated to complete the construction of a multilayer printed circuit board [FIG. 26(*a*)]. Separately, a solder resist composition was prepared as in Example 12 (14).

(17) The multilayer printed circuit board prepared in step (16) was held in vertical position between the coating rollers of a roll coater and coated with said solder resist composition in a thickness of 20 µm.

(18) The substrate board was then dried at 70° C. for 30 minutes and, then, subjected to UV exposure at 1000 mJ/cm² and development with DMTG. The substrate board was further heat-treated under the conditions of 80° C. for 1 hr, 100° C. for 1 hr, 120° C. for 1 hr and 150° C. for 3 hrs sequentially to form a solder resist layer 18 (20 µm thick) with openings on the via hole, lands and in part of the upper surface of the grid-shaped power layer (openings diameter 200 µm).

(19) Then, the substrate board was immersed in an electroless gold plating bath comprising an aqueous solution of potassium gold cyanide (2 g/L), ammonium chloride (75 g/L), sodium citrate (50 g/L) and sodium hypophosphite (10 g/L) at 93° C. for 23 seconds to form a 0.03 µm-thick plated gold layer 20 on the nickel layer.

(20) Then, a solder paste was printed into the openings of the solder resist layer 18 and caused to reflow at 200° C. to form solder vamps 21. In this manner, a multilayer printed circuit board comprising solder vamps 21 was provided [FIG. 26(*b*)].

Example 29

In this example, In this example using Mitsui Chemical's TPX (product designation) as polyolefin resin, desmear treatment with oxygen plasma was carried out as in Example 28 and surface modification was performed by UV irradiation for 30 to 60 sec. with a low-pressure mercury vapor lamp to introduce OH and carbonyl groups. After this surface modification, the presence of polar groups such as hydroxyl and carbonyl on the surface of the insulating layer was confirmed.

Except for the above modification and further except that 0.1 μm-thick Pd was deposited on the polyolefin resin insulating layer and conductor circuit under the conditions of gas pressure: 0.6 Pa, temperature: 100° C., power: 200 W and time: 2 min, the procedure of Example 28 was otherwise repeated to manufacture a multilayer printed circuit board.

Example 30

In this example, Idemitsu Petrochemical's SPS (product designation) was used as polyolefin resin. Except for the above modification and further except that 0.1 μm-thick Ti was deposited on the polyolefin resin insulating layer and conductor circuit under the conditions of gas pressure: 0.6 Pa, temperature: 100° C., power: 200 W and time 5 min, the procedure of Example 28 was otherwise repeated to manufacture a multilayer printed circuit board.

Example 31

Except that Cr, Sn, Mo, W or Fe was sputtered in lieu of Ni, the procedure of Example 28 was otherwise repeated to provide a multilayer printed circuit board.

The sputtering mentioned above was carried out under the conditions of gas pressure: 0.6 Pa, temperature: 100° C., power: 200 W and time: 2 min., whereby the corresponding metal was deposited in a thickness of 0.1 μm on the polyolefin resin insulating layer and the conductor circuit.

For each of the multilayer printed circuit boards obtained as above, peel strength was measured.

Further, each circuit board was subjected to 500 heat cycles at −55° C. to 125° C.

In addition, after an IC chip was mounted, the circuit board was driven at room temperature in an atmosphere controlled at 100% R.H. for 100 hours and checked for copper migration. The test of migration was whether layer-to-layer conduction occurred or not. The minimum formable L/S value was also determined. The results are shown in Table 4.

TABLE 4

|  | Peal strength (kg/cm) | Migration | Crack | L/S (μm) |
|---|---|---|---|---|
| Example 28 (Ni) | 2.4 | None | None | 15/15 |
| Example 29 (Pd) | 2.0 | None | None | 15/15 |
| Example 30 (Ti) | 1.5 | None | None | 15/15 |
| Example 31-1 (Cr) | 2.0 | None | None | 15/15 |
| Example 31-2 (Sn) | 2.0 | None | None | 15/15 |
| Example 31-3 (Mo) | 2.0 | None | None | 15/15 |
| Example 31-4 (W) | 1.8 | None | None | 15/15 |

The data presented in Table 4 indicate that despite the omission of roughened surface of the interlayer resin insulating layer, the circuit boards according to the examples had sufficient peel strength.

Moreover, despite the low heat radiation characteristics, the circuit boards according to the examples kept good layer to layer insulation without the migration because the diffusion of copper was inhibited by the intervening Ni, Pd or other metal deposited.

It is, therefore, clear that the above-mentioned beneficial effect of this invention is derived from the buildup structure formed on both sides of a resin substrate board and forming a metal layer composed of at least one metal selected from among the metals of the $4^{th}$ through $7^{th}$ periods in Group 4A to Group 1B of the periodic table of the elements, exclusive of Cu, as disposed on the surface of each conductor circuit.

Furthermore, in accordance with this invention, a fine-pattern circuit as fine as L/S=15/15 μm can be constructed.

Example 32

(1) A copper-clad BT resin laminate comprising a 0.8 mm-thick BT (bis(maleimide)triazine) resin substrate sheet 1 and a 18 μm-thick copper foil 2 laminated to both sides of said sheet (Mitsubishi Gas Chemical, product designation: HL830-0.8T12D) was used as the starting material [FIG. 29(*a*)]. This copper-clad laminate was first drilled to form through holes [FIG. 29(*b*)]. Then, palladium-tin coloid was applied to the surface of the laminate and electroless plating was carried out using an aqueous electroplating solution of the following formulation to form a 0.7 μm-thick electroless plated film on the entire surface of the substrate.

| [Aqueous electroless plating solution] | |
|---|---|
| EDTA | 150 g/L |
| Copper sulfate | 20 g/L |
| HCHO | 30 ml/L |
| NaOH | 40 g/L |
| α,α'-Bipyridyl | 80 mg/L |
| Polyethylene grycol (PEG) | 0.1 g/L |
| [Electroless plating conditions] | |
| Bath temperature: | 70° C., for 30 min. |

Furthermore, using a copper electroplating solution of the under-mentioned formulation, copper electroplating was carried out to form a 15 μm-thick electroplated copper film.

| [Aqueous electroplating solution] | |
|---|---|
| Sulfuric acid | 180 g/L |
| Copper sulfate | 80 g/L |
| Additive (Atotech Japan, product designation: Kaparacid GL) | 1 ml/L |
| [Electroplating conditions] | |
| Current density | 1 A/dm² |
| Time | 30 min. |
| Temperature | Room temperature |

Figure 29:
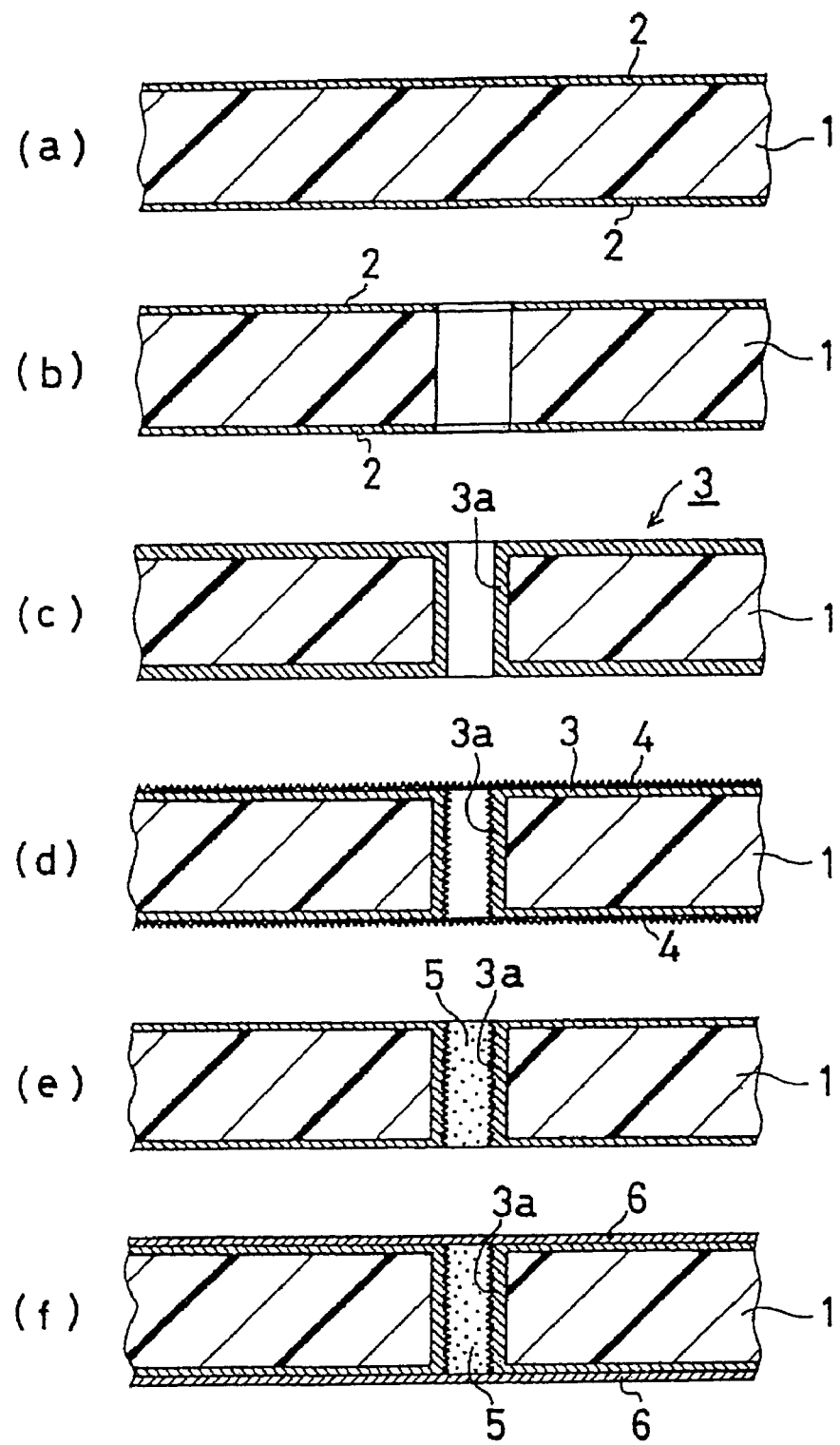
FIG. 29 (a) through (f) are cross-section views illustrating the flow of production of a multilayer printed circuit board in accordance with the seventh group of the present invention.

(2) The substrate formed with a conductor layer 3 on its entire surface (inclusive of plated-through holes 3*a*) in the above step [FIG. 29(*c*)] was rinsed with water and dried. This board was subjected to an oxidation-reduction treatment using an oxidation bath (blackening bath) comprising an aqueous solution of NaOH (20 g/L), NaClO₂ (50 g/L) and Na₃PO₄ (15.0 g/L) and a reduction bath comprising an aqueous solution of NaOH (2.7 g/L) and NaBH₄ (1.0 g/L) to form a roughened layer 4 on the entire surface of the conductor circuit 3 inclusive of plated-through holes 3*a* [FIG. 29(*d*)].

(3) Then, a metal particle paste containing a copper particle having a mean particle diameter of 15 μm (Tatsuta Electric Wire, DD Paste; a non-conductive filler copper paste) was printed into the plated-through holes 3*a* by screen printing and oven-dried to cure at 100° C. for 30 minutes and at 180° C. for 2 hours. The conductive paste 5 deposited on the roughened layer 4 of the conductor layer 3 or overflowing the plated-through holes 3a was removed with a belt sander using a #400 belt-sanding paper (Sankyo Rikagaku), and to remove the injuries caused by sanding, alumina abrasion or abrasion with SiC grits was carried out to smoothen the substrate surface [FIG. 29(e)].

(4) On the surface of the substrate which had been smoothened in the above step (3), the coloidal palladium catalyst was deposited and electroless plating was carried out in the routine manner to form a 0.6 μm-thick electroless copper film 6 [FIG. 29(f)].

Figure 30:
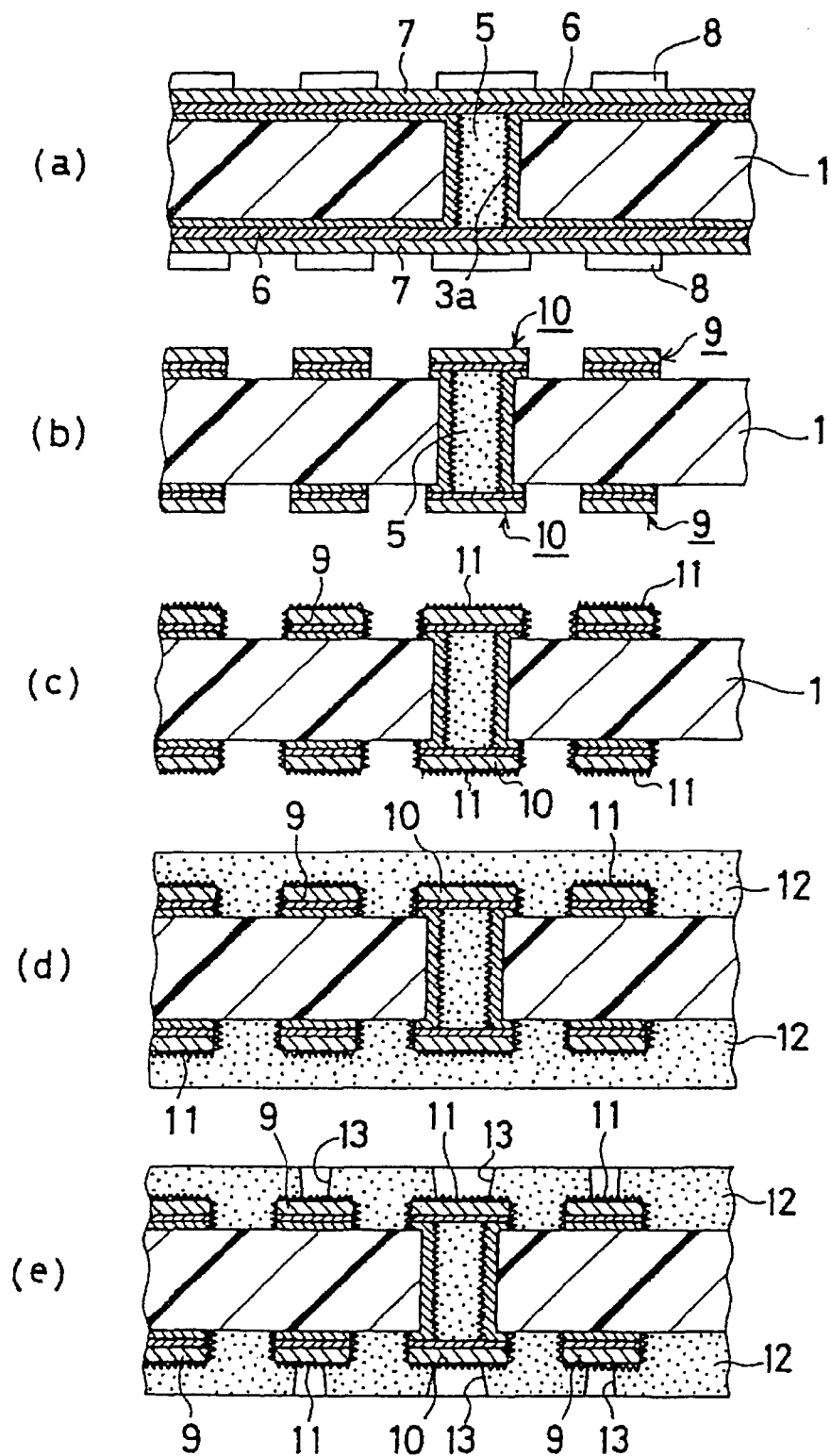
FIG. 30 (a) through (e) are cross-section views illustrating the flow of production of a multilayer printed circuit board in accordance with the seventh group of the present invention.

(5) Then, copper electroplating was performed under the following conditions to form a 15 μm-thick electroplated copper film 7, thereby thickening the part to become a lower-layer conductor circuit 9 and forming the part to become a conductor layer 10 covering the conductive paste 5 in the plated-through holes in the subsequent step shown in FIG. 30(b).

| [Aqueous electroplating solution] | |
| --- | --- |
| Sulfuric acid | 180 g/L |
| Copper sulfate | 80 g/L |
| Additive (Atotech Japan, product designation: Kaparacid GL) | 1 ml/L |
| [Electroplating conditions] | |
| Current density | 1 A/dm$^2$ |
| Time | 30 min. |
| Temperature | Room temperature |

(6) To both sides of the substrate board formed with the part to become the lower-layer conductor circuit 9 and conductor layer 10, a commercial photosensitive dry film was laminated, and with a mask set in position, exposure at 100 mJ/cm$^2$ and development with 0.8% sodium carbonate/water were carried out to form a 15 m-thick etching resist 8 [FIG. 30(a)].

(7) The plated film in the area not masked by the etching resist 8 was dissolved and removed by etching with a sulfuric acid-hydrogen peroxide solution and the etching resist 8 was stripped off with 5% KOH to construct a discrete lower-layer conductor circuit 9 and a conductor layer 10 covering the conductive paste 5 [FIG. 30(b)].

(8) Then, on the surface of the lower-layer conductor circuit 9 and conductor layer 10 covering the conductive paste 5, a 2.5 μm-thick rough (uneven) layer 11 composed of Cu—Ni—P alloy was formed and, further on this roughened layer 11, a 0.3 mm-thick Sn layer was formed [FIG. 30(c)]. The procedures for formation of these layers are described below. The Sn layer is not shown in FIG. 30(c).

Thus, the substrate board was acid-degreased, soft etched and treated with a catalyst solution comprising palladium chloride and an organic acid to deposit catalyst Pd nuclei. After the catalyst was activated, electroless plating was performed using an electroless plating bath (pH=9) containing copper sulfate (8 g/L), nickel sulfate (0.6 g/L), citric acid (15 g/L), sodium hypophosphite (29 g/L), boric acid (31 g/L) and surfactant (Nisshin Chemical Industries, Surfynol 465) (0.1 g/L) to form a roughened layer (corrugated layer) 11 composed of Cu—Ni—P alloy on the entire surface of the conductor circuit. The substrate board was further immersed in an electroless Sn substitution plating bath (pH=1.2, temperature 50° C.) containing tin borofluoride (0.1 mol/L) and thiourea (1.0 mol/L) to form a 0.3 μm-thick Sn layer on the surface of said roughened layer.

(9) To both sides of the resin board which had undergone the above step, a 50 μm-thick thermosetting polyolefin resin sheet (Sumitomo-3M, product designation: 1592) was hot-pressure laminated with increasing temperature from 50° C. to 200° C. under a pressure of 10 kg/cm$^2$ to provide an inter-level resin insulating layer 12 of polyolefin resin [FIG. 30(d)].

(10) Then, using a $CO_2$ gas laser at a wavelength of 10.4 μm, openings 13 for via holes, having 80 μm of diameter, were pierced in the interlayer resin insulating layer 12 of polyolefin resin. Then, the desmear treatment was carried out by oxygen-plasma. [FIG. 30(e)].

(11) The film etching by sputtering was curried out for surface cleaning and surface modification of the interlayer resin insulating layer. Thus, using Tokuda Seisakusho CFS-12P-100, after argon gas purging, sputtering was performed under the conditions of gas pressure: 0.6 Pa, substrate temperature: 70° C., power (RF): 200 W and time: 2 min.

(12) Then, using the same equipment, sputtering using an Ni target was carried out in an argon gas atmosphere under the conditions of gas pressure 0.6 Pa, substrate temperature 70° C., power (DC) 400 W and time 1 min. to form a first conductor layer 14a composed of Ni on the surface of the interlayer resin insulating layer 12 of polyolefin resin. The thickness of the first conductor circuit 14a thus formed was 0.05 μm.

Figure 31:
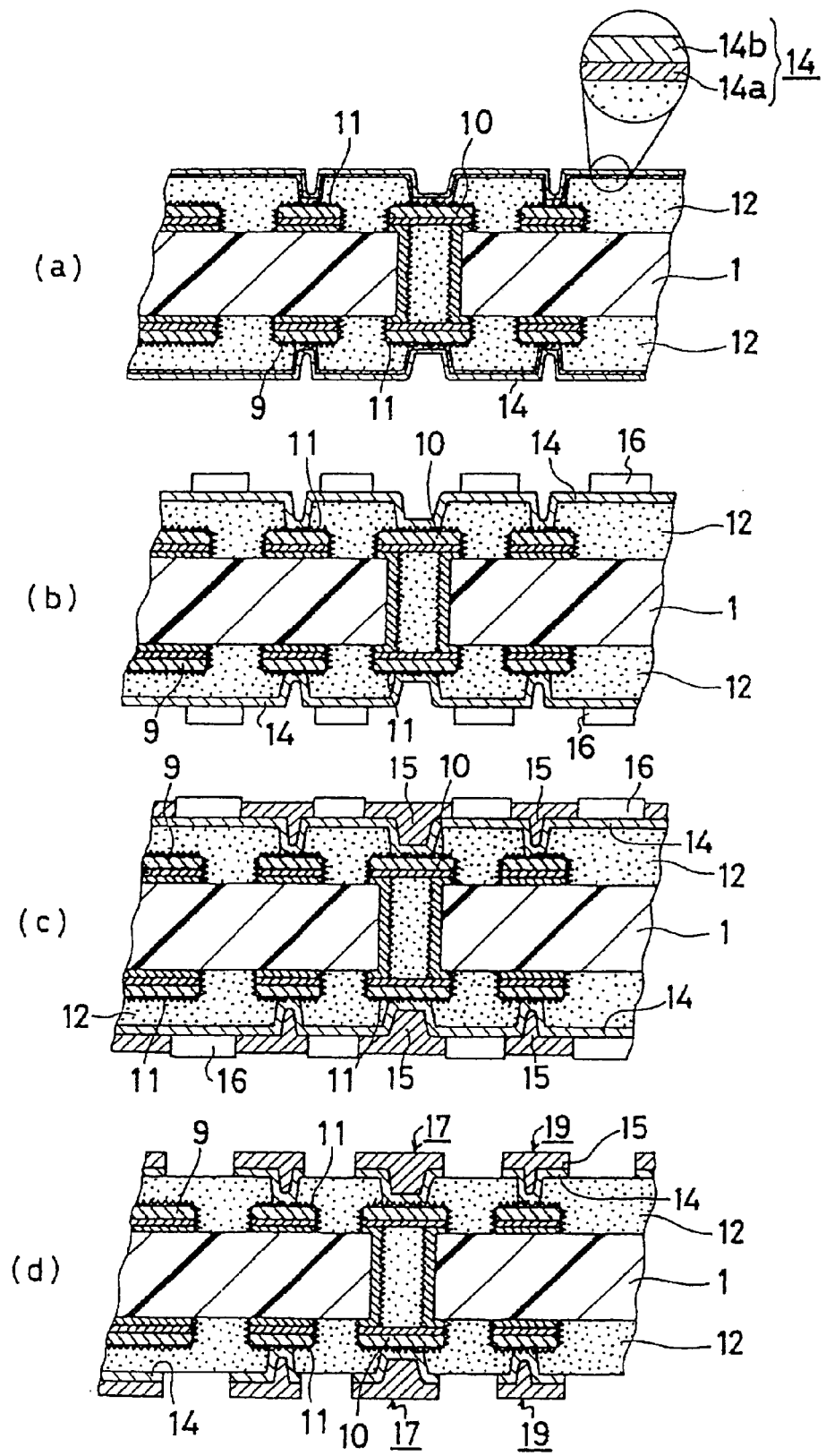
FIG. 31 (a) through (d) are cross-section views illustrating the flow of production of a multilayer printed circuit board in accordance with the seventh group of the present invention.

(13) Then, on this first conductor layer 14a, a second conductor layer 14b composed of Cu was formed by sputtering [FIG. 31(a)]. Except that the power (DC) and time settings were 4500 W and 2 minutes, the conditions of this sputtering were identical with those used in the formation of the first conductor layer 14a. The thickness of the Cu layer thus formed was 0.15 μm.

In FIG. 31(b) et seq., the first conductor layer 14a and the second conductor layer 14b are combinedly indicated by the numeral 14.

(14) To both sides of the substrate board which had undergone the above treatment, a commercial photosensitive dry film (Nitigo-Morton, NIT-215) was laminated, and with a photomask film set in position, exposure at 40 mJ/cm$^2$ and development with 0.8% sodium carbonate were carried out to form a 15 μm-thick plating resist 16 pattern [FIG. 31(b)].

(15) Then, electroplating was performed under substantially the same conditions as in step (1) to form a 10 μm-thick electroplated film 15. Formation of this electroplated film consummated the thickening of the part to become a conductor circuit 9 and the filling of the via holes 17 [FIG. 31(c)].

(16) The plating resist 16 was then removed with 5% KOH and the first conductor layer (Ni layer) 14a and second conductor layer (Cu layer) 14b under the plating resist 16 were dissolved and removed by etching with an aqueous sulfuric acid-hydrogen peroxide solution to provide a 10 μm-thick conductor circuit 19 (inclusive of via holes 17) comprising said first conductor layer (Ni layer) 14a, second conductor layer (Cu layer) 14b and electroplated copper layer 15 [FIG. 31(d)].

Figure 32:
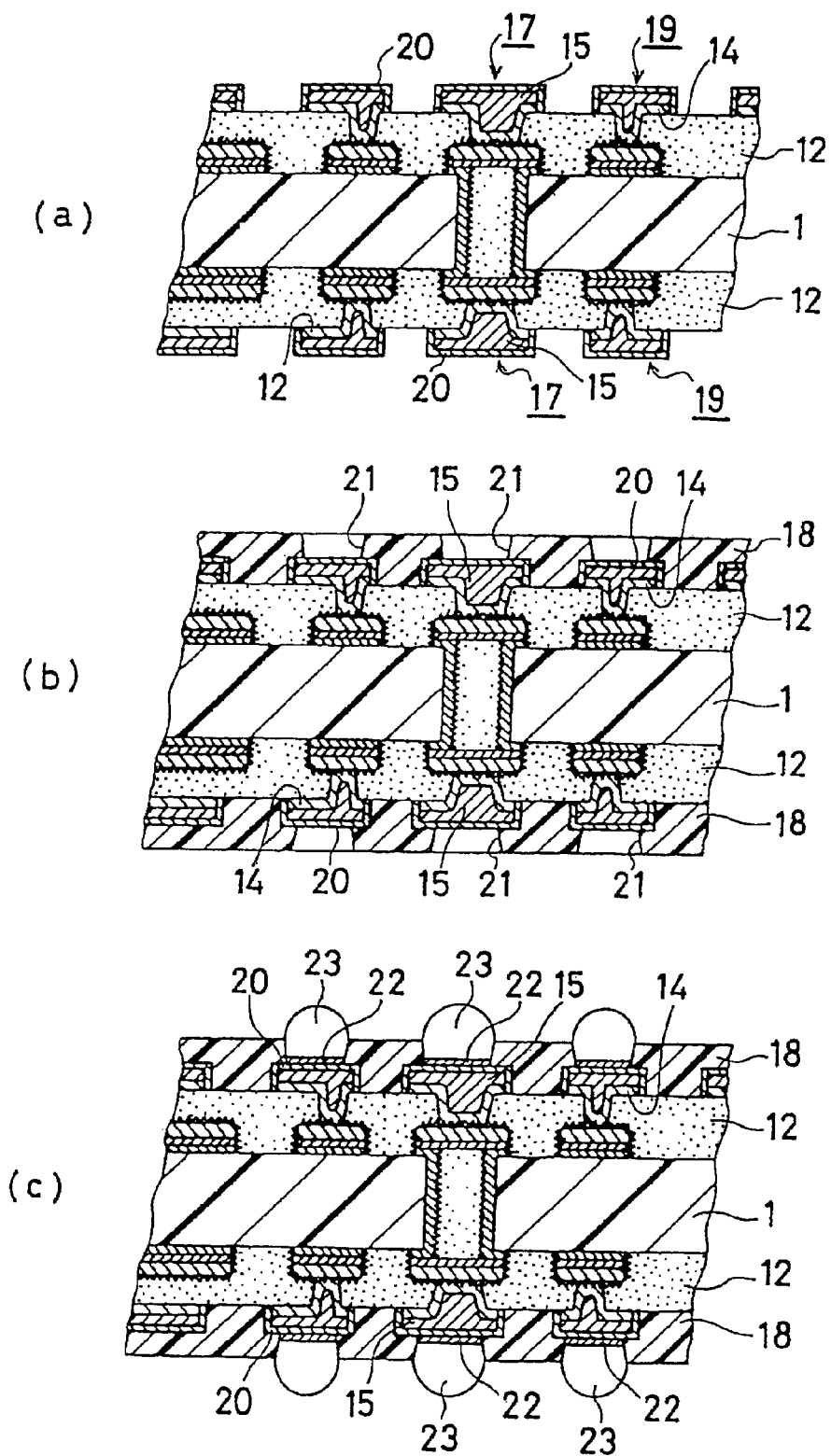
FIG. 32 (a) through (c) are cross-section views illustrating the flow of production of a multilayer printed circuit board in accordance with the seventh group of the present invention.

(17) Thereafter, a plated Ni layer 20 was formed on the conductor circuit 19 (inclusive of via holes 17) [FIG. 32(a)] and the sequence of steps (9) to (16) was repeated to build up layers. In FIG. 32(b) et seq, the further sequence is not represented but a solder resist layer is shown as built on one layer comprising an interlayer resin insulating layer 12 and an upper-layer conductor circuit 19 [FIG. 32(b) to (c)]. The procedure for formation of the solder resist layer is as follows.

(18) In the first place, a solder resist composition was prepared as in Example 12 (14). Then, both sides of the multilayer circuit board was coated with the above solder resist composition in a thickness of 20 µm, and after the coat was dried, a photomask printed with a pattern corresponding to the solder resist openings was set in close contact with the solder resist layer. Then, UV exposure at 1000 mJ/cm and development with the DMTG developer were carried out to form the openings. The substrate board was then heat-treated under the conditions of 80° C. for 1 hr, 100° C. for 1 hr, 120° C. for 1 hr and 150° C. for 3 hrs sequentially to cure the solder resist layer, whereby a 20 µm-thick solder resist pattern layer 18 having openings 21 was obtained [FIG. 32(b)].

(19) The substrate board formed with said solder resist pattern layer 18 was then immersed in an electroless nickel plating solution (pH=5) containing nickel chloride (30 g/L), sodium hypophosphite (10 g/L) and sodium citrate (10 g/L) for 20 minutes to form a 5 µm-thick plated nickel layer in the valleys of the openings 21.

The substrate board was further immersed in an electroless plating solution containing potassium gold cyanide (2 g/L), ammonium chloride (75 g/L), sodium citrate (50 g/L) and sodium hypophosphite (10 g/L) at 93° C. for 23 seconds to form a 0.03 µm-thick plated gold layer 22 on the plated nickel layer. In FIG. 32(c), the plated nickel layer and the plated gold layer are indicated together by the numeral 22.

(20) Then, a solder paste was filled into the openings 21 of the solder resist pattern layer 18 by printing and caused to reflow at 200° C. to form solder vamps (solder masses) 23. In this manner, a multilayer printed circuit board comprising solder vamps 23 was obtained [FIG. 32(c)].

The inspection made for unetched residues after the above manufacture of the multilayer printed board revealed no residues.

Examples 33 to 43

Except that the first conductor layer 14a and second conductor layer 14b were respectively formed using the metals indicated below in Table 5, the procedure of Example 1 was otherwise repeated to manufacture multilayer printed circuit boards.

The multilayer printed circuit boards were inspected for unetched spots. The results are shown in Table 5.

TABLE 5

|  | Metal for first conductor layer | Metal for second conductor layer | Unetched spots |
|---|---|---|---|
| Example 33 | Ni | Sn | Negative |
| Example 34 | Ni | Pb | Negative |
| Example 35 | Al | Cu | Negative |
| Example 36 | Al | Pb | Negative |
| Example 37 | Al | Sn | Negative |
| Example 38 | Al | Fe | Negative |
| Example 39 | Ti | Cu | Negative |
| Example 40 | Ta | Sn | Negative |
| Example 41 | Co | Cu | Negative |
| Example 42 | Nb | Sn | Negative |
| Example 43 | Cr | Cu | Negative |
| Compar. Ex. 6 | Ni | — | Positive |

It will be seen from Table 5 that any of the multilayer printed circuit boards manufactured had no unetched spots.

Comparative Example 6

The sequence of steps (1) to (12) described in Example 32 was repeated to provide the first conductor layer 14a formed with Ni layer. Then, without formation of the second conductor layer 14b, the formation of an etching resist using a photosensitive dry film (14) and electroplating (15) were carried out according to the manufacturing sequence described in Example 1.

The etching resist was then stripped off and an attempt was made to carry out etching of the first conductor layer (Ni layer) using the same acid etching solution as used in Example 32 but the attempt failed to consummate by etching.

Example 44

A. Preparation of an Adhesive for Electroless Plating

The adhesive for electroless plating use was prepared as in Example 14.

B. Manufacture of a Multilayer Printed Circuit Board (1) A copper-clad laminate comprising a 1 mm-thick glass-epoxy or BT (bis(maleimide)triazine) resin substrate 101 and a 18 µm-thick copper foil 108 laminated to both sides of said substrate board 101 was used as the starting material [FIG. 33(a)]. This copper laminate was first drilled and a plating resist was then disposed. The substrate board was subjected to electroless copper plating to form plated-through holes 109 and the copper foils were pattern-etched in the routine manner to form inner copper patterns (inner conductor circuits) 104 on the both sides of the substrate board.

Figure 33:
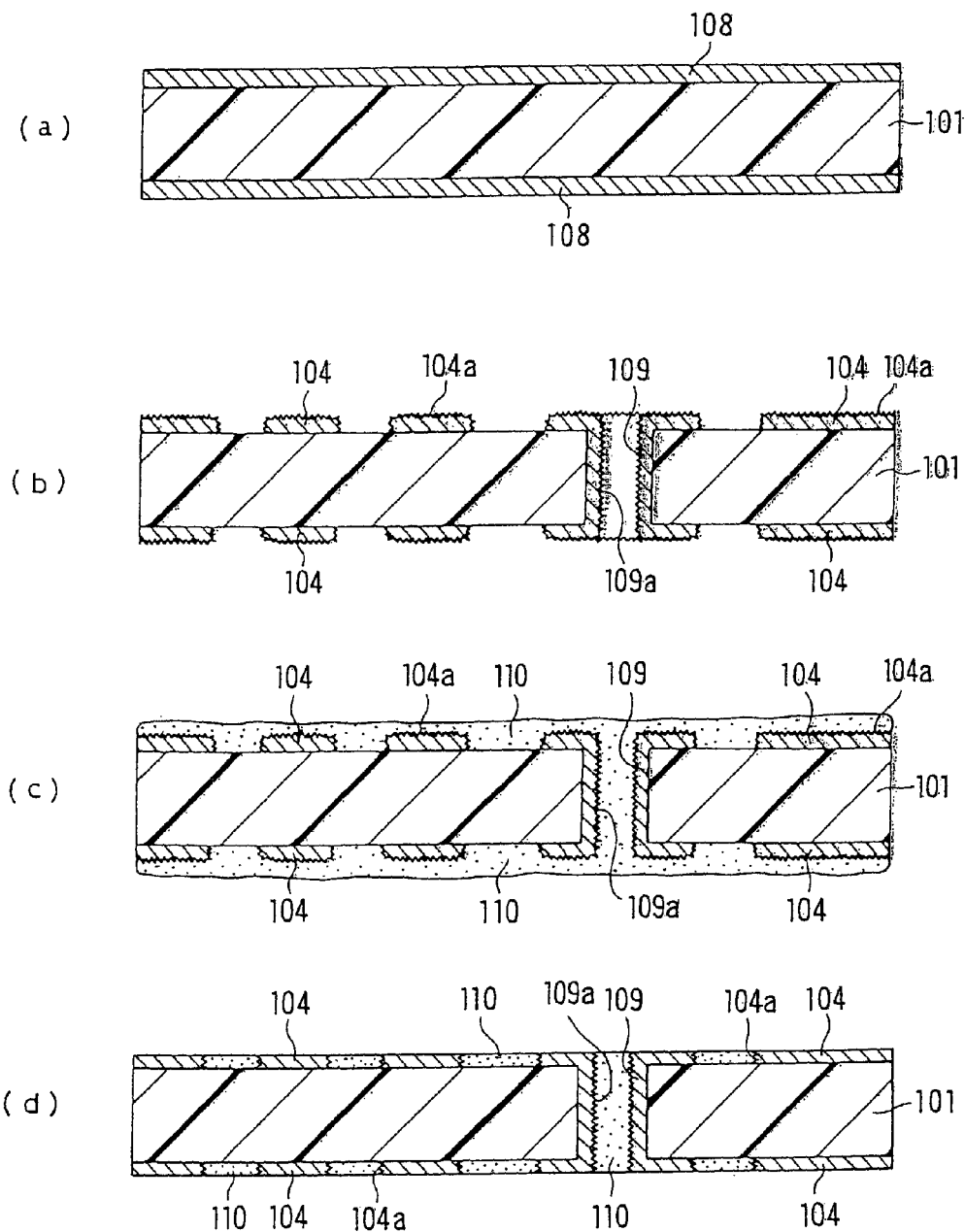
FIG. 33 (a) through (d) are cross-section views illustrating the flow of production of a multilayer printed circuit board in accordance with the eighth group of the present invention.

The substrate board formed with said inner conductor circuits 104 was rinsed with water, dried and subjected to an oxidation treatment using an aqueous solution containing NaOH (10 g/L), NaClO$_2$ (40 g/L) and Na$_3$PO$_4$ (6 g/L) as the oxidation bath (blackening bath) to provide roughened surfaces 104a and 109a on the entire surfaces of the inner conductor circuits 104 inclusive of plated-through holes 109 [FIG. 33(b)].

(2) A resin filler 110 composed predominantly of epoxy resin was coated on both sides of the substrate board by means of a printer to fill up the pattern gaps of inner conductor circuit 104 and the plated-through holes 109 and oven-dried. By this step, the pattern gaps of the inner conductor circuit 104 and the plated-through holes 109 were filled with the resin filler 110 [FIG. 33(c)].

(3) One side of the substrate board which had undergone the above treatment in step (2) was abraded by belt sanding using a belt sanding paper (Sankyo Rikagaku) to remove the resin filler 110 from the surface of the inner conductor circuit 104 and land surfaces of plated-through holes 109, followed by abrasion to remove the injuries caused by belt sanding. This series of abrasive treatments was carried out on the other side of the substrate board as well. The resin filler 110 was then thermally cured [FIG. 33(d)].

The surface layer of the resin filler 110 filled into the plated-through holes 109 and the roughened surface layer 104a of the inner conductor circuit 104 were thus removed to smoothen the both surfaces of the substrate board. The resulting circuit board featured a good adhesion of the resin filler 110 not only to the lateral sides of the inner conductor circuit 104 through its roughened layer 104a but also to the internal walls of the plated-through holes 109 via said roughened layer 109a.

Figure 34:
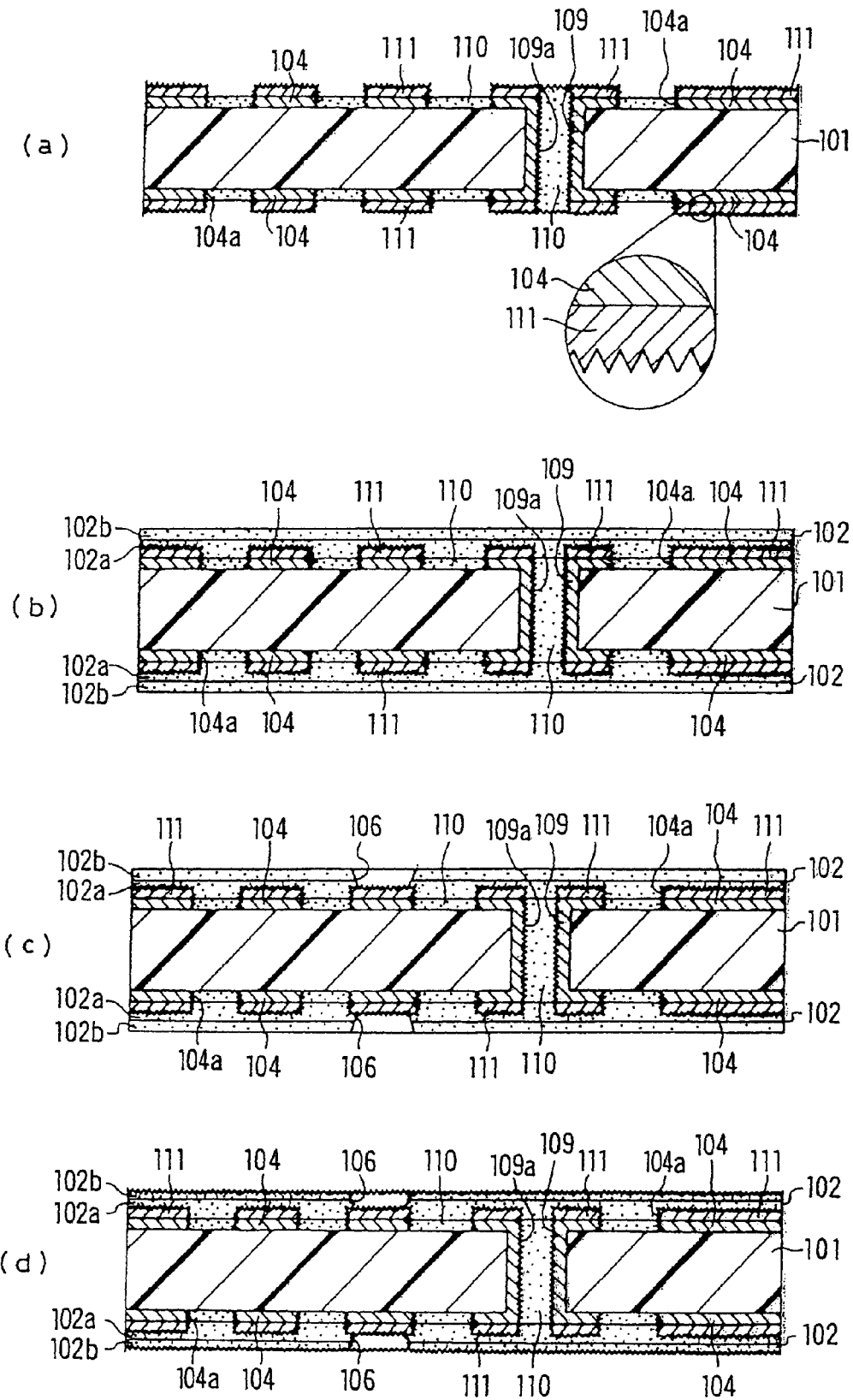
FIG. 34 (a) through (d) are cross-section views illustrating the flow of production of a multilayer printed circuit board in accordance with the eighth group of the present invention.

(4) Then, on the exposed inner conductor circuit 104 and lands of the plated-through holes 109, a 2 µm-thick roughened layer 111 composed of porous Cu—Ni—P alloy was formed, and further on the surface of the roughened layer 111, a 0.3 µm Sn layer was formed [FIG. 34(a)]. However, the Sn layer is not shown.

The procedure used for the formation of said roughened layer 111 was as follows. Thus, the substrate board was alkali-degreased and soft-etched. Then, it was treated with a catalyst solution comprising palladium chloride and an organic acid to deposit the Pd catalyst, which was then activated.

Then, electroless plating was carried out using an electroless plating bath (pH=9) comprising an aqueous solution containing copper sulfate ($3.2 \times 10^{-2}$ mol/L), nickel sulfate ($2.4 \times 10^{-3}$ mol/L), citric acid ($5.2 \times 10^{-2}$ mol/L), sodium hypophosphite ($2.7 \times 10^{-1}$ mol/L), boric acid ($5.0 \times 10^{-1}$ mol/L) and surfactant (Nisshin Chemical Industries, Surfynol 465) (1.0 g/L) to form a roughened layer 111 composed of Cu—Ni—P alloy on the entire surface of the conductor circuit.

Then, the substrate board was further immersed in an electroless Sn substitution plating bath (pH=1.2) containing tin borofluoride (0.1 mol/L) and thiourea (1.0 mol/L) at a temperature of 50° C. to form a 0.3 μm-thick Sn layer on said roughened surface.

(5) Using a roll coater, both sides of the substrate board was coated with an adhesive for electroless plating of the formulation shown above in A in two successive coats and the substrate board was allowed to sit in horizontal position for 20 minutes and, then, dried at 60° C. for 30 minutes [FIG. 34(b)].

(6) On both sides of the substrate board formed with the layer of an adhesive for electroless plating use in the above step (5), a photomask film printed with black dots, 85 μm in diameter each, was set in intimate contact with the surface and light exposure at 500 mJ/cm² was carried out using an ultrahigh-pressure mercury vapor lamp. The development was made by spraying the diethylene glycol dimethyl ether (DMDG) solution to form openings 106 for via holes, 85 μm in diameter each, in the adhesive layer. This board was further exposed to light at 3000 mJ/cm² using an ultrahigh-pressure mercury vapor lamp and heated at 100° C. for 1 hour and further at 150° C. for 5 hours, whereby a 18 μm-thick interlayer resin insulating layer 102 (102a, 102b) having openings (openings for via holes 106) with an excellent accuracy of dimention for the photomask used was obtained [FIG. 34(c)].

(7) The substrate board formed with openings 106 for via holes was immersed in an aqueous solution of chromic acid (700 g/L) at 73° C. for 20 minutes to dissolve out the epoxy resin particles from the surface of the interlayer resin insulating layer 102, thereby producing a roughened surface. Then, the substrate board was immersed in a neutralizing solution (Shipley) and rinsed with water [FIG. 34(d)].

The roughened surface of the substrate board was then treated with a palladium catalyst (Atotech) to deposit the catalyst nuclei on the surface of the interlayer resin insulating layer 102 and the inner walls of openings 106 for via holes.

Figure 35:
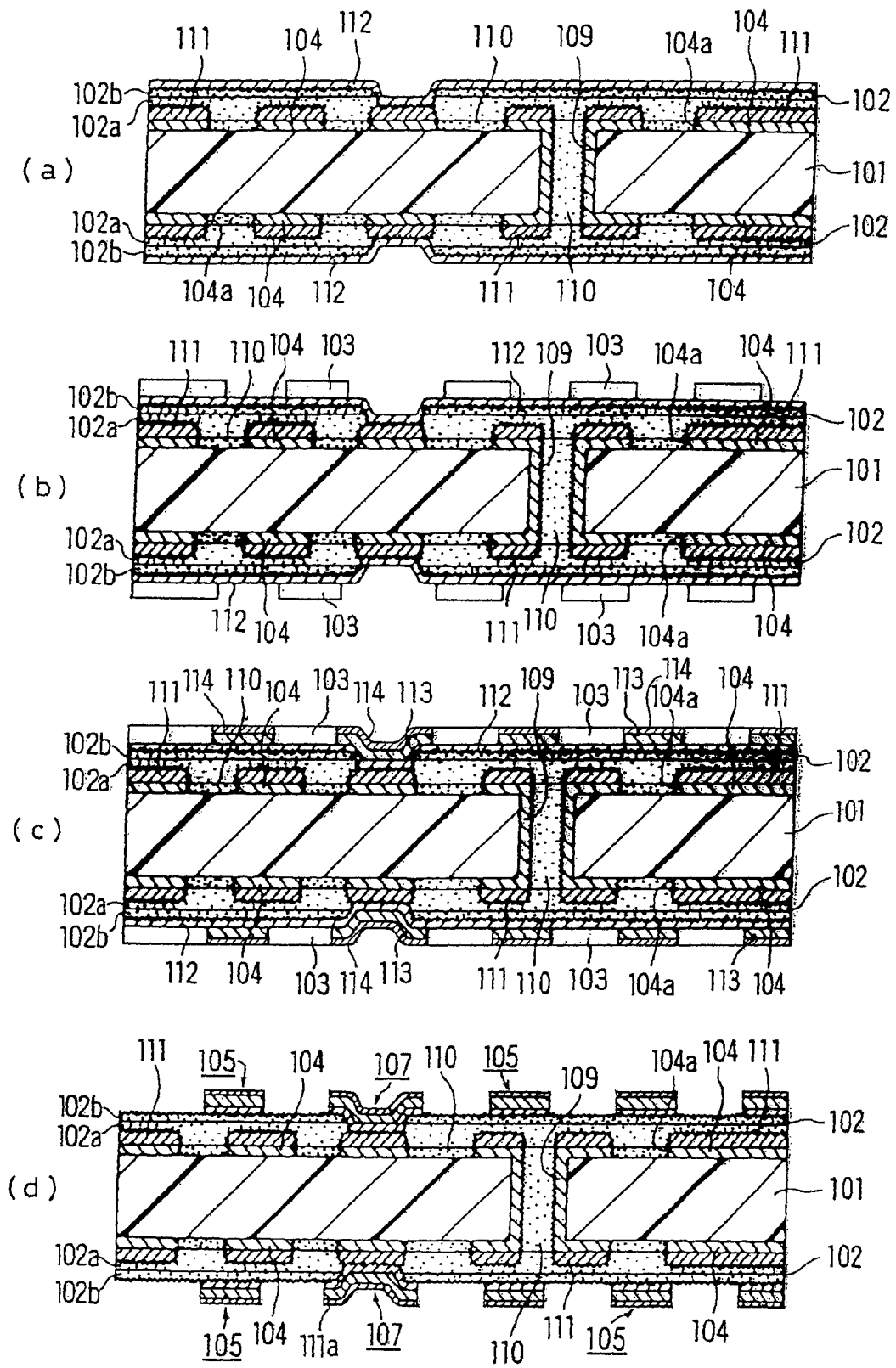
FIG. 35 (a) through (d) are cross-section views illustrating the flow of production of a multilayer printed circuit board in accordance with the eighth group of the present invention.
Figure 36:
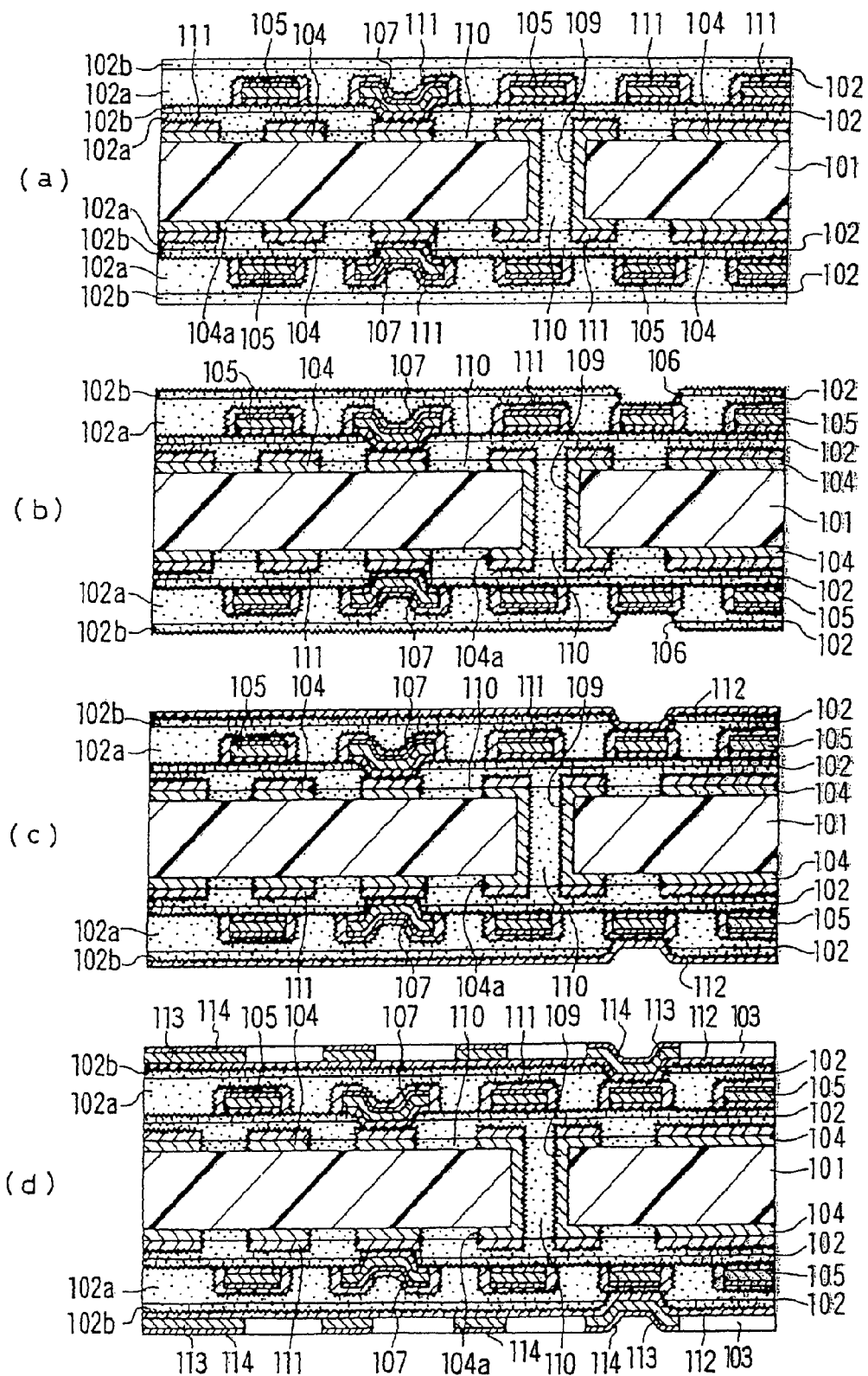
FIG. 36 (a) through (d) are cross-section views illustrating the flow of production of a multilayer printed circuit board in accordance with the eighth group of the present invention.
Figure 37:
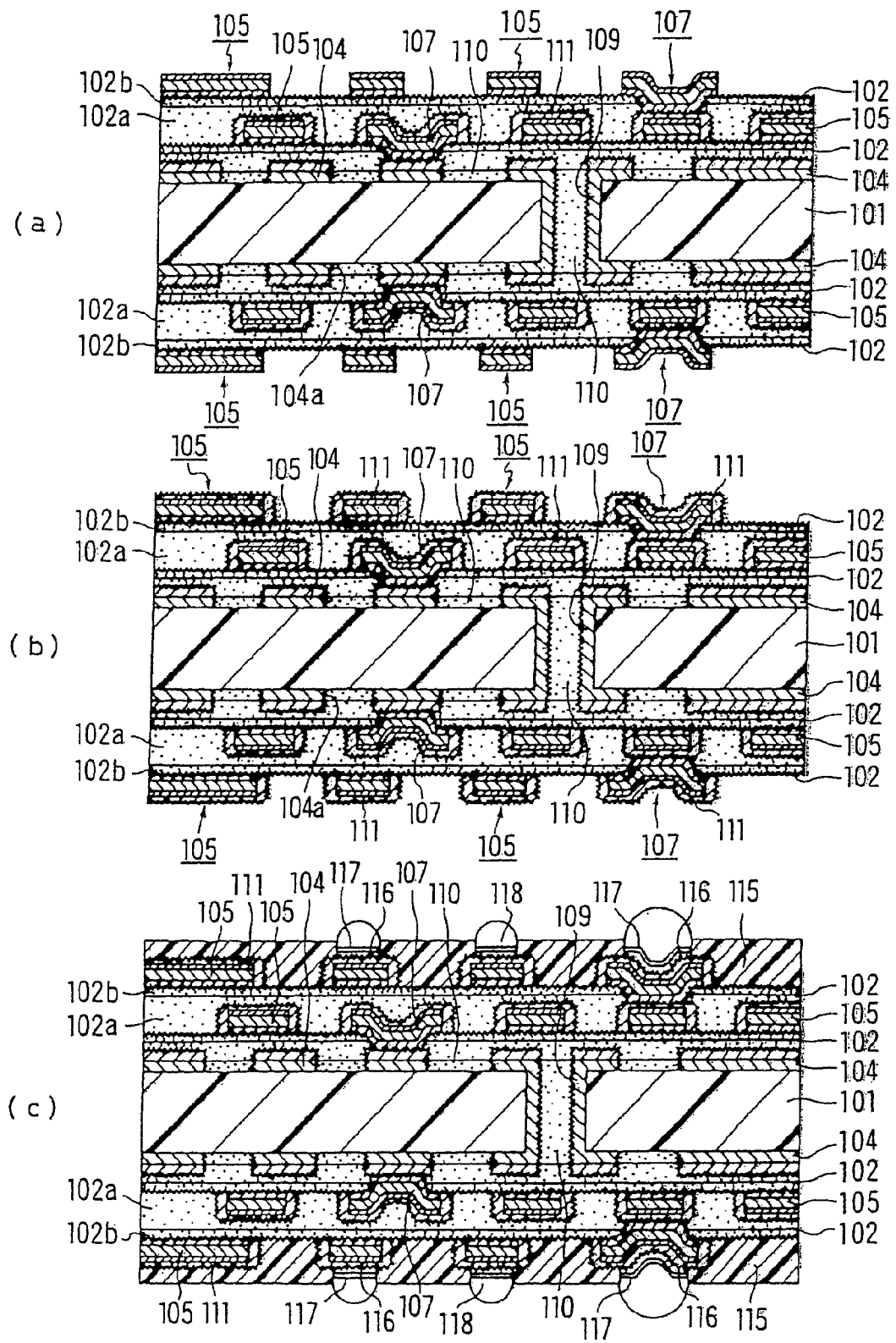
FIG. 37 (a) through (c) are cross-section views illustrating the flow of production of a multilayer printed circuit board in accordance with the eighth group of the present invention.

(8) The substrate board was then immersed in an aqueous electroless copper plating solution of the following composition to form a 0.8 μm-thick electroless plated copper film 112 on the entire roughened surface [FIG. 35(a)].

| [Aqueous electroless plating solution] | |
|---|---|
| EDTA | 60 g/L |
| Copper sulfate | 10 g/L |
| HCHO | 6 ml/L |
| NaOH | 10 g/L |
| α,α'-Bipyridyl | 80 mg/L |
| Polyethylene grycol (PEG) | 0.1 g/L |
| [Electroless plating conditions] | |
| Bath temperature: | 60° C., for 20 min. |

(9) A commercial photosensitive dry film was laminated to the electroless plated copper film 112 and with a photomask set in position, exposure at 100 mJ/cm² and development with 0.8% sodium carbonate/H₂O were carried out to dispose a plating resist 103 [FIG. 35(b)].

(10) Then, copper electroplating was performed under the following conditions to form a 13 μm-thick electroplated copper film 113.

| [Aqueous electroplating solution] | |
|---|---|
| Sulfuric acid | 180 g/L |
| Copper sulfate | 80 g/L |
| Additive (Atotech Japan, product designation: Kaparacid GL) | 1 ml/L |
| [Electroplating conditions] | |
| Current density | 1 A/dm² |
| Time | 30 min. |
| Temperature | Room temperature |

(11) The substrate board was further immersed in an electroless nickel plating bath comprising an aqueous solution (90° C.) containing nickel chloride (30 g/L), sodium hypophosphite (10 g/L) and sodium citrate (10 g/L) to form a 1.2 μm-thick nickel film 114 on the electroplated copper film 113 [FIG. 35(c)].

(12) The plating resist 103 was removed with 5% KOH/H₂O and the electroless plated film 112 under the plating resist 103 was dissolved and removed by etching with sulfuric acid-hydrogen peroxide to provide a 11 μm-thick upper-layer conductor circuit 105 (inclusive of via holes 107) composed of said electroless plated copper film 112, electroplated copper film 113 and nickel film 114 with L/S=28/28 [FIG. 35(d)].

(13) The substrate board which had undergone the treatment in the above step (12) was immersed in a hydrochloric acid solution of 6.0 mol/L concentration at 25° C. for 3 min. to remove the oxide film formed on the surface. Then, the substrate board was treated as in the above step (4) to form a 2 μm-thick roughened layer 111 composed of Cu—Ni—P alloy on the surface of the upper-layer conductor circuit 105.

(14) Then, the above sequence of steps (5) to (13) was repeated to build up a still higher upper-layer conductor circuit 105, via holes 107 and a roughened layer 111. Thereafter, a solder resist layer 115 having openings, a plated nickel layer 116 and a plated gold layer 117 were successively formed, followed by formation of solder vamps 118 to complete a multilayer printed circuit board comprising solder vamps 118 [FIG. 36(a) to FIG. 37(c)].

In the above step, too, the formation of the plated nickel layer 116 was followed by 3-minute immersion in a solution containing 6.0 mol/L of hydrochloric acid at 25° C. to remove the oxide film formed on the surface.

Example 45

The procedure of Example 44 was repeated except that in the step (11), a 0.6 μm-thick nickel electroplated film was formed on the electroplated copper film using a nickel electroplating solution containing nickel sulfate (240 g/L), nickel chloride (45 g/L) and boric acid (30 g/L) and that in the step (13), the substrate board which had undergone the treatment in step (12) was immersed in a solution containing 4.0 mol/L of hydrochloric acid at 40° C. for 5 minutes to remove the oxide film formed on the surface. Thus, a multilayer printed circuit board was manufactured in otherwise the same manner as in Example 44.

Example 46

A multilayer printed circuit board was manufactured by the same procedure as described in Example 44 except that in said step (13) the substrate board which had gone through said step (12) was immersed in a solution containing 10.0 mol/L of hydrochloric acid at 20° C. for 1 minute to remove the oxide film formed on the surface.

Comparative Example 7

A multilayer printed circuit board was manufactured by the same procedure as described in Example 44 except that the step (13) of Example 44 was omitted.

Comparative Example 8

A multilayer printed circuit board was manufactured by the same procedure as described in Example 44 except that in said step (13) the substrate board which had gone through said step (12) was immersed in an aqueous solution containing 4 mol/L of sulfuric acid at 25° C. for 5 minutes.

Comparative Example 9

A multilayer printed circuit board was manufactured by the same procedure as described in Example 44 except that in said step (13) the substrate board which had gone through said step (12) was immersed in an aqueous solution containing 6 mol/L of phosphoric acid at 25° C. for 5 minutes.

Comparative Example 10

A multilayer printed circuit board was manufactured by the same procedure as described in Example 44 except that in said step (13) the substrate board which had gone through said step (12) was immersed in an aqueous solution containing 3 mol/L of nitric acid at 25° C. for 5 minutes.

Using the multilayer printed circuit boards manufactured in Examples 44 to 46 and Comparative Examples 7 to 10 as test specimens, an adhesive tape was stuck to the roughened layer of Cu—Ni—P alloy and then peeled off to see whether the roughened layer would peel or not.

In addition, each printed circuit board was subjected to 1000 heat cycles at the temperature of −55 to 125° C. and examined under the light microscope to check for delamination of the roughened layer of Cu—Ni—P alloy. The results are shown below in Table 6.

TABLE 6

|  | Peel | Delamination |
| --- | --- | --- |
| Example 44 | Negative | Negative |
| Example 45 | Negative | Negative |
| Example 46 | Negative | Negative |
| Comparative Example 7 | Positive | Positive |
| Comparative Example 8 | Positive | Positive |
| Comparative Example 9 | Positive | Positive |
| Comparative Example 10 | Positive | Positive |

It will be apparent from Table 6 that the multilayer printed circuit boards according to the Examples have high peel strength, thus demonstrating that by removing the oxide film formed on the surface from the nickel film 14 constituting the conductor circuit 5 and lands 7 of plated-through holes with an aqueous solution containing 2.0 to 10.0 mol/L of a reducing acid, a good adhesion can be obtained between the conductor circuit etc. and the roughened layer 11 of Cu—Ni—P alloy formed thereon, thus preventing the stripping of the conductor circuit due to the presence of said oxide film formed on the nickel film.

On the other hand, the multilayer printed circuit boards according to Comparative Examples 7 to 10 are low in peel strength owing to the oxide film on the plated nickel film so that the roughened layer composed of Cu—Ni—P is liable to peel.

Example 47

Figure 38:
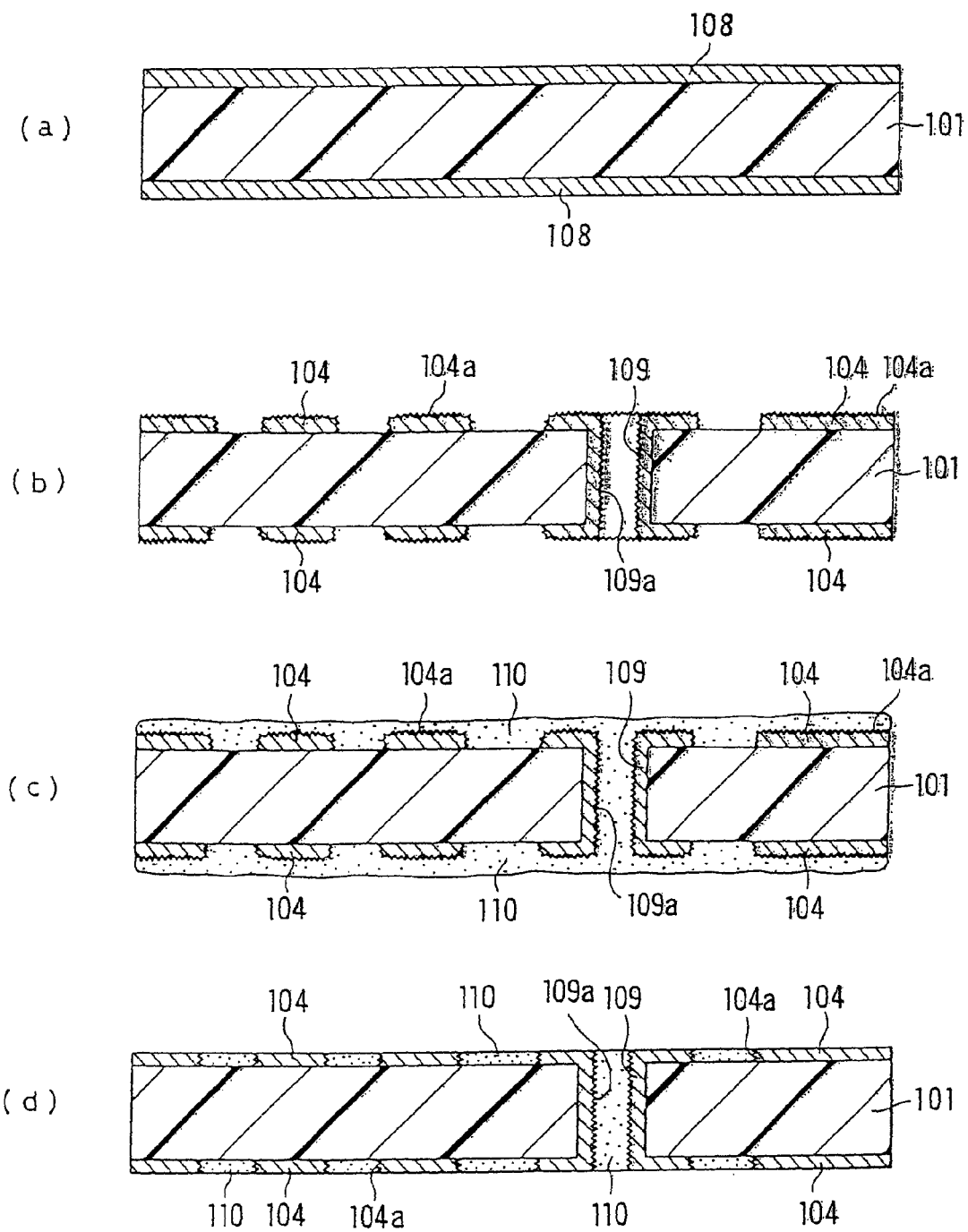
FIG. 38 (a) through (d) are cross-section views illustrating the flow of production of a multilayer printed circuit board in accordance with the ninth group of the present invention.

A. Preparation of an Adhesive for Electroless Plating Use
    The procedure of Example 14 was repeated.
B. Process for Manufacture of a Multilayer Printed Circuit Board
(1) A copper-clad laminate composed of a substrate 101 comprising a 1 mm-thick glass-epoxy or BT (bis(maleimide) triazine) resin and an 18 μm-thick copper foil 108 laminated to both sides of said substrate was used as the starting material [FIG. 38(a)]. First, this copper-clad laminate was drilled and, then, a plating resist was disposed. This substrate board was electroless copper plated to prepare plated-through holes 109 and the copper foil was pattern-etched in the routine manner to provide an inner copper pattern (lower-layer conductor circuit) 104 on both sides of the substrate board.

The substrate board formed with lower-layer conductor circuits 104 was rinsed with water and dried. Then, an oxidation treatment using an aqueous solution of NaOH (10 g/L), NaClO$_2$ (40 g/L) and Na$_3$PO$_4$ (6 g/L) as the oxidizing (blackening) bath was carried out to form roughened surface layers 104a, 109b on the entire surfaces of the lower-layer conductor layers 104 inclusive of the plated-through holes 109 [FIG. 38(b)].

(2) To both sides of the substrate board, a resin filler 110 composed predominantly of epoxy resin was applied with a printing press to fill up the gaps of the lower-layer conductor circuit patterns 104 and the free spaces in the plated-through holes 109 followed by oven-drying. By this procedure, the resin filler 110 was filled in the gaps of the lower-layer conductor circuit patterns 104 and the free spaces within the plated-through holes 109 [FIG. 38(c)].

(3) One side of the substrate board which had undergone the above treatment (2) was abraded with a belt sander using a belt sanding paper (Sankyo Rikagaku) to thoroughly remove the resin filler 110 from the surface of the lower-layer conductor circuit 104 and the land surfaces of the plated-through holes 109 and further buffed to remove any surface injuries originating from the sanding operation. The above series of operations was repeated for the other side of the substrate board. Then, the resin filler 110 was thermally cured [FIG. 38(d)].

In this manner, the superficial layer of the resin filler 110 in the plated-through holes 109 and the roughened surface layers 104a of the lower-layer conductor circuits 104 were removed to smoothen both sides of the substrate board to thereby give a circuit board featuring a firm adhesion between the resin filler 110 and the lateral walls of the lower-layer conductor circuits 104 via said roughened layers 104a as well as a firm adhesion between the resin filler 110 and the internal walls of the plated-through holes 109 via said roughened layers 109a.

(4) The substrate board which had gone through the above step (3) was immersed in an electroless nickel plating bath comprising an aqueous solution (90° C.) of nickel chloride (30 g/L), sodium hypophosphite (10 g/L) and sodium citrate (10 g/L) to form a 1.2 µm-thick nickel cover layer 111a on the upper surface of the lower-layer conductor circuit 4 and lands of plated-through holes 109.

Figure 39:
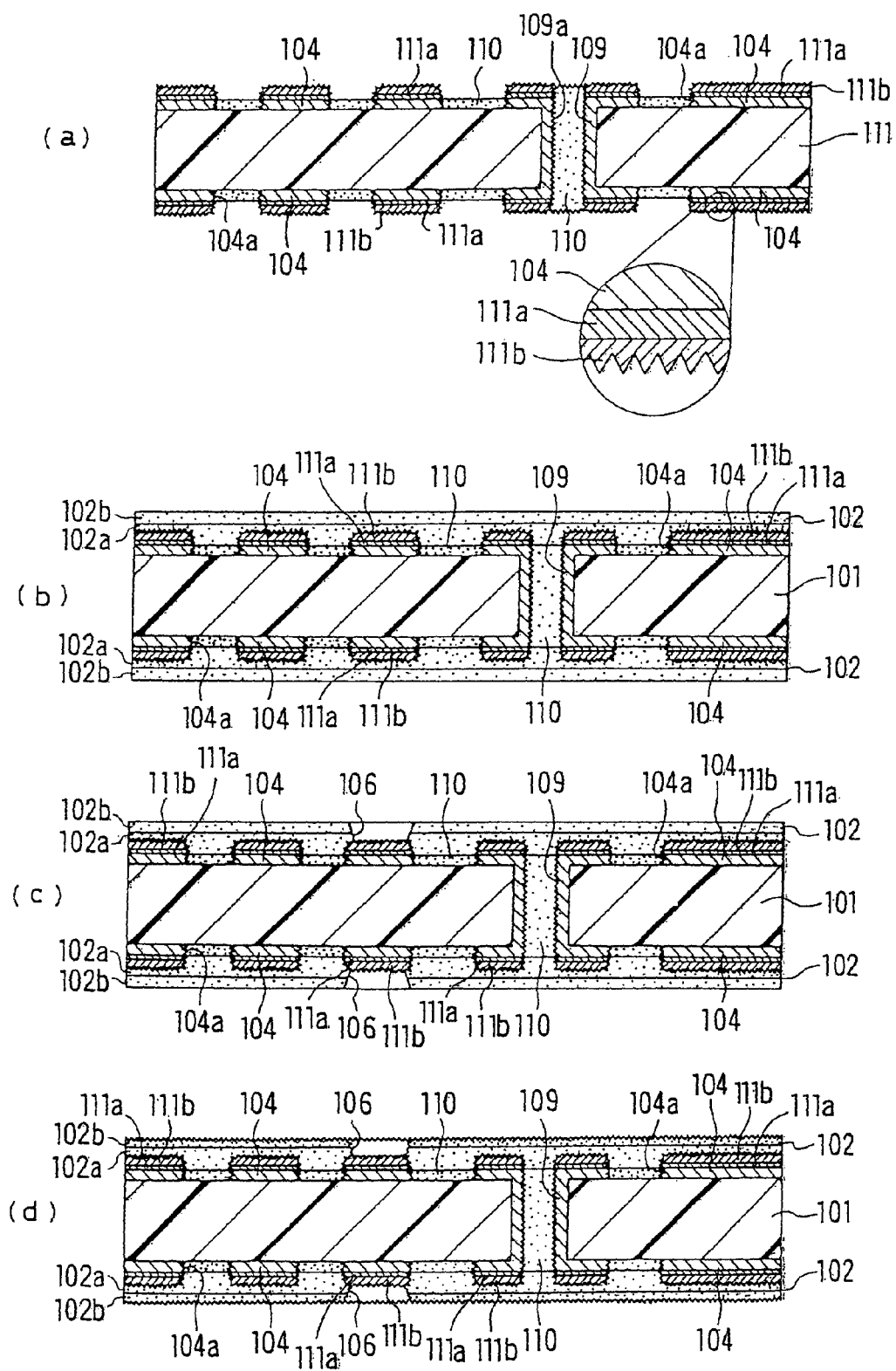
FIG. 39 (a) through (d) are cross-section views illustrating the flow of production of a multilayer printed circuit board in accordance with the ninth group of the present invention.

(5) Then, on the nickel layer thus constructed on the exposed conductor circuit 104 and lands of plated-through holes 109, a 2 µm-thick roughened layer 111b composed of acicular or porous Cu—Ni—P alloy was formed, and further on the surface of this roughened layer 111b, a 0.3 µm-thick Sn layer was constructed [FIG. 39(a)]. However, the Sn layer is not shown.

The procedure for the formation of said roughened layer 111b was as follows. Thus, the substrate board was alkali-degreased and soft-etched. Then, it was treated with a catalyst solution comprising palladium chloride and an organic acid to deposit Pd nuclei on the surface. After activation of the catalyst, the substrate board was immersed in an electroless copper plating bath (pH=9) comprising an aqueous solution of copper sulfate ($3.2 \times 10^{-2}$ mol/L), nickel sulfate ($2.4 \times 10^{-3}$ mol/L), citric acid ($5.2 \times 10^{-2}$ mol/L), sodium hypophosphite ($2.7 \times 10^{-1}$ mol/L), boric acid ($5.0 \times 10^{-1}$ mol/L) and surfactant (Nisshin Chemical Industries, Surfynol 465) (1.0 g/L). After immersing for 2 minutes, the substrate was lengthwise vibrated every 1 second to form a 5 µm-thick roughened layer 111b composed of acicular or porous Cu—Ni—P alloy on the nickel layer present on the surface of the copper circuit 104 and lands of plated-through holes 109. In addition, a Cu—Sn substitution reaction was carried out under the conditions of tin borofluoride: 0.1 mol/L, thiourea: 1.0 mol/L, temperature: 35° C. and pH=1.2 to form a 0.3 µm-thick Sn layer (not shown) on the surface of said roughened layer.

(6) Using a roll coater, both sides of the substrate board were coated twice with an adhesive for electroless plating of said formulation mentioned in A and the substrate board was allowed to sit in horizontal position for 20 minutes and then dried at 60° C. for 30 minutes [FIG. 39(b)].

(7) On both sides of the substrate board formed with the layer of an adhesive for electroless plating use in the above step (6), a photomask printed with black dots having a diameter of 85 µm each was placed in close contact with said layer and using an ultrahigh-pressure mercury vapor lamp, light exposure was carried out at 500 mJ/cm². The resultant compound was developed by spraying diethylene glycol dimethyl ether (DMDG) to form openings measuring 85 µm in diameter for via holes in the adhesive layer. Furthermore, using the ultrahigh-pressure mercury vapor lamp, light exposure at 3000 mJ/cm² was carried out and the substrate board was then heat-treated at 100° C. for 1 hour and further at 150° C. for 5 hours to construct an 18 µm-thick interlayer resin insulating layer 102 (102a, 102b) having openings (openings 106 for via holes) with an excellent accuracy of dimention for the photomask used [FIG. 39(c)].

(8) The substrate board formed with the openings 106 for via holes as above was immersed in an aqueous solution of chromic acid (7500 g/L) at 73° C. for 20 minutes to dissolve out the epoxy resin particles from the surface of the interlayer resin insulating layer 102 to roughen its surface. Thereafter, the substrate board was immersed in a neutralizing solution (Shipley) and, then, rinsed with water [FIG. 39(d)].

In addition, this roughened surface of the substrate board was treated with a palladium catalyst (Atotech) solution to deposit catalyst nuclei on the surface of the interlayer resin insulating layer 102 and internal walls of openings 106 for via holes.

Figure 40:
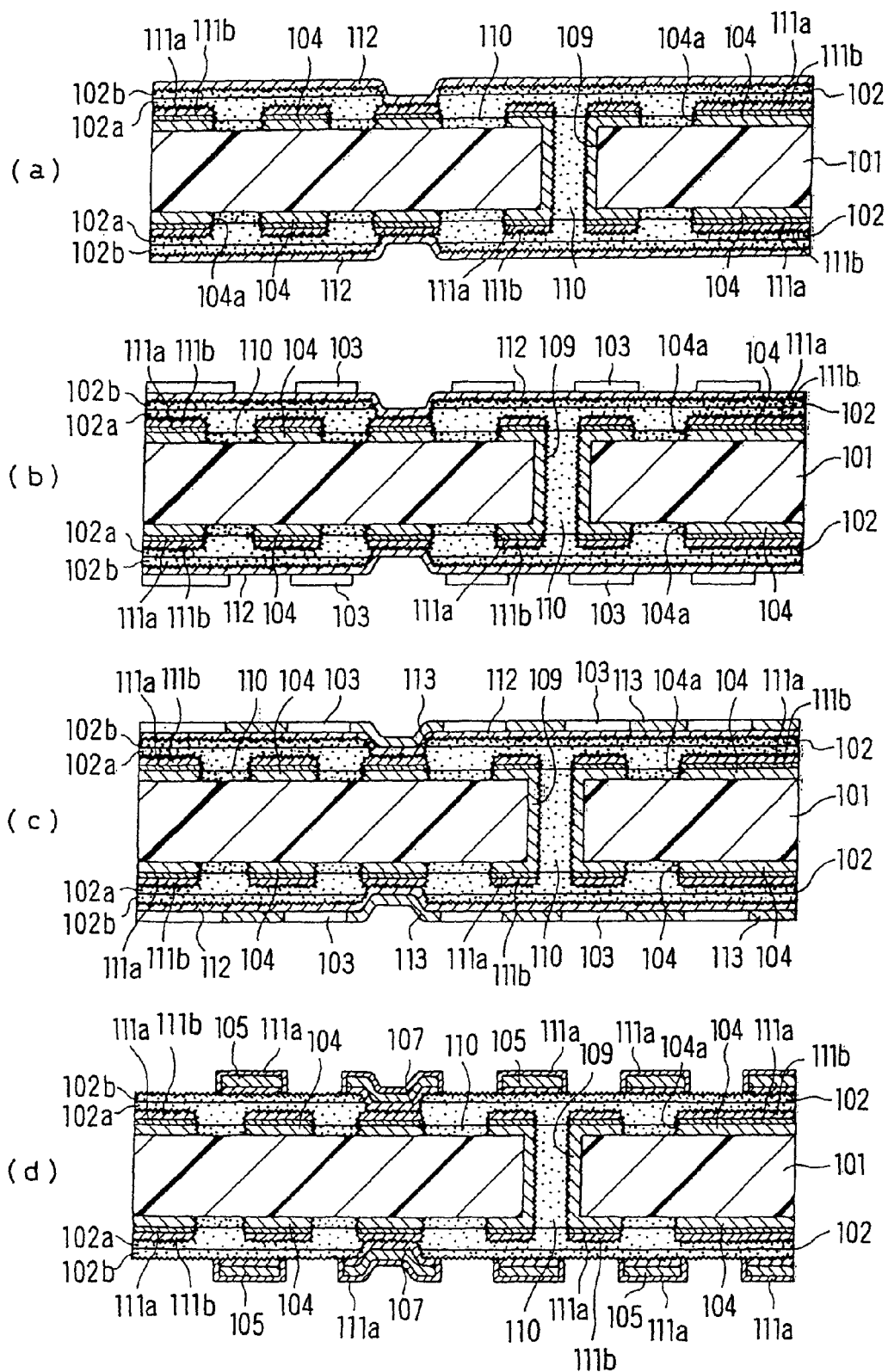
FIG. 40 (a) through (d) are cross-section views illustrating the flow of production of a multilayer printed circuit board in accordance with the ninth group of the present invention.

(9) The substrate board was then immersed in an aqueous electroless copper plating solution of the following composition to form a 0.8 µm-thick electroless plated copper film 112 on the entire roughened surface [FIG. 40(a)].

| [Aqueous electroless plating solution] | |
|---|---|
| EDTA | 50 g/L |
| Copper sulfate | 10 g/L |
| HCHO | 10 ml/L |
| NaOH | 6 g/L |
| α,α'-Bipyridyl | 80 mg/L |
| Polyethylene grycol (PEG) | 0.1 g/L |
| [Electroless plating conditions] | |
| Bath temperature: | 70° C., for 15 min. |

(10) A commercial photosensitive dry film was laminated to the electroless plated copper film 112 and with a photomask set in position, exposure at 100 mJ/cm² and development with 0.8% sodium carbonate/$H_2O$ were carried out to dispose a plating resist 103 [FIG. 40(b)].

(11) Then, copper electroplating was performed under the following conditions to form a 13 µm-thick electroplated copper film 113 [FIG. 40(c)].

| [Aqueous electroplating solution] | |
|---|---|
| Sulfuric acid | 180 g/L |
| Copper sulfate | 80 g/L |
| Additive (Atotech Japan, product designation: Kaparacid GL) | 1 ml/L |
| [Electroplating conditions] | |
| Current density | 1 A/dm² |
| Time | 30 min. |
| Temperature | Room temperature |

(12) The plating resist 3 was then removed with 5% KOH/$H_2O$ and the electroless plated film 112 under the plating resist 103 was dissolved and removed by etching with sulfuric acid-hydrogen peroxide to provide a 11 µm-thick upper-layer conductor circuit 105 (L/S=28/28) (inclusive of via holes 107) comprising electroless plated copper layer 112 and electroplated copper layer 113 [FIG. 43(a)].

In addition, the substrate board was immersed in an electroless nickel plating bath comprising an aqueous solution (90° C.) of nickel chloride (30 g/L), sodium hypophosphite (10 g/L) and sodium citrate (10 g/L) to form a 1.2 µm-thick nickel cover layer 111a on the entire surface of the conductor circuit and lands of plated-through holes [FIG. 40(d)].

Figure 41:
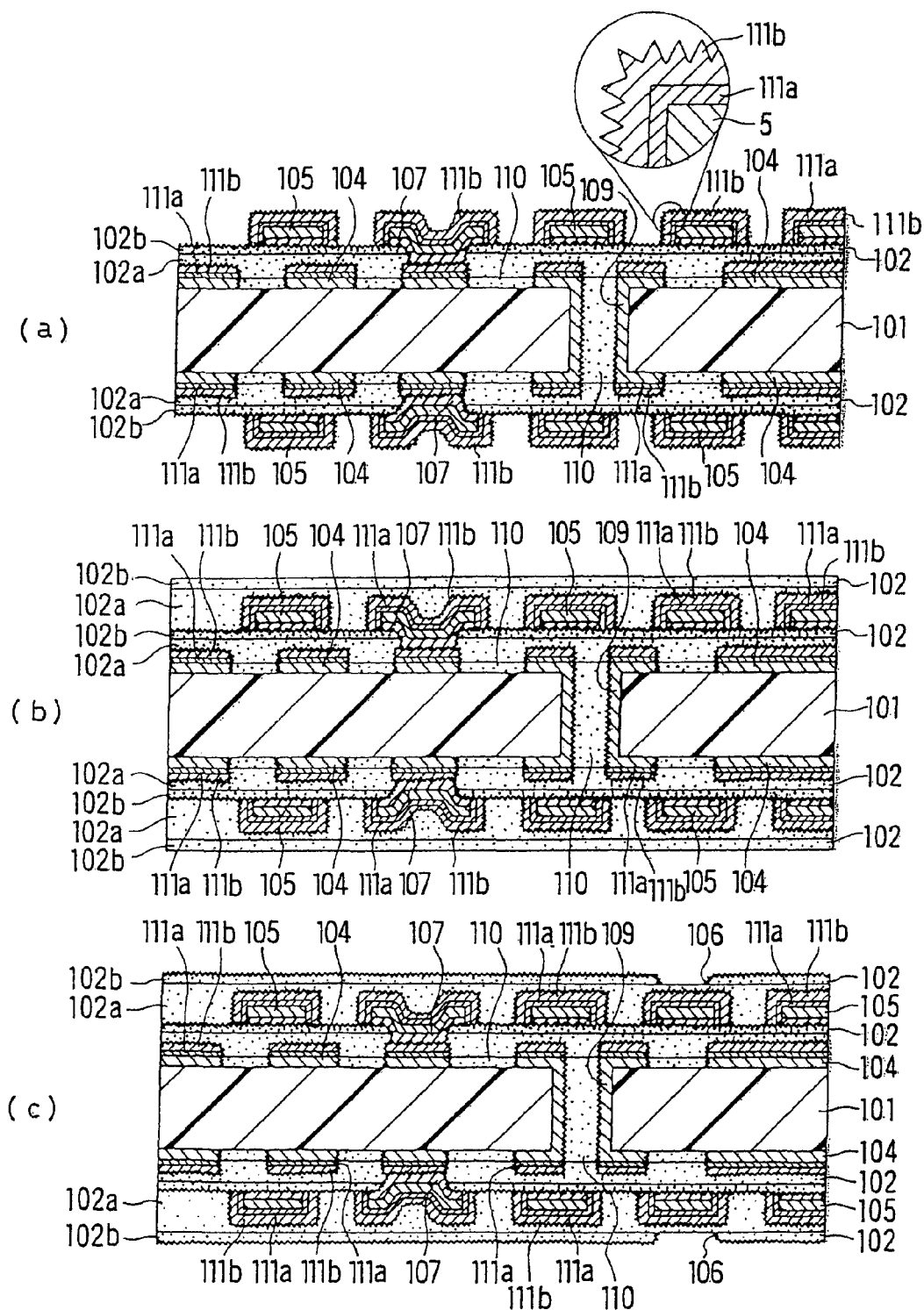
FIG. 41 (a) through (c) are cross-section views illustrating the flow of production of a multilayer printed circuit board in accordance with the ninth group of the present invention.

(13) The substrate board formed with said upper-layer conductor circuit 105 and nickel cover layer 111a was treated in the same manner as in said step (5) to form a 2 µm-thick roughened layer 111*b* composed of Cu—Ni—P alloy on the surface of the upper-layer conductor circuit 105 [FIG. 41(*a*)]. In addition, a Cu—Sn substitution reaction was conducted under the conditions of tin borofluoride: 0.1 mol/L, thiourea: 1.0 mol/L, temperature: 35° C. and pH=1.2 to form a 0.3 μm-thick Sn layer (not shown) on the surface of said roughened layer.

Figure 42:
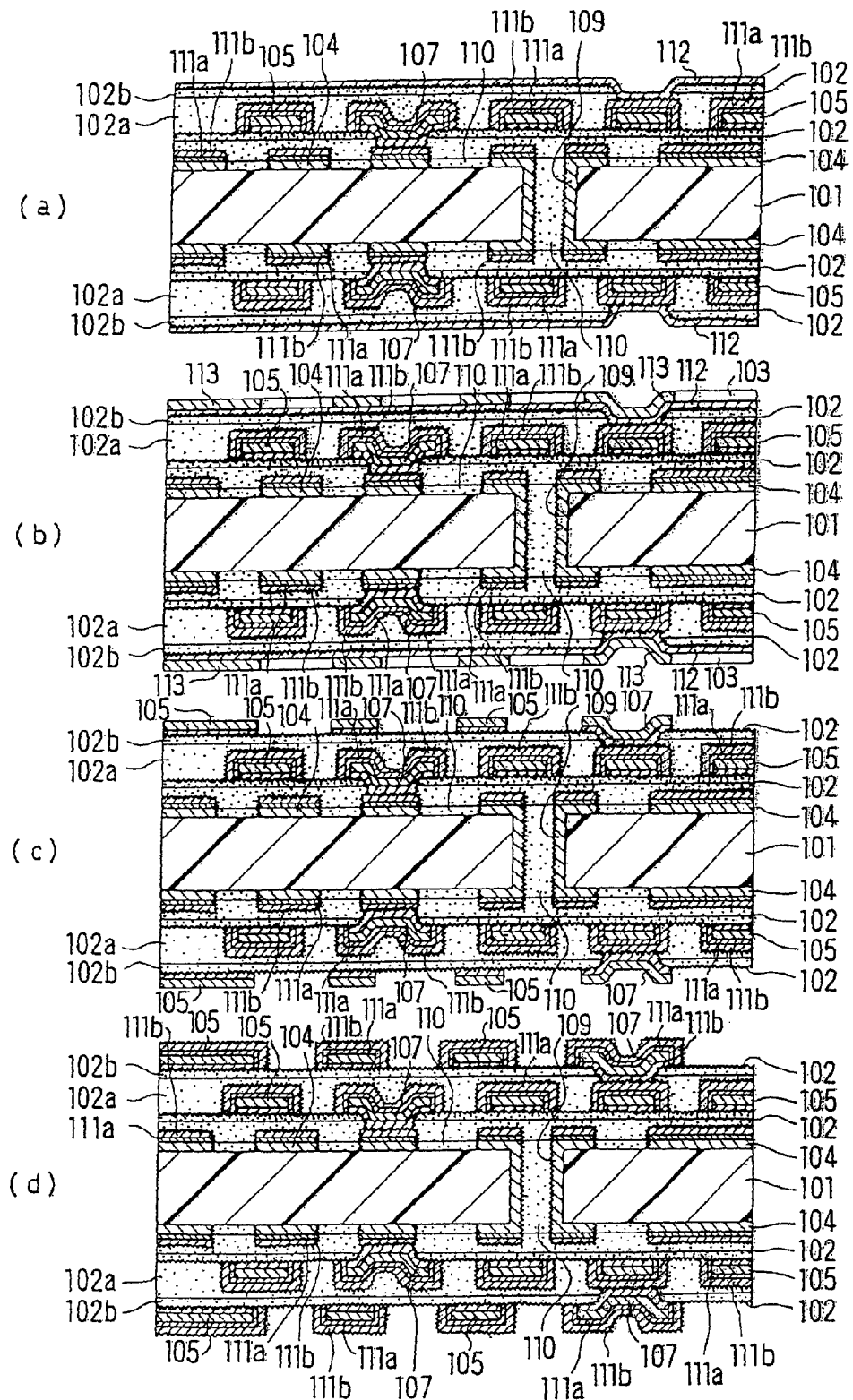
FIG. 42 (a) through (d) are cross-section views illustrating the flow of production of a multilayer printed circuit board in accordance with the ninth group of the present invention.

(14) The above sequence of steps (6) to (13) was repeated to further build up an upper-layer conductor circuit [FIG. 41(*b*) to FIG. 42(*d*)]. Finally, though not shown, a solder resist layer formed with openings, a plated gold film and solder vamps were successively formed to complete a multilayer printed circuit board comprising solder vamps.

Example 48

Except that said step (12) was modified as follows, the procedure of Example 47 was otherwise repeated to provide a multilayer printed circuit board.

(12) Following copper electroplating, the substrate board was immersed in a plating bath (pH=4.5) comprising an aqueous solution of nickel sulfate (240 g/L), nickel chloride (45 g/L) and boric acid (30 g/L) and using an Ni plate as anode, nickel electroplating was performed under the conditions of temperature: 55±5° C. and current density: 4 A/dm² to form a 0.8 μm-thick nickel cover layer.

Figure 43:
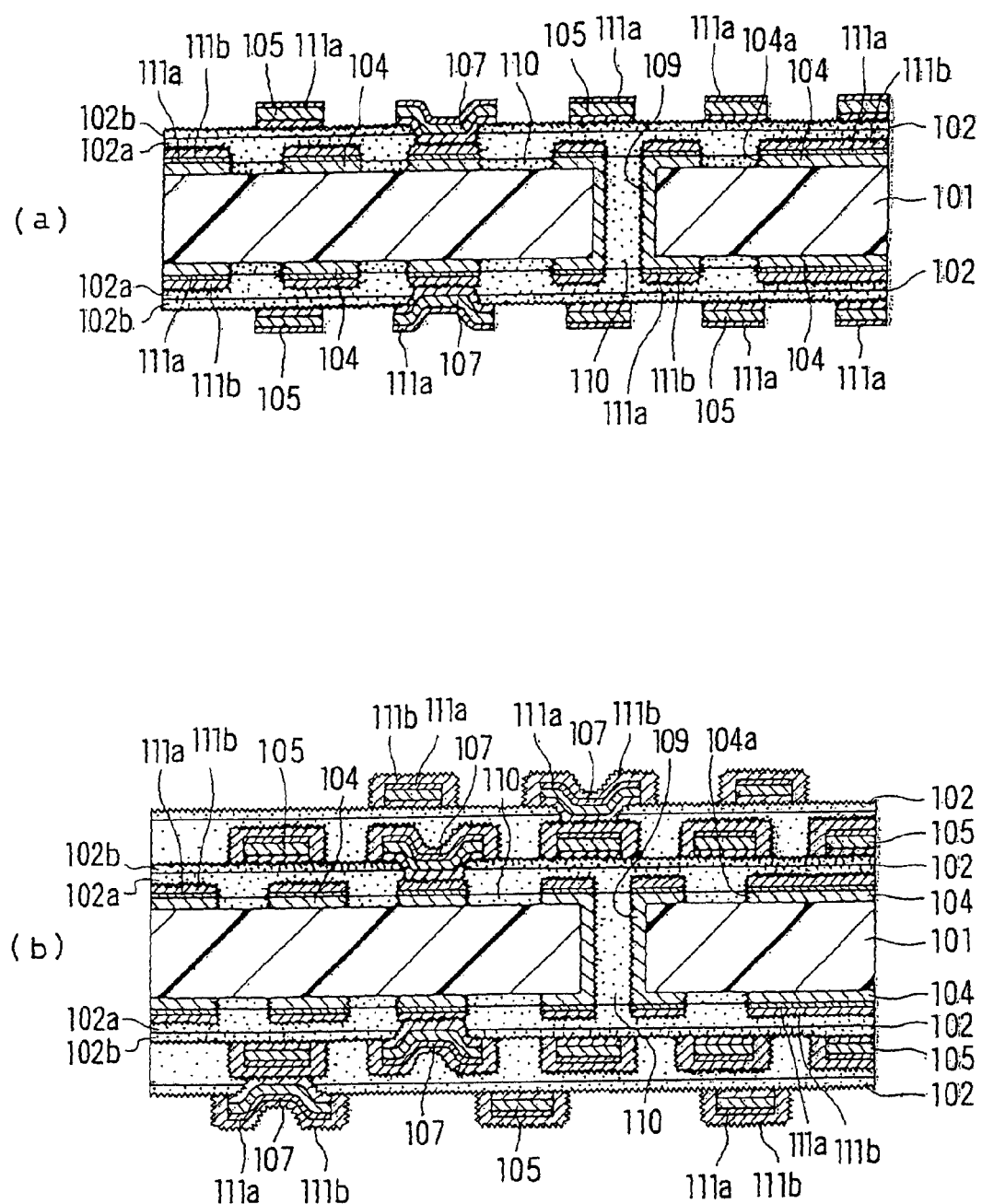
FIGS. 43 (*a*) and (*b*) are cross-section views illustrating the flow of production of a multilayer printed circuit board in accordance with the ninth group of the present invention.

The plating resist 3 was then removed with 5% KOH/H₂O and the electroless plated film 112 under the plating resist 103 was dissolved and removed by etching with sulfuric acid-hydrogen peroxide to provide a 11 μm-thick upper-layer conductor circuit 105 (L/S=28/28) (inclusive of via holes 107) comprising electroless plated copper layer 112 and electroplated copper layer 113 [FIG. 43(*a*)].

FIG. 43(*b*) shows the upper-layer conductor circuit as further built up on the substrate board shown in FIG. 43(*a*)

Comparative Example 11

Except that the nickel cover layer was not formed, the procedure of Example 47 was otherwise repeated to provide a multilayer printed circuit board.

Example 49

Except that a 1.1 μm-thick Sn layer in lieu of the nickel layer was formed by electroless plating, the procedure of Example 47 was otherwise repeated to provide a multilayer printed circuit board. The formulation of the tin plating bath was as follows.

| | |
|---|---|
| Sodium citrate | 0.34 mol/L |
| EDTA | 0.04 mol/L |
| Tin chloride | 0.04 mol/L |
| Sodium acetate | 0.12 mol/L |
| Titanium chloride | 0.029 mol/L |
| Bath temperature | 70 to 90° C. |

Example 50

Except that a cobalt layer in lieu of the nickel layer was formed by electroless plating, the procedure of Example 47 was otherwise repeated to provide a multilayer printed circuit board. The electroless plating was performed under the following conditions.

| [Electroless plating solution] | |
|---|---|
| Cobalt chloride | 0.60 mol/L |
| Sodium hypophosphite | 0.26 mol/L |
| Sodium tartrate | 0.90 mol/L |
| Ammonium chloride | 1.30 mol/L |
| pH | 8 to 10 |
| Bath temperature | 90 to 100° C. |

Example 51

Except that a palladium layer in lieu of the nickel layer was formed by electroless plating, the procedure of Example 47 was otherwise repeated to provide a multilayer printed circuit board. The electroless plating was performed under the following conditions.

| [Electroless plating solution] | |
|---|---|
| Tetramine palladium chloride | 5.4 g/L |
| EDTA sodium salt | 33.6 g/L |
| Ammonia | 350 g/L |
| Hydrazine | 0.3 g/L |
| Bath temperature | 90° C. |

Example 52

Except that a chromium layer in lieu of the nickel layer was formed by electroplating, the procedure of Example 48 was otherwise repeated to provide a multilayer printed circuit board. The electroplating was performed under the following conditions.

| [Electroplating solution] | |
|---|---|
| Chromic anhydride | 300 g/L |
| Sodium silicofluoride | 15 g/L |
| Sulfuric acid | 0.5 g/L |
| Bath temperature | 45° C. |
| [Electroplating conditions] | |
| Current density | 20 A/dm² |

Example 53

An aluminum layer was formed by sputtering instead of forming the nickel layer by nickel electroplating and the roughened layer was formed by copper nodule instead of forming the roughened layer composed of Cu—Ni—P alloy. Otherwise, the procedure of Example 48 was repeated to provide a multilayer printed circuit board. The above treatments were carried out under the following conditions.

| [Conditions of aluminum sputtering] | |
|---|---|
| sputtering equipment Japan Vacuum Technology's | SV-4540 |
| Gas pressure | 0.7 Pa |
| Power | 200 W |
| Time | 15 min. |
| Thickness of Al layer | 0.4 μm |

-continued

[Copper nodule solution]

| | |
|---|---|
| Copper sulfate | 20 g/L |
| EDTA | 15 g/L |
| Sodium pyrophosphate | 200 g/L |
| Sodium nitrate | 8 g/L |
| Ammonia | 2 g/L |
| Sodium orthophosphate | 15 g/L |

Example 54

Except that a zinc layer in lieu of the nickel layer was formed by electroless zinc plating, the procedure of Example 48 was otherwise repeated to provide a multilayer printed circuit board. The above electroless plating was performed under the following conditions.

[Electroless plating solution]

| | |
|---|---|
| Sodium hydroxide | 100 to 800 g/L |
| Zinc oxide | 50 to 200 g/L |
| Bath temperature | Room temperature |

Example 55

Except that an iron layer in lieu of the nickel layer was formed by Fe electroplating, the procedure of Example 48 was otherwise repeated to provide a multilayer printed circuit board. The Fe electroplating was carried out under the following conditions.

[Electroplating solution]

| | |
|---|---|
| Ferrous sulfate | 100 to 400 g/L |
| Ammonium sulfate | 50 to 200 g/L |

[Electroplating conditions]

| | |
|---|---|
| Current density | 6 to 10 A/dm$^2$ |

Example 56

Instead of forming the nickel layer by Ni electroplating, a nickel layer was formed by electroless nickel plating. Otherwise, the procedure of Example 48 was repeated to provide a multilayer printed circuit board. The electroless nickel plating was performed under the following conditions.

[Electroless plating solution]

| | |
|---|---|
| Nickel chloride | 30 g/L |
| Sodium hypophosphite | 10 g/L |
| Sodium citrate | 10 g/L |
| Bath temperature | 90° C. |

For each of the circuit boards obtained in the above Examples and Comparative Examples, a light microscopic observation of its cross-section was carried out to check for dissolution of the conductor circuit and bare spots in the roughened layer of Cu—Ni—P alloy.

In Examples 47 to 56, no dissolution of the conductor circuit was observed but Comparative Example 15 showed local dissolution of the power layer (plain layer).

Further, in Examples 47 to 52 and 54 to 56, there was no incidence of bare spots in the acicular or porous Cu—Ni—P plating process even in the $10^{th}$ turn but Comparative Example 15 showed bare spots as early as in the $3^{rd}$ turn. In the copper nodule performed in Example 54, too, no bare spots were observed.

In regard of the formable pattern width (L/S), whereas a fine-line pattern of 15/15 μm could be formed in Examples 48 and 52 to 56, only a pattern width of 30/30 could be obtained in the Comparative Examples.

Example 57

A. Preparation of a Resin Composition for an Upper-layer Roughened Layer
(1) Four-hundred (400) weight parts of an 80 wt. % solution of cresol novolac epoxy resin (Nippon Kayaku, mol. wt.: 2500) 25% acrylate in diethylene glycol dimethyl ether (DMDG), 60 weight parts of photosensitive monomer (Toa Gosei, Aronix M325), 5 weight parts of antifoam (Sun Nopco, S-65) and 35 weight parts of N-methylpyrrolidone (NMP) were taken in a vessel and stirred to give a mixed composition.
(2) Eighty (80) weight parts of polyethersulfone (PES) and epoxy resin particles (Sanyo Kasei, Polymerpole) (mean particle diameter 1.0 μm, 72 weight parts and mean particle diameter 0.5 μm, 31 weight parts) were taken in a separate vessel and stirred. Then, 257 weight parts of NMP was added and the whole mixture was blended in a beads mill to provide a second mixed composition.
(3) Twenty (20) weight parts of imidazole series curing agent (Shikoku Kasei, 2E4MZ-CN), 20 weight parts of photopolymerization initiator (benzophenone), 4 weight parts of photosensitizer (Ciba-Geigy, EAB) and 16 weight parts of NMP were taken in a still another vessel and stirred to provide a third mixed composition.

The above mixed compositions prepared in (1), (2) and (3) above were blended to provide a resin composition for forming roughened surface.

B. Preparation of a Lower-layer Roughened Surface-forming Composition
(1) Four-hundred (400) weight parts of a 80 wt. % resin solution dissolving cresol novolac epoxy resin (Nippon Kayaku, mol. wt.: 2500) 25% acrylate in diethylene glycol dimethyl ether (DMDG), 60 weight parts of photosensitive monomer (To a Gosei, Aronix M325), 5 weight parts of antifoam (Sun Nopco, S-65) and 35 weight parts of N-methylpyrrolidone (NMP) were taken in a vessel and stirred to provide a mixed composition.
(2) Eighty (80) weight parts of polyethersulfone (PES) and 145 weight parts of epoxy resin particle (Sanyo Kasei, Polymerpole; mean particle diameter 0.5 μm) were taken in a separate vessel and mixed. Then, 285 weight parts of NMP was added and the whole mixture was stirred in a beads mill to provide a second mixed composition.
(3) Twenty (20) weight parts of imidazole series curing agent (Shikoku Kasei, 2E4MZ-CN), 20 weight parts of photopolymerization initiator (benzophenone), 4 weight parts of photosensitizer (Ciba-Geigy, EAB) and 16 weight parts of NMP were taken in still another vessel and mixed to provide a third mixed composition.

The mixed compositions prepared in (1), (2) and (3) above were blended to provide an adhesive for electroless plating use.

C. Preparation of a Resin Filler
(1) One-hundred (100) weight parts of bisphenol F epoxy monomer (Yuka-Shell, mol. wt.: 310, YL983U), 170 weight parts of surface-silanated SiO$_2$ beads having a mean particle diameter of 1.6 μm and a maximum particle diameter of not more than 15 μm (Adotech, CRS 1101-CE) and 1.5 weight parts of leveling agent (Sun Nopco, Pellenol S4) were taken in a vessel and mixed to provide a resin filler with a viscosity of 45~49 Pa·s at 23±1° C.

As the curing agent, 6.5 weight parts of imidazole series curing agent (Shikoku Kasei, 2E4MZ-CN) was used.

D. Process for Manufacturing a Multilayer Printed Circuit Board (1) A copper-clad resin laminate composed of a 0.6 mm-thick glass-epoxy resin or BT (bis(maleimide)triazine) resin substrate 101 and a 18 μm-thick copper foil laminated to both sides thereof was used as the starting material [FIG. 44(*a*)] This copper-clad resin laminate was drilled, electroless plated and pattern-etched to form a lower-layer conductor circuit 104 and plated-through holes 109 on both sides of the substrate 101.

Figure 44:
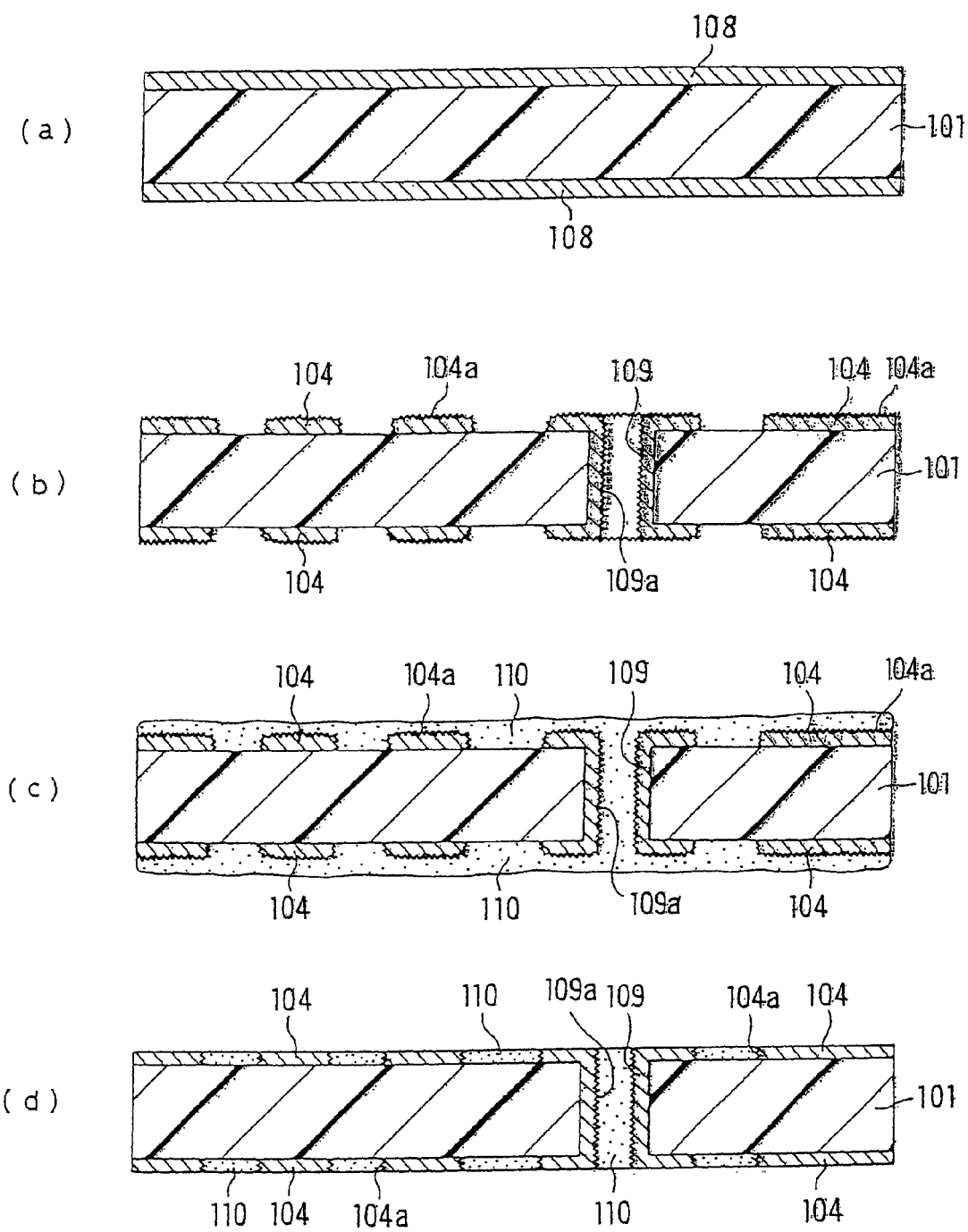
FIG. 44 (*a*) through (*d*) are cross-section views illustrating the flow of production of a multilayer printed circuit board in accordance with the tenth group of the present invention.

(2) The substrate board formed with the plated-through holes 109 and lower-layer conductor circuits 4 was rinsed with water, dried and subjected to a blackening treatment using an aqueous solution of NaOH (10 g/L), NaClO$_2$ (40 g/L) and Na$_3$PO$_4$ (16 g/L) as blackening bath (oxidation bath) and reduction treatment using an aqueous solution of NaOH (19 g/L) and NaBH$_4$ (5 g/L) as reduction bath to form roughened layers 104*a* and 109*a* on the entire surface of the lower-layer conductor circuit 104 inclusive of plated-through holes 109 [FIG. 44(*b*)].

(3) Using a roll coater, the resin filler 110 was coated on one side of the substrate board to fill up the pattern gaps of lower-layer conductor circuit 104 and the plated-through holes 109 and dried. On the other side of the substrate board, too, the resin filler 110 was similarly coated to fill the pattern gaps of conductor circuit 104 and the plated-through holes 109 and dried [FIG. 44(*c*)].

(4) One side of the substrate board which had gone through the above treatment (3) was abraded by belt sanding using a #600 belt sanding paper (Sankyo Rikagaku) to thoroughly remove the resin filler 110 from the surface of inner copper pattern 104 and lands of plated-through holes 109, followed by abrasion to get rid of injuries produced by said belt sanding. The above series of operations was performed on the other side of the substrate board as well. The substrate board was then heat-treated under the conditions of 100° C. for 1 hr, 120° C. for 1 hr, 150° C. for 3 hrs and 180° C. for 1 hr sequentially to cure the resin filler 110.

As the surface of the resin filler 110 filled in the plated-through holes 109 and non-conductor circuit region and the surface of the lower-layer conductor circuit 104 were thus leveled, there was obtained an insulating layer featuring a good adhesion of the resin filler 110 not only to the lateral sides 104*a* of the lower-layer conductor circuit 104 via the roughened surface but also to the internal walls 109*a* of plated-through holes 109 via the roughened layer [FIG. 44(*d*)]. By the above treatment, the surface of the resin filler 110 became flush with the surface of the lower-layer conductor circuit 104. The Tg temperature of the filled and cured resin was 155.6° C. and the coefficient of linear thermal expansion of the resin was $44.5 \times 10^{-6}/°$ C.

Figure 45:
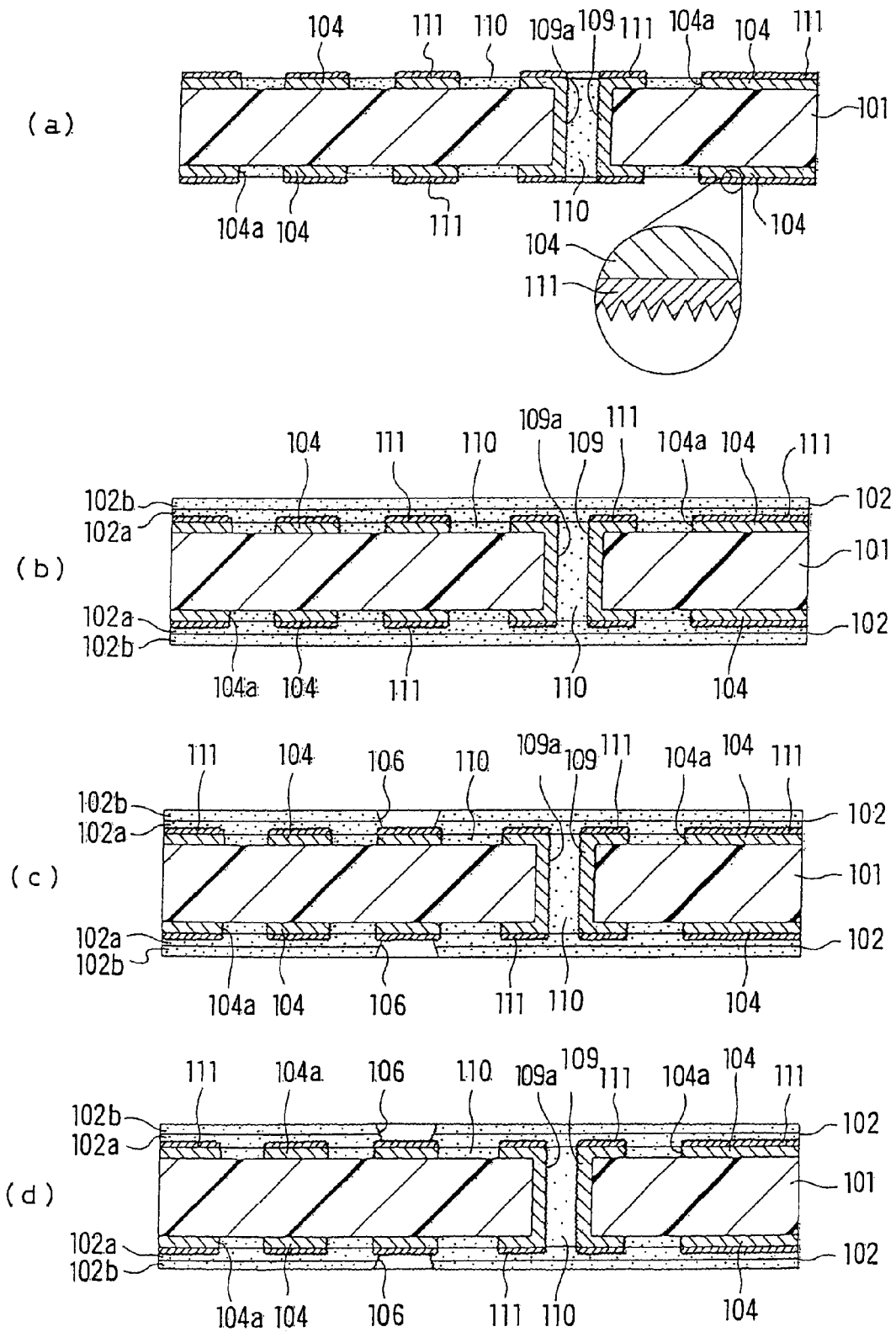
FIG. 45 (*a*) through (*d*) are cross-section views illustrating the flow of production of a multilayer printed circuit board in accordance with the tenth group of the present invention.

(5) On the thus-exposed surface of lower-layer conductor circuit 104 and lands of plated-through holes 109, a 2.5 g m-thick roughened layer (corrugated layer) 111 composed of Cu—Ni—P alloy was formed [FIG. 45(*a*)].

The procedure for the formation of said roughened layer (uneven layer) was as follows. Thus, the substrate board was immersed in an electroless copper plating bath (pH=9) comprising an aqueous solution of copper sulfate (8 g/L), nickel sulfate (0.6 g/L), citric acid (15 g/L), sodium hypophosphite (29 g/L), boric acid (31 g/L) and surfactant (Nisshin Chemical Industries, Surfynol 465) (0.1 g/L). After immersing for 1 minute, the substrate board was vibrated lengthwise and crosswise every 4 seconds to form a roughened layer 111 composed of acicular Cu—Ni—P alloy on the surface of the lower-layer conductor circuit and lands of plated-through holes.

(6) The substrate board formed with said roughened layer 111 was placed in an oven and heated in the atmospheric air at 150° C. for 1 hour, whereby a 0.1 μm-thick oxide film was formed on the surface. The formation of an oxide film could be ascertained from the color of the roughened layer and its presence was actually verified by fluorescent X-ray analysis (analyzer: Rigaku RIX2100). The oxide film is not shown, however.

(7) Then, both sides of the substrate board was coated with the adhesive for electroless plating B (viscosity: 1.5 Pa·s) by means of a roll coater and after the substrate board was allowed to sit in horizontal position for 20 minutes, the coat was dried at 60° C. for 30 minutes to provide an the layer of an adhesive for electroless plating use 102*a*.

Furthermore, on the above the layer of an adhesive for electroless plating use 102*a*, the adhesive for electroless plating A (viscosity: 7 Pa·s) was coated by means of a roll coater. After the coated board was allowed to sit in horizontal position for 20 minutes, the coat was oven-dried at 60° C. for 30 minutes, whereby an adhesive layer 102*b* was obtained. In this manner, a 35 μm-thick the layer of an adhesive for electroless plating use 102 was constructed [FIG. 45(*b*)].

(8) On both sides of the substrate board 101 formed with the layer of an adhesive for electroless plating use 102 in the above step (7), a photomask film printed with black dots each measuring 85 μm in diameter was set in close contact with the substrate board surface and light exposure at 500 mJ/cm$^2$ using an ultrahigh pressure mercury vapor lamp and DMDG spray development were carried out. Thereafter, the substrate board was further exposed to light at 3000 mJ/cm$^2$ using the ultrahigh pressure mercury vapor lamp and heat-treated at 100° C. for 1 hour and further at 150° C. for 5 hours to form a 35 μm-thick interlayer resin insulating layer 2 having openings 106 for via holes, 85 μm in diameter each, with dimensional tolerances close to those of the photomask film used [FIG. 45(*c*)].

(9) The substrate board formed with openings 106 for via holes in the above step was immersed in a solution containing 800 g/L of chromic acid at 70° C. for 19 minutes to dissolve out epoxy resin particles from the surface of the interlayer resin insulating layer 102 and thereby produce a roughened surface (3 μm deep) on said interlayer resin insulating layer 102 [FIG. 45(*d*)].

Here, the oxide film on the roughened layer 111 of the lower-layer conductor circuit 104 had not been dissolved and removed by etching. There were no voids.

(10) The substrate board which had gone through the above treatment was immersed in a neutralizing solution (Shipley) and then rinsed with water. Thereafter, the roughened surface of the substrate board was treated with a palladium catalyst solution (Atotech) to deposit catalyst nuclei on the surface of the inter-level insulating layer 102 and internal walls of openings 106 for via holes.

Figure 46:
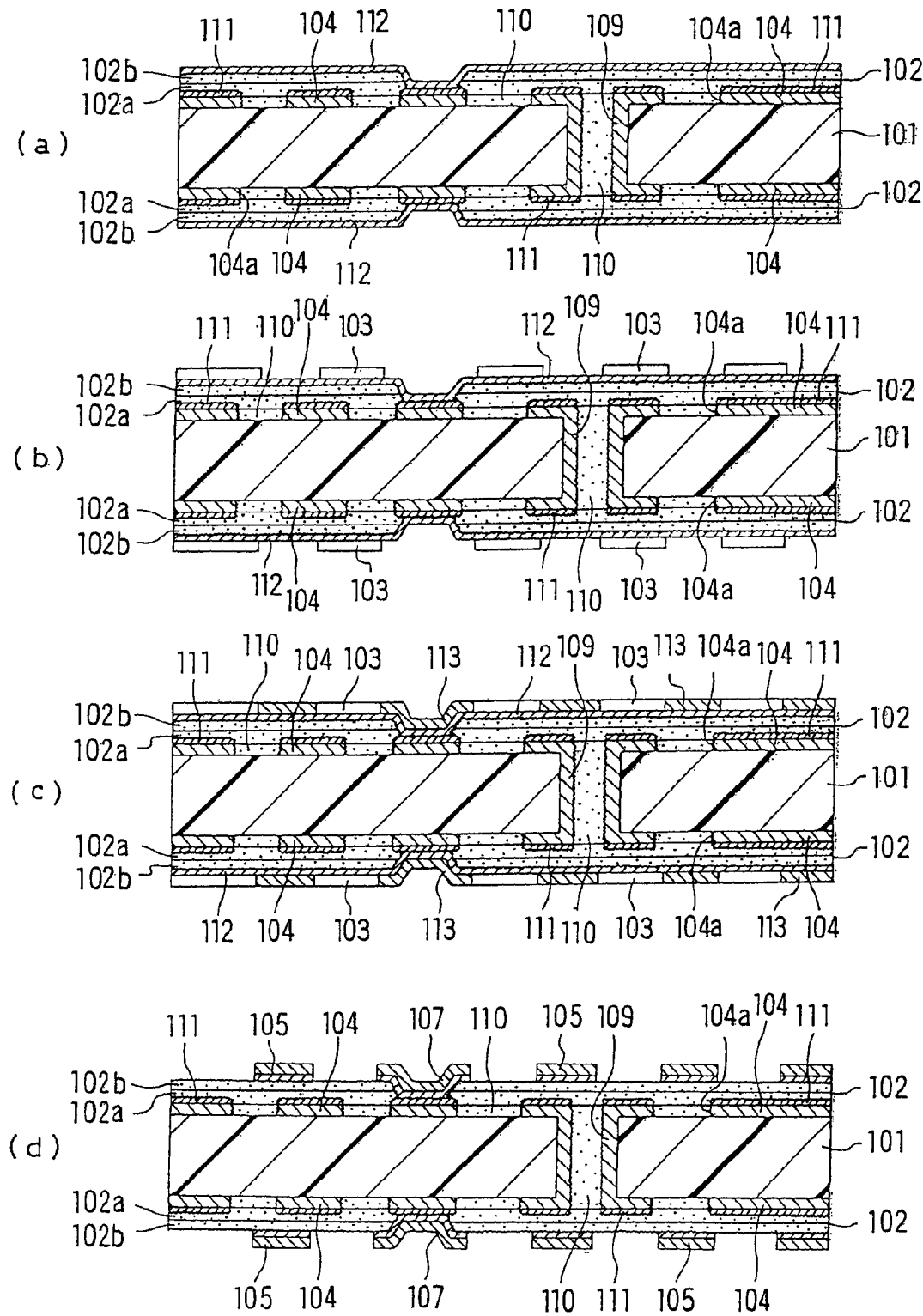
FIG. 46 (*a*) through (*d*) are cross-section views illustrating the flow of production of a multilayer printed circuit board in accordance with the tenth group of the present invention.

(11) Then, the substrate board was immersed in an aqueous electroless copper plating solution of the following formulation to form a 0.8 μm-thick electroless plated copper film 112 on the entire roughened surface [FIG. 46(*a*)]. Because of the small thickness of the plated copper film, the surface of electroless plating film has surface irregularities.

| [Aqueous electroless plating solution] | |
|---|---|
| EDTA | 50 g/L |
| Copper sulfate | 10 g/L |
| HCHO | 8 ml/L |
| NaOH | 10 g/L |
| α,α'-Bipyridyl | 80 mg/L |
| Polyethylene grycol (PEG) | 0.1 g/L |
| [Electroless plating conditions] | |
| Bath temperature: | 70° C., for 30 min. |

(12) A commercial photosensitive dry film was laminated to the electroless plated copper film 112 and, with a photomask set in position, light exposure at 100 mJ/cm$^2$ and development with 0.8% sodium carbonate/water were carried out to dispose a plating resist 103 [FIG. 46(*b*)].

(13) Then, the substrate board was washed with water at 50° C., degreased, rinsed with water at 25° C., and further cleaned with sulfuric acid. Thereafter, copper electroplating was performed under the following conditions to form a 15 μm-thick electroplated copper film 113 [FIG. 46(*c*)].

| [Aqueous electroplating solution] | |
|---|---|
| Sulfuric acid | 180 g/L |
| Copper sulfate | 80 g/L |
| Additive (Atotech Japan, product designation: Kaparacid GL) | 1 ml/L |
| [Electroplating conditions] | |
| Current density | 1 A/dm$^2$ |
| Time | 30 min. |
| Temperature | Room temperature |

(14) The plating resist 103 was stripped off with 5% KOH and the electroless plated film 112 under the plating resist 103 was dissolved and removed by etching with sulfuric acid-hydrogen peroxide, thus giving a 18 μm-thick conductor circuit (inclusive of via holes 107) 105 comosed of electroless plated copper film 112 and electroplated copper film 113. The substrate board was then immersed in a bath containing 800 g/L of chromic acid at 70° C. for 30 minutes to effect a 1 μm-etch of the surface of the interlayer resin insulating layer 102, in the non-conductor circuit regions between the conductor circuits, to remove the palladium catalyst residues from the surface thereof [FIG. 46(*d*)].

Figure 47:
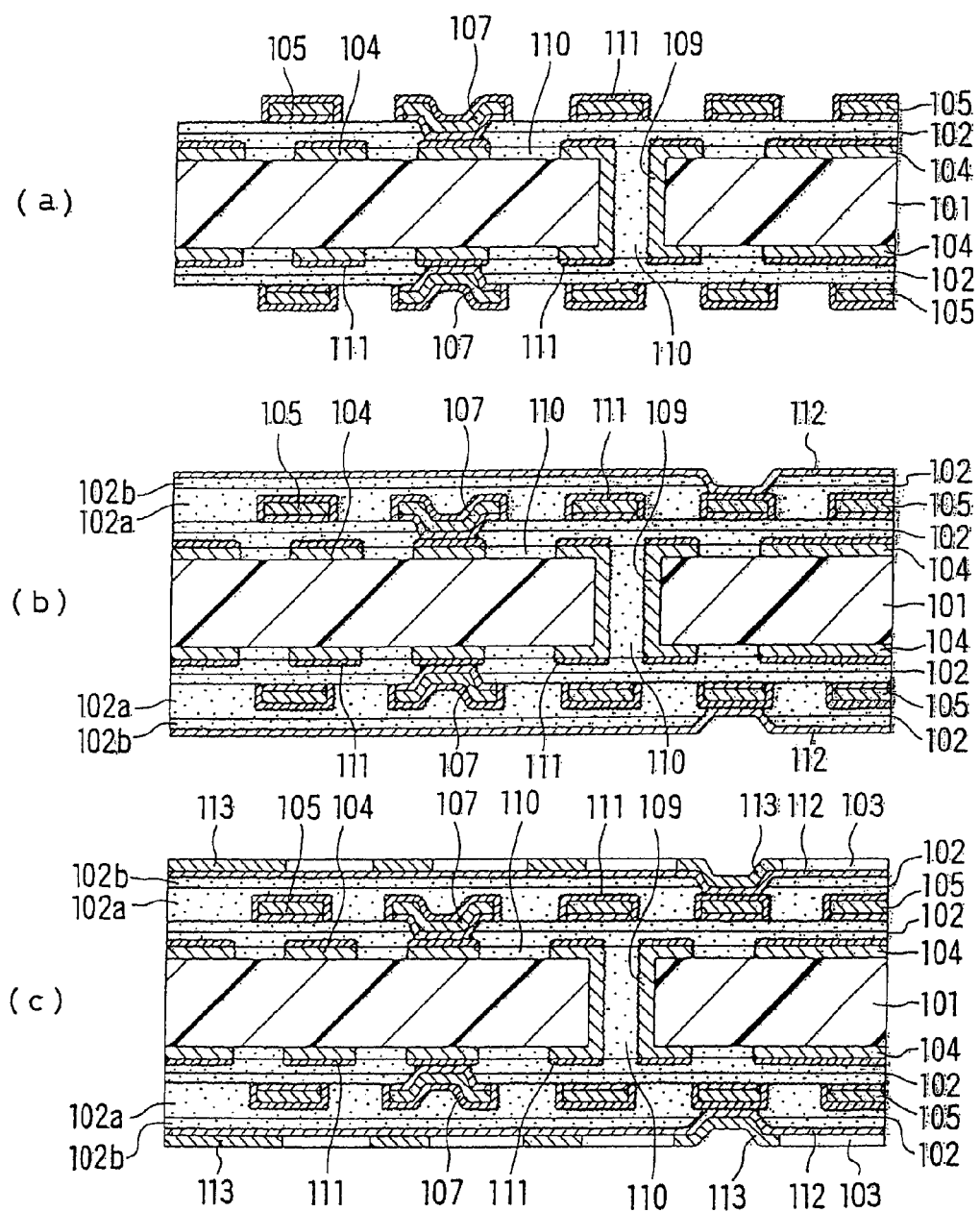
FIG. 47 (*a*) through (*c*) are cross-section views illustrating the flow of production of a multilayer printed circuit board in accordance with the tenth group of the present invention.

(15) The substrate board formed with the conductor circuit 105 was immersed in an electroless copper plating bath (pH=9) comprising an aqueous solution of copper sulfate (8 g/L), nickel sulfate (0.6 g/L), citric acid (15 g/L), sodium hypophosphite (29 g/L), boric acid (31 g/L) and surfactant (Nisshin Chemical Industries, Surfynol 465) (0.1 g/L). Starting 1 minute after immersing, the substrate board was shaken lengthwise and crosswise every 4 seconds to complete a roughened layer 11 composed of acicular Cu—Ni—P alloy on the surface of the lower-layer conductor circuit and lands of plated-through holes [FIG. 47(*a*)]. Analysis of the roughened layer 11 by EPMA (fluorescent X-ray analyzer) revealed the fractional composition of Cu: 98 mol %, Ni: 1.5 mol % and P: 0.5 mol %.

(16) The above sequence of steps (6) to (15) was repeated to build a further upper-layer conductor circuit, thereby completing the manufacture of a multilayer printed circuit board. However, no Sn substitution reaction was carried out [FIG. 47(*b*) to FIG. 48(*b*)].

(17) Then, 46.67 weight parts of a 60 wt. % solution of a photosensitive oligomer (mol. wt.: 4000) prepared by acrylating 50% of the epoxy groups of cresol novolac epoxy resin (Nippon Kayaku) in diethylene glycol dimethyl ether (DMDG), 6.67 weight parts of a 80 wt. % solution of bisphenol A epoxy resin (Yuka-Shell, product designation: Epikote 1001) in methyl ethyl ketone, 6.67 weight parts of a similar solution of bisphenol A epoxy resin (Yuka-Shell, Epikote E-1001-B80), 1.6 weight parts of imidazole series curing agent (Shikoku Kasei, product designation: 2E4MZ-CN), 4.5 weight parts of photosensitive bifunctional acrylic monomer (Nippon Kayaku, product designation: R604), 1.5 weight parts of photosensitive polyfunctional acrylic monomer (Kyoei Chemical, product designation: DPE6A), and 0.36 weight part of acrylic ester polymer leveling agent (Kyoei Chemical, product designation: polyflow No. 75) were taken in a vessel and stirred to provide a mixed composition. To this mixed composition, 2.0 weight part of the photopolymerization initiator Irgacure I-907 (Ciba-Geigy), 0.2 weight part of the photosensitizer DETX-S (Nippon Kayaku) and 0.6 weight part of DMDG were added, whereby a solder resist composition controlled to a viscosity of 1.4±0.3 Pa·s at 25° C. was obtained. The measurement of viscosity was carried out with a Type B viscometer (Tokyo Instruments, DVL-B) using Rotor No. 4 for 60 rpm and Rotor No. 3 for 6 rpm.

(18) Then, both sides of the multilayer printed circuit board was coated with the above solder resist composition in a thickness of 20 μm and the coat was oven-dried at 70° C. for 20 minutes and further at 70° C. for 30 minutes. Then, a 5 mm-thick photomask printed with a pattern corresponding to solder resist openings was set in close contact with the solder resist layer and UV exposure at 1000 mJ/cm$^2$ and development with DMTG were carried out to form openings with a diameter of 200 μm each.

The substrate board was then heat-treated under the conditions of 80° C. for 1 hr, 100° C. for 1 hr, 120° C. for 1 hr and 150° C. for 3 hrs sequentially to cure the solder resist layer and thereby provide a 20 μm-thick solder resist pattern layer 114 having openings.

(19) The substrate board formed with the solder resist layer 114 in this manner was immersed in an electroless nickel plating solution (pH=5) containing nickel chloride (30 g/L), sodium hypophosphite (10 g/L) and sodium citrate (10 g/L) for 20 minutes to form a 5 μm-thick plated nickel layer 15 in the openings. The substrate board was further immersed in an electroless plating solution containing potassium gold cyanide (2 g/L), ammonium chloride (75 g/L), sodium citrate (50 g/L) and sodium hypophosphite (10 g/L) at 93° C. for 23 seconds to form a 0.03 μm-thick plated gold layer 116 on the plated nickel layer 115.

Figure 48:
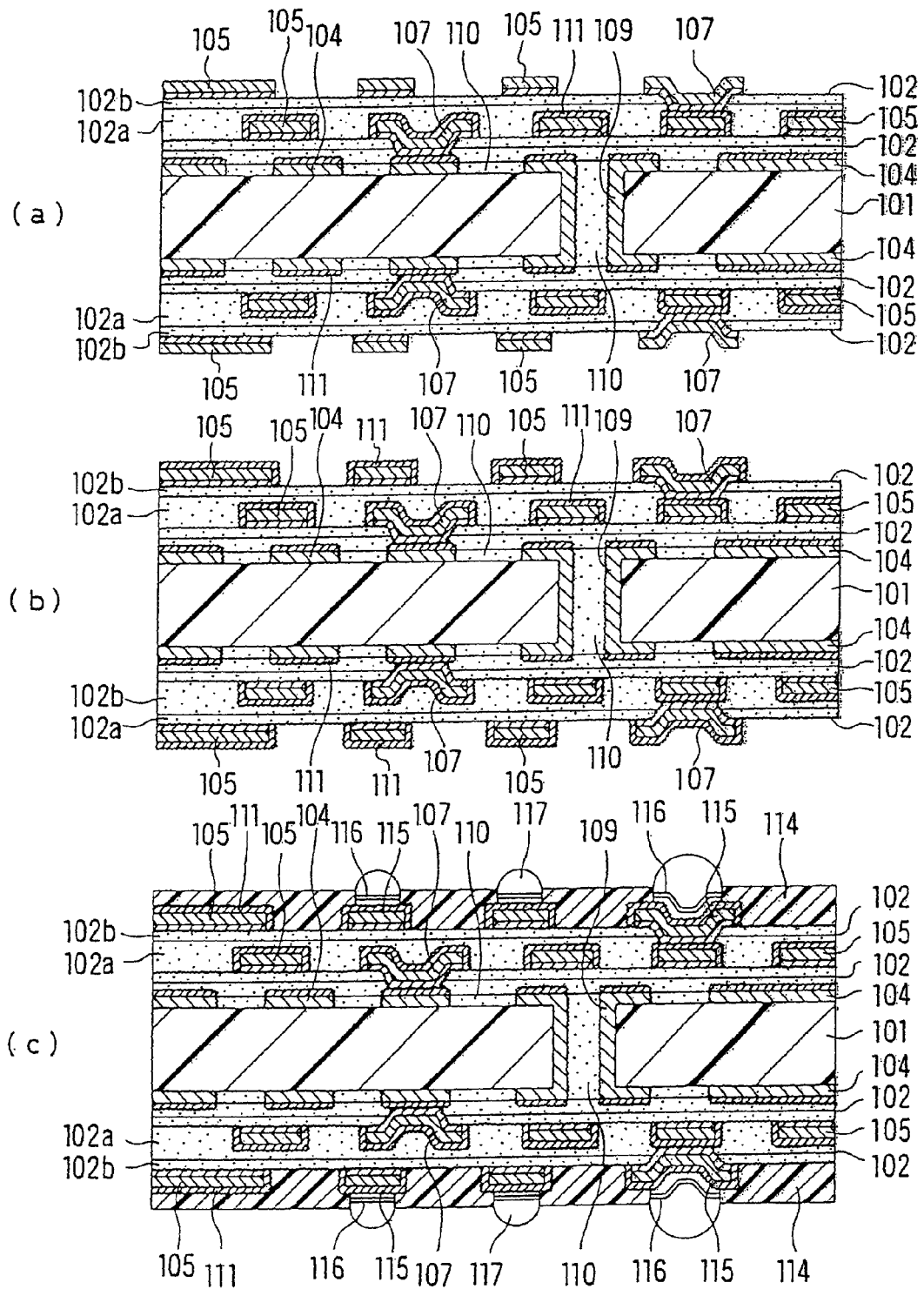
FIG. 48 (*a*) through (*c*) are cross-section views illustrating the flow of production of a multilayer printed circuit board in accordance with the tenth group of the present invention.

(20) Then, a solder paste was printed into the openings of the solder resist layer 114 and caused to reflow at 200° C. to provide solder vamps (solder masses) 117, whereby a multilayer printed circuit board comprising solder vamps 117 was obtained [FIG. 48(*c*)].

Example 58

In the above step (5) or (16), the substrate board which had gone through said step (4) or (15) was rinsed with water, acid-degreased, soft-etched and sprayed with an etching solution on both sides of the substrate to etch the surface of the lower-layer conductor circuit and the lands and internal walls of the plated-through holes to roughen the entire surface of the lower-layer conductor circuit. Otherwise, the procedure of Example 57 was repeated to provide a multilayer printed circuit board.

As said etching solution, a mixture of 10 weight parts of imidazole copper (II) complex, 7 weight parts of glycolic acid, 5 weight parts of potassium chloride and 78 weight parts of deionized water was used.

Comparative Example 12

In the above (6) or equivalent step, the substrate board formed with a roughened layer without formation of an oxide film and Cu—Sn substitution plating was curried out immersing a plating bath (pH=1.2) containing tin borofluoride (0.1 mol/L) and thiourea (1.0 mol/L) at 50° C. to form a 0.3 μm-thick Sn layer on the surface of the roughened layer. Otherwise, the procedure of Example 57 was repeated to provide a multilayer printed circuit board.

Comparative Example 13

In said (6) or equivalent step, the substrate board formed with a roughened surface without formation of an oxide film and an Cu—Sn substitution plating was curried out immersing a plating bath (pH=1.2) containing tin borofluoride (0.1 mol/L) and thiourea (1.0 mol/L) at 50° C. to form a 0.3 μm-thick Sn layer on the roughened surface of the conductor circuit. Otherwise, the procedure of Example 58 was repeated to provide a multilayer printed circuit board.

For each of the multilayer printed circuit boards obtained in Examples 57 and 58 and in Comparative Examples 12 and 13, the heat cycle test was held at −55° C. for 30 minutes and then at 125° C. for 30 minutes in 1000 cycles. After this heat cycle test, the substrate board was cut crosswise at the via hole-conductor circuit connection and the cross-section was observed by light microscopy.

As a result, whereas the multilayer printed circuit boards according to Examples 57 and 58 invariably showed no delamination with the via hole remaining secured to the roughened surface of the conductor circuit, some samples of the multilayer conductor circuits according to Comparative Examples 12 and 13 showed delamination along the connection interface between the via hole and the underlying conductor circuit.

INDUSTRIAL APPLICABILITY

As described above in detail, the multilayer printed circuit board according to the first group of the present invention is excellent in heat cycle resistance, in signal conduction characteristics in the high-frequency band and in solder heat resistance without compromise in the adhesion strength of conductor circuits.

The multilayer printed circuit board according to the first invention of the second group of the present invention, wherein a cycloolefin resin is used for the construction of the interlayer resin insulating layer, is low in dielectric constant and dielectric loss constant, with the result that even when high-frequency signals in the GHz band are carried, the incidence of signal delay or signal error is low. Furthermore, because the substrate board is excellent in rigidity and other mechanical properties, the reliability of circuit-to-circuit connection is high and the adhesion between the conductor circuit and interlayer resin insulating layer is also high.

The process for manufacturing a multilayer printed circuit board according to the second invention of the second group comprises a step that the interlayer resin insulating layer is formed by laminating a cycloolefin resin sheet to the conductor circuit, so that it is unnecessary to use a solvent and, moreover, the production process is simplified with the result that the objective PCB can be easily manufactured.

The multilayer printed circuit board according to the third group of the present invention shows the dissolution of the conductor circuit due to a local cell reaction which would otherwise occur in the treatment of the substrate board with an acid or the like can be completely inhibited and, in the plating of the conductor circuit with an acicular Cu—Ni—P alloy, the deposition of plating metals can be allowed to proceed well so that a satisfactory roughened layer can be certainly provided.

In the process for manufacturing a multilayer printed circuit board according to the fourth group of the present invention, which comprises forming a resin insulating layer on a metal layer and cleaning the insulating layer with an acid to remove the oxide film formed on the metal layer, the peel of the electroplated copper layer from said metal layer can be precluded, with the result that the conductor circuit reliability is enhanced. Moreover, as the surface of the conductor circuit is rendered smooth, the trouble of signal delay is prevented.

In accordance with the fifth group of the present invention, the resin insulating layer can be made flat and level without compromise in the adhesion strength of the conductor circuit so that the resulting multilayer printed circuit board shows an excellent signal conduction characteristic in the high-frequency band.

In accordance with the sixth group of the present invention, the conductor circuit can be made level and flat without compromise in its adhesion so that the resulting multilayer circuit board features an excellent signal conduction characteristic in the high-frequency band. Moreover, the incidence of cracking can be inhibited to enhance the circuit reliability. In addition, an improvement in fine-line definition of the circuit can be obtained.

In accordance with the process for constructing a conductor circuit according to the first invention of the seventh group of the present invention, wherein a first conductor layer composed of a metal forming a passivation film on surface, such as Ni or Al, is formed on an insulating substrate and, then, a second conductor layer composed of a metal having the ionization tendency lower than said metal forming a passivation film on surface is formed on the surface of said first conductor layer, the first and second conductor layers can be selectively etched at the same time with an easily manageable acid etching solution to thereby construct a conductor circuit.

Furthermore, the conductor circuit thus constructed shows good adhesion to an interlayer resin insulating layer such as a resin board and, moreover, because the surface of the conductor circuit is flattened, the noise associated with the carrying of high-frequency signals can be prevented.

In the process for manufacturing a multilayer printed circuit board according to the second invention of said seventh group, wherein a first conductor layer composed of a metal forming a passivation film on surface, such as Ni or Al, is first formed on a resin insulating substrate and a second conductor layer composed of a metal having the ionization tendency lower than said metal forming a passivation film is then formed, the subsequent formation of a plating resist, electroplating and removal of the plating resist may be followed by the simultaneous etch of said first and second conductor layers under the plating resist using an easily manageable acid etching solution to construct the objective conductor circuit.

Furthermore, the conductor circuit thus constructed shows good adhesion to an insulating substrate such as a resin board and, moreover, because the surface of the conductor circuit is flattened, the noise associated with the carrying of high-frequency signals can be prevented.

In the process for forming a metal layer according to the first invention of the eighth group, a conductor circuit with high adhesion to the nickel film and superimposed other metal film built up on a substrate board can be constructed so that the delamination between the metal layers due to the oxide film on said nickel film can be prevented.

The process for manufacturing a multilayer printed circuit board according to the second invention of the eighth group is characterized that the delamination between the plated nickel film and superimposed roughened layer of Cu—Ni—P alloy of the conductor circuit is prevented.

The multilayer printed circuit board according to the ninth group of the present invention allows the dissolution of the conductor circuit due to a local cell reaction which might otherwise occur in the treatment of the substrate board with an acid or the like can be completely inhibited and, at the same time, the deposition of plating metals can be allowed to proceed well at plating of the acicular or porous Cu—Ni—P alloy for the preparation of a roughened layer on the conductor circuit so that the roughened layer can be certainly provided.

Moreover, the process for manufacturing a multilayer printed circuit board according to the tenth group of the present invention allows, on a conductor circuit formed with a roughened surface and a roughened layer, a protective film can be formed by a simple procedure and the resulting multilayer printed circuit board has a good via-hole connection reliability.

What is claimed as new and desired to be secured by Letters Patent of the United States is:

1. A multilayer printed circuit board comprising:
   a plurality of conductor circuits alternately laminated with an interlayer resin insulation layer, the conductor circuits including a lower conductor circuit and an uppermost conductor circuit connected to the lower conductor circuit through a via hole;
   a metal layer formed on a surface of the uppermost conductor circuit, the metal layer comprising Sn and having a flat surface; and
   a solder resist layer formed over the uppermost conductor circuit and the metal layer.

2. The multilayer printed circuit board according to claim 1, wherein the metal layer comprising Sn has a non-roughened surface which is not roughened.

3. The multilayer printed circuit board of claim 2, wherein said lower conductor circuit comprises a roughened surface.

4. The multilayer printed circuit board of claim 2, wherein each side surface of said uppermost conductor circuit is said non-roughened surface.

5. The multilayer printed circuit board of claim 4, wherein a top surface of the conductor circuit is said non-roughened surface.

6. The multilayer printed circuit board according to claim 1, wherein the metal layer comprises a plated layer formed by plating the metal layer comprising Sn on at least a part of the surface of the uppermost conductor circuit.

7. The multilayer printed circuit board according to claim 6, wherein the uppermost conductor circuit comprises:
   an electroless plated film; and
   and an electroplated film formed on the electroless plated film.

8. The multilayer printed circuit board according to claim 7, wherein the electroless plated film comprises Cu.

9. The multilayer printed circuit board according to claim 7, where the electroplated film comprises Cu.

10. The multilayer printed circuit board of claim 1, further comprising a core substrate, the plurality of conductor circuits and interlayer resin insulation layer being formed over the core substrate.

11. The multilayer printed circuit board of claim 1, wherein said lower conductor circuit comprises a roughened surface.

12. The multilayer printed circuit board of claim 1, wherein each side surface of the uppermost conductor circuit is said flat surface.

13. The multilayer printed circuit board of claim 12, wherein a top surface of said conductor circuit is said flat surface.

14. The multilayer printed circuit board according to claim 1, wherein said metal layer comprising Sn is formed directly on at least a portion of the surface of the uppermost conductor circuit.

15. The multilayer printed circuit board according to claim 1, wherein said uppermost conductor circuit comprising Cu.

16. The multilayer printed circuit board according to claim 1, wherein said metal layer comprising Sn improves adhesion of the metal layer to the resin insulating layer.

17. The multilayer printed circuit board according to claim 1, wherein the uppermost conductor circuit is an electroless plated film.

18. A multilayer printed circuit board including a plurality of conductor circuits alternately laminated with an interlayer resin insulation layer, the conductor circuits including a lower conductor circuit and an uppermost conductor circuit connected to the lower conductor circuit through a via hole, a metal layer provided on the surface of the uppermost conductor circuit, and a solder resist layer formed over the uppermost conductor circuit and the metal layer, the multilayer printed circuit board being formed by a method comprising:
   providing at least part of the metal layer as a metal layer comprising Sn on the surface of the uppermost conductor circuit, wherein the metal layer comprising Sn is formed to have a flat surface.

19. The multilayer printed circuit board of claim 18, wherein the multilayer printed circuit board being formed by a method further comprising:
   providing the metal layer by plating the metal layer comprising Sn on the surface of the uppermost conductor circuit.

20. The multilayer printed circuit board according to claim 18, wherein the multilayer printed circuit board being formed by a method further comprising: forming the uppermost conductor circuit by forming electroless plated film, and forming an electroplated film on the electroless plated film.

21. The multilayer printed circuit board according to claim 18, wherein the multilayer printed circuit board being formed by a method further comprising forming the electroless plated film comprising Cu.

22. The multilayer printed circuit board according to claim 18, wherein the multilayer printed circuit board being formed by a method further comprising forming the electroplated film comprising Cu.

23. The multilayer printed circuit board according to claim 18, wherein said providing comprises providing as an electroless plated film.

* * * * *

UNITED STATES PATENT AND TRADEMARK OFFICE
CERTIFICATE OF CORRECTION

PATENT NO. : 8,018,045 B2  Page 1 of 1
APPLICATION NO. : 12/146212
DATED : September 13, 2011
INVENTOR(S) : Honchin En et al.

It is certified that error appears in the above-identified patent and that said Letters Patent is hereby corrected as shown below:

Column 108, line 34 (Claim 18), change "metal layer provided on the surface of the uppermost" to --metal layer provided on a surface of the uppermost--.

Signed and Sealed this
Third Day of April, 2012

David J. Kappos
*Director of the United States Patent and Trademark Office*

UNITED STATES PATENT AND TRADEMARK OFFICE
CERTIFICATE OF CORRECTION

PATENT NO. : 8,018,045 B2
APPLICATION NO. : 12/146212
DATED : September 13, 2011
INVENTOR(S) : Dongdong Wang et al.

Page 1 of 1

It is certified that error appears in the above-identified patent and that said Letters Patent is hereby corrected as shown below:

In the Claims

Column 108, line 4 (Claim 9), change "where the electroplated film comprises Cu" to
--wherein the electroplated film comprises Cu--.

Signed and Sealed this
Twenty-third Day of April, 2013

Teresa Stanek Rea
*Acting Director of the United States Patent and Trademark Office*